United States Patent [19]
Yamasaki et al.

[11] Patent Number: 5,396,100
[45] Date of Patent: Mar. 7, 1995

[54] SEMICONDUCTOR INTEGRATED CIRCUIT DEVICE HAVING A COMPACT ARRANGEMENT OF SRAM CELLS

[75] Inventors: Kohji Yamasaki, Akishima; Nobuyuki Moriwaki, Kyoto; Shuji Ikeda, Koganei; Hideaki Nakamura, Kodaira; Shigeru Honjo, Ohtsuki, all of Japan

[73] Assignees: Hitachi, Ltd.; Hitachi VLSI Engineering Corp., Tokyo, Japan

[21] Appl. No.: 861,366

[22] Filed: Mar. 31, 1992

[30] Foreign Application Priority Data

Apr. 5, 1991 [JP] Japan .................... 3-072748
Feb. 5, 1992 [JP] Japan .................... 4-020175

[51] Int. Cl.⁶ ............... H01L 29/76; H01L 27/10; H01L 23/552; H01L 27/11
[52] U.S. Cl. .................. 257/390; 257/205; 257/659; 257/903
[58] Field of Search ........... 257/202, 203, 204, 206, 257/208, 210, 211, 903, 904, 314, 390, 391, 392, 393, 659, 544, 205

[56] References Cited

U.S. PATENT DOCUMENTS

| | | | |
|---|---|---|---|
| 4,597,805 | 7/1986 | Mohan Rao | 257/544 |
| 4,709,351 | 11/1987 | Kajigaya | 257/390 |
| 5,132,771 | 7/1992 | Yamanaka et al. | 257/390 |
| 5,148,255 | 9/1992 | Nakazato et al. | 257/378 |
| 5,160,995 | 11/1992 | Wada et al. | 257/210 |

FOREIGN PATENT DOCUMENTS

58-106858 6/1983 Japan .................... 257/544

OTHER PUBLICATIONS

IEDM 88, "A 25 $\mu m^2$, New Poly-Si PMOS Load (PPL) SRAM Cell having excellent Soft error immunity", pp. 48-51, by Yamanaka et al.

*Primary Examiner*—Steven Ho Yin Loke
*Assistant Examiner*—Steven Loke
*Attorney, Agent, or Firm*—Antonelli, Terry, Stout & Kraus

[57] ABSTRACT

Herein disclosed is a semiconductor integrated circuit device which has a memory array or a memory mat formed of memory cells arranged regularly in a matrix shape. At the end portion or inside of the memory array or memory cell in the region of the device where the patterning of the memory cells is discontinued or interrupted, the shape of an element isolating insulating film, which is formed for regulating the memory cells having pattern interruptions, is made substantially identical to the shape of the element isolating insulating film for regulating the memory cells in the region of the device where the patternings of the memory cells are of an uninterrupted regular form. In the location on the chip front face where the regular patterns associated with the memory area are discontinued, there is formed a dummy pattern having a shape made substantially identical to that of a gate electrode arranged at the end portion of the location where the regular patterns are interrupted.

30 Claims, 57 Drawing Sheets

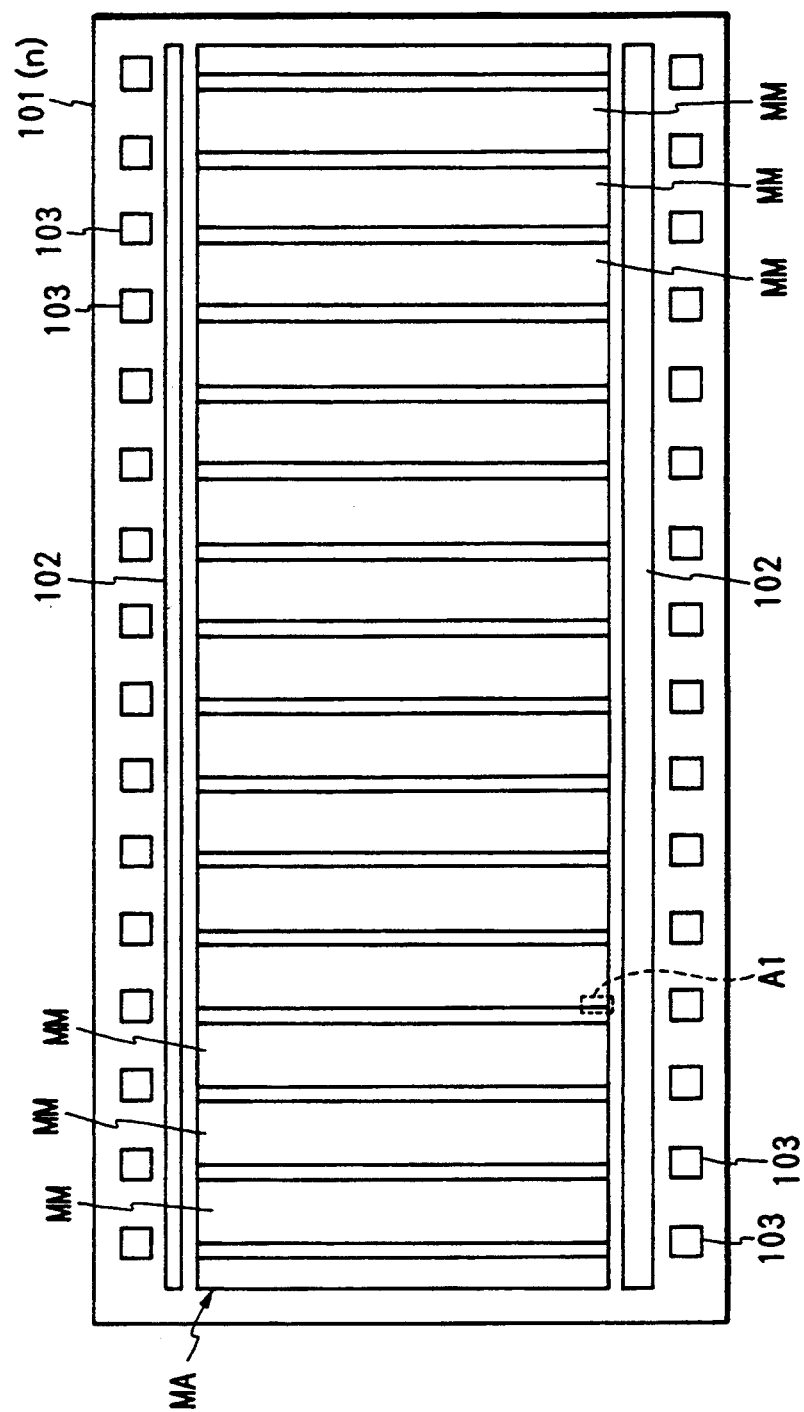

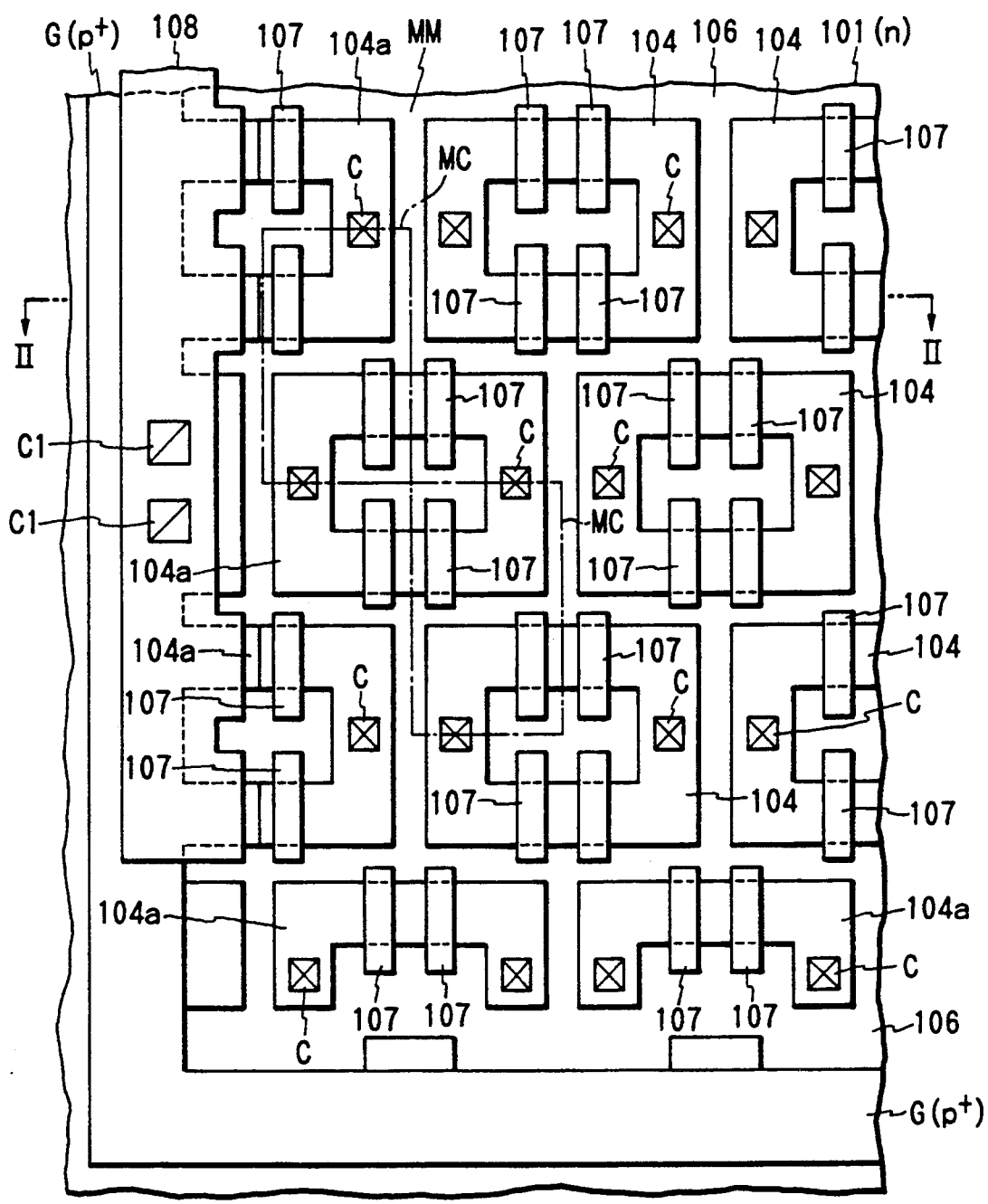

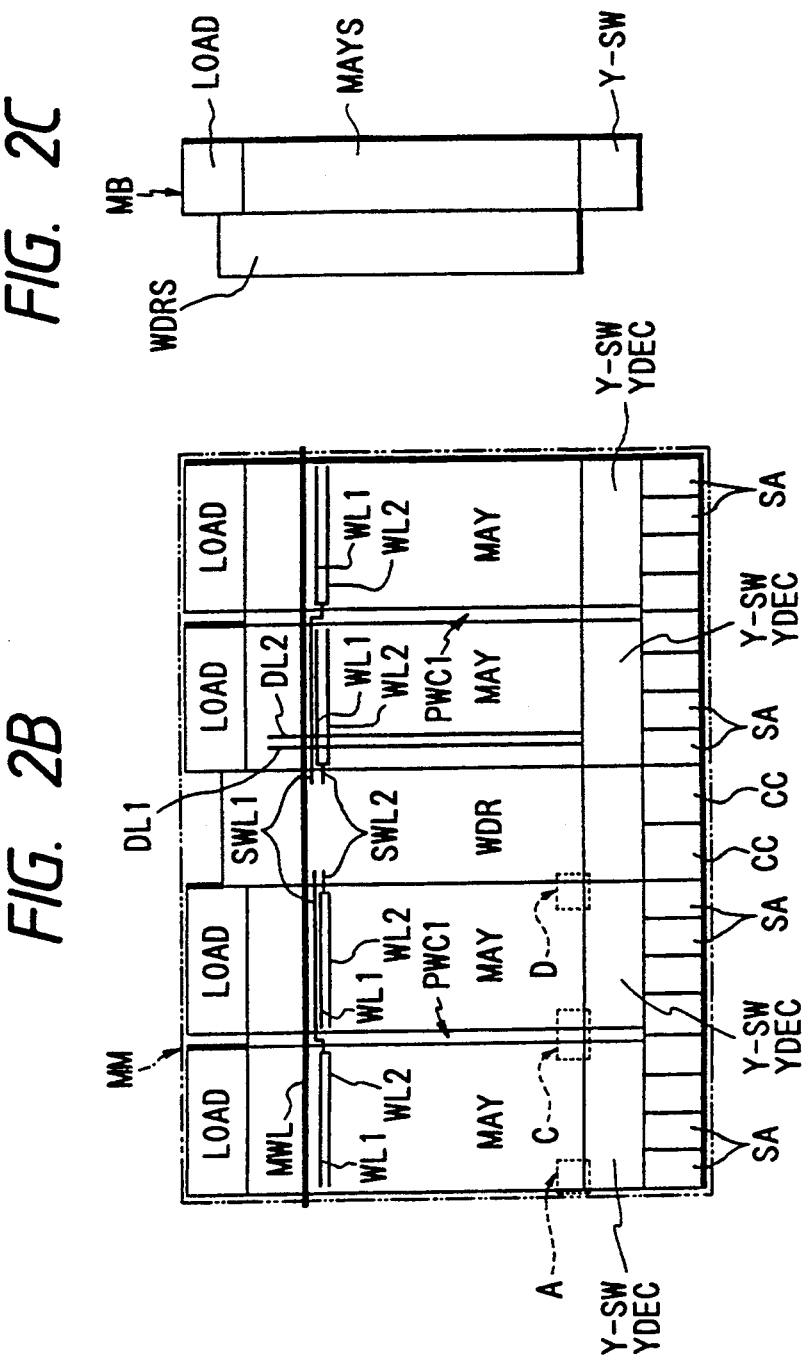

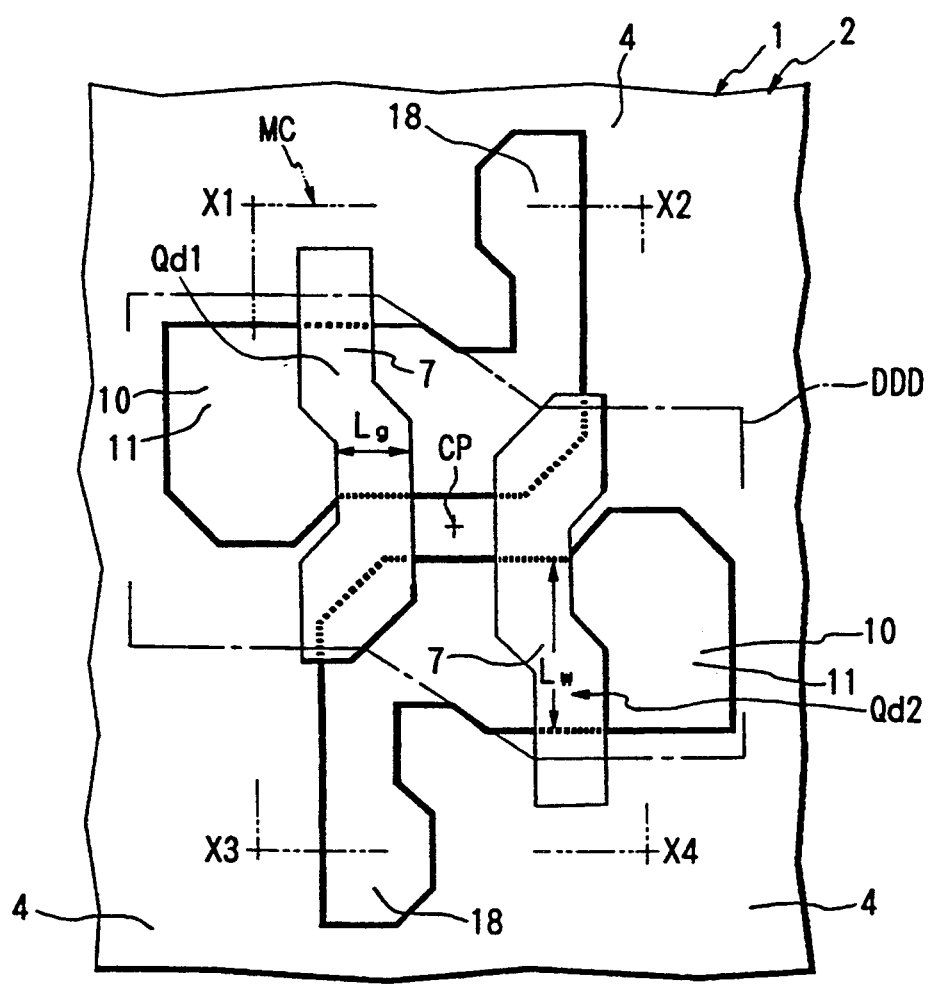

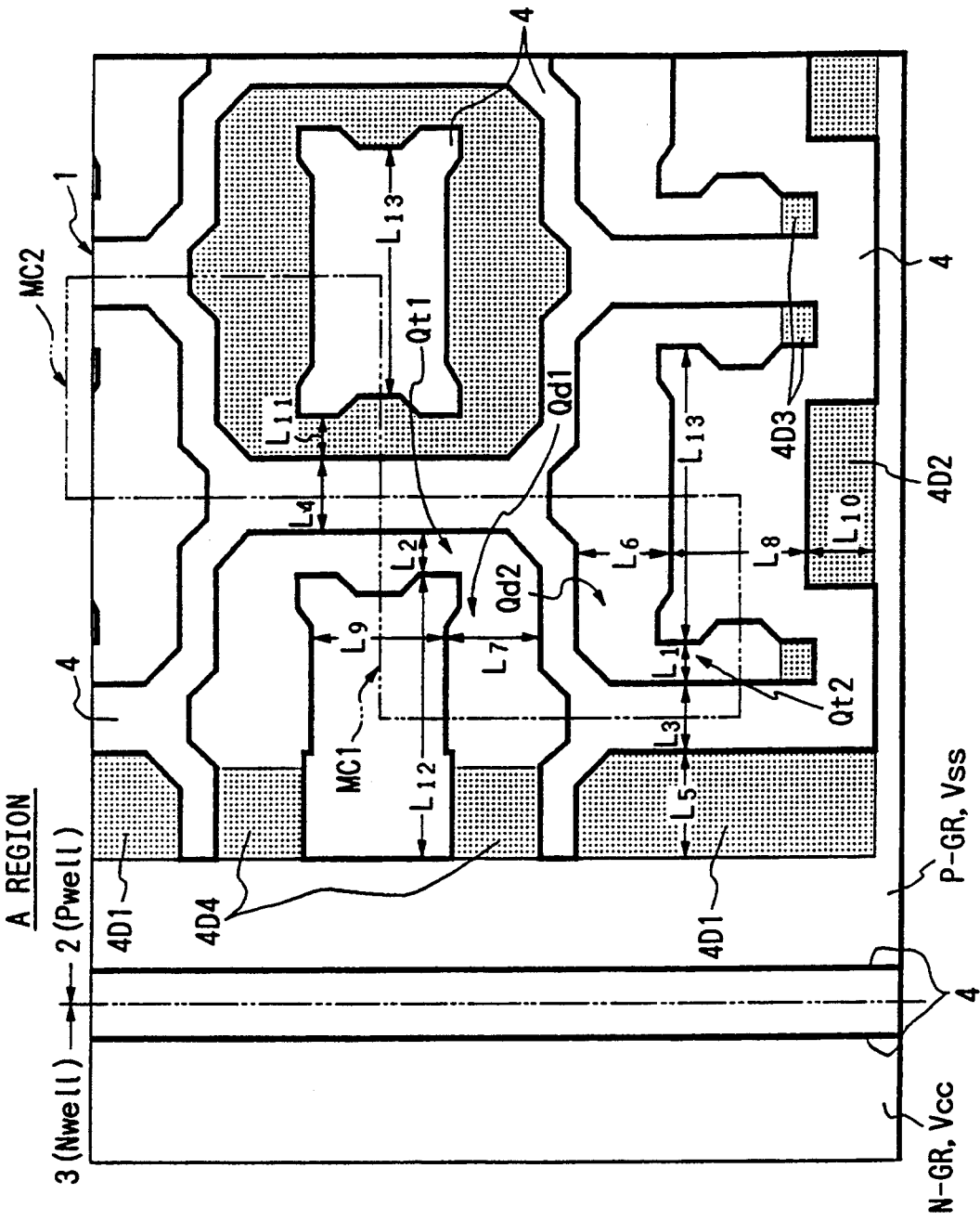

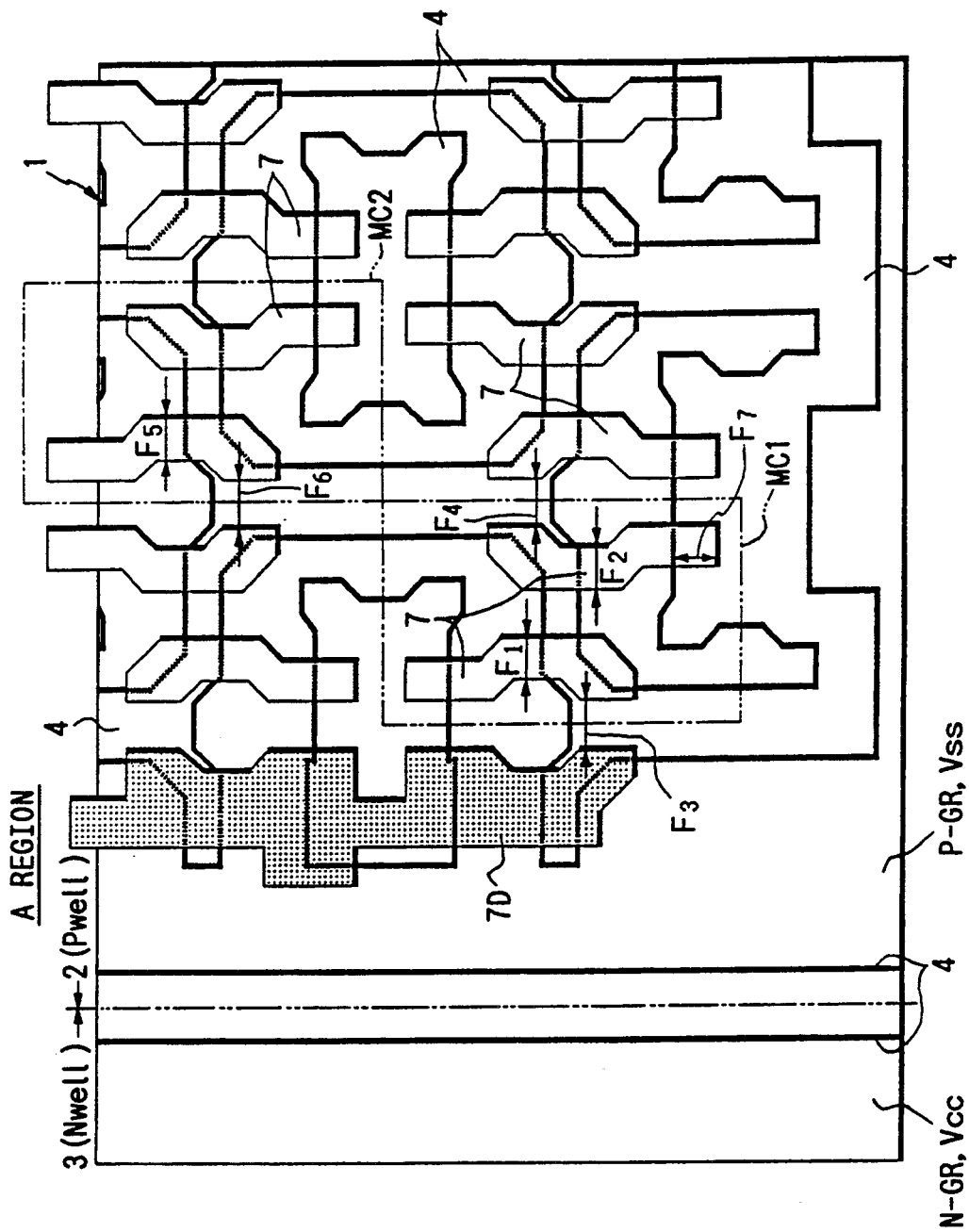

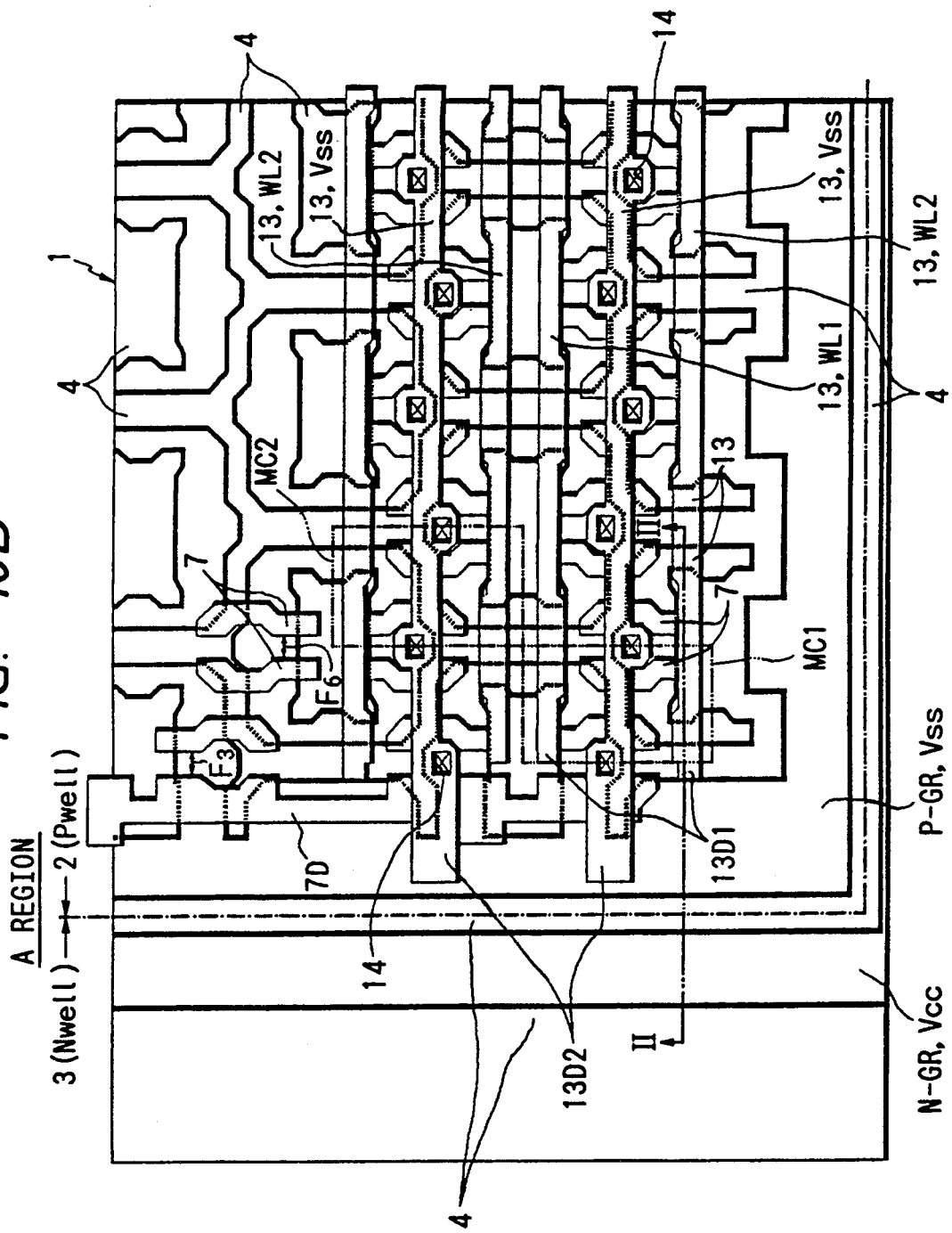

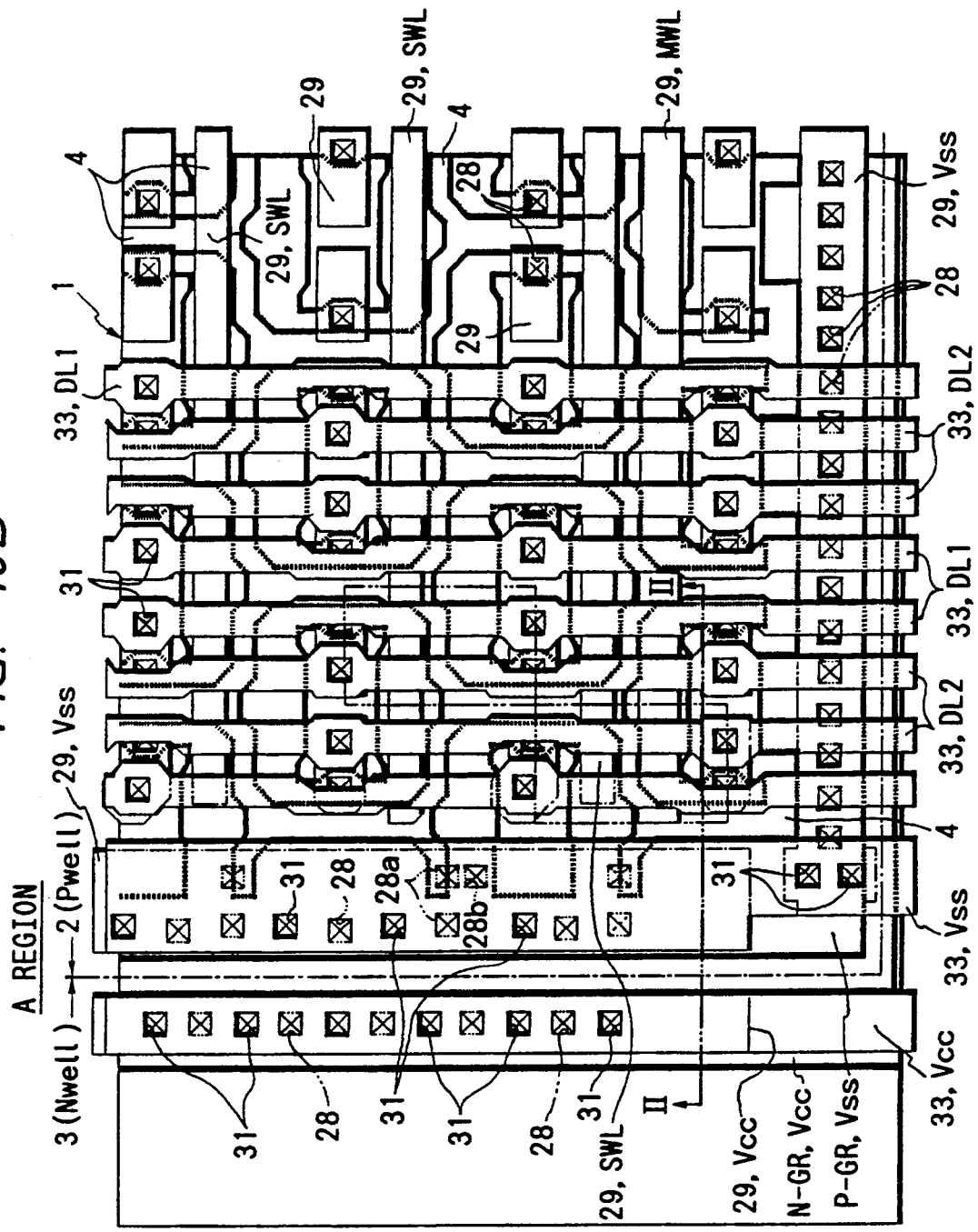

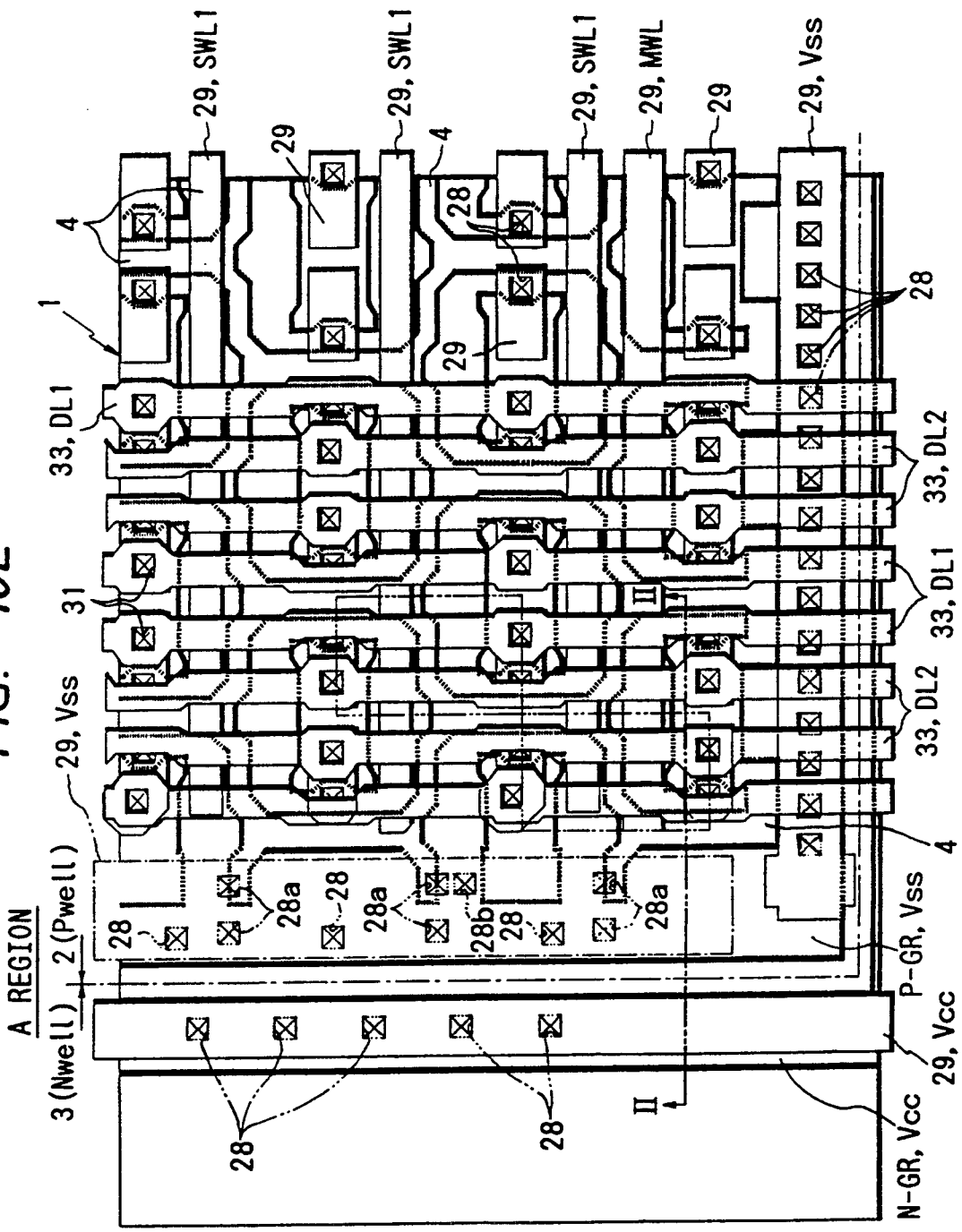

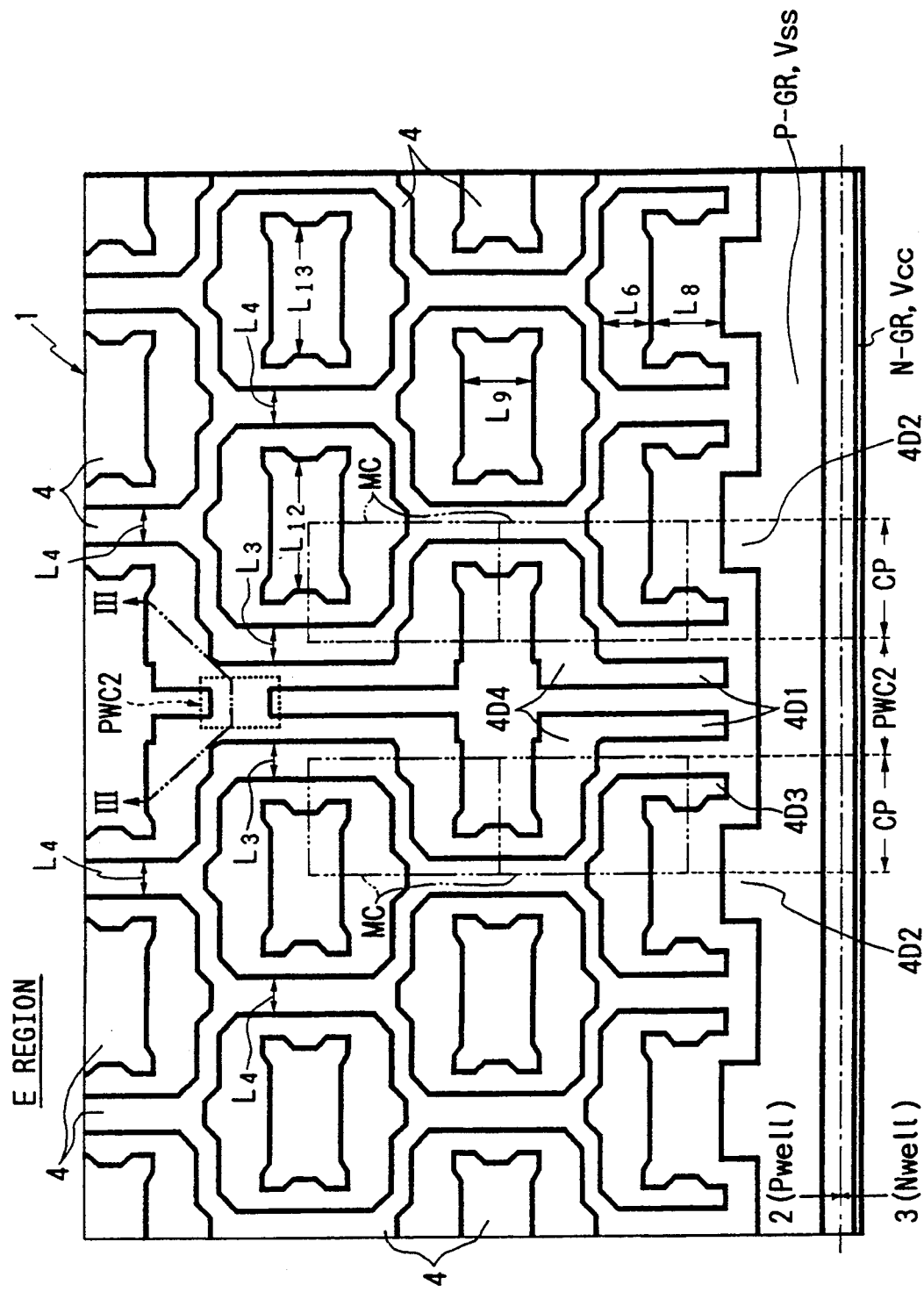

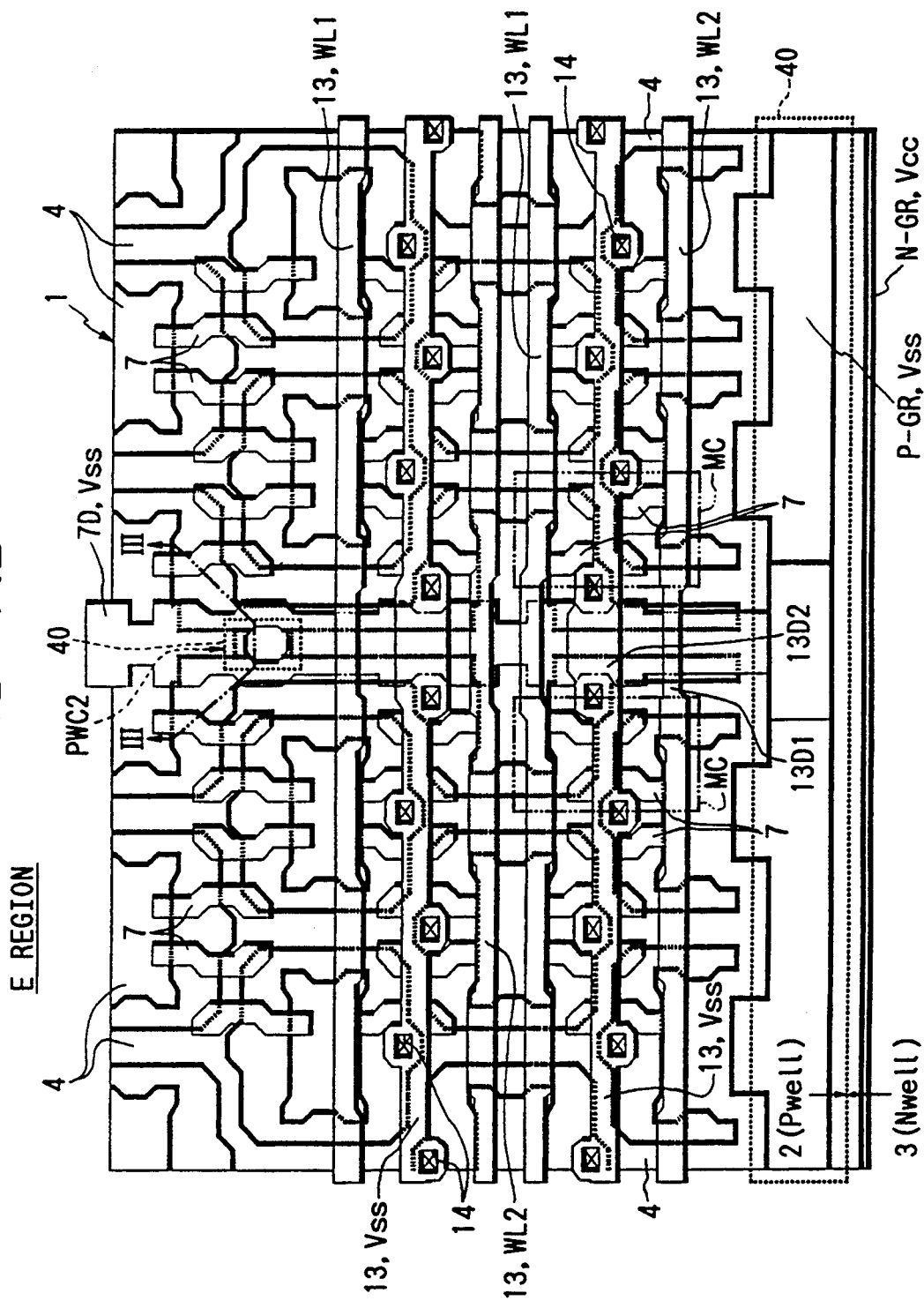

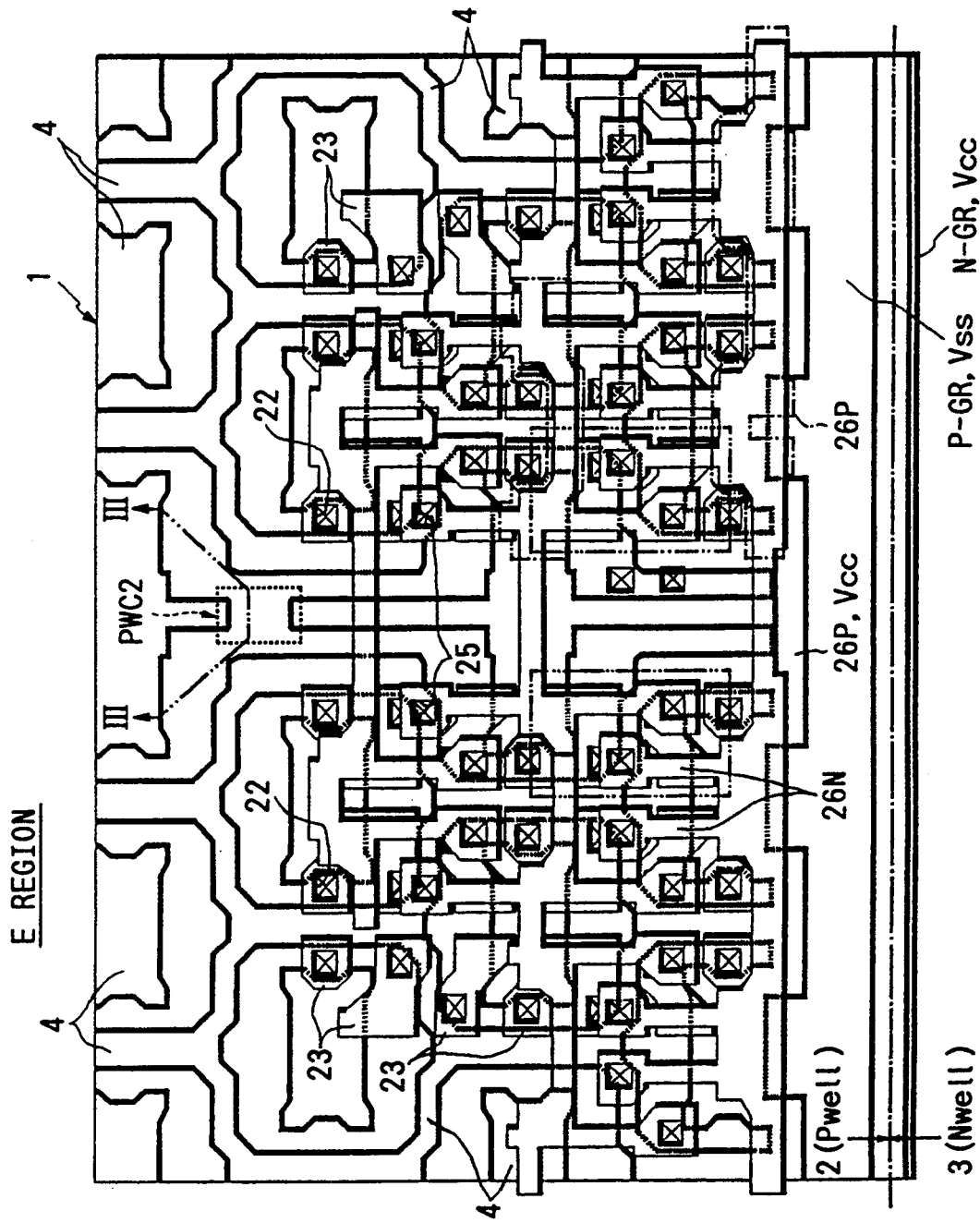

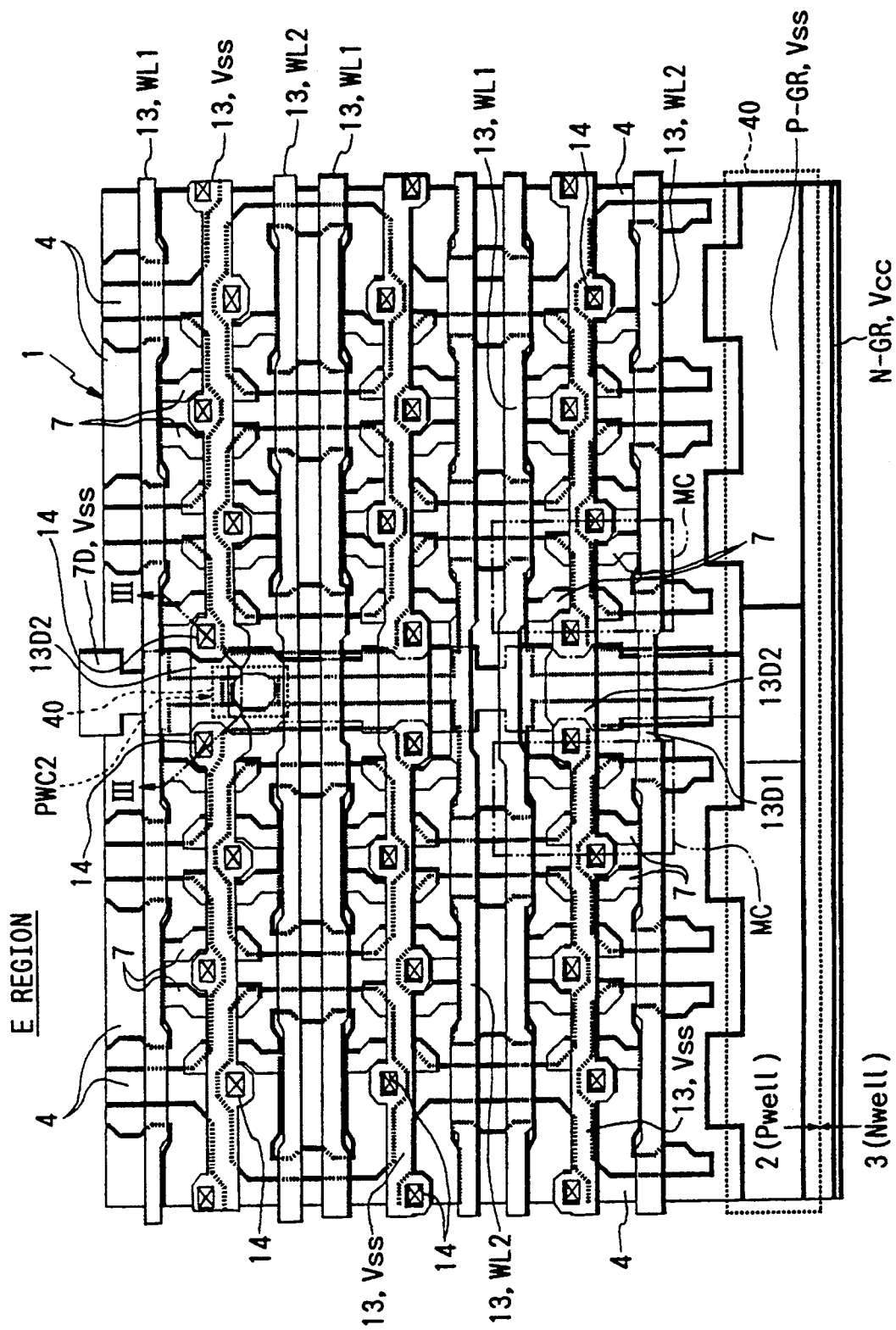

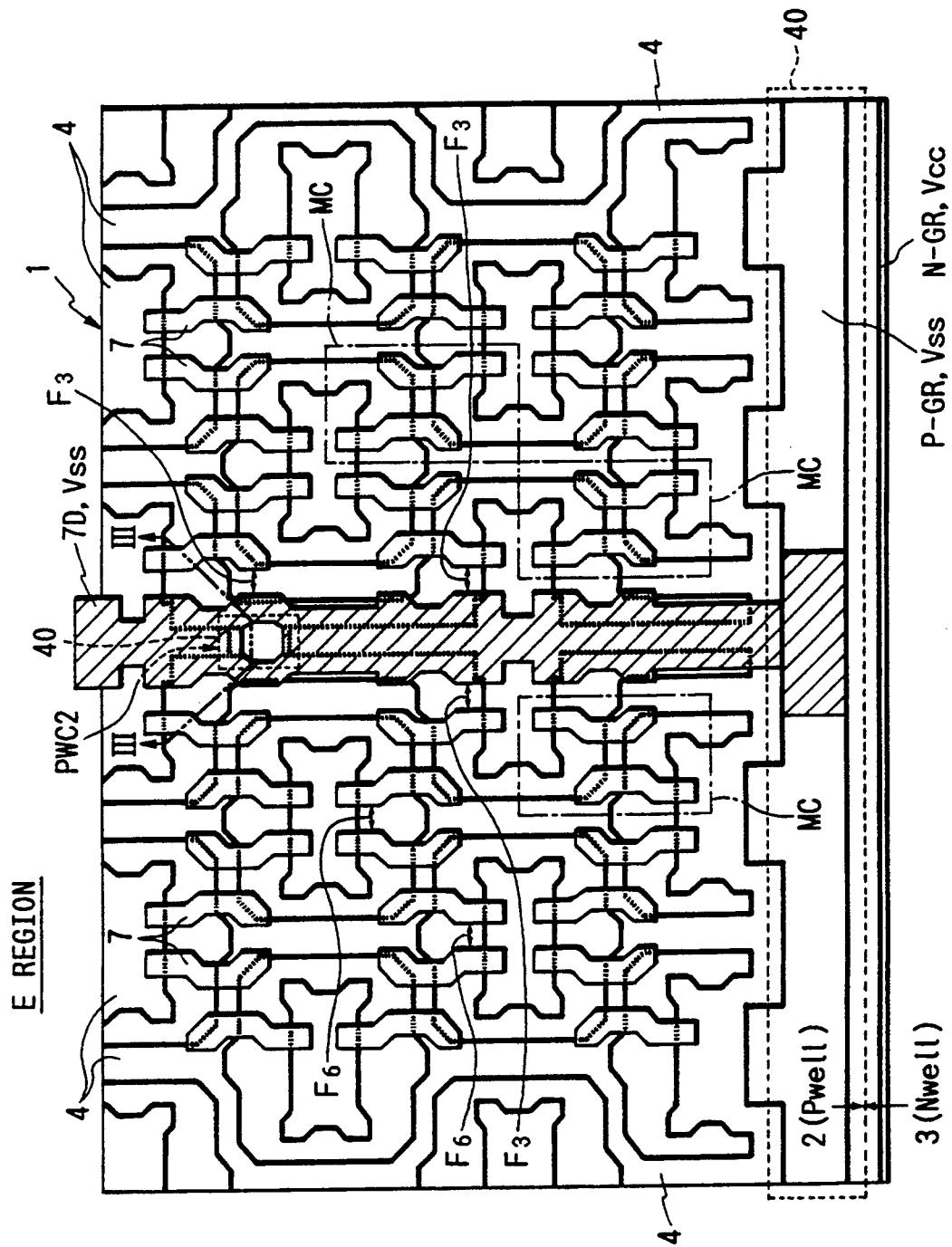

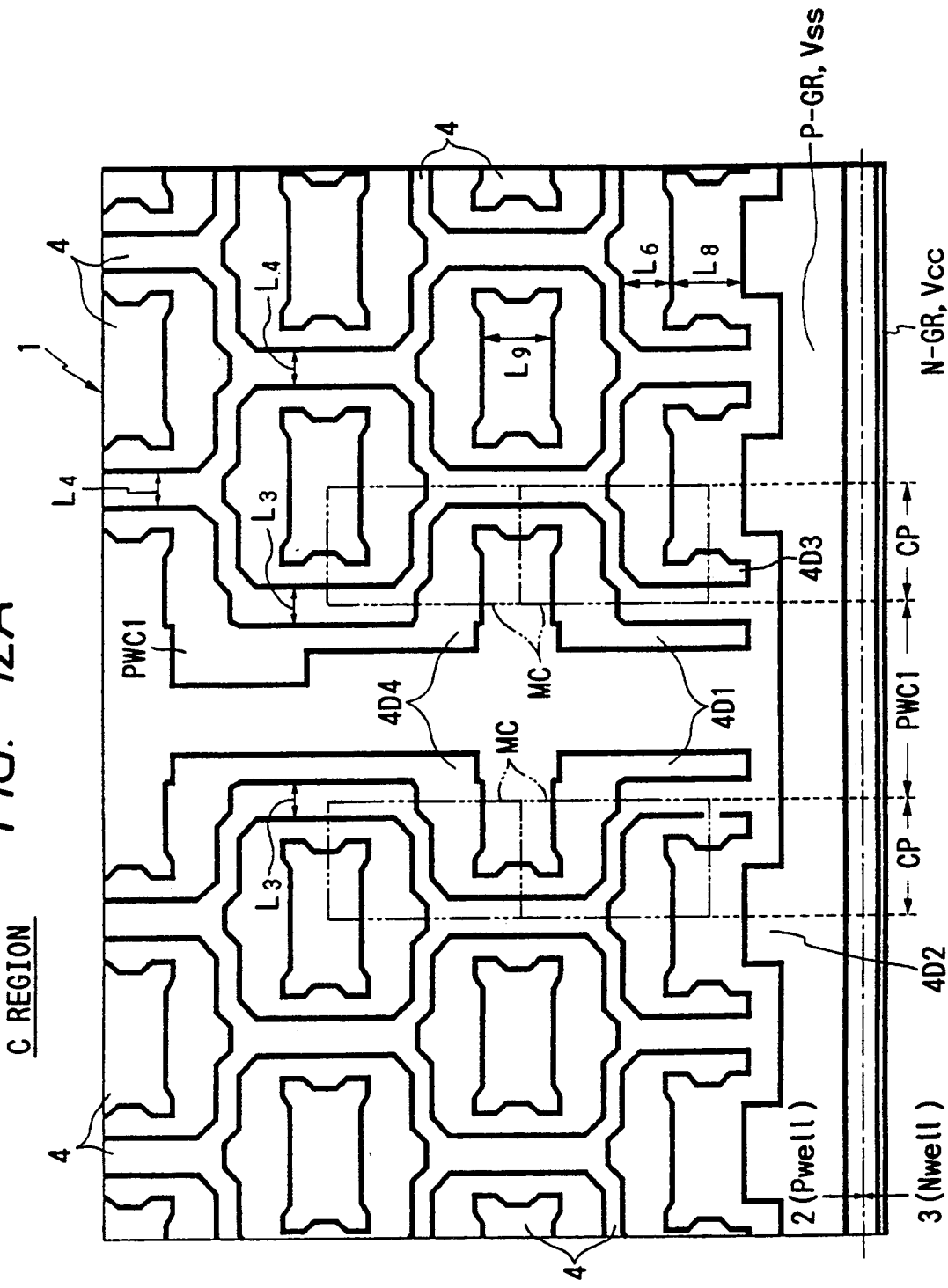

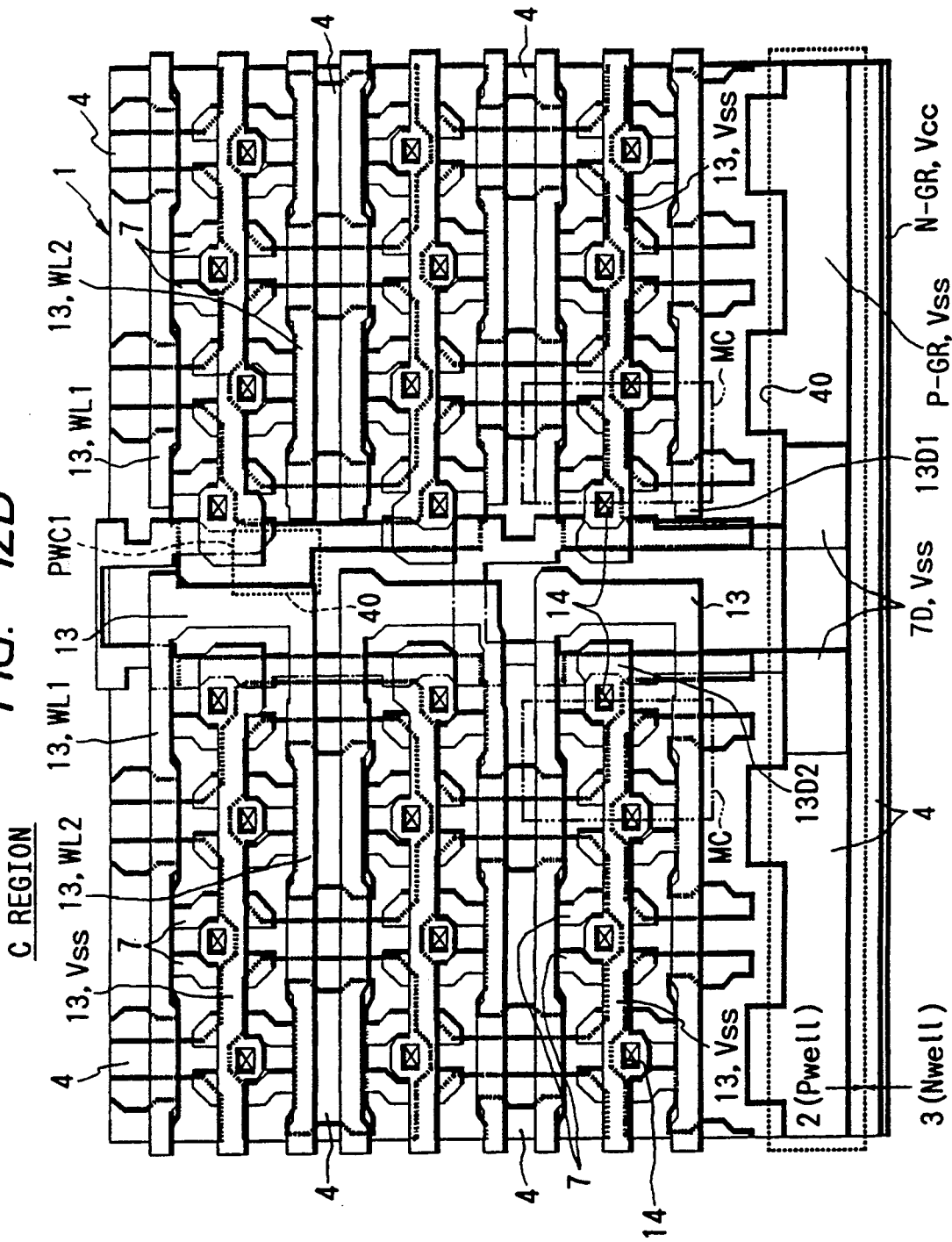

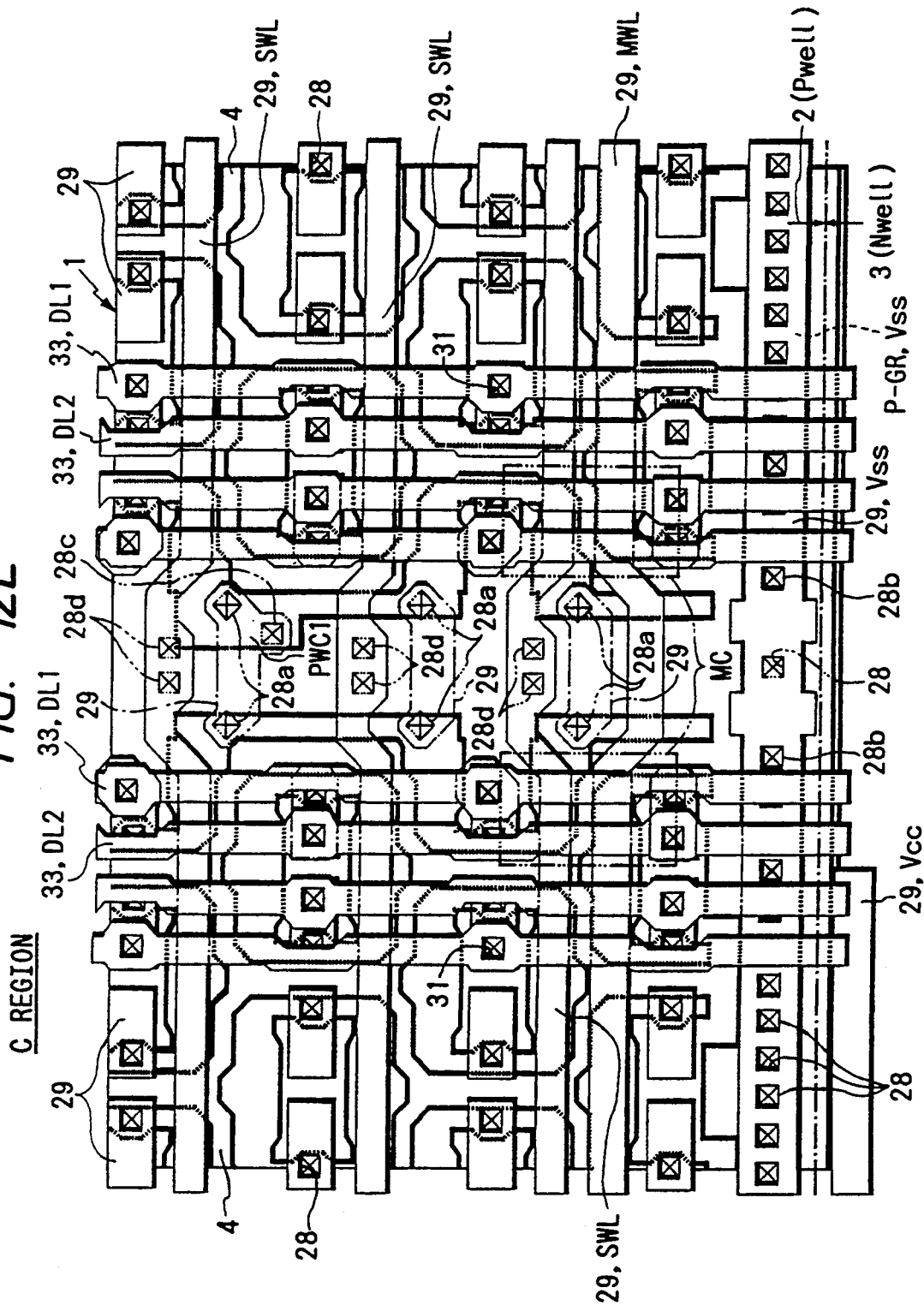

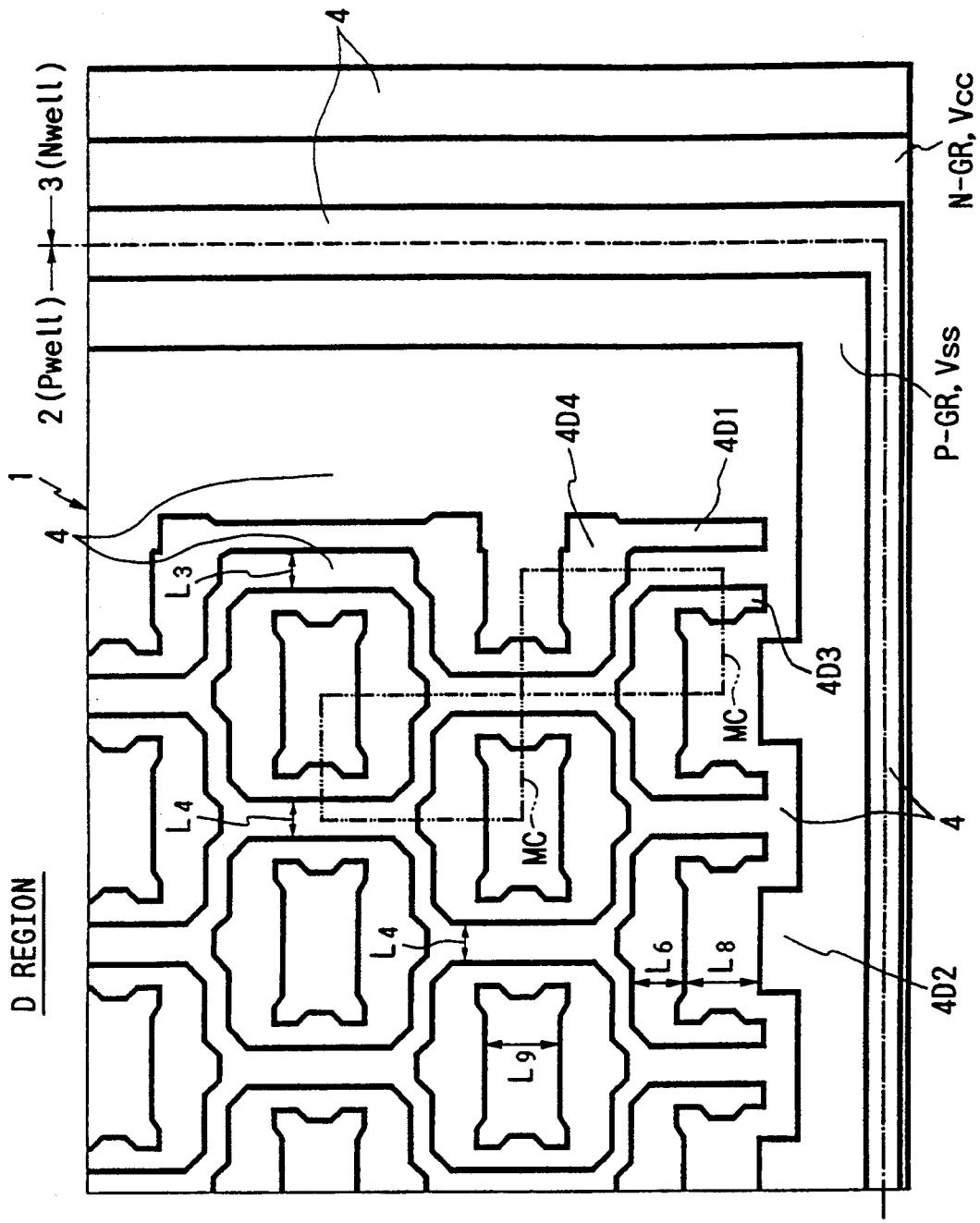

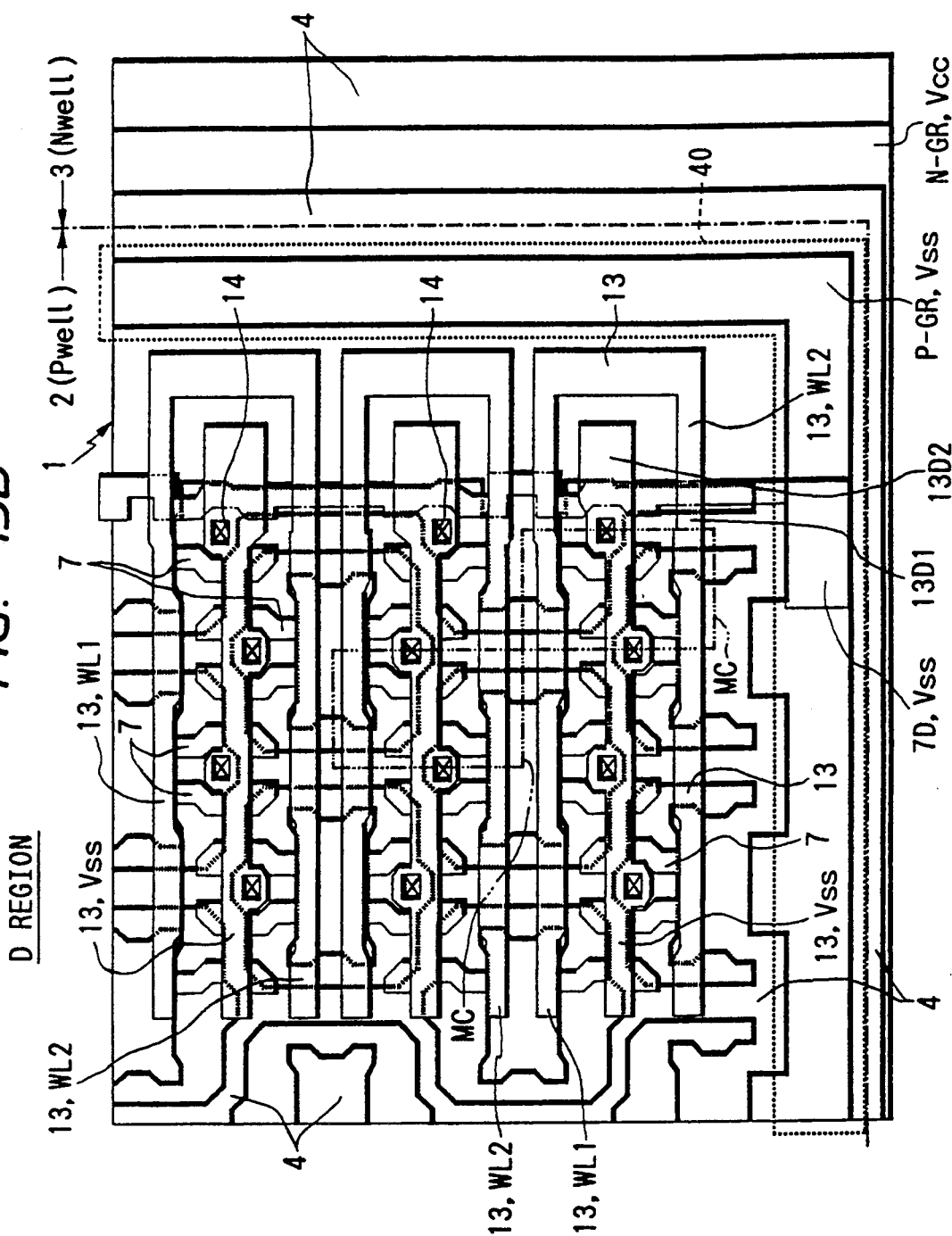

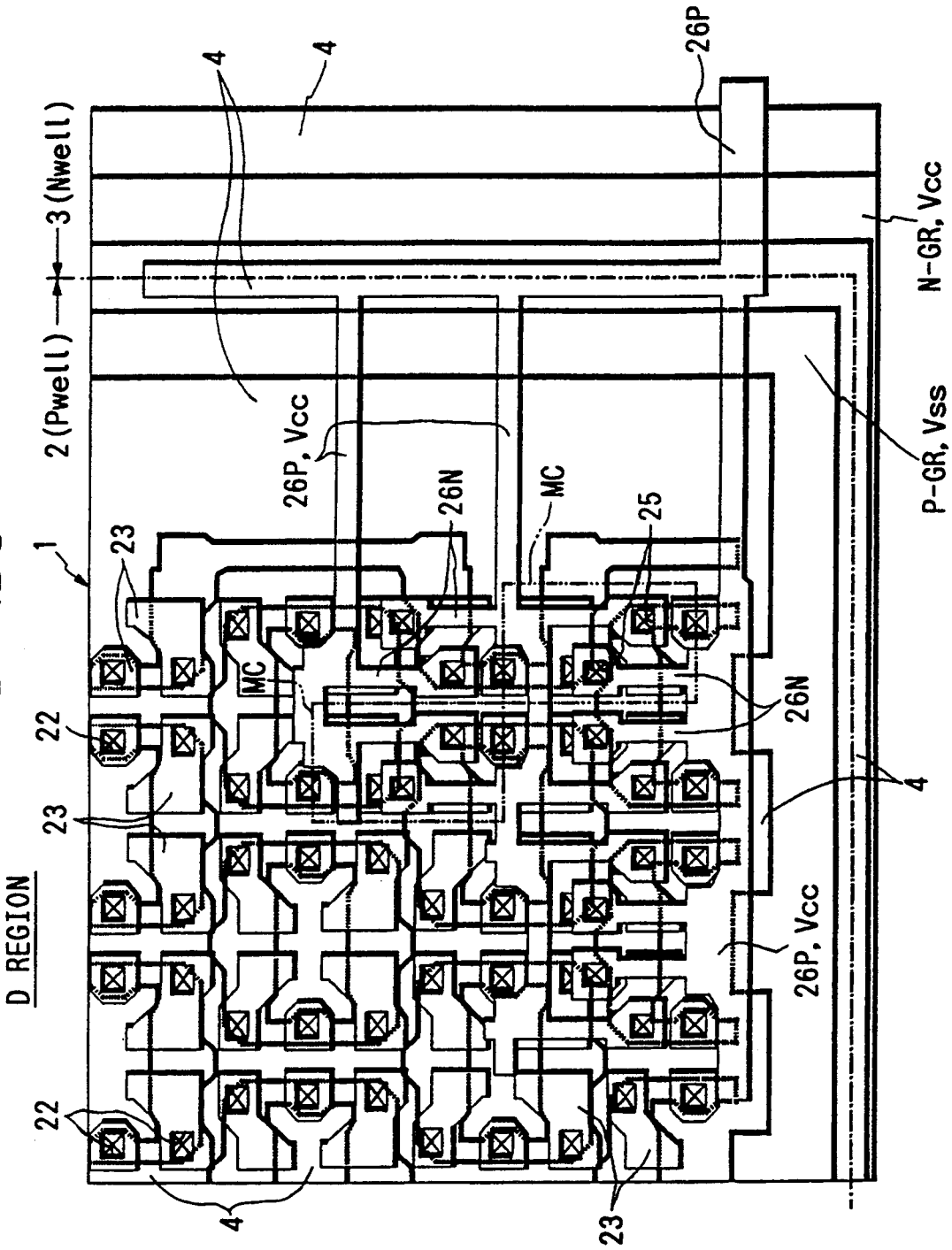

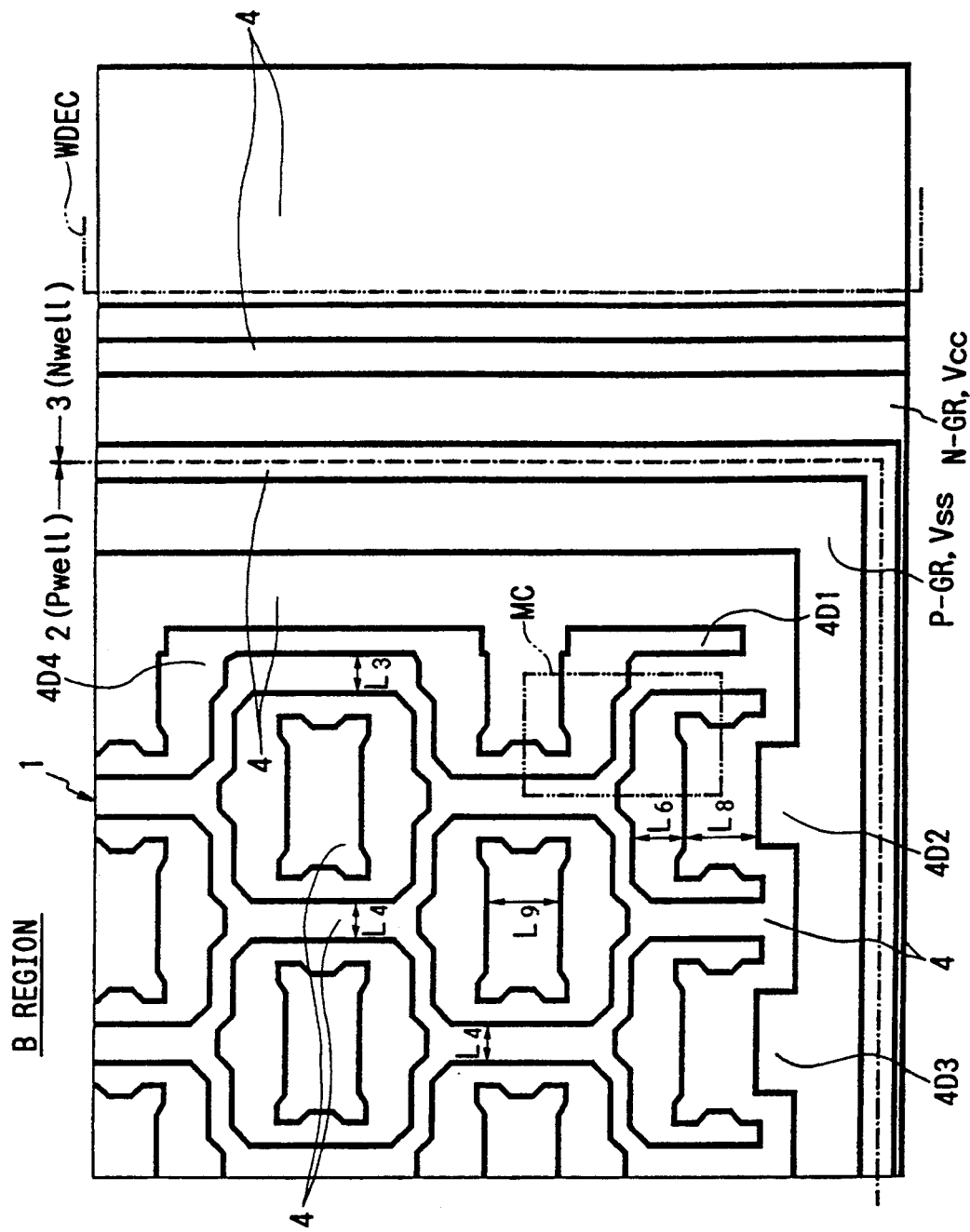

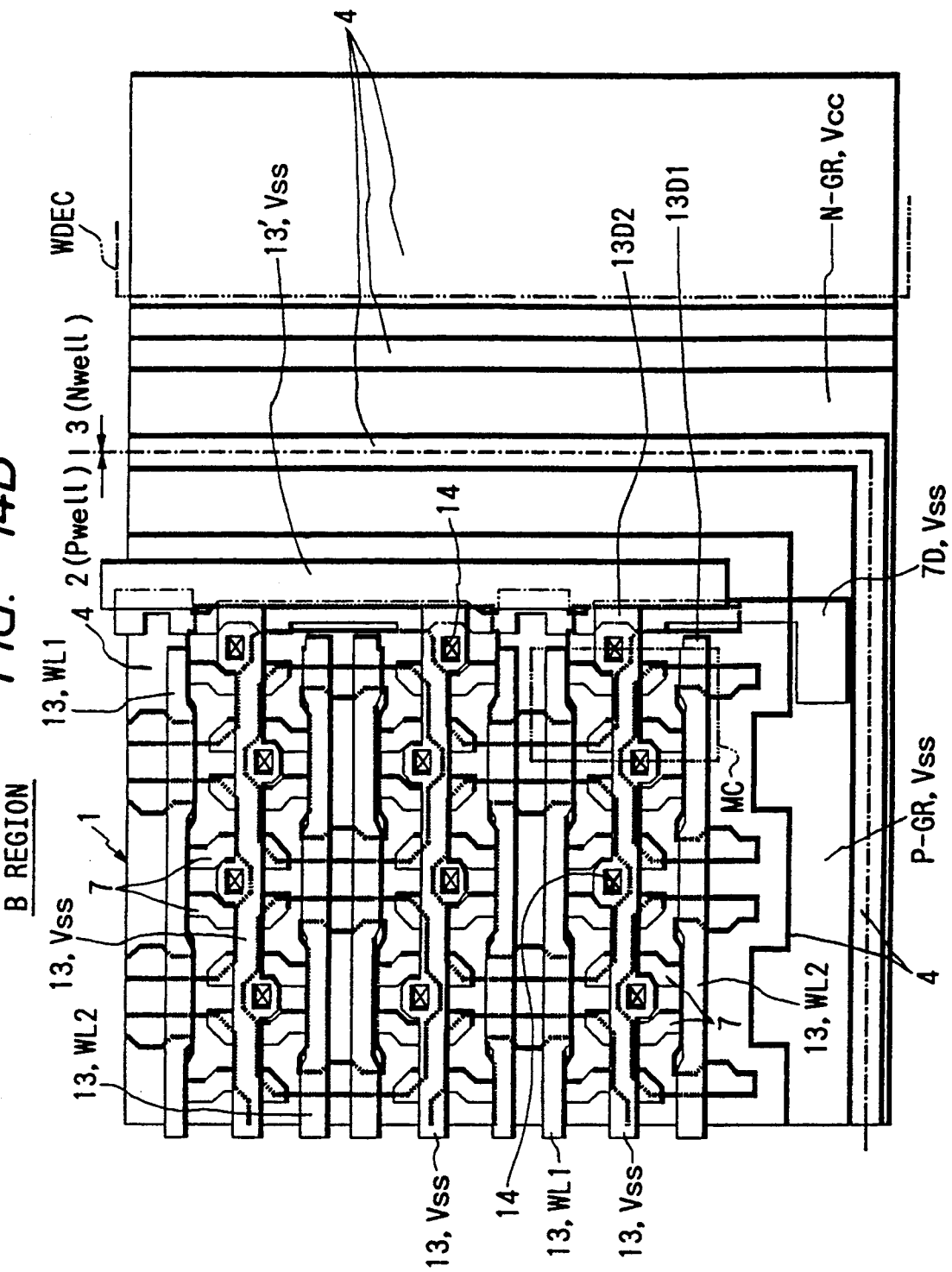

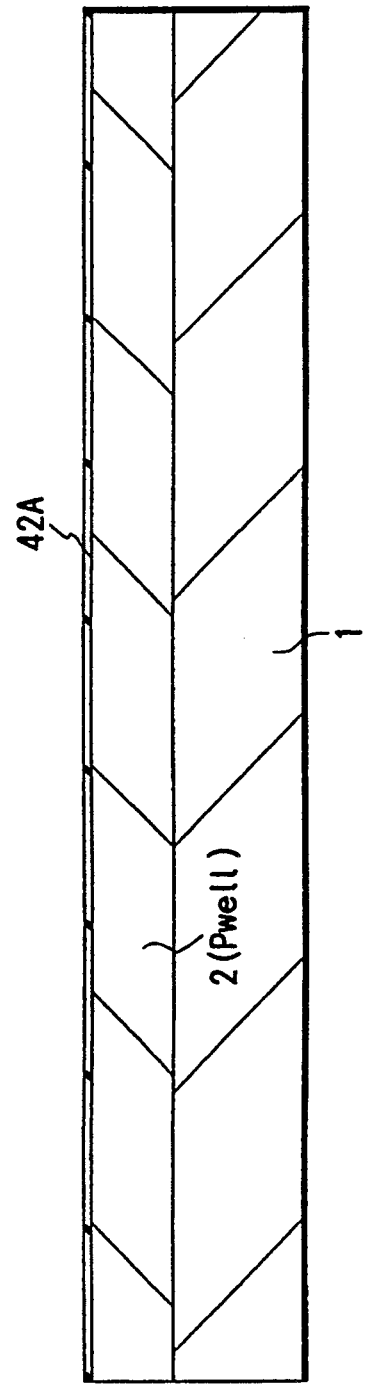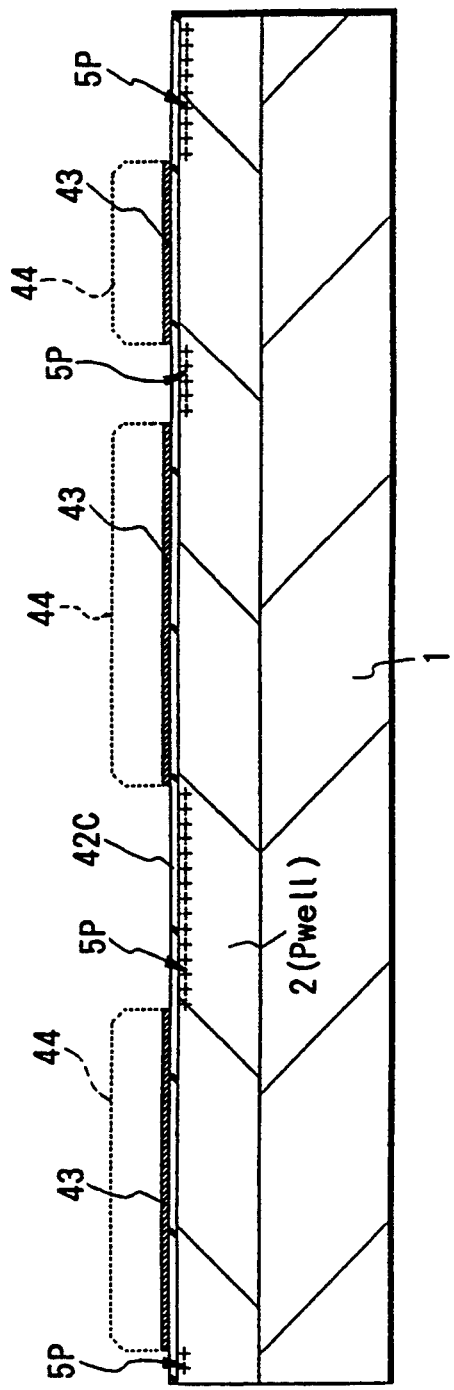

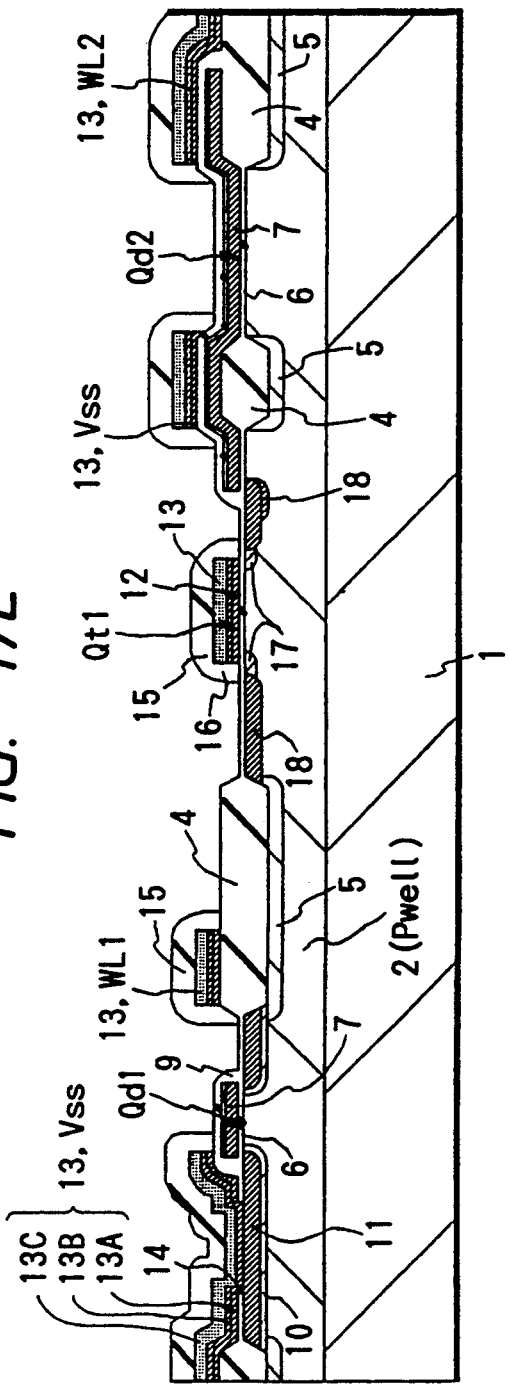
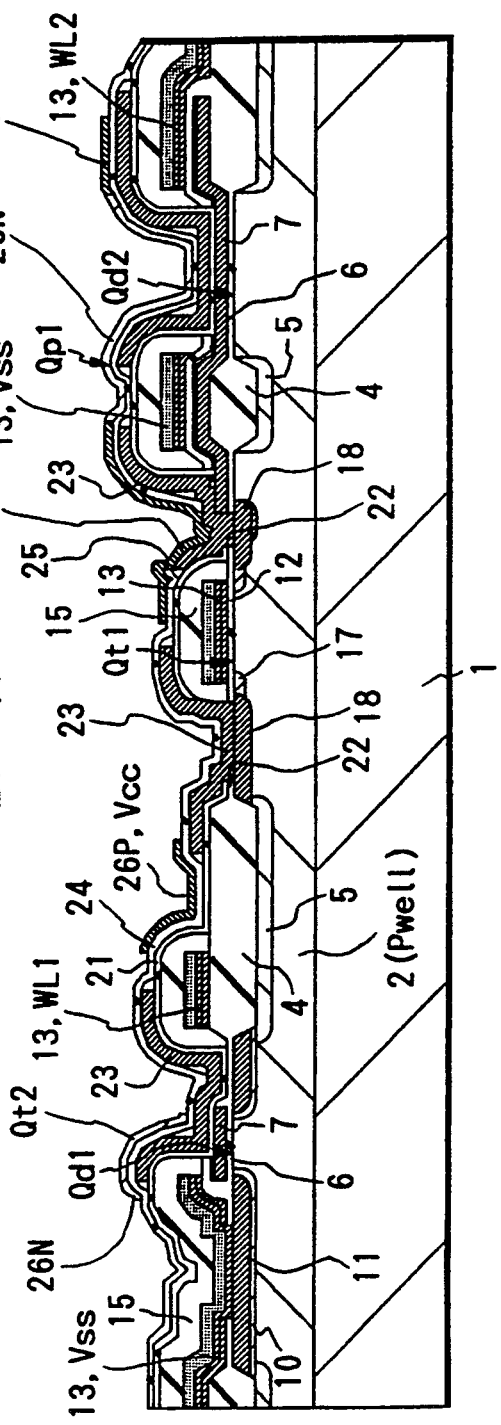

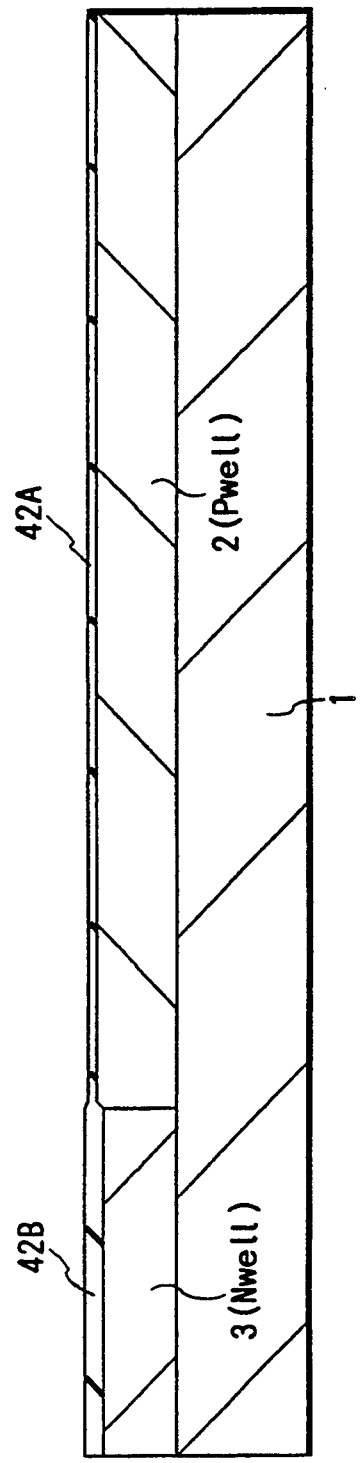
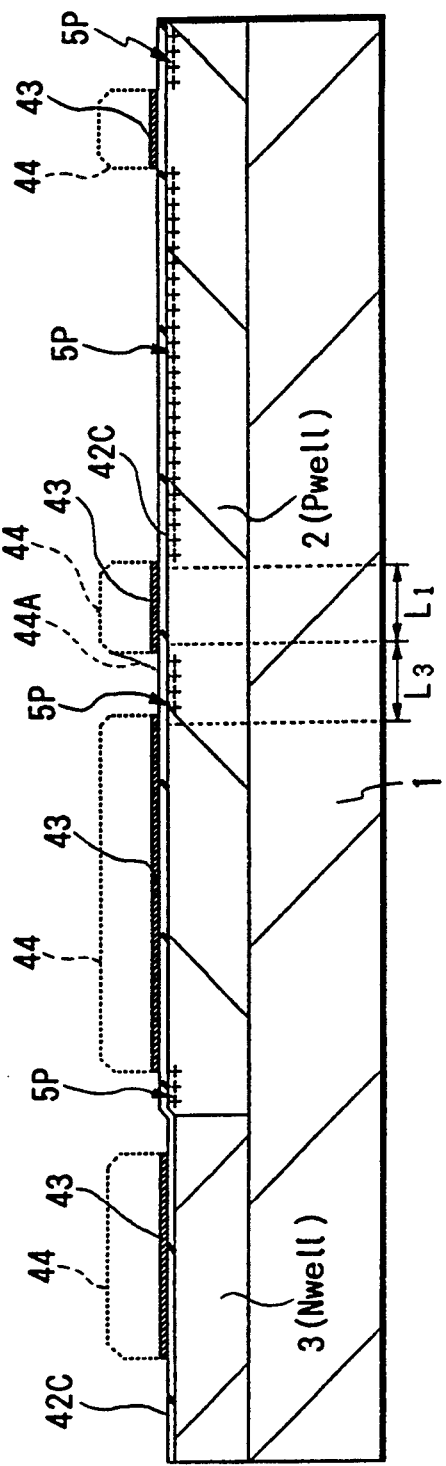

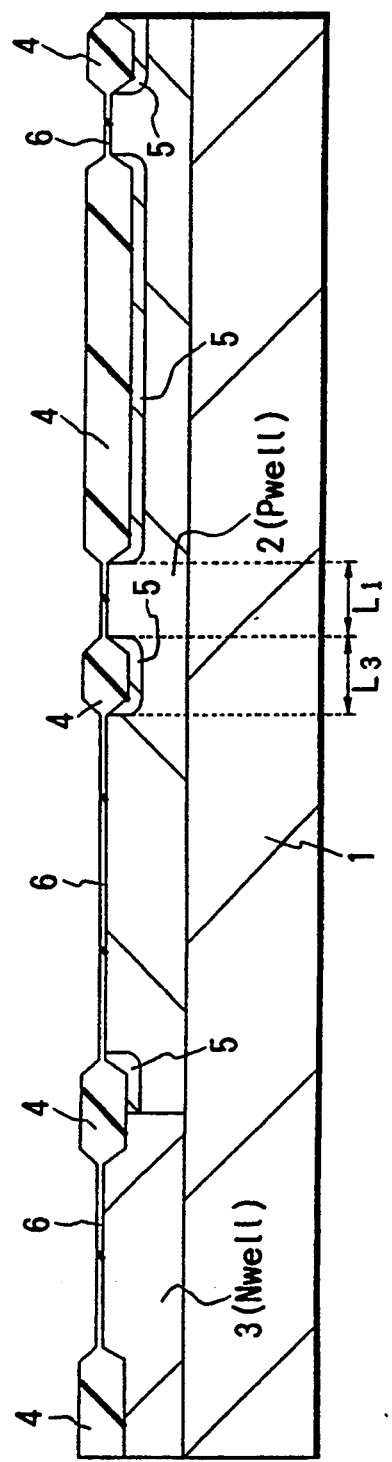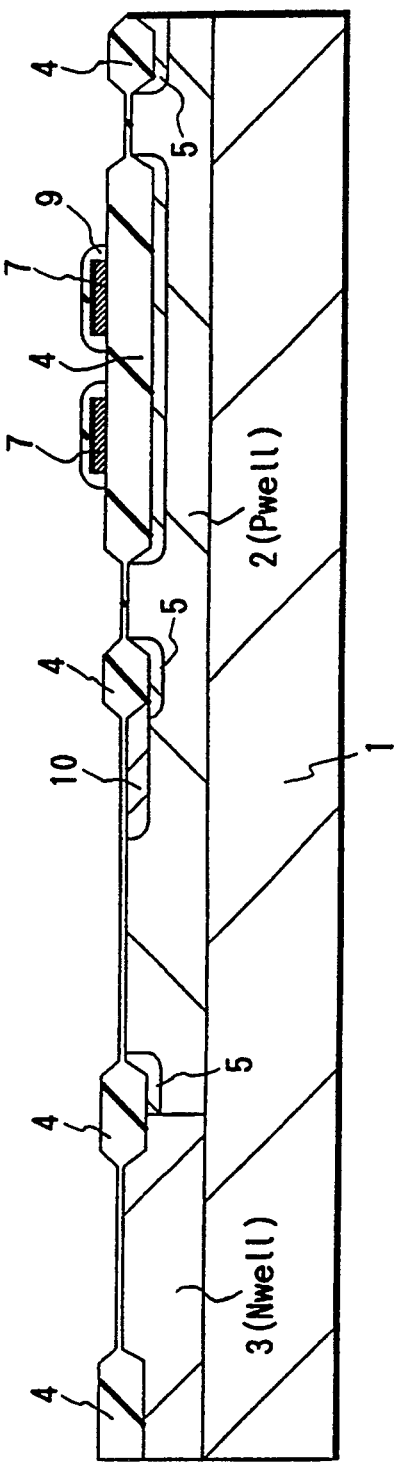

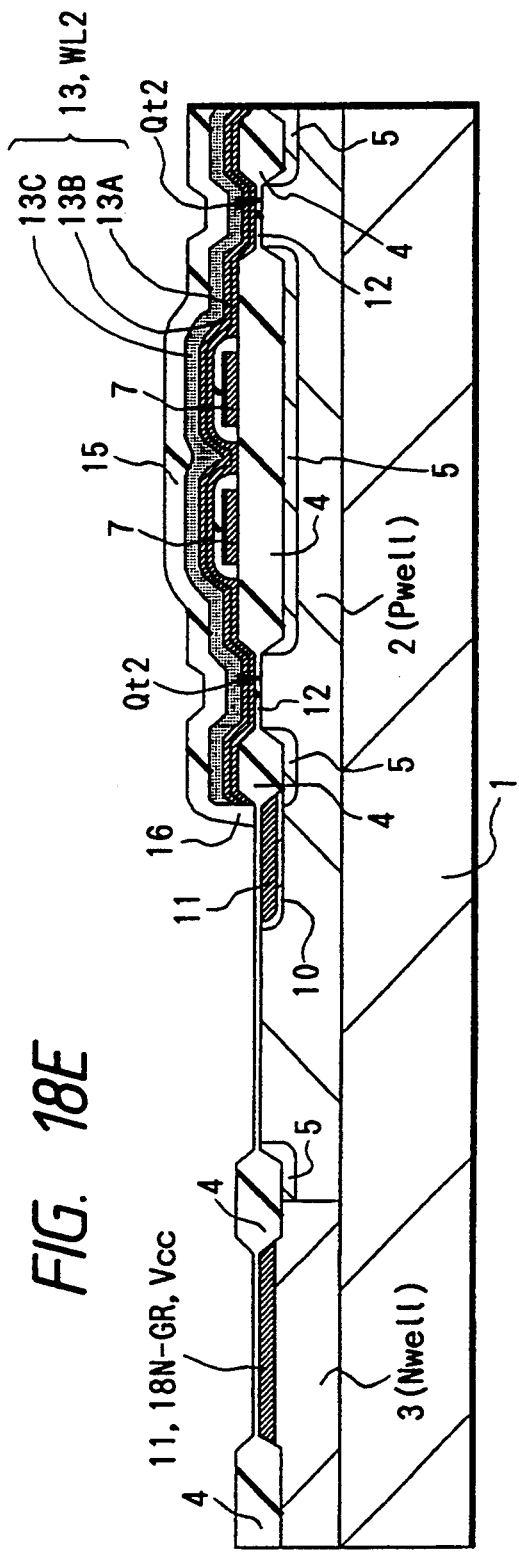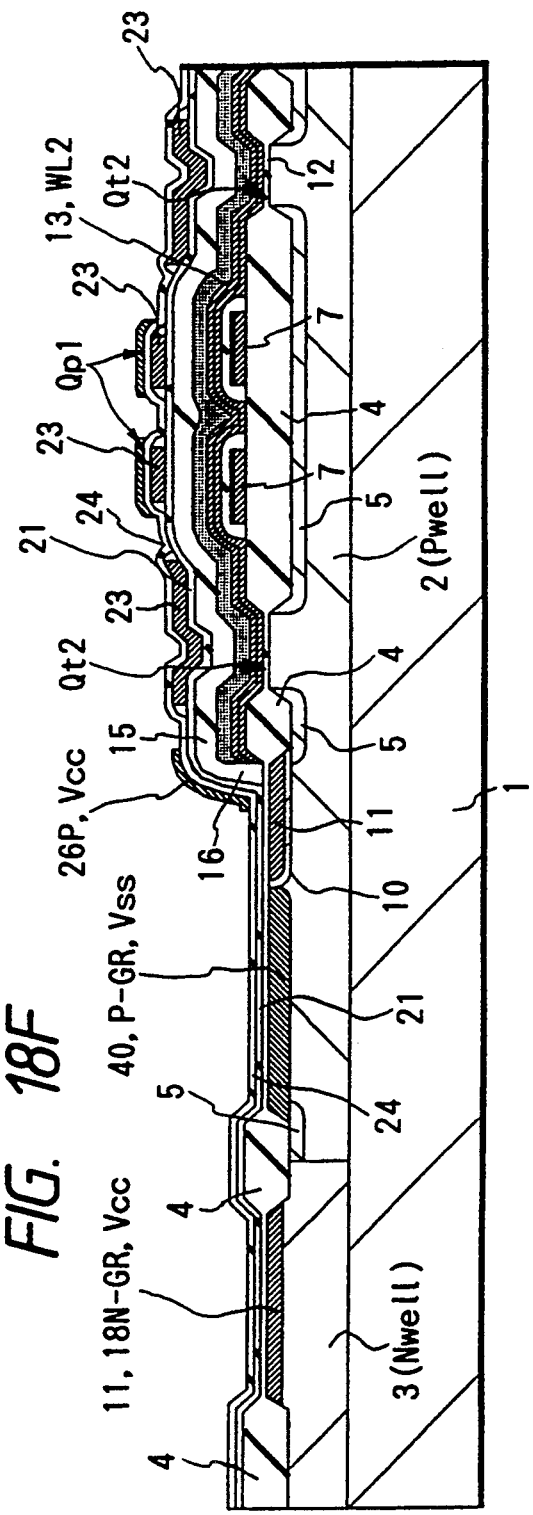

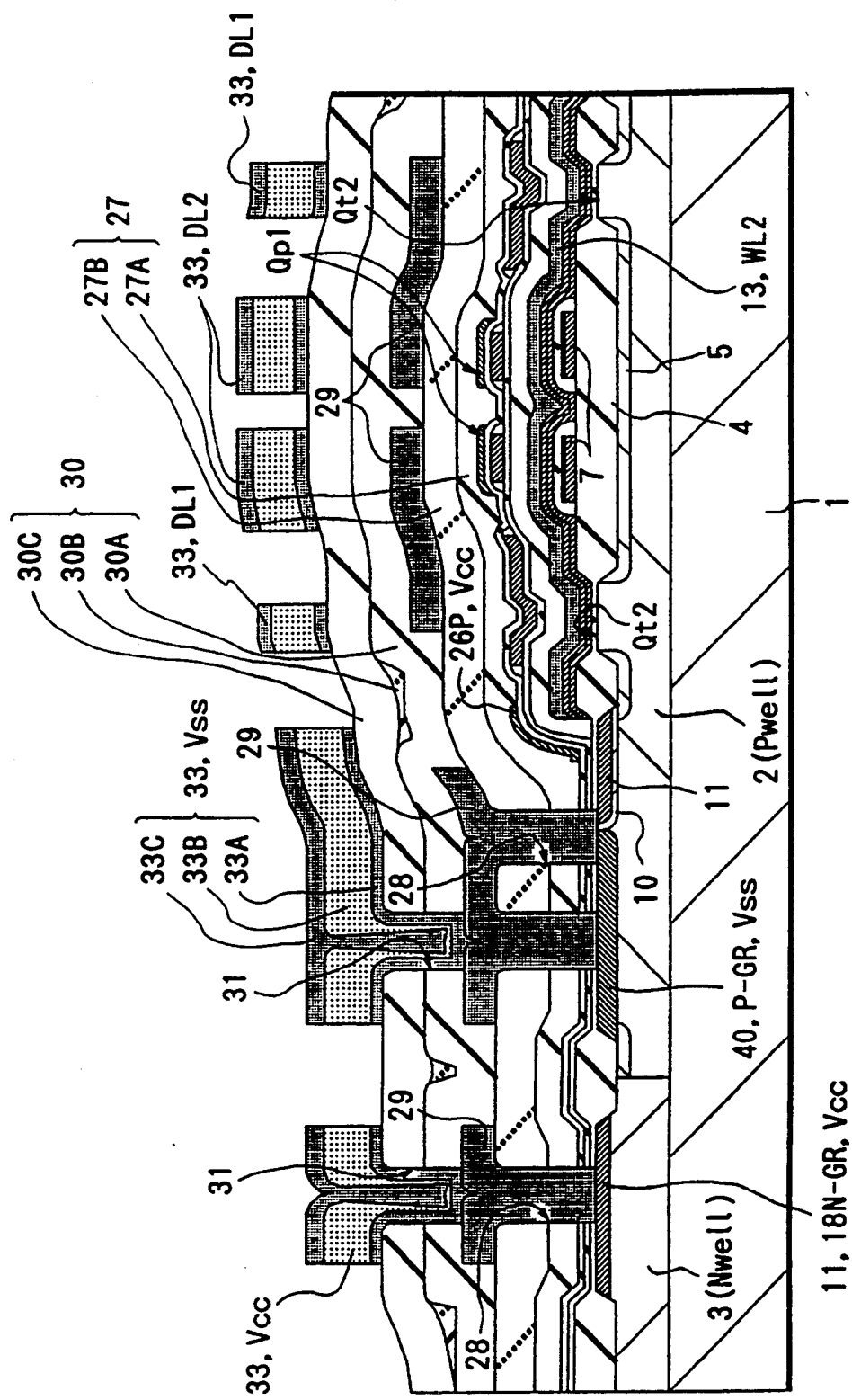

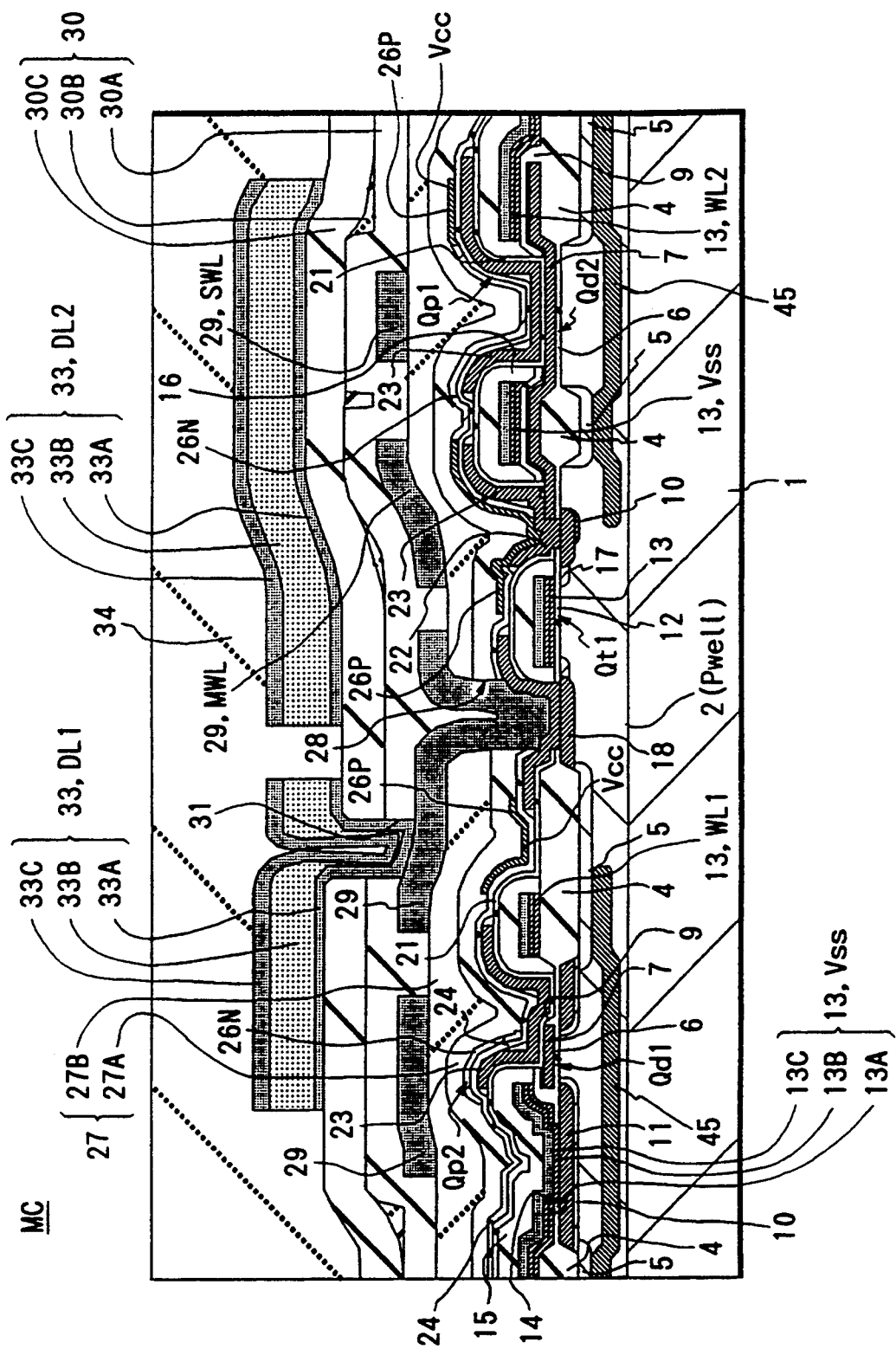

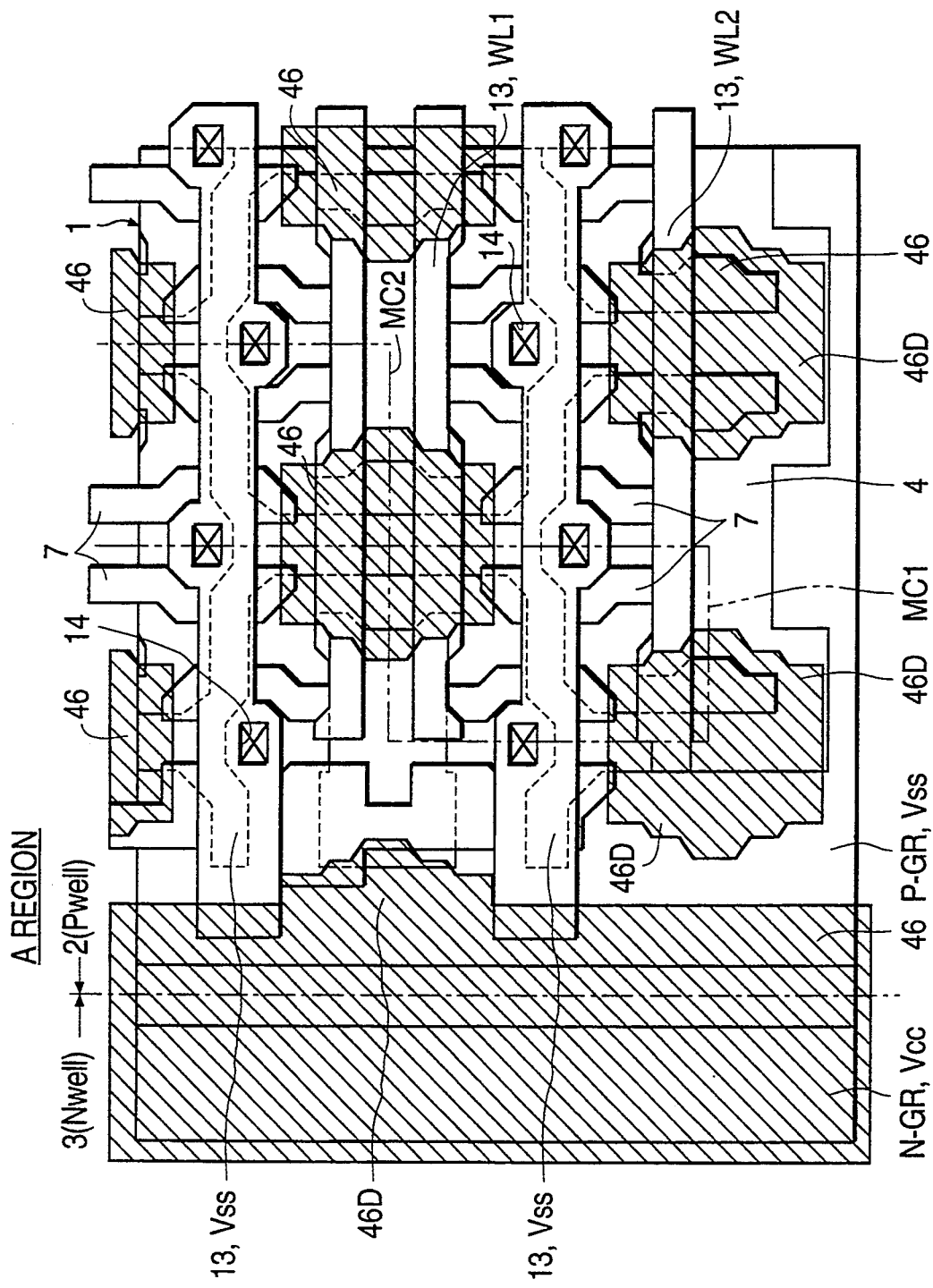

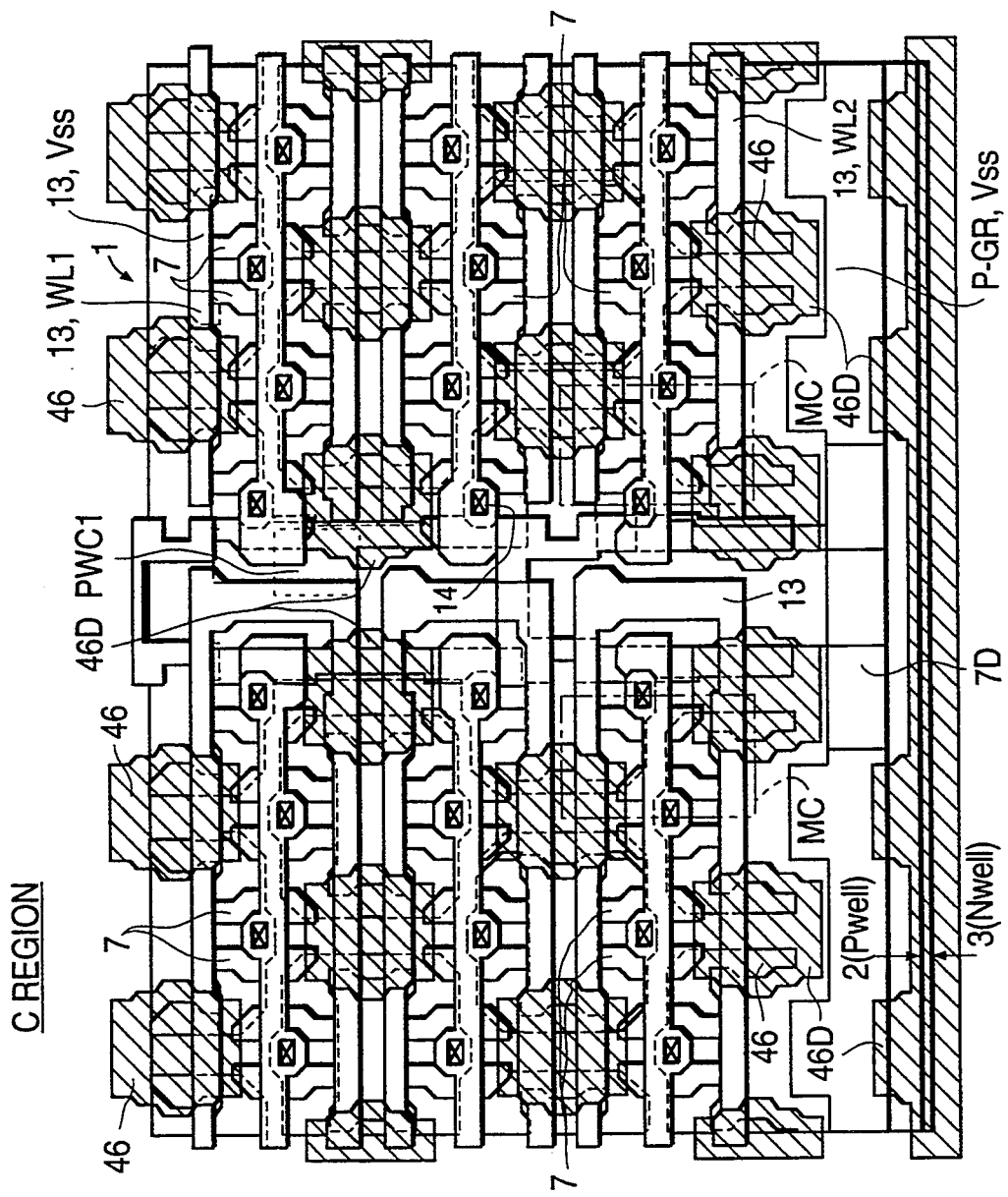

SEMICONDUCTOR INTEGRATED CIRCUIT DEVICE HAVING A COMPACT ARRANGEMENT OF SRAM CELLS

BACKGROUND OF THE INVENTION

The present invention relates to a semiconductor integrated circuit device and, more particularly, to a technology effective when applied to a semiconductor integrated circuit device equipped with a SRAM (i.e., Static Random Access Memory).

The SRAM is disclosed as a volatile semiconductor device on pp. 48 to 51 of IEDM (i.e., International Electron Devices Meeting) Technical Digest, December, 1988, for example. In a SRAM of this type, a memory cell for storing information of 1 [bit] is arranged at each of intersections between complementary data lines and word lines.

The memory cell is composed of a flip-flop circuit and two transfer MOSFETs (i.e., Metal Oxide Semiconductor Field Effect Transistors). Each transfer MOSFET has its one semiconductor region connected with the input/output terminal of the flip-flop circuit and its other semiconductor region connected with a respective one of a pair of complementary data lines. Each of the transfer MOSFETs has its gate electrode connected with a word line so that its conduction and nonconduction states are controlled by the word line. The flip-flop circuit is constructed, as an information latching portion, of two drive MOSFETs and two load MOSFETs. The drive MOSFET has its drain region connected with one semiconductor region of one transfer MOSFET and its source region connected with a reference voltage line (i.e., a source line). The gate electrode of the drive MOSFET is connected with one semiconductor region of the other transfer MOSFET. The load MOSFET has its drain region connected with one semiconductor region of one transfer MOSFET and its source region connected with a supply voltage line (i.e., a source line).

SUMMARY OF THE INVENTION

The SRAM includes a memory array having a multiplicity of memory cells arranged over the principal face of a semiconductor chip. The array of the memory cells in the memory array has a periodicity (or a regularity). The present inventors have found that the characteristics of the memory cells of the region, in which the array of the memory cells terminate midway to have its peroidicity disturbed, deteriorate unlike those memory cells located in a periodic region.

For example, the memory cells arranged at an end portion of the memory array are more liable to have their power margin decreased more than that of the memory cells arranged inside of the memory array. This is because the memory cell pattern has a repetition inside of the memory array but not at the end portion of the memory array. Thus, due to the fact that the surface tension of a photoresist applied to the semiconductor wafer at a step of lithography is different between the inside and the end portion of the memory array, the worked size of a diffusion layer at the end portion of the memory array seems to grow different from that of the internal diffusion layer so that the transistor at the end portion has its electrical characteristics degraded.

Similar discussion applies to a gate electrode which is arranged over the diffusion layer.

As a measure for eliminating such problem, there has been used a method of equalizing the shapes of the diffusion layers and the arrangements of the gate electrodes for all the memory arrays by arranging the dummy cells, not acting as the memory cells, around the memory arrays.

However, the technology of arranging the dummy cells around the memory array is accompanied by a problem that the area of the memory array increases. Especially, a memory LSI of large storage capacity has its memory array divided into multiple memory mats (MM) so as to prevent the wiring delay of the circuit due to the large capacity. If the dummy cells are arranged around each memory mat (MM), the occupation percentage of the dummy cells to the total area of the memory mat increases to reduce the degree of integration of the SRAM.

In a SRAM adopting the well structure, on the other hand, a well region arranged with the memory cells is arranged with the so-called "well contact region" for feeding a fixed power so as to suppress any electric fluctuation. In a region adjacent to that well contact region, the array of the memory cells terminates to disturb the periodicity of the array of the memory cells. This seems to cause a degradation of the electric characteristics of the memory cells in a region adjacent to the well contact region.

The present invention has the following objects: (1) To improve, in a semiconductor integrated circuit device having a SRAM, the information latching characteristics of memory cells arranged at the end portion of the memory cell array of the SRAM and the reliability in the circuit operation of the SRAM; and (2) To achieve the aforementioned object (1) and improve the degree of integration of the SRAM of the semiconductor integrated circuit device.

The foregoing and other objects and novel features of the present invention will become apparent from the following description to be made with reference to the accompanying drawings.

The representative aspect typifying the invention disclosed herein will now be briefly summarized in the following.

(1) In a semiconductor integrated circuit device having a SRAM, in which a plurality of memory cells each having two transfer MISFETs (i.e., Metal Insulator Semiconductor Field Effect Transistors), both having their gate widths regulated by an element isolating insulating film, are arrayed in a direction aligned with the direction of the gate widths, and in which the other transfer MISFET of at least such one memory cell of the plurality of arrayed memory cells as is located at the initial and final stages in the array direction and a semiconductor region arranged in a direction aligned with the gate width direction of the other transfer MISFET for feeding a reference potential to a substrate, arranged in the outer peripheral region of the plurality of arrayed memory cells, are spaced from each other through the element isolating insulating film, an active region is arranged between the element isolating insulating film for regulating the gate width of the other transfer MISFET of the memory cell at the initial or final stage in the array direction and the semiconductor region, and the width size of the element isolating insulating film, which is arranged between the other transfer MISFET and the semiconductor region; in the direction aligned with the spacing direction is made smaller than the Spacing size between the other transfer MISFET and the semiconductor region.

(2) In a semiconductor integrated circuit device having a SRAM, in which a plurality of memory cells having two transfer MISFETs both having their gate 7idths regulated by an element isolating insulating film are arrayed in a direction aligned with the direction of the gate widths, and in which the other transfer MISFET of at least such one memory cell of the plurality of arrayed memory cells as is located at the initial and final stages in the array direction and a semiconductor region arranged in a direction aligned with the gate width direction of the other transfer MISFET for feeding a reference potential to a substrate arranged in the outer peripheral region of the plurality of arrayed memory cells are spaced from each other through the element isolating insulating film, the width size of the element isolating insulating film which is located between the channel forming region of the other transfer MISFET of the memory cell at the initial or final stage in the array direction, in the direction aligned to the gate width direction, is substantially equalized to the width size of the element isolating insulating film which is located between the channel forming region of the one transfer MISFET of the memory cell at the initial or final stage in the array direction and the channel forming region of the one transfer MISFET of the memory cell at either the stage subsequent to the initial stage or the stage prior to the final stage in the array direction, in the direction aligned to the gate width direction.

(3) In a semiconductor integrated circuit device as set forth in the aforementioned means (1) or means (2), the respective gate width sizes of the one transfer MISFET of the memory cell at the initial or final stage in the array direction and the other transfer MISFET are substantially equalized.

(4) In a semiconductor integrated circuit device as set forth in the aforementioned means (1) to means (3), either the width size of the element isolating insulating film regulating the gate width of the other transfer MISFET of the memory cell at the initial or final stage in any array direction or the gate width size of the other transfer MISFET and the width size of the element isolating insulating film regulating the gate width of the other transfer MISFET of the memory cell at either the stage subsequent to the initial stage or the stage prior to the final stage in the array direction or the gate width size of the other transfer MISFET are substantially equalized to each other.

(5) In a semiconductor integrated circuit device as set forth in any of the aforementioned means (1) to means (4), the semiconductor region for feeding the fixed potential to the substrate is either a guard ring enclosing the plurality of arrayed memory cells or a substrate connecting region (i.e., a substrate contact region or a well contact region) arranged around the plurality of arrayed memory cells at a predetermined spacing along either the array direction or a direction intersecting the array direction.

(6) In a semiconductor integrated circuit device having a SRAM, in which a plurality of memory cells having two drive MISFETs both having their gate widths regulated by an element isolating insulating film are arrayed in a direction aligned with the direction of the gate widths, and in which the other drive MISFET of at least such one memory cell of the plurality of arrayed memory cells as is located at the initial and final stages in the array direction and a semiconductor region arranged in a direction aligned with the gate width direction of the other drive MISFET for feeding a reference potential to a substrate arranged in the outer peripheral region of the plurality of arrayed memory cells are spaced from each other through the element isolating insulating film, an active region is arranged between the element isolating insulating film for regulating the gate width of the other drive MISFET of the memory cell at the initial or final stage in the array direction and the semiconductor region, and the width size of the element isolating insulating film, which is arranged between the other drive MISFET and the semiconductor region, in the direction aligned with the spacing direction is made smaller than the spacing size between the other drive MISFET and the semiconductor region.

(7) In a semiconductor integrated circuit device having a SRAM, in which a plurality of memory cells having two drive MISFETs both having their gate widths regulated by an element isolating insulating film are arrayed in a direction aligned with the direction of the gate widths, and in which the other drive MISFET of at least such one memory cell of the plurality of arrayed memory cells as is located at the initial and final stages in the array direction and a semiconductor region arranged in a direction aligned with the gate width direction of the other drive MISFET for feeding a reference potential to a substrate arranged in the outer peripheral region of the plurality of arrayed memory cells are spaced from each other through the element isolating insulating film, the width size of the element isolating insulating film which is located between the channel forming region of the other drive MISFET of the memory cell at the initial or final stage in the array direction, in the direction aligned to the gate width direction, is substantially equalized to the width size of the element isolating insulating film which is located between the channel forming region of the one drive MISFET of the memory cell at the initial or final stage in the array direction and the channel forming region of the one drive MISFET of the memory cell at either the stage subsequent to the initial stage or the stage prior to the final stage in the array direction, in the direction aligned to the gate width direction.

(8) In a semiconductor integrated circuit device as set forth in the aforementioned means (6) or means (7), the respective gate width sizes of the one drive MISFET of the memory cell at the initial or final stage in the array direction and the other drive MISFET are substantially equalized.

(9) In a semiconductor integrated circuit device as set forth in the aforementioned means (6) to means (8), either the width size of the element isolating insulating film regulating the gate width of the other drive MISFET of the memory cell at the initial or final stage in any array direction or the gate width size of the other drive MISFET and the width size of the element isolating insulating film regulating the gate width of the other drive MISFET of the memory cell at either the stage subsequent to the initial stage or the stage prior to the final stage in the array direction or the gate width size of the other drive MISFET are substantially equalized to each other.

(10) In a semiconductor integrated circuit device as set forth in any of the aforementioned means (6) to means (9), the semiconductor region for feeding the reference potential to the substrate is a guard ring enclosing the plurality of arrayed memory cells.

(11) In a semiconductor integrated circuit device having a SRAM, in which a plurality of memory cells having two transfer MISFETs having both their gate widths regulated by an element isolating insulating film are arrayed in a direction aligned with the gate length direction and in which a semiconductor region for feeding a reference potential to a substrate is arranged through the element isolating insulating film at one side along the plurality of arrayed memory cells in a direction aligned with the gate length direction, either an active region having a shape identical or approximate to that of an active region, in which the other transfer MISFET of the plurality of memory cells arrayed in a direction aligned with the gate length direction, or a portion of the active region is arranged between the element isolating insulating film regulating the gate width of the other transfer MISFET and the semiconductor region arranged along one side of the plurality of arrayed memory cells.

(12) In a semiconductor integrated circuit device having a SRAM, in which a plurality of memory cells having two transfer MISFETs having both their shapes around the source regions or drain regions defined by an element isolating insulating film are arrayed in a direction aligned with the gate width direction and in which a semiconductor region for feeding a reference potential to a substrate is arranged through the element isolating insulating film at one side along the plurality of individual memory cells arrayed in a direction aligned with the gate width direction, either an active region having a shape identical or approximate to that of an active region, in which the other transfer MISFET is arranged, or a portion of the active region is arranged between the source region or drain region of the other transfer MISFET of each of the plurality of memory cells arrayed in the direction aligned with the gate width direction and the semiconductor region arranged along at one side of the plurality of arrayed memory cells.

(13) In a semiconductor integrated circuit device having a SRAM, in which a plurality of memory cells having two drive MISFETs having both their gate widths regulated by an element isolating insulating film are arrayed in a direction aligned with the gate length direction and in which a semiconductor region for feeding a reference potential to a substrate is arranged through the element isolating insulating film at one side along the plurality of arrayed memory cells in a direction aligned with the gate length direction, either an active region having a shape identical or approximate to that of an active region, in which the other drive MISFET of the plurality of memory cells arrayed in a direction aligned with the gate length direction, or a portion (i.e., a dummy active region) of the active region is arranged between the element isolating insulating film regulating the gate width of the other drive MISFET and the semiconductor region arranged along one side of the plurality of arrayed memory cells.

(14) In a semiconductor integrated circuit device having an SRAM, in which a plurality of memory cells having two drive MISFETs having both their shapes around the source regions defined by an element isolating insulating film are arrayed in a direction aligned with the gate width direction and in which a semiconductor region for feeding a reference potential to a substrate is arranged through the element isolating insulating film at one side along the plurality of individual memory cells arrayed in a direction aligned with the gate width direction, either an active region having a shape identical or approximate to that of an active region, in which the one drive MISFET is arranged, or a portion of the active region is arranged between the source region of the other drive MISFET of each of the plurality of memory cells arrayed in the direction aligned with the gate width direction and the semiconductor region arranged along at one side of the plurality of arrayed memory cells.

(15) In a semiconductor integrated circuit device having a SRAM, in which a plurality of memory cells having their other drive MISFET constructed to have a planar shape of central symmetry with respect to that of their one drive MISFET and their one drive MISFET and other drive MISFET substantially in parallel gate length directions are arrayed such that the two drive MISFETs of the memory cells are alternately arranged for each memory cell in a direction aligned with the gate length direction, a dummy gate electrode layer formed of a layer identical to the individual gate electrodes of the one and other drive MISFETs is so arranged in the outer peripheral region in the direction aligned with the array direction of memory cell at the initial or final stage of the array direction of the plurality of arrayed memory cells as to face at a predetermined spacing one side of the outer peripheral region of the gate electrode of at least one drive MISFET of the initial or final stage in the array direction, and the spacing size is set substantially equal to the spacing size between the gate electrode of at least the other drive MISFET of the memory cell at the initial or final state in the array direction and the gate electrode of at least the other drive MISFET of the memory cell at either the step subsequent to the initial stage or the stage prior to the final stage in the array direction.

(16) In a semiconductor integrated circuit device having a SRAM as set forth in the aforementioned means (15), the dummy gate electrode layer is fed with a reference potential.

(17) In a semiconductor integrated circuit device having a SRAM, in which a plurality of memory cells having their other transfer MISFET constructed to have a planar shape of central symmetry with respect to that of their one transfer MISFET and their one transfer MISFET and other transfer MISFET substantially in parallel gate length directions are arrayed such that the two transfer MISFETs of the memory cells are alternately arranged for each memory cell in a direction aligned with the gate length direction, a dummy gate electrode layer formed of a layer identical to the individual gate electrodes of the one and other transfer MISFETs is so arranged in the outer peripheral region in the direction aligned with the array direction of memory cell at the initial or final stage of the array direction of the plurality of arrayed memory cells as to face at a predetermined spacing one side of the outer peripheral region of the gate electrode of at least one transfer MISFET of the initial or final stage in the array direction, and the spacing size is set substantially equal to the spacing size between the gate electrode of at least the one transfer MISFET of the memory cell at the initial or final stage in the array direction and the gate electrode of at least the one transfer MISFET of the memory cell at either the step subsequent to the initial stage or the stage prior to the final stage in the array direction.

(18) In a semiconductor integrated circuit device having a SRAM as set forth in the aforementioned means (1) to means (14), the memory cells are constructed: either such that the planar shape of the other transfer MISFET is formed in central symmetry with respect to the planar shape of the one transfer MISFET, i.e. the pair of transfer MISFETs are symmetrically disposed about a central location within each memory cell, and such that the gate length directions of the one transfer MISFET and the other transfer MISFET are substantially in parallel with each other; or such that the planar shape of the other drive MISFET is formed in central symmetry with respect to the planar shape of the one drive MISFET, i.e. the pair of drive MISFETs are symmetrically disposed about a central location within each memory cell, and such that the gate length directions of the one drive MISFET and the other drive MISFET are substantially in parallel with each other.

According to the aforementioned means (1), the following effects can be achieved:

(A) The width size of the element isolating insulating film (i.e., the end portion) between the one transfer MISFET of the memory cell at the initial or final stage in the array direction and the semiconductor region for feeding the fixed potential to the substrate is reduced to an extent with the arranging of the active region so that the width size of the element isolating insulating film (i.e., the end portion) can be equalized or approximated to the width size of the element isolating insulating film (i.e., the internal portion) between the other transfer MISFET at the initial or final stage in the array direction and the transfer MISFET of the memory cell at either the stage subsequent to the initial stage or the stage prior to the final stage in the array direction. As a result, the periodicities of the respective width sizes of the element isolating insulating film regulating the gate width of the one transfer MISFET at the initial or final stage in the array direction and the element isolating insulating film regulating the gate width of the other transfer MISFET can be maintained to equalize the respective gate width sizes of the two transfer MISFETs of the memory cell at the initial or final stage in the array direction; and (B) On the basis of the aforementioned effect (A), moreover, the $\beta$ ratio, which is given by the one transfer MISFET of the memory cell at the initial or final stage in the array direction and the drive MISFET connected with the former, and the $\beta$ ratio, which is given by the other transfer MISFET and the drive MISFET connected with the former, can be individually equalized to improve the information latching characteristics of the memory cell so that the reliability in the circuit operation of the SRAM can be improved.

According to the aforementioned means (2), the following effects can be achieved:

(A) The width size of the element isolating insulating film (i.e., the end portion) between the other transfer MISFET of the memory cell at the initial or final stage in the array direction and the semiconductor region can be substantially equalized to the width size of the element isolating insulating film (i.e., the internal portion) between the one transfer MISFET of the memory cell at the initial or final stage in the array direction and the one transfer MISFET of the memory cell at either the stage subsequent to the initial stage or the stage prior to the final stage in the array direction, so that the periodicities of the respective width sizes of the element isolating insulating film regulating the gate width of the other transfer MISFET of the memory cell at the initial or final stage in the array direction and the element isolating insulating film regulating the gate width of the one transfer MISFET can be maintained to equalize the respective gate width sizes of the two transfer MISFETs of the memory cell at the initial or final stage in the array direction.

(B) On the basis of the aforementioned effect (A), moreover, the $\beta$ ratio, which is given by the one transfer MISFET of the memory cell at the initial or final stage in the array direction and the one drive MISFET connected with the former, and the $\beta$ ratio, which is given by the other transfer MISFET and the other drive MISFET connected with the former, can be individually equalized to improve the information latching characteristics of the memory cell so that the reliability in the circuit operation of the SRAM can be improved.

According to the aforementioned means (3), the $\beta$ ratio, which is given by the one transfer MISFET of the memory cell at the initial or final stage in the array direction and the one drive MISFET connected with the former, and the $\beta$ ratio, which is given by the other transfer MISFET and the other drive MISFET connected with the former, can be individually equalized to improve the information latching characteristics of the memory cell so that the reliability in the circuit operation of the SRAM can be improved.

According to the aforementioned means (4), the $\beta$ ratio of the memory cell at the initial or final stage in the array direction and the $\beta$ ratio of the memory cell at either the stage subsequent to the initial stage or the stage prior to the final stage in the array direction can be individually equalized to equalize the individual information latching characteristics of the two memory cells so that the reliability in the circuit operation of the SRAM can be improved considerably. (In case either of the information latching characteristics are degraded, the information latching characteristics of the whole system of the SRAM are determined on the basis of the memory cell having its information latching characteristics degraded. However, such degradation of the latching characteristics this can be prevented.)

According to aforementioned means (6), the following effects can be achieved:

(A) The width size of the element isolating insulating film (i.e., the end portion) between the other drive MISFET of the memory cell at the initial or final stage in the array direction and the semiconductor region for feeding the fixed potential to the substrate is reduced to an extent arranging the active region so that the width size of the element isolating insulating film (i.e., the end portion) can be equalized or approximated to the width size of the element isolating insulating film (i.e., the internal portion) between one drive MISFET at the initial or final stage in the array direction and the one drive MISFET of the memory cell at either the stage subsequent to the initial stage or the stage prior to the final stage in the array direction. As a result, the periodicities of the respective width sizes of the element isolating insulating film regulating the gate width of the one drive MISFET at the initial or final stage in the array direction and the element isolating insulating film regulating the gate width of the other drive MISFET can be maintained to equalize the respective gate width sizes of the two drive MISFETs of the memory cell at the initial or final stage in the array direction; and (B) On the basis of the aforementioned effect (A), moreover, the $\beta$ ratio, which is given by the one drive MISFET of the memory cell at the initial or final stage in the array direction and one transfer MISFET connected with the former, and the $\beta$ ratio, which is given by the other drive MISFET and the other transfer MISFET connected with the former, can be individually equalized to improve the information latching characteristics of the memory cell so that the reliability in the circuit operation of the SRAM can be improved.

According to the aforementioned means (7), the following effects can be achieved:

(A) The width size of the element isolating insulating film (i.e., the end portion) between the other drive MISFET of the memory cell at the initial or final stage in the array direction and the semiconductor region for feeding the fixed potential to the substrate can be substantially equalized to the width size of the element isolating insulating film (i.e., the internal portion) between the one drive MISFET of the memory cell at the initial or final stage in the array direction and the one drive MISFET of the memory cell at either the stage subsequent to the initial stage or the stage prior to the final stage in the array direction, so that the periodicities of the respective width sizes of the element isolating insulating film regulating the gate width of the other drive MISFET of the memory cell at the initial or final stage in the array direction and the element isolating insulating film regulating the gate width of the one drive MISFET can be maintained to equalize the respective gate width sizes of the two drive MISFETs of the memory cell at the initial or final stage in the array direction;

(B) On the basis of the aforementioned effect (A), moreover, the $\beta$ ratio, which is given by the one drive MISFET of the memory cell at the initial or final stage in the array direction and the one transfer MISFET connected with the former, and the $\beta$ ratio, which is given by the other drive MISFET and the other transfer MISFET connected with the former, can be individually equalized to improve the information latching characteristics of the memory cell so that the reliability in the circuit operation of the SRAM can be improved.

According to the aforementioned means (8), the $\beta$ ratio, which is given by the one drive MISFET of the memory cell at the initial or final stage in the array direction and the one drive MISFET connected with the former, and the $\beta$ ratio, which is given by the other drive MISFET and the other drive MISFET connected with the former, can be individually equalized to improve the information latching characteristics of the memory cell so that the reliability in the circuit operation of the SRAM can be improved.

According to the aforementioned means (9), the $\beta$ ratio of the memory cell at the initial or final stage in the array direction and the $\beta$ ratio of the memory cell at either the stage subsequent to the initial stage or the stage prior to the final stage in the array direction can be individually equalized to equalize the individual information latching characteristics of the two memory cells so that the reliability in the circuit operation of the SRAM can be improved better. (In case either of the information latching characteristics are degraded, the information latching characteristics of the whole system of the SRAM are determined on the basis of the memory cell having its information latching characteristics degraded. However, such degradiation of the latching characteristics can be prevented.)

According to the aforementioned means (11), the following effects can be achieved:

(A) The width size of the element isolating insulating film between the other transfer MISFET of each of the plurality of memory cells arrayed in a direction aligned with the gate length direction and the semiconductor region for feeding the fixed potential to the substrate is made smaller to an extent arranging the active region or its portion, and the width size of the element isolating insulating film (i.e., the end portion) can be equalized or approximated to the width size of-the element isolating insulating film (i.e., the internal portion) between the one transfer MISFET of the memory cell and the one transfer MISFET of the other memory cell of the subsequent stage, which is arranged in the gate width direction. As a result, the periodicities of the respective width sizes of the element isolating insulating film regulating the gate width of the individual other transfer MISFET of the plurality of memory cells arrayed in a direction aligned with the gate length direction and the element isolating insulating film regulating the gate width of the one transfer MISFET, so that the respective gate width sizes of the two transfer MISFETs of the plurality of memory cells arrayed in the direction aligned with the gate length direction can be equalized; and (B) On the basis of the aforementioned effect (A), the $\beta$ ratio, which is given by the one transfer MISFET of each of the plurality of memory cells arrayed in the direction aligned with the gate length direction and the one drive MISFET connected with the former, and the $\beta$ ratio, which is given by the other transfer MISFET and the other drive MISFET connected with the former, can be individually equalized to improve the information latching characteristics of the memory cells so that the reliability in the circuit operation of the SRAM can be improved.

According to the aforementioned means (12), the following effects can be achieved:

(A) The width size of the element isolating insulating film (i.e., the end portion) between the source region or drain region connected with the complementary data lines of the other transfer MISFET of the plurality of memory cells arrayed in a direction aligned with the gate width direction and the semiconductor region for feeding the fixed potential to the substrate is reduced to an extent arranging the active region or its portion so that the width size of the element isolating insulating film (i.e., the end portion) can be equalized or approximated to the width size of the element isolating insulating film (i.e., the internal portion) between the one transfer MISFET of the memory cell and the one transfer MISFET of the other memory cell at the subsequent stage arranged in the gate length direction. As a result, the periodicities of the respective width sizes of the element isolating insulating film defining the source region or drain region of the other transfer MISFET of each of the plurality of memory cells arrayed in the direction aligned with the gate width direction and the width sizes of the element isolating insulating film defining the source region or drain region of the one transfer MISFET can be regulated so as to make uniform the shapes of the individual source regions or drain regions of the two transfer MISFETs of the plurality of memory cells arrayed in the direction aligned with the gate width direction; and (B) On the basis of the aforementioned effect (A), moreover, it is possible to prevent the conduction errors and the resistance fluctuations between the source region or drain region of the other transfer MISFET of each of the plurality of memory cells arrayed in the direction aligned with the gate width direction and the complementary data lines.

According to the aforementioned means (13), the following effects can be achieved:

(A) The width size of the element isolating insulating film between the other drive MISFET of each of the plurality of memory cells arrayed in a direction aligned with the gate length direction and the semiconductor region for feeding the fixed potential to the substrate is made smaller to an extent arranging the active region or its portion, and the width size of the element isolating insulating film (i.e., the end portion) can be equalized or approximated to the width size of the element isolating insulating film (i.e., the internal portion) between the one drive MISFET of the memory cell and the one drive MISFET of the other memory cell of the subsequent stage, which is arranged in the gate width direction. As a result, the periodicities of the respective width sizes of the element isolating insulating film regulating the gate width of the individual other drive MISFET of the plurality of memory cells arrayed in a direction aligned with the gate length direction and the element isolating insulating film regulating the gate width of the one transfer MISFET, so that the respective gate width sizes of the two drive MISFETs of the plurality of memory cells arrayed in the direction aligned with the gate length direction can be equalized; and (B) On the basis of the aforementioned effect (A), the $\beta$ ratio, which is given by the one transfer MISFET of each of the plurality of memory cells arrayed in the direction aligned with the gate length direction and the one drive MISFET connected with the former, and the $\beta$ ratio, which is given by the other transfer MISFET and the other drive MISFET connected with the former, can be individually equalized to improve the information latching characteristics of the memory cells so that the reliability in the circuit operation of the SRAM can be improved.

According to the aforementioned means (14), the following effects can be achieved:

(A) The source region connected with the reference voltage line of the one drive MISFET of the plurality of memory cells arrayed in the direction aligned with the gate width direction can be enlarged to an extent arranging the active region or its portion between itself and the semiconductor region for feeding the fixed potential to the substrate so that the width size in a direction aligned with the gate width direction of the element isolating insulating film (i.e., the end portion) defining the source region can be equalized or approximated to the width size of the element isolating insulating film (i.e., the internal portion) defining the respective source regions of the other drive MISFET of the memory cells and the other drive MISFET of the other memory cells at the subsequent stage. As a result, the periodicities of the respective width sizes of the element isolating insulating film defining the source region of the one drive MISFET of each of the plurality of memory cells arrayed in the direction aligned with the gate width direction and the element isolating insulating film defining the source region of the other drive MISFET can be regulated so as to make uniform the shapes of the respective source regions of the two drive MISFETs of the plurality of memory cells arrayed in the direction aligned with the gate width direction; and (B) As a result, it is possible to prevent the connection error between the source region of the one drive MISFET of the plurality of memory cells arrayed in the direction aligned with the gate width direction and the reference voltage line.

According to the aforementioned means (15), the following effects can be achieved:

(A) The spacing size between the gate electrode of at least one drive MISFET of the memory cell at the initial or final stage in the array direction and the dummy gate electrode layer and the spacing size between the gate electrode of at least the other drive MISFET of the memory cell at the initial or final stage in the array direction and the gate electrode of at least the other drive MISFET of the memory cell at either the stage subsequent to the initial stage or the stage prior to the final stage in the array direction can be set to a substantially equal size to equalize the spacing between the gate electrode of the one drive MISFET and the dummy gate electrode layer and the spacing between the gate electrodes of the other drive MISFET. As a result, the periodicities can be maintained to equalize the gate length size of at least one drive MISFET of the memory cell at the initial or final stage in the array direction and the gate length size of the other drive MISFET;

(B) On the basis of the aforementioned effect (A), moreover, the $\beta$ ratio, which is given by the one drive MISFET of either memory cell at the initial and final stages in the array direction and the one transfer MISFET connected with the former, and the $\beta$ ratio, which is given by the drive MISFET and the other transfer MISFET connected with the former can be individually equalized to improve the information latching characteristics of the memory cells so that the reliability in the circuit operation of the SRAM can be improved; and (C) Still moreover, the two drive MISFETs of the memory cell at the initial or final stage in the array direction are constructed in central symmetry with each other so that the $\beta$ ratio given by the one drive MISFET and the one transfer MISFET connected with the former and the $\beta$ ratio given by the other drive MISFET and the other transfer MISFET connected with the former can be easily equalized. As a result, the information latching characteristics of the memory cells can be better improved to improve the reliability in the circuit operation of the SRAM better.

According to the aforementioned means (16), a phenomenon that the dummy gate electrode layer is electrified can be prevented to improve the reliabilities in the manufacture and use of the SRAM.

According to the aforementioned means (17), the following effects can be achieved:

(A) The spacing size between the gate electrode of at least the other transfer MISFET of the memory cell at the initial or final stage in the array direction and the dummy gate electrode layer and the spacing size between the gate electrode of at least the one transfer MISFET of the memory cell at the initial or final stage in the array direction and the gate electrode of at least the one transfer MISFET of the memory cell at either the stage subsequent to the initial stage or the stage prior to the final stage in the array direction can be set to a substantially equal size to equalize the spacing between the gate electrode of the other transfer MISFET and the dummy gate electrode layer and the spacing between the gate electrodes of the one transfer MISFET. As a result, the periodicities can be maintained to equalize the gate length size of at least the other transfer MISFET of the memory cell at the initial or final stage in the array direction and the gate length size of the one transfer MISFET; and (B) On the basis of the aforementioned effect (A), moreover, the $\beta$ ratio, which is given by the one transfer MISFET of either memory cell at the initial and final stages in the array direction and the one drive MISFET connected with the former, and the $\beta$ ratio, which is given by the transfer MISFET and the other drive MISFET connected with the former can be individually equalized to improve the information latching characteristics of the memory cells so that the reliability in the circuit operation of the SRAM can be improved.

According to the aforementioned means (18), the two transfer MISFETs of the memory cells at the initial or final stage in the array direction are constructed in central symmetry with respect to each other, or the two drive MISFETs of the memory cells are constructed in central symmetry with respect to each other so that the $\beta$ ratio given by the one transfer MISFET and the one drive MISFET connected with the former and the $\beta$ ratio given by the other transfer MISFET and the other drive MISFET can be easily equalized. As a result, the information latching characteristics of the memory cells can be considerably improved to improve the reliability of the circuit operation of the SRAM.

The structure of the present invention will be described in the following in connection with one embodiment thereof.

Throughout the embodiments and drawing illustration pertaining thereto, the portions having the same functions in the various embodiments are designated with the same reference characters, and their repeated description will be omitted.

BRIEF DESCRIPTION OF THE DRAWINGS

FIG. 1A is a top plan view showing the whole structure of a semiconductor chip formed with a semiconductor integrated circuit device according to one embodiment of the present invention; FIG. 1B is a top plan view showing a portion of a memory mat of the semiconductor integrated circuit device of FIG. 1A in an enlarged scale.

Figure 2A:
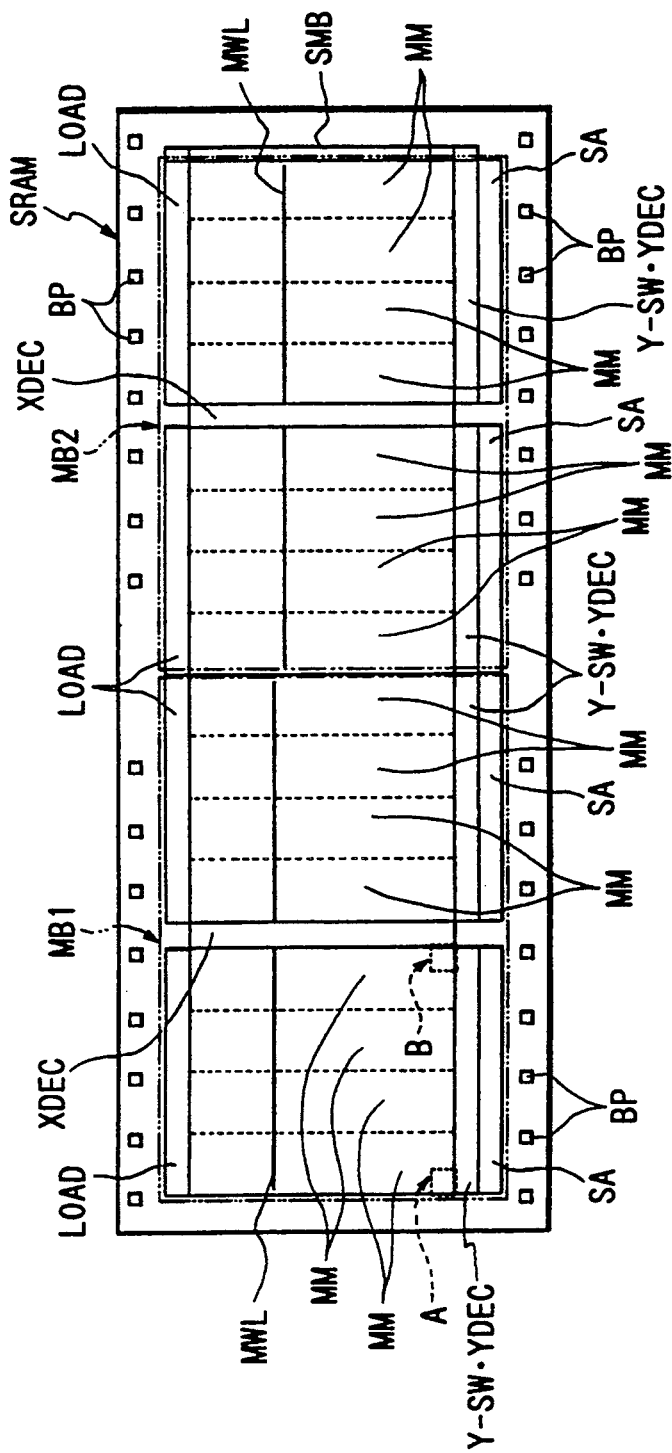
Figure 3:
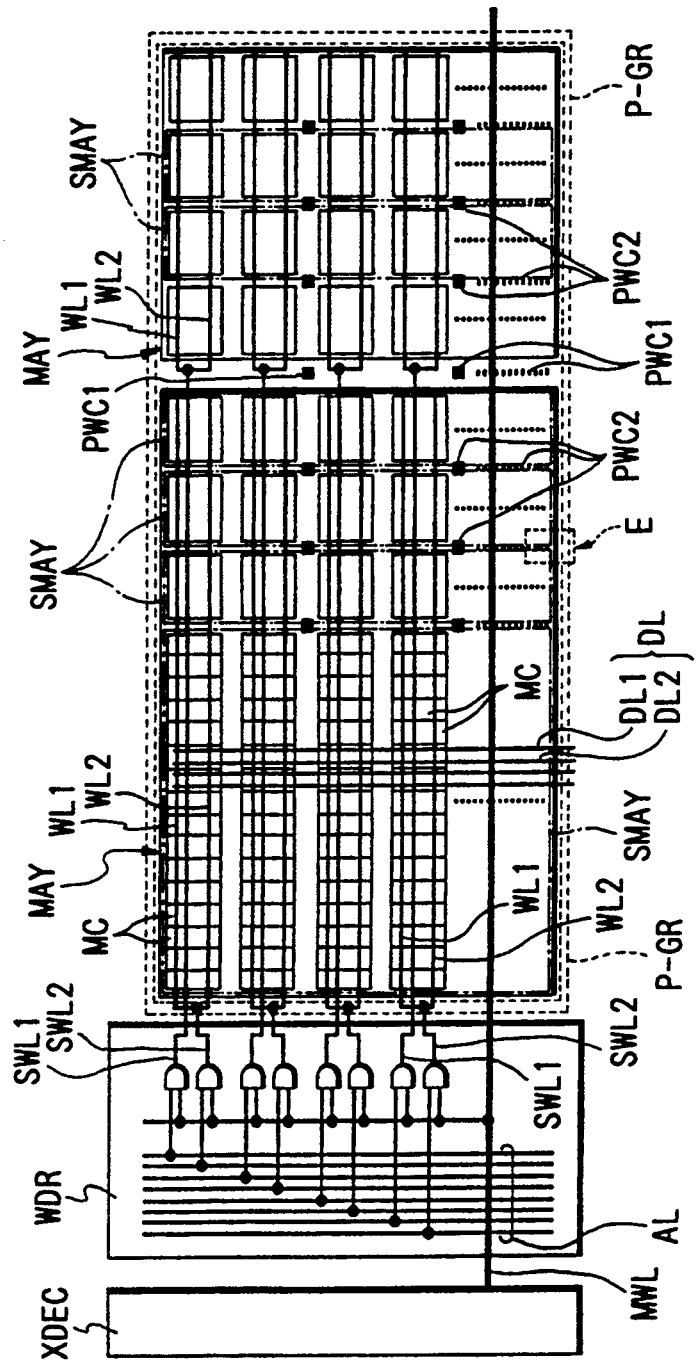
Figure 4:
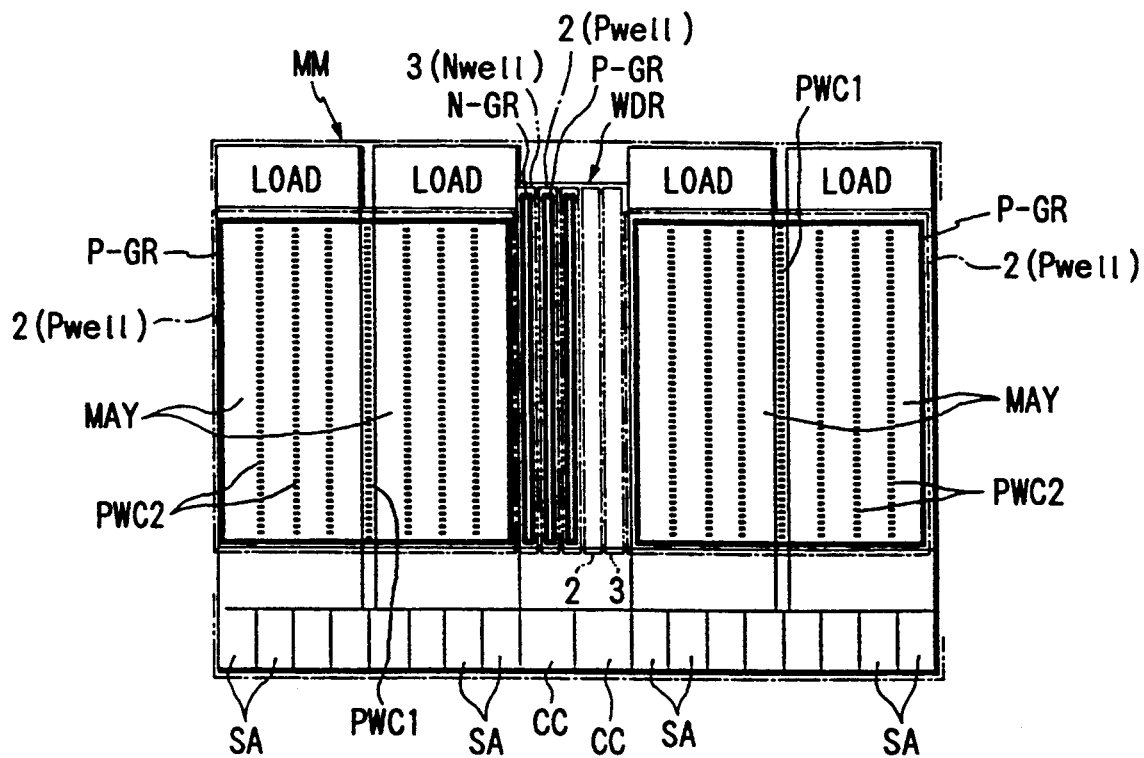
Figure 5:
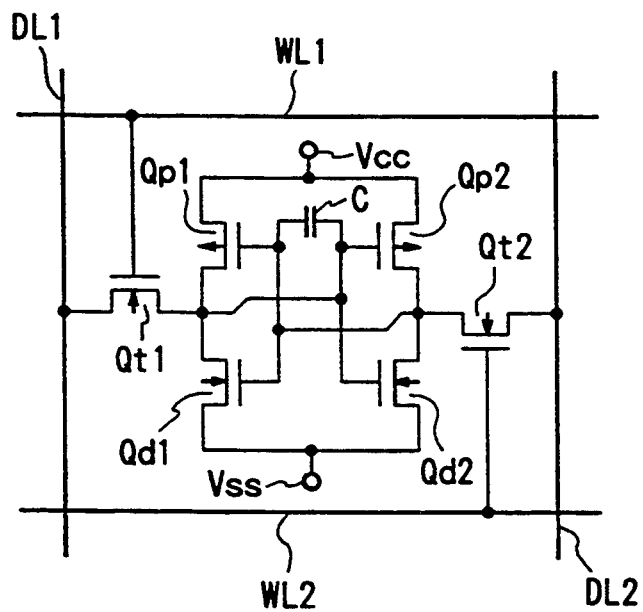
Figure 6:
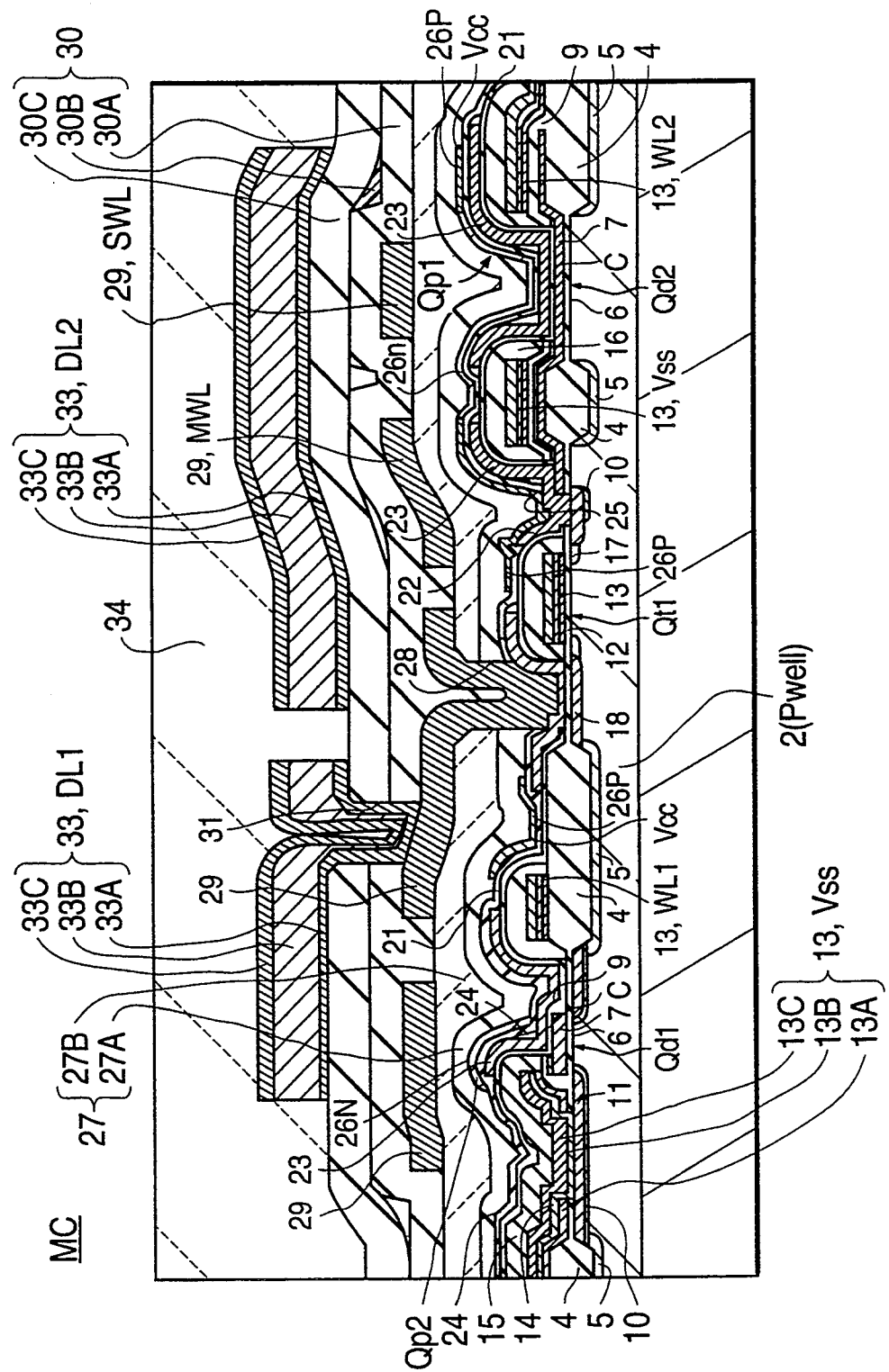
Figure 7:
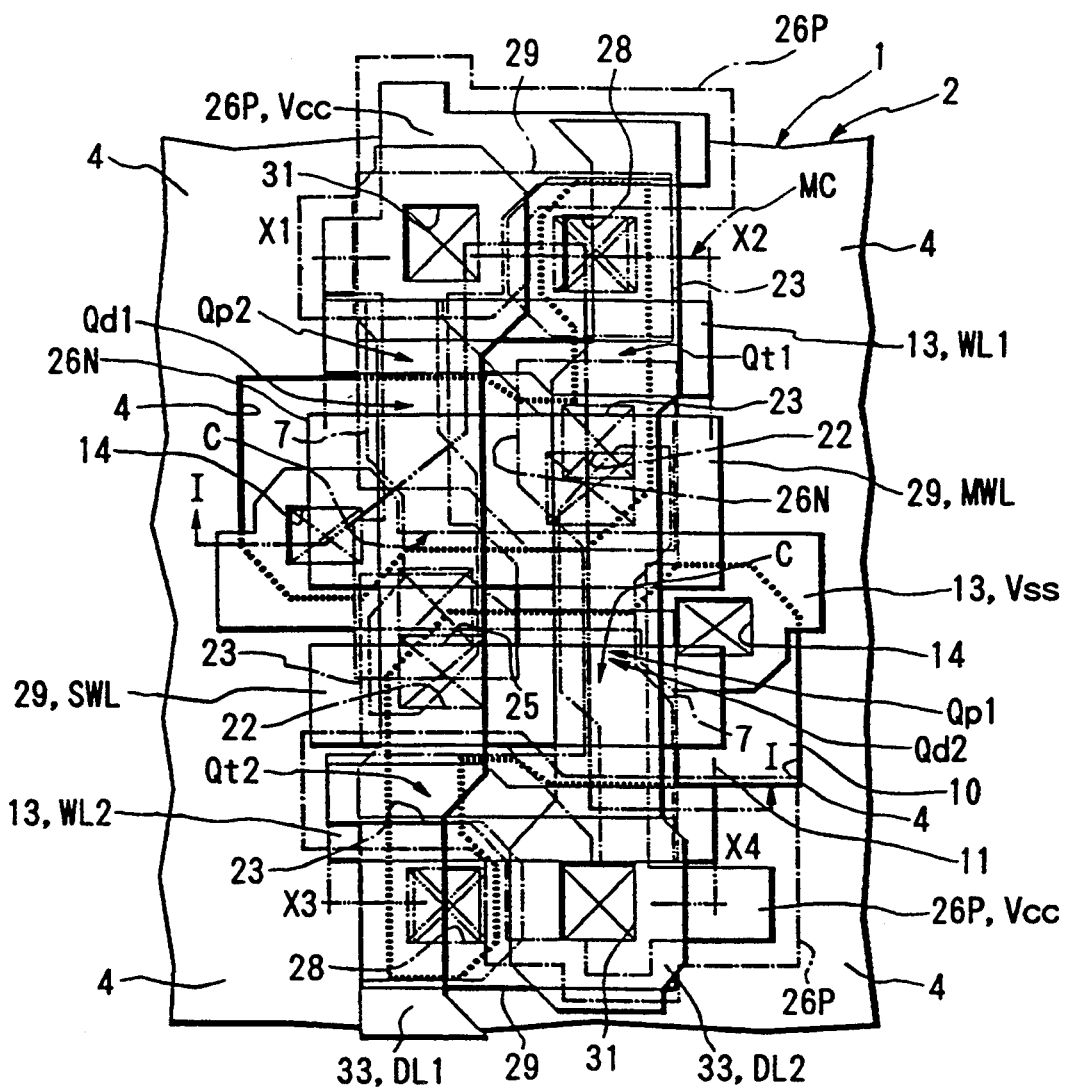
Figure 8A:
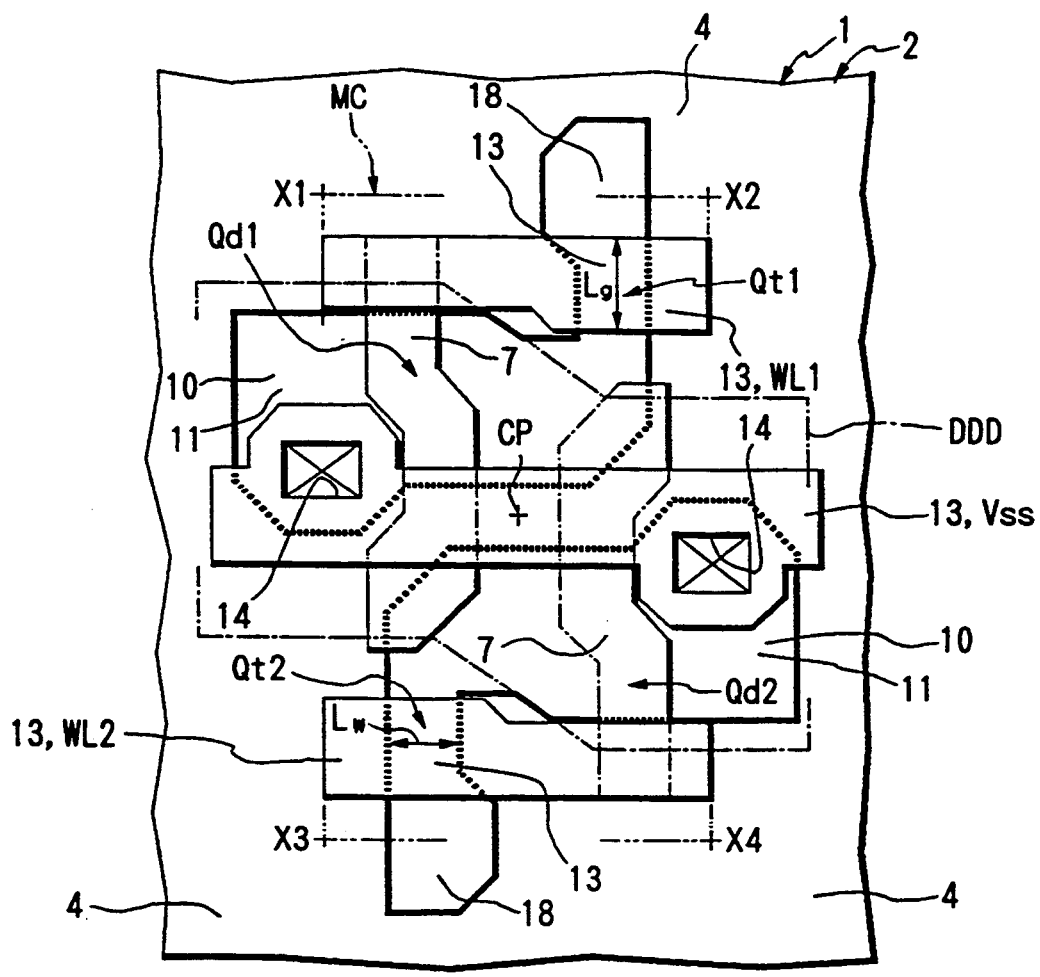
Figure 8B:
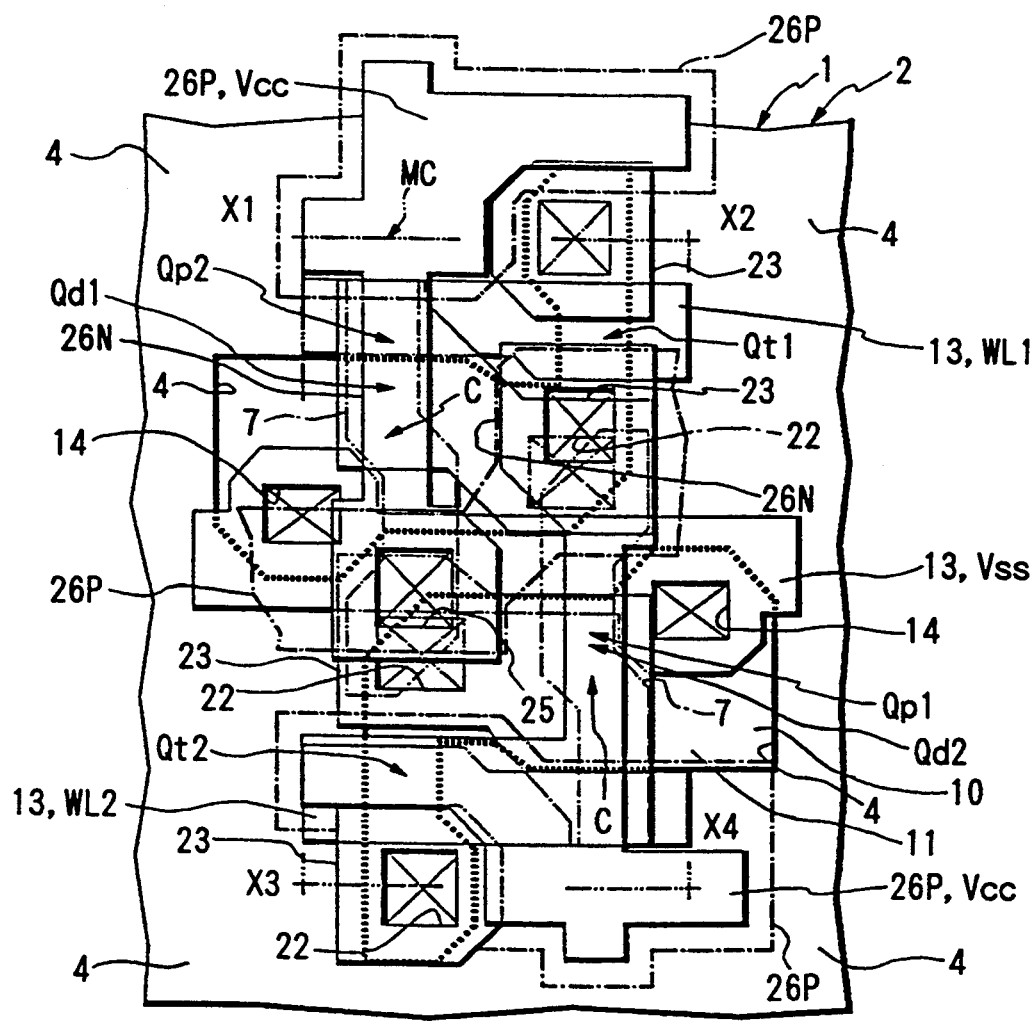
Figure 9C:
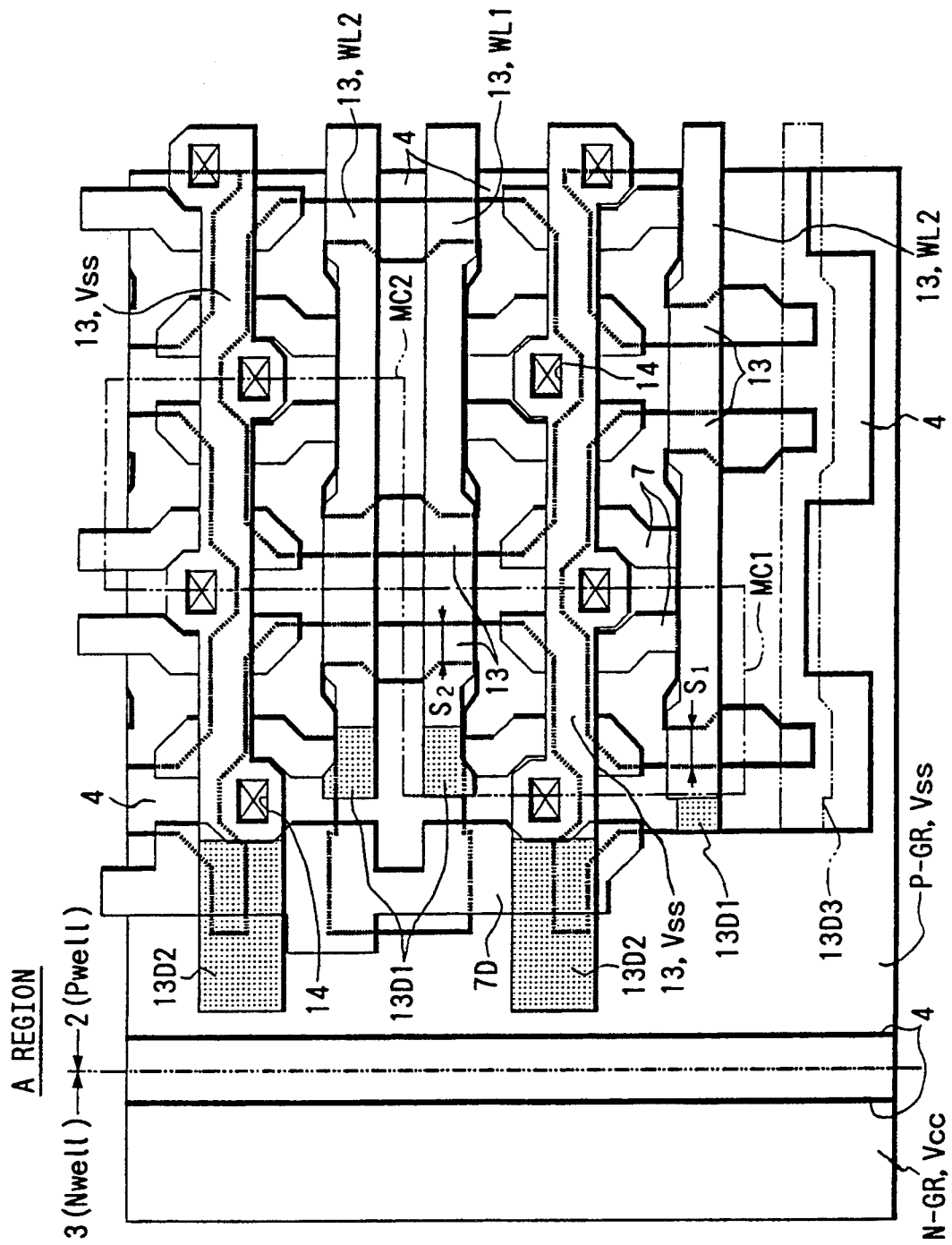
Figure 15:
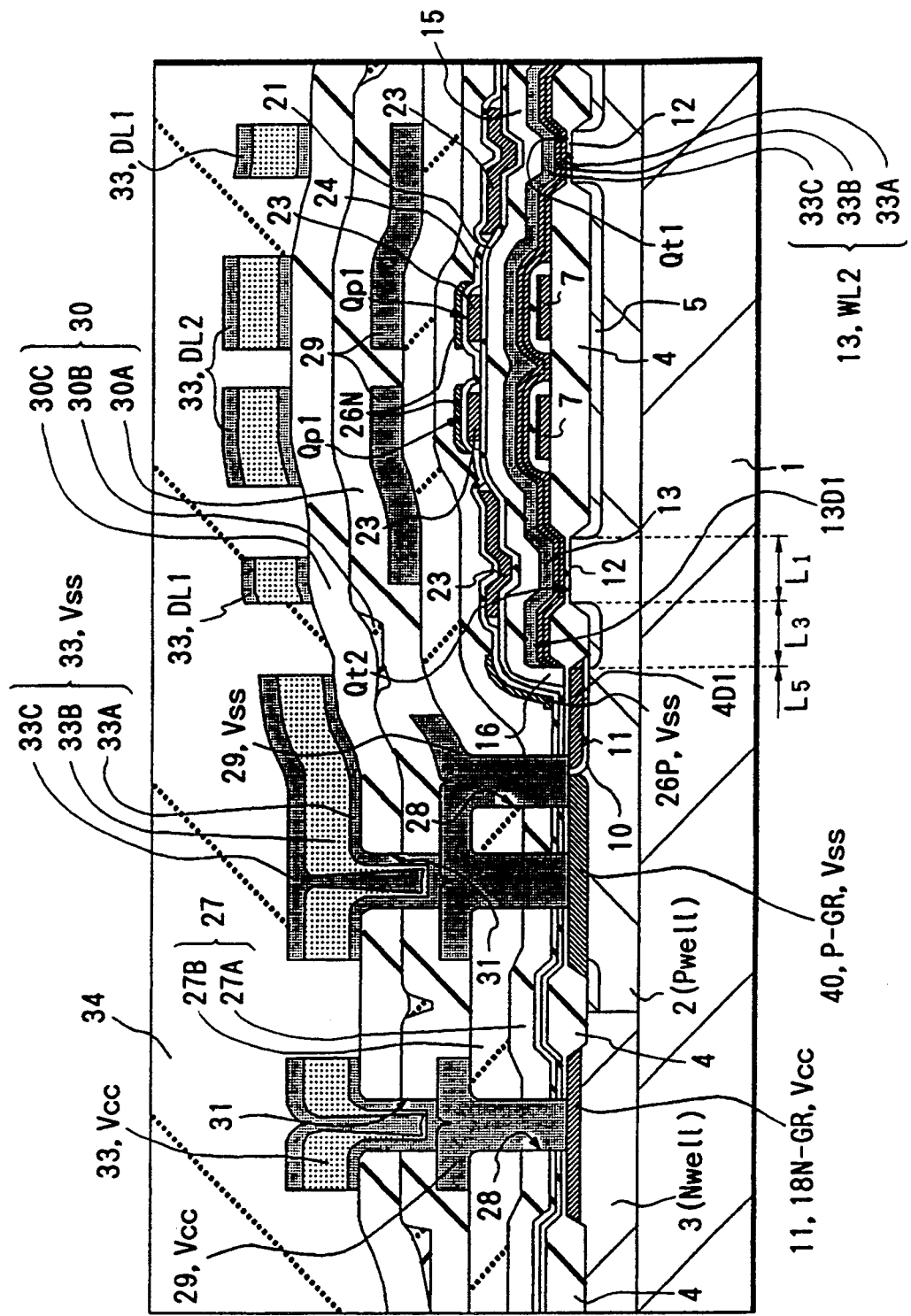
Figure 16:
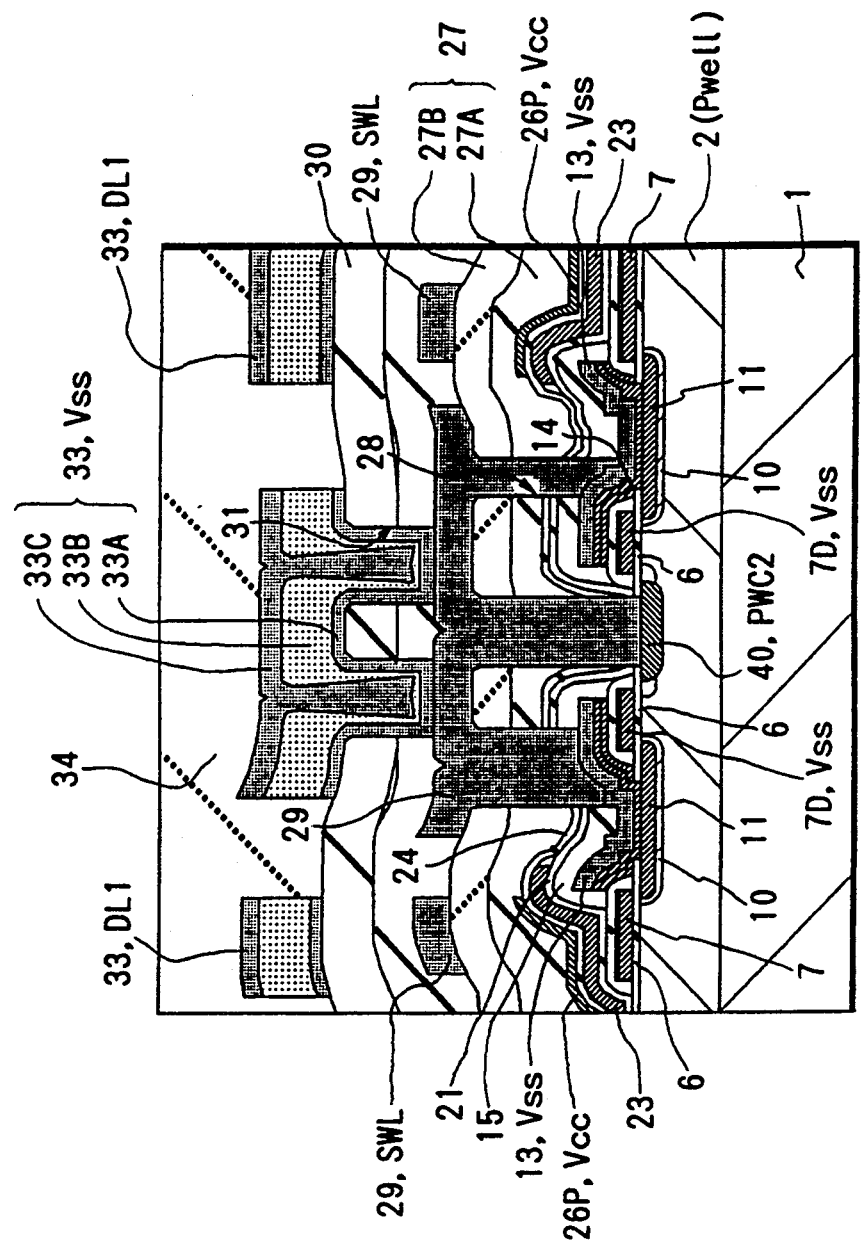

Fig, 2A is a layout showing a chip of a SRAM according to another embodiment of the present invention;

FIGS. 2B and 2C are enlarged block diagrams showing the SRAM shown in FIG. 2A;

FIG. 3 is an enlarged block diagram showing an essential portion of the SRAM shown in FIG. 2A;

FIG. 4 is an enlarged block diagram showing an essential portion of the SRAM shown in FIG. 2A;

FIG. 5 is a circuit diagram showing a memory cell of the SRAM shown in FIG. 2A;

FIG. 6 is a section showing the memory cell shown in FIG. 2A;

FIG. 7 is a top plan view showing the memory cell shown in FIG. 2A;

FIGS. 8A to 8C are top plan views showing the memory cell of FIG. 2A at every step of manufacture;

FIGS. 9A to 9C are top plan views showing the array end portion of the memory cells of FIG. 2A at every steps;

FIGS. 10A to 10E are top plan views showing the array end portion of the memory of FIG. 2A at every of steps of manufacture;

FIGS. 11A to 11G showing the array end portion of the memory of FIG. 2A at every of steps of manufacture;

FIGS. 12A to 12F showing the array end portion of the memory of FIG. 2A at every step of manufacture;

FIGS. 13A to 13D showing the array end portion of the memory of FIG. 2A at every step of manufacture;

FIGS. 14A to 14D showing the array end portion of the memory of FIG. 2A at every step of manufacture;

FIG. 15 is a section showing the array end portion of the SRAM shown in FIG. 2A;

FIG. 16 is a section showing the array end portion of the SRAM shown in FIG. 2A;

FIGS. 17A to 17G are sections showing the memory cell of FIG. 2A at every step of manufacture; and FIGS. 18A to 18G are sections showing the memory cell of FIG. 2A at every step of manufacture.

Figure 19B:
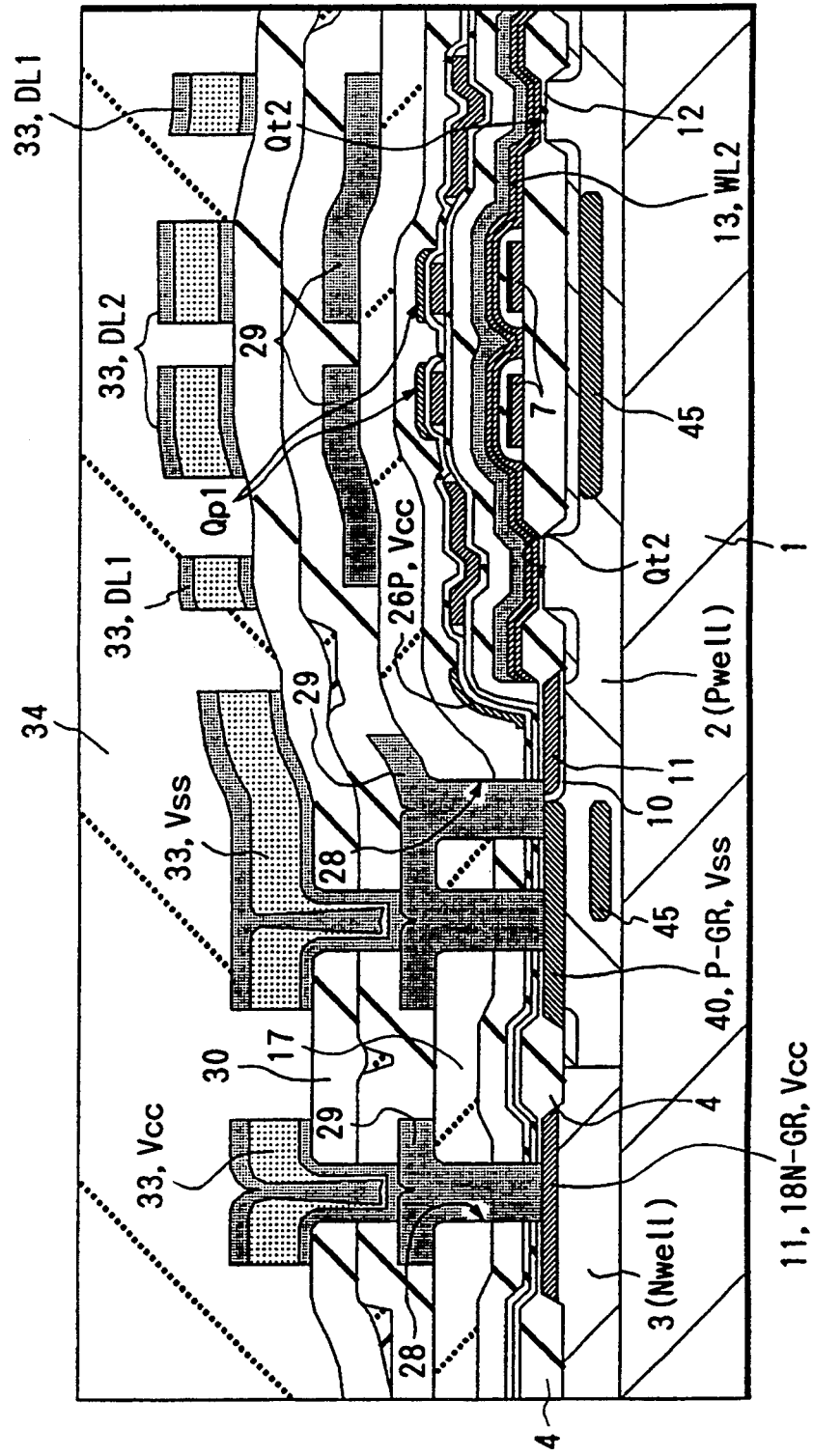

FIG. 19A is a section showing a memory cell of a SRAM according to a further embodiment of the present invention; and FIG. 19B is a section showing the array end portion of the same.

Figure 20A:
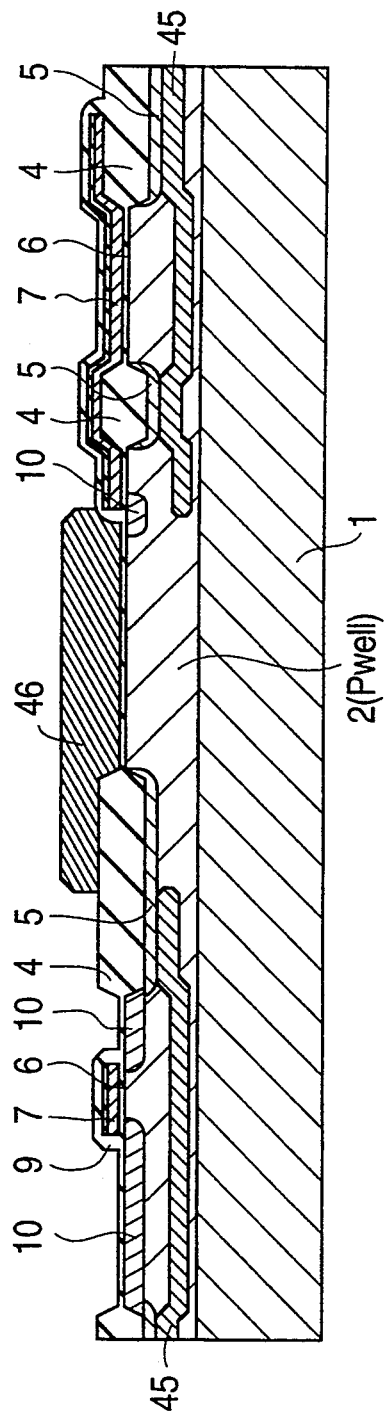
Figure 20B:
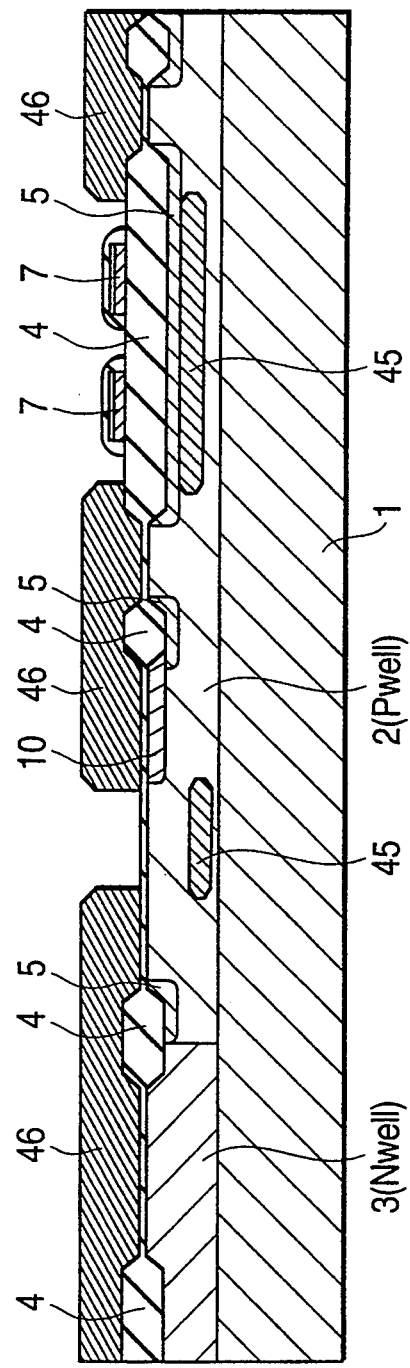

FIG. 20A is a section showing the memory cell of FIG. 19 at a predetermined step; and FIG. 20B is a section showing the array end portion of the same at a predetermined step.

FIGS. 21A and 21B are top plan views showing the array end portion of the memory of FIG. 19 at predetermined steps.

DESCRIPTION OF THE PREFERRED EMBODIMENTS

One embodiment of the present invention will be described with reference to FIGS. 1A to 1D. First of all, a degradation, as has been found out by us, of the electric characteristics of the memory cells arranged at the end portion of a memory array will be described with reference to FIG. 1D (presenting a memory array MA of a SRAM).

Figure 1C:
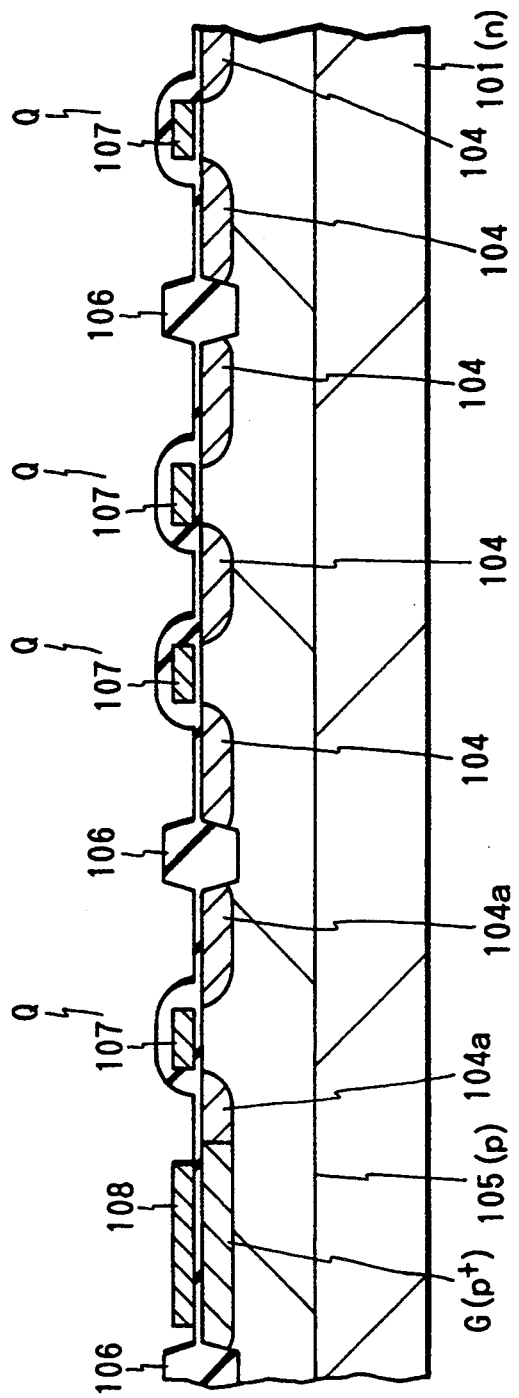
FIG. 1C is a section showing a semiconductor chip and taken along line II—II of FIG. 1B.
Figure 1D:
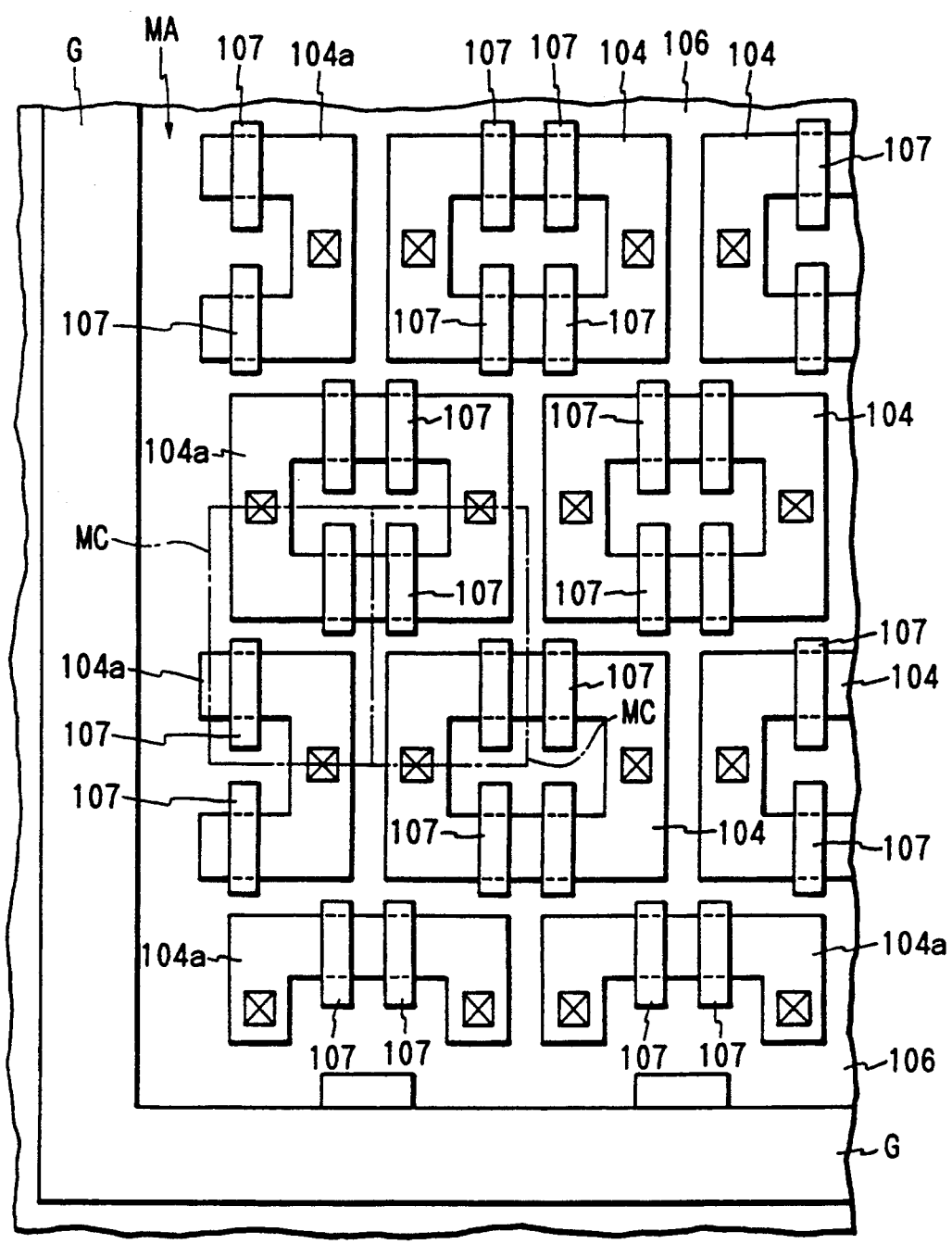
FIG. 1D is a top plan view showing the whole face of the semiconductor chip for describing one embodiment shown in FIG. 1A.

In the memory array MA, as shown in FIG. 1D, diffusion layers 104 of MOSFETs constituting memory cells MC of the SRAM are arranged in a matrix shape, and an element isolating insulating film 106 is formed between the diffusion layers 104. A gate electrode 107 of the MOSFET 107 is arranged over each of the diffusion layers 104. Outside of the memory array MA, on the other hand, there is arranged a power supply guard ring G enclosing the memory array MA.

Noting the diffusion layers 104 of the MOSFET, therefore, the diffusion layer 104 arranged inside of the memory array MA is surrounded by another diffusion layer 104, but a diffusion layer 104a arranged at the end portion of the memory array MA is juxtaposed at its one side to the guard ring G so that it has a shape different from the diffusion layer 104 inside of the memory array MA.

As a result, due to the difference in the surface tension of a photoresist applied to the semiconductor wafer at the step of lithography between the inside and the end portion of the memory array MA, the worked size of the diffusion layer 104l at the end portion of the memory array MA becomes different from that of the inside diffusion layer 104. Thus, it seems that the electric characteristics of a transistor at the end portion are degraded.

Similar discussion applies to the gate electrode arranged over the diffusion layer 104. This is because the four gate electrodes 107 are arranged over the diffusion layer 104 inside of the memory array MA whereas only two gate electrodes 107 are arranged over the diffusion layer 104a at the end portion of the memory array MA.

Next, the present embodiment of the present invention will be described with reference to FIGS. 1A to 1C.

At the center of a principal face of a semiconductor chip 101 made of an n-type silicon single crystal, for example, as shown in FIG. 1A, there is formed a memory array MA of a SRAM which has a storage capacity as high as 4 megabits (Mbits), for example. This SRAM has its memory array MA divided into a multiplicity of memory mats MM so as to prevent the wiring delay of the circuit which might otherwise follow the increase in the memory capacity.

Outside of the memory array MA, there is arranged a peripheral circuit 102 along the longer side of a chip 101. Outside of the peripheral circuit 102, there are arranged bonding pads 103 for electric connections with the outside.

FIG. 1B is an enlarged view showing the corner portion (as enclosed by broken lines A1 in FIG. 1A) of the memory mat MM, and FIG. 1C is a section showing the chip 101 and taken along line II—II of FIG. 1B.

This memory mat MM is arranged in a matrix shape with the diffusion layers 104 of an n-channel MOSFET Q constituting the memory cell MC of the SRAM. Of these diffusion layers 104, as shown in FIG. 1B, the diffusion layers 104a arranged at the end portion of the memory mat MM are shaped by halving the diffusion layer inside of the memory mat MM. As shown in FIG. 1C, moreover, the diffusion layer 104 is made of an n-type semiconductor region formed over the principal face of a p-type well 105.

Incidentally, the memory cell MC is substantially identical to the memory cell of a later-described another embodiment shown in FIG. 7, and the layers (i.e., a polycrystalline silicon layer and a metal wiring layer) over the second-layered polycrystalline silicon layer are omitted from FIGS. 1B and 1C.

The individual diffusion layers 104 are isolated from one another by the element isolating insulating film 106 made of a silicon oxide film, for example. Over each of the diffusion layers 104, on the other hand, there is formed the gate electrode 107 of the n-channel MOSFET Q. This gate electrode 107 is made of polycrystalline silicon (i.e., a first polycrystalline silicon layer). Over the diffusion layer 104 inside of the memory mat MM, as shown in FIG. 1B, there are arranged four gate electrodes 107. Over the diffusion layer 104a at the end portion, there are arranged two gate electrodes 107.

Outside of the memory mat MM, there is formed the guard ring G for feeding a supply potential ($V_{ss}$) to the p-type well 105, for example. As shown in FIG. 1C, the guard ring G is made of a p+-type semiconductor region formed in the principal face of the p-type well 105 and arranged to enclose the memory mat MM.

As shown in FIG. 1B, the guard ring G of the present embodiment has an inner boundary, i.e. an inner periphery, shape substantially identical (i.e., conforming) to that of the diffusion layer 104a at the end portion of the memory mat MM. As a result, the added shape of the shape of the diffusion layer 104a and the inside shape of the guard ring G adjoining the former is made substantially identical to that of the diffusion layer 104 inside of the memory mat MM.

As shown in FIG. 1B, moreover, there is formed over the guard ring G a dummy pattern 108. This dummy pattern 108 is arranged to enclose the memory mat MM along the guard ring G. The dummy pattern 108 is made of the same material (i.e., a polycrystalline silicon film) as that of the gate electrode 107, for example, and is formed simultaneously as the step of forming the gate electrode 107.

The dummy pattern 108 has its inside shape made substantially identical to that of the gate electrode 107 which is formed over the diffusion layer 104a at the end portion of the memory mat MM. As a result, the added shape of the shape of the two gate electrodes 107 over the diffusion layer 104a and the inside shape of the dummy pattern 108 adjoining the former is substantially identical to that of the four gate electrodes 107 which are formed over the diffusion layer 104 inside of the memory mat MM.

The dummy pattern 108 is electrically connected with not only the overlying wiring layer fed with the potential $V_{ss}$ through a contact hole C1 but also the underlying guard ring G through that wiring layer so that an active transistor may be inhibited. Incidentally, a contact hole C formed over the diffusion layer 104 of the memory mat MM is intended to transmit the supply potential ($V_{ss}$) of the memory cell MC to the (not-shown) wiring layer.

Although the description thus far made has been directed to the corner portion A1 of the memory mat, the memory array end is made to have substantially the same structure as that of the corner portion of the memory mat.

According to the SRAM thus constructed according to the present embodiment, the following operations and effects can be achieved:

(1) The inside shape of the guard ring G is made substantially identical to the shape of the diffusion layer 104a at the end of the memory mat MM or the memory array MA so that the added shape of the shape of the diffusion layer 104a and the inside shape of the guard ring G adjoining the former can be made substantially identical to the shape of the diffusion layer 104 inside of the memory mat MM or the memory array MA;

(2) The inside shape of the dummy pattern 108 is made substantially identical to the shape of the gate electrode 107 formed over the diffusion layer 104a at the end portion of the memory mat MM or the memory array MA so that the added shape of the gate electrode 107 over the diffusion layer 104a and the inside shape of the dummy pattern 108 adjoining the former can be made substantially identical to the shape of the gate electrode 107 formed over the inside diffusion layer 104 of the memory mat MM or the memory array MA;

(3) Thanks to the aforementioned effects (1) and (2), the shape of the memory cell arranged inside of the memory mat MM and the memory array MA is made substantially identical to that of the memory cell arranged at the end portion so that the inside and end portion of the memory mat MM or the memory array MA can prevent the worked size of the diffusion layer 104 or the gate electrode 107 from being dispersed and thereby the electric characteristics of the MOSFETs constituting the memory cells at the end portion of the memory mat MM or the memory array MA from degrading; and (4) The technology required is not to arrange the dummy cells around the memory mat MM or the memory array MA but merely to change the inside shape of the guard ring G so that the area of the memory mat MM or the memory array MA will not increase.

Thus, the electric characteristics of the transistors arranged at the end portion of the memory array MA or the memory mat MM can be prevented from degrading without increasing the area of the chip.

Next, a SRAM according to another embodiment of the present invention will be described with reference to FIGS. 2 to 18. First of all, the point to be noted by us while leading to the present embodiment will be described with reference to FIGS. 4 and 7 and FIGS. 8A to 8C. As shown in FIG. 7 and FIGS. 8A to 8C, the memory cell MC of the SRAM of the present embodiment is constructed such that the other transfer MISFET $Q_{t2}$ of the two has its planar shape formed in central symmetry with respect to the planar shape containing the active region and gate electrode of one transfer MISFET $Q_{t1}$, i.e. the pair of transfer MISFETs $Q_{t1}$ and $Q_{t2}$ are symmetrically disposed about a central location within the plan view area associated with each memory cell. The one transfer MISFET $Q_{t1}$ of the memory cell MC has its gate width direction (or its gate length direction) set in parallel with the gate width direction (or the gate length direction) of the other transfer MISFET $Q_{t2}$.

On the other hand, the memory cell MC is likewise constructed such that the planar shape of the other drive MISFET $Q_{d2}$ of the two is formed in central symmetry with respect to the planar shape including the active region and gate electrode of one drive MISFET $Q_{d1}$. The one drive MISFET $Q_{d1}$ of the memory cell MC has its gate width direction (or its gate length direction) set in parallel with the gate width direction (or the gate length direction) of the other drive MISFET $Q_{d2}$ and normal with respect to the gate width direction of the transfer MISFETs $Q_{t1}$ and $Q_{t2}$.

One semiconductor region of the one transfer MISFET $Q_{t1}$ of the memory cell MC and the drain region of the one drive MISFET $Q_{d1}$ are individually made integral to omit a portion of the element isolating insulating film 4 enclosing and defining the one semiconductor region and the drain region. Except the integrated region, the one transfer MISFET $Q_{t1}$ and the one drive MISFET $Q_{d1}$, i.e., the active regions are enclosed and defined by the element isolating insulating film 4. Likewise, the one semiconductor region of the other transfer MISFET $Q_{t2}$ of the memory cell MC and the drain region of the other drive MISFET $Q_{d2}$ are made integral, and the other transfer MISFET $Q_{t2}$ and the other drive MISFET $Q_{d2}$ are individually defined by the element isolating insulating film 4.

Load MISFETs $Q_p$ of the memory cell MC are arranged over the drive MISFETs $Q_d$ through an insulating film.

A plurality of memory cells MC are arrayed in a direction (i.e., an X direction) aligned with the gate width direction of the transfer MISFETs $Q_t$ and in a direction (i.e., a Y direction) aligned with the gate length direction of the transfer MISFETs $Q_t$. In other words, the memory cells MC are arranged in plurality in the direction (i.e., the Y direction) aligned with the gate width direction of the drive MISFETs $Q_d$ and in plurality in the direction (i.e., the X direction) aligned with the gate length direction of the drive MISFETs $Q_d$. The memory cells MC are arranged in plurality in a matrix shape to constitute a later-described memory cell array MAY.

As shown in FIG. 4, on the other hand, the SRAM adopts the well structure in case the peripheral circuit arranged around the memory cell array MAY is composed of a complementary MISFET (i.e., Complementary Metal Insulator Semiconductor Field Effect Transistor). The peripheral circuit includes both a direct peripheral circuit for directly controlling the circuit operations of the memory cells arrayed in the memory cell array, such as a decoder circuit, a driver circuit or a sense amplifier circuit and an indirect peripheral circuit for controlling the circuit operations of the direct peripheral circuit, such as an input/output circuit or an address buffer circuit. In case the twin well structure is adopted, the memory cell array MAY is arranged in the well region 2 (i.e., Pwell), which is set to be electrically independent of the well region arranged with the peripheral circuit, with a view to preventing the information stored in the memory cells MC from being fluctuated by the circuit operation of the peripheral circuit.

The well region 2 (Pwell) arranged with the memory cell array MAY is located in the outer peripheral region of the memory cell array MAY, and a guard ring region P-GR is arranged in the peripheral region of the well region 2 (Pwell). The guard ring region P-GR is made mainly of a semiconductor region which is arranged in the principal plane of the active region having its width direction regulated by the element isolating insulating film 4 of the well region 2 (Pwell). The semiconductor region forming that guard ring region P-GR is formed of the same conductivity type as that of the well region 2 (Pwell) and in a high impurity concentration and is fed with a fixed power. The guard ring region P-GR is formed mainly to feed the fixed power to the well region 2 (Pwell).

Moreover, the well region 2 (Pwell) arranged with the memory cell array MAY is arranged with regions for feeding a fixed power, i.e., the well contact regions PWC1 and PWC2 with a view to suppressing the potential fluctuations in the central region of the memory cell array MAY. As will be described hereinafter, the well contact regions PWC1 and PWC2 divide one memory cell array MAY into a plurality to constitute a plurality of sub-memory cell arrays SMAY and are arranged between these sub-memory cell arrays SMAY.

In case the single well structure is adopted, the memory cell array is arranged in the well region or the semiconductor substrate.

(1) In the memory cell array MAY of the aforementioned SRAM, the plurality of memory cells MC have their transfer MISFETs $Q_t$ and drive MISFET $Q_d$ set in central symmetry for each memory cell, i.e. symmetrically disposed about a central location within each memory cell, and are arrayed in the individual array directions of the X and Y directions. Specifically, in the central region of the memory cell array MAY, if the transfer MISFETs $Q_t$ and the drive MISFET $Q_d$ of the memory cells MC are individually arranged in the array direction of the memory cells MC, the drive MISFET $Q_d$ and the transfer MISFETs $Q_t$ of the memory cells MC at the subsequent step in the array direction are individually arranged through the element isolating insulating film 4. Thus, the array of the memory cells MC has a periodicity (i.e., a regularity).

On the other hand, at the end portion of the memory cell array MAY, i.e., the region adjacent to the guard ring region P-GR and at the end portion of the sub-memory cell array SMAY, i.e., the region adjacent to the well contact regions PWC1 and PWC2, the array of the memory cells MC terminates to establish disturbances in the periodicity of the array of the memory cells MC.

The transfer MISFETs $Q_t$ and the drive MISFET $Q_d$ of the memory cells are formed by the following manufacture process.

First of all, the well region is formed at the principal face of the semiconductor substrate. After this, the element isolating insulating film 4 is formed in the inactive region of the principal face of the well region, and an active region defined by the element isolating insulating film 4 is formed over the principal face of the well region. The element isolating insulating film 4 is formed by the well-known substrate (i.e., well region) selective oxidation method, for example.

In short, at first, the well region is consecutively formed over its principal face with the silicon oxide film, the silicon nitride film and the so-called "positive type photosensitive resin film". Next, an exposure is carried out to expose the portion of the inactive region of the photosensitive resin film, and a development is then carried out to remove the exposed portion of the photosensitive resin film. As a result, the portion of the photosensitive resin film left over the active region is formed as an etching mask. Next, this etching mask is used to etch and pattern the silicon nitride film to remove the portion of the inactive region of the silicon nitride film thereby to form the portion of the silicon nitride film left in the active region, as an oxidation mask. Next, the etching mask is removed, and the exposed oxidation mask is used to carry out a thermal oxidation treatment so that the element isolating insulating film 4 of the silicon oxide film is formed over the principal face of the inactive region of the well region. After this element isolating insulating film 4 has been formed, the oxidation mask is removed.

Next, the active region of the principal face of the well region is formed with the drive MISFETs $Q_d$ and the transfer MISFETs $Q_t$. The drive MISFETs $Q_d$ are formed by sequentially forming the gate insulating film, the gate electrode 7, the source region and the drain region. The gate electrode 7 of the drive MISFETs $Q_d$ is formed at the step of the SRAM manufacture process for forming the first-layered gate electrode material. The transfer MISFETs $Q_t$ are formed by sequentially forming the gate insulating film, the gate electrode 3, the word lines WL1 and WL2, the source region and the drain region. The gate electrode 3 of the transfer MISFETs $Q_t$ is formed at the step of the SRAM manufacture process for forming the second-layered gate electrode material.

Next, the load MISFETs $Q_p$ are formed over the drive MISFETs $Q_d$ and transfer MISFETs $Q_t$.

Next, the load MISFETs $Q_p$ are formed thereover with word lines (i.e., main word lines MWL and sub-word lines SWL) and complementary data lines DL1 and DL2.

At the step of forming the element isolating insulating film 4 in the aforementioned SRAM manufacture process, however, the phenomenon that the photosensitive resin film, i.e., the etching mask side flows occurs at the end portion of the memory cell array MAY, i.e., the region in which the array of the memory cells MC terminates to disturb the periodicity. Although the etching mask should be intrinsically worked into a steep side face substantially normal to the surface of the underlying silicon nitride film, its planar size will grow larger than the transfer size at the exposure time if its side face flows.

We have analyzed the defects but have failed to find out the causes for any stress occurring in the photosensitive resin film at the aforementioned region in which the periodicity of the memory cells is interrupted.

Thus, at the end portion of the memory cell array MAY, the size of the active region of the drive MISFETs $Q_d$ and the transfer MISFETs $Q_t$ most adjoining the memory cells MC, i.e., the guard ring region P-GR or the well contact regions PWC1 and PWC2. Specifically, in the memory cells MC at the end portion of the memory cell array MAY, the sizes of the respective active regions of the one drive MISFET $Q_{d1}$ and the one transfer MISFET $Q_{t1}$ in one memory cell MC are larger than those of the other drive MISFET $Q_{d2}$ and the other transfer MISFET $Q_{t2}$. Especially in the SRAM, the $\beta$ ratio is degraded by the changes in the gate width and length sizes of the drive MISFETs $Q_d$ and the changes in the gate width and length sizes of the transfer MISFETs $Q_t$. The $\beta$ ratio is given by the following formula:

$\beta = (DW/DL)/(TW/TL),$ wherein:
DW: Gate width of the drive MISFETs;
DL: Gate length of the drive MISFETs;
TW: Gate width of the transfer MISFETs; and
TL: Gate length of the transfer MISFETs.

The degradation in the $\beta$ ratio causes the information stored in the memory cells MC to be offset to the high or low level so that the information latching characteristics (i.e., $V_{cc}$ min/max characteristics) of the memory cells MC are degraded. As a result, moreover, an error will occur in the information writing operation or information reading operation of the SRAM to degrade the reliability of the circuit operation. (2) In the aforementioned region where the periodicity disturbs, on the other hand, the etching characteristics will also fluctuate at the step of forming the thermal oxidation mask to be used for forming the element isolating insulating film 4, i.e., the step of patterning the silicon nitride film. Likewise, the fluctuations in the working size will occur in the periodicity disturbed region not only at the step of forming the element isolating insulating film 4 but also at the step of patterning the gate electrodes 7 of the drive MISFETs $Q_d$ of the memory cells and at the step of patterning the gate electrodes 13 of the transfer MISFETs $Q_t$. Like the foregoing problem (1), those fluctuations will degrade the $\beta$ ratio of the memory cells and the information latching characteristics of the memory cells thereby to degrade the reliability in the circuit operation of the SRAM. (3) As a technology for solving the aforementioned problems (1) and (2), it is conceivable to arrange the memory cells MC acting as the dummy ones performing no circuit operation between the end portion of the memory cell array MAY and the guard ring region P-GR or the well contact regions PWC1 and PWC2. However, the arrangement of those dummy memory cells will resultantly increase the synthetic area occupied by the memory cell array MAY thereby to reduce the degree of integration of the SRAM.

We have found out the aforementioned points to be noted.

The present embodiment will be described in the following.

The overall structure of the SRAM according to the present embodiment is schematically shown in FIG. 2A (presenting a chip layout diagram).

The SRAM (i.e., the semiconductor pellet) shown in FIG. 2A is constructed to have a capacity as high as 4 [Mbits] of 512 [Kwords]×8 [bits]. This SRAM is sealed to a resin-sealed type semiconductor device (i.e., a package) adopting the dual in-line system, e.g., the DIP or SOP, in which the leads are arrayed in two opposed sides, although not shown. The SRAM is formed into a rectangle having a slim planar shape. The SRAM of the present embodiment is formed substantially into a rectangle having a longer side of 17 [mm] and a shorter side of 7 [mm].

In the individual peripheral regions extending along the opposed longer sides of the rectangle of the SRAM, there are arranged a plurality of external terminals (i.e., bonding pads) BP. These external terminals BP are connected with the internal (or inner) leads. The plurality of external terminals BP are individually fed with an address signal, a chip select signal, an output enable signal, a write enable signal or an input/output data signal, for example. The external terminals BP are further fed with the supply voltage $V_{cc}$ and the reference voltage $V_{ss}$. The supply voltage $V_{cc}$ is exemplified by the operating voltage of 3 to 5 [V] of the circuit, and the reference voltage $V_{ss}$ is exemplified by the earth voltage of 0 [V] of the circuit.

The SRAM is arranged at its central portion with two memory blocks MB1 and MB2. These two memory blocks MB1 and MB2 are sequentially arranged along the longer sides of the SRAM (i.e., in the X direction from the lefthand shorter side to the righthand shorter side of FIG. 2A). One memory block MB1 is divided into eight memory mats MM, as shown in FIG. 2A. These eight memory mats MM are individually arrayed in the X direction in the memory block MB1. Likewise, the other memory block MB2 is divided into eight memory mats MM. These eight memory mats MM are individually arrayed in the X direction in the memory block MB2.

In FIG. 2A, load circuits LOAD are arranged at the individual upper sides of the four memory mats MM, which are arranged at the lefthand side of the memory block MB1 of the SRAM, and the four memory mats MM which are arranged at the righthand side. Y-decoder circuits YDEC, Y-switch circuits Y-SW and sense amplifier circuits SA are individually arranged at the individual lower sides of the four memory mats MM, which are arranged at the lefthand side, and the four memory mats MM which are arranged at the righthand side. The four memory mats MM at the lefthand side and the four memory mats MM at the righthand side are arranged inbetween with X-decoder circuits XDEC such that they are symmetry across the X-decoder circuits XDEC with respect to the X direction.

Moreover, the four memory mats arranged at the lefthand side of the memory block MB2 and the four memory mats MM arranged at the righthand side are individually arranged at their upper side with the load circuits LOAD and at their lower side with the Y-decoder circuits YDEC, the Y-switch circuits Y-SW and the sense amplifiers SA. The four memory mats MM arranged at the lefthand side and the four memory mats MM arranged at the righthand side are individually arranged inbetween with the X-decoder circuits XDEC. Moreover, the memory block MB2 is made substantially identical to the memory block MB1.

Of the two memory blocks MB1 and MB2, the memory block MB2 arranged at the righthand side of the SRAM is arranged with a redundancy circuit SMB at its righthand, i.e., at the most righthand side of the SRAM.

Each of the memory mats MM dividing the memory block MB1 into eight and each of the memory mats MM dividing the memory block MB2 into eight are individually composed of the four memory cell arrays MAY, as shown in FIG. 2B (presenting an enlarged block diagram showing the essential portion). These four memory cell arrays MAY are individually arrayed in the X direction in the memory mat MM. In short, the SRAM is arranged with totally sixty four memory cell arrays MAY because each of the two memory blocks MB is divided into the eight memory cell arrays MAY and because each of these eight memory cell arrays MAY is composed of fourth memory cell arrays MAY. Those sixty four memory cell arrays MAY are arrayed in the X direction (i.e., along the long sides of the rectangle of the SRAM).

Of the sixty four memory cell arrays MAY, one memory cell array MAY is further divided into four sub-memory cell arrays SMAY, as shown in FIG. 3 (presenting an enlarged block diagram showing the essential portion). These four divided sub-memory cell arrays SMAY are individually arrayed in the X direction. Each of these sub-memory cell arrays SMAY is composed of sixteen memory cells MC which are arrayed in the X direction (i.e., in the word line extending direction). In short, one memory cell array MAY is arranged with totally sixty four (i.e., 64 [bits]) memory cells MC because four sub-memory cell arrays SMAY having sixteen memory cells MC arrayed in the X direction are arranged. Moreover, one memory cell array MAY has one thousand and twenty eight (i.e., 1,028 [bits]) memory cells MC arrayed in the Y direction (i.e., in the complementary data line extending direction). Of the one thousand and twenty eight memory cells MC arrayed in the Y direction, one thousand and twenty four (i.e., 1,024 [bits]) memory cells MC are constructed as the normal memory cells MC (for storing the information actually), whereas the remaining four (i.e., 4 [bits]) are constructed as the redundancy memory cells MC.

As shown in FIG. 2B and FIG. 3, a word driver circuit WDR is arranged between the two memory cell arrays MAY at the lefthand of one memory mat MM and the two memory cell arrays MAY at the righthand side. In each of the memory mats MM, moreover, the two memory cell arrays MAY at the lefthand side and the two memory cell arrays MAY at the righthand side are arranged in symmetry around the word driver circuit WDR with respect to the X direction. The individual word driver circuits WDR of the totally eight memory mats MM of the memory block MB1 arranged at the lefthand side of the SRAM shown in FIG. 2A are selected through the main word lines MWL by the X-decoder circuits XDEC which are arranged between the lefthand four memory mats MM and the righthand four memory mats MM. Likewise, the individual word driver circuits WDR of the totally eight memory mats MM of the memory block MB2 arranged at the righthand side of the SRAM are selected through the main word line MWC by the X-decoder circuits XDEC which are arranged between the lefthand four memory mats MM and the righthand four memory mats MM.

As shown in FIG. 3, the word driver circuits WDR are selected through the main word line MWL by the X-decoder circuits XDEC. Moreover, the sd are selected by address signal lines AL individually arranged therefor. The main word lines MWL extend in the X direction over the memory cell arrays MAY and are arranged in plurality (i.e., 256) in the Y direction for every four (i.e., 4 [bits]) memory cells MC. In other words, the two hundred and fifty six main word lines MWL are arranged in the Y direction so that the X-decoder circuits XDEC select the word driver circuits WDR by selecting one of the main word lines MWL. In one memory mat MM, the main word lines MWL select totally one thousand and twenty four memory cells MC, i.e., the five hundreds and twelve memory cells MC of the two memory cell arrays MAY arranged at the righthand side of the word driver circuits WDR and the five hundreds and twelve memory cells MC of the two memory cell arrays MAY arranged at the lefthand side. The address signal lines AL extend in the Y direction and are arranged in plurality in the X direction. Totally sixteen address signal lines AL are in the memory mats MM, that is, the eight address signal lines AL are arranged to select the memory cells MC of the two memory cell arrays MAY arranged at the righthand side of the word driver circuits WDR, and the eight address signal lines AL are arranged to select the memory cells MC of the two memory cell arrays MAY arranged at the lefthand side.

In the memory mats MM, as shown in FIG. 2B and FIG. 3, the word driver circuits WDR select one pair of first word line WL1 and second word line WL2, which extend over one of the four memory cell arrays MAY. These first word line WL1 and second word line WL2 are arranged at each memory cell array MAY (i.e., at every four sub-memory cell arrays SMAY). The first and second word lines WL1 and WL2 are spaced from each other and extend substantially in parallel in the X direction. The first and second word lines WL1 and WL2 are arranged at each of the memory cells MC arrayed in the Y direction. In other words, one memory cell MC is connected with the two first and second word lines WL1 and WL2 which are fed with a common select signal.

The first word line WL1 and the second word line WL2 extending over such one of the two memory cell arrays MAY arranged at the righthand side of the word driver circuits WDR shown in FIGS. 2B and 3 as is located near the word drive circuit WDR are selected through a second sub-word line SWL2 by the word driver circuit WDR. The first word line WL1 and second word line WL2 extending over the memory cell array MAY apart from the word driver circuit WDR are selected through a first sub-word line SWL1 by the word driver circuit WDR. These first sub-word line SWL1 and second sub-word line SWL2 are spaced from each other and extend in parallel in the X direction. The first and second sub-word lines SWL1 and SWL2 are arranged like the first and second word lines WL1 and WL2 for each of the memory cells MC arrayed in the Y direction. The first sub-word line SWL1 extend over one memory cell array MAY near the word driver circuit WDR to connect the first and second word lines WL1 and WL2 arranged in another remote memory cell array MAY and the word driver circuit WDR.

Each of the two memory cell arrays MAY arranged at the lefthand side of the word driver circuit WDR is arranged like the righthand side with the first word line WL1 and the second word line WL2. These first and second word lines WL1 and WL2 are connected through the first sub-word line SWL1 or the second sub-word line SWL2 with the word driver circuit WDR. Since the second sub-word line SWL2 is shorter than the first sub-word line SWL1, the second sub-word line SWL2 may be abolished from the present invention, and the first and second word lines WL1 and WL2 arranged in the memory cell array MAY closer to the word driver circuit WDR may be connected directly with the word driver circuit WDR.

In the memory mat MM, as shown in FIG. 2B, there are individually arranged over the four memory cell arrays MAY the load circuits LOAD which are divided therefor. Below the four memory cell arrays MAY, there are arranged the Y-decoder circuits YDEC and the Y-switch circuits Y-SW, which are individually divided therefor. Below the four memory cell arrays MAY, there are arranged the sense amplifier circuits SA which are divided therefor. Four sense amplifier circuits SA are arranged for each memory cell array MAY so that they can output information of 4 [bits] (i.e., the information stored in the four memory cells MC) all at once. Below the word driver circuits WDR, there are arranged control circuits CC. In the memory mats MM shown in FIG. 2B, moreover, junction cells for connecting the memory cell arrays MAY, as will be described hereinafter (with reference to FIGS. 12A to 12D), are arranged between the -two memory cell arrays MAY which are arranged at the lefthand and righthand sides of the word driver circuits WDR.

In the memory mat MM, as shown in FIGS. 2B and 3, the memory cell array MAY is arranged with complementary data lines DL. These complementary data lines DL extend in the Y direction intersecting the extending directions of the main word line MWL, the sub-word lines SWL and word lines WL. Each of the complementary data lines DL is composed of two data lines, i.e., the first data line DL1 and the second data line DL2 which are spaced from each other and extend in parallel in the Y direction. These complementary data lines DL are arranged for each of the memory cells MC arrayed in the X direction, as shown in FIG. 3. The complementary data lines DL have their upper ends connected with the load circuits LOAD. The lower other ends of the complementary data lines DL are connected through the Y-switch circuits Y-SW with the sense amplifier circuits SA.

The redundancy circuit SMB arranged at the righthand side of the memory block MB of the SRAM shown in FIG. 2A is arranged with a redundancy memory cell array MAYS, as shown in FIG. 2C (presenting an enlarged block diagram showing the essential portion). This redundancy memory cell array MAYS is arranged with a plurality of redundancy memory cells having the same structure as that of the memory cells MC which are arranged in the aforementioned memory cell array MAY. Although not limitative, the redundancy memory cell array MAYS has thirty two (i.e., 32 [bits]) redundancy memory cells MC arrayed in the X direction and one thousand and twenty four (i.e., 1,024 [bits]) redundancy memory cells MC arrayed in the Y direction.

At the upper side of the redundancy memory cell array MAYS, there are arranged the redundancy load circuits LOAD, as shown in FIG. 2C. The redundancy memory cell array MAYS is arranged at the lefthand side with a redundancy word driver circuit WDRS. The redundancy memory cell array MAYS is arranged at its lower side with the redundancy Y-switch circuits Y-SW.

The peripheral circuits including the direct and indirect peripheral circuits to be packaged in the SRAM, and the memory cells MC to be arrayed in the sub-memory cell array SMAY are basically composed of complementary MISFETs. The SRAM is constructed mainly of an $n^-$-type semiconductor substrate 1 made of single crystal silicon, although its specific sectional structure will be described (with reference to FIG. 6), and adopts the twin well structure, in which an $n^-$-type well region (i.e., Nwell) 3 and a $p^-$-type well region (i.e., Pwell) 2 are individually arranged in the different regions of the principal face of that $n^-$-type semiconductor substrate 1.

In the memory mat MM of the SRAM, as shown in FIG. 3 and FIG. 4 (presenting enlarged block diagrams showing the essential portions), the two memory cell arrays MAY arranged at the lefthand side of the word driver circuit WDR are arranged in one $p^-$-type well region 2. Around the outer periphery of the memory cell array MAY (indicating, in this case, the region in which the memory cells MC are substantially arranged) and in the peripheral region of the $p^-$-type well region 2, there is arranged the guard ring region P-GR which is formed in a planar ring shape along the contour of that $p^-$-type well region 2. The guard ring region P-GR feeds the fixed reference voltage $V_{ss}$ to the $p^-$-type well region 2.

Between the two memory cell arrays MAY arranged at the lefthand side of the word driver circuit WDR, the well contact region PWC1 is arranged over the principal face of the $p^-$-type well region 2. A plurality of well contact regions PWC1 are arrayed each for one of the plurality of memory cells MC (e.g., each for two memory cells MC).

Likewise, in the memory mat MM, the two memory cell arrays MAY arranged at the righthand side of the word driver circuits WDR are arranged in one $p^-$-type well region 2. This $p^-$-type well region 2 is arranged around its periphery with the guard ring region P-GR so that it is fed with the fixed reference voltage $V_{ss}$. Between the two memory cell arrays MAY arranged at the righthand side of the word driver circuit WDR, the well contact region PWC1 is arranged over the principal face of the $p^-$-type well region 2.

In the memory cell array MAY, as shown in FIGS. 3 and 4, the well contact region PWC2 is arranged between the individual ones of the four divided submemory cell arrays SMAY. Like the aforementioned well contact region PWC1, the well contact regions PWC2 are arranged in plurality each for a plurality of memory cells MC (e.g., one for two memory cells MC).

The well contact region PWC1 arranged between the memory cell arrays MAY and the well contact region PWC2 arranged between the sub-memory cell arrays SMAY are arranged to feed the fixed reference voltage $V_{SS}$ to the $p^-$-type well region 2 thereby to stabilize the potential of the $p^-$-type well region 2.

As shown in FIG. 4, in the region to be arranged with the word driver circuits WDR of the memory mat MM, there are alternately arranged in the X direction a plurality of $p^-$-type well regions 2 and a plurality of $n^-$-type well regions 3. The guard ring region P-GR is arranged in the peripheral region of the $p^-$-type well region 2 to be arranged with the word driver circuits WDR, and a guard ring region N-GR is arranged in the peripheral region of the $n^-$-type well region 3.

One memory cell MC arranged in the sub-memory cell array SMAY of the memory cell array MAY shown in FIG. 3 is arranged at each of the intersections between the word lines WL and the complementary data lines DL, as shown in FIG. 5 (presenting a circuit diagram). In other words, the memory cell MC is arranged at the intersection between the first and second word lines WL1 and WL2 and the first and second data lines DL1 and DL2. The memory cell MC is composed of a flip-flop circuit and two transfer MISFETs $Q_{t1}$ and $Q_{t2}$. The flip-flop circuit is constructed as an information latching portion, and the memory cell MC latches the information "1" or "0" of 1 [bit].

The two transfer MISFETs $Q_{t1}$ and $Q_{t2}$ of the memory cell MC individually connect each of the paired input/output terminals of the flip-flop circuit with one semiconductor region. The transfer MISFET $Q_{t1}$ has its other semiconductor region connected with the first data line DL1 and its gate electrode connected with the first word line WL1. The transfer MISFET $Q_{t2}$ has its other semiconductor region connected with the second data line DL2 and its gate electrode connected with the second word line WL2. These two transfer MISFETs $Q_{t1}$ and $Q_{t2}$ are individually formed of n-channel type.

The flip-flop circuit is composed of two drive MISFETs $Q_{d1}$ and $Q_{d2}$ and two load MISFETs $Q_{p1}$ and $Q_{p2}$. The drive MISFETs $Q_{d1}$ and $Q_{d2}$ are individually formed of n-channel type. The load MISFETs $Q_{p1}$ and $Q_{p2}$ are individually formed of p-channel type. In other words, the memory cells MC of the SRAM of the present embodiment are constructed to have a completely complementary MISFET (i.e., the so-called "full CMOS") structure.

The drive MISFET $Q_{d1}$ and the load MISFET $Q_{p1}$ have their drain regions connected with each other and their gate electrodes connected with each other to construct the complementary MISFETs. Likewise, the drive MISFET $Q_{d2}$ and the load MISFET $Q_{p2}$ have their drain regions connected with each other and their gate electrodes connected with each other to construct the complementary MISFETs. The individual drain regions (i.e., the input/output terminals) of the drive MISFET $Q_{d1}$ and the load MISFET $Q_{p1}$ are connected with not only one semiconductor region of the transfer MISFET $Q_{t1}$ but also the individual gate electrodes of the drive MISFET $Q_{d2}$ and the load MISFET $Q_{p2}$. The individual drain regions (i.e., the input/output terminals) of the drive MISFET $Q_{d2}$ and the load MISFET $Q_{p2}$ are connected with not only one semiconductor region of the transfer MISFET $Q_{t2}$ but also the individual gate electrodes of the drive MISFET $Q_{d1}$ and the load MISFET $Q_{p1}$. The individual source regions of the drive MISFETs $Q_{d1}$ and $Q_{d2}$ are connected with the reference voltage $V_{ss}$ (e.g., 0 [V]). The individual source regions of the load MISFETs $Q_{p1}$ and $Q_{p2}$ are connected with the supply voltage $V_{cc}$ (e.g., 5 [V]).

The capacity element C is formed between the paired input/output terminals of the flip-flop circuit of the memory cell MC, i.e., between the two information latching node regions. The capacity element C has its one electrode connected with one information latching node region and its other electrode connected with the other information latching node region. The capacity element C is constructed basically to increase the amount of the charge latched in the information latching node regions thereby to enhance the breakdown voltage to the α-ray soft error. Since, moreover, the capacity element C has its individual electrodes connected between the two information latching node regions, it can be formed with a planar area as large as that of the case, in which two capacity elements are independently formed in the information latching node ares of two positions. In short, the capacity element C can reduce the area occupied by the memory cells MC to improve the degree of integration of the SRAM.

In the SRAM thus constructed, as shown in FIGS. 2A and 2B and FIG. 3, the X-decoder circuit XDEC selects the word driver circuits WDR, which are arranged in the plurality of memory mats of the memory block MB, through one of the twenty eight main word lines MWL, and the first word line WL1 and the second word line WL2 of one memory cell array MAY are selected by the selected word driver circuits WDR. In other words, the SRAM adopts the divided word line system by dividing the first word line WL1 and the second word line WL2 into a plurality in their extending direction and by selecting one set of the divided first word line WL1 and second word line WL2 by the word driver circuit WDR and the X-decoder circuit XDEC. The adoption of the divided word line system can reduce the power consumption of the SRAM because the electric currents to be charged and discharged through the selected word lines WL can be reduced.

In the SRAM, as shown in FIG. 2B and FIG. 3, the first word line WL1 and the second word line WL2 extending in one of the two memory cell array MAY arranged at one end side of the word driver circuit WDR are connected through the second sub-word line SWL2 with the word driver circuit WDR, and the first word line WL1 and the second word line WL2 extending in the other memory cell array MAY are connected through the first sub-word line SWL1 with the word driver circuit WDR. In short, the SRAM adopts the double word line system, in which each memory cell array MAY is arranged with the word lines WL divided therefor and the sub-word lines SWL for connecting the plurality of divided word lines WL. Thanks to the adoption of the double word line system, the resistances between the word driver circuits WDR and the word lines WL can be reduced to an extent corresponding to the sub-word lines SWL so that the charging and discharging rates of the selected word lines WL can be raised to speed up the circuit operation of the SRAM.

The X-decoder circuit XDEC, the Y-decoder circuit YDEC, the Y-switch circuit Y-SW, the sense amplifier circuit SA, the load circuit LOAD and so on, which are arranged in the peripheral region of the memory cell array MAY of the SRAM, constitute the peripheral circuits of the SRAM. These peripheral circuits control the information writing operation, the information latching operation and the information reading operation of the memory cells MC.

Next, the specific structures of the memory cell MC and the memory cell array MAY of the SRAM will be described in the following. The planar structure of the completed state of the memory cell MC is shown in FIG. 7 (presenting a top plan view), and the planar structures of the individual steps in the manufacture process are shown in FIGS. 8A to 8C (presenting top plan views). The sectional structure in the completed state of the memory cell MC is shown in FIG. 6 (presenting a section taken along line I—I of FIG. 7).

As shown in FIGS. 6 and 7, the SRAM is constructed mainly of an $n^-$-type semiconductor substrate 1 made of single crystal silicon. The region of the memory cell array MAY of the $n^-$-type semiconductor substrate 1 is formed in its principal face with a $p^-$-type well region 2. This $p^-$-type well region 2 is formed in not only the region of the memory cell array MAY but also the region to be formed with the n-channel MISFET of the peripheral circuit, as has been described hereinbefore. On the other hand, the region of the principal face of the $n^-$-type semiconductor substrate 1 other than that to be arranged with the p-type well region 2 is formed with an $n^-$-type well region 3.

The inactive region of the $p^-$-type well region 2 arranged with the memory cell array MAY is formed over its principal face with an element isolating insulating film (i.e., a field silicon oxide film) 4. Moreover, the inactive region of the $p^-$-type well region 2 is formed in its principal face, i.e., below the element isolating insulating film 4 with a p-type channel stopper region 5. Likewise, the inactive region of the $n^-$-type well region 3 is formed over its principal face with the element isolating insulating film 4, although not shown in FIGS. 6 and 7 (but shown in FIG. 15). Basically, the principal face of the inactive region of the $n^-$-type well region 3 is not formed with any channel stopper region with a view to simplifying the manufacture process, because an inverted region is more reluctant to occur than the $p^-$-type well region 2 so that the element isolation can be ensured.

One memory cell MC of the s is formed in the principal face of the active region of the $p^-$-type well region 2. The active region is formed in the region which is defined by the element isolating insulating film 4 (especially the end portion of the element isolating insulating film 4) and the p-type channel stopper region 5. Of the memory cell MC, each of the two drive MISFETs $Q_{d1}$ and $Q_{d2}$ is formed in the principal face of the $p^-$-type well region 2 in the region which is defined by the element isolating insulating film 4, as shown in FIGS. 6 and 7 and FIGS. 8A to 8C. Each of the drive MISFETs $Q_{d1}$ and $Q_{d2}$ is formed main of the $p^-$-type well region 2, a gate insulating film 6, a gate electrode 7, a source region and a drain region.

The drive MISFETs $Q_{d1}$ and $Q_{d2}$ have their individual gate length (Lg) set substantially in parallel, and these gate length direction is aligned with the X direction (or the extending direction of the word lines WL). The element isolating insulating film 4 (and the p-type channel stopper region 5 is formed mainly in a position to regulate the individual gate widths (Lw) of the drive MISFETs $Q_{d1}$ and $Q_{d2}$.

The $p^-$-type well region 2 constitutes each of the channel forming regions of the drive MISFETs $Q_{d1}$ and $Q_{d2}$.

In the active region, the gate electrode 7 is formed through the gate insulating film 6 over the channel forming region of the $p^-$-type well region 2. One end of the gate electrode 7 protrudes in the Y direction over the element isolating insulating film 4 to an extent corresponding to the masking margin size at least in the manufacture process. The other end of the gate electrode 7 of the drive MISFET $Q_{d1}$ extends in the Y direction through the element isolating insulating film 4 to over the drain region of the drive MISFET $Q_{d2}$. Likewise, one end of the gate electrode 7 of the drive MISFET $Q_{d2}$ protrudes to over the element isolating insulating film 4, and the other end extends through the element isolating insulating film 4 to over the drain region of the drive MISFET $Q_{d1}$.

The gate electrode 7 is formed at the step of forming the first-layered gate material and made of a single-layered polycrystalline silicon film, for example. This polycrystalline silicon film is doped with an n-type impurity such as P (or As) for reducing the resistance. Since the gate electrode 7 having the single-layered structure can have its thickness reduced, it can flatten the surface of the inter-layer insulating film underlying the upper conductive layer.

The source region and the drain region are respectively formed of a lightly doped n-type semiconductor region 10 and a heavily doped $n^+$-type semiconductor region 11 formed over the principal face of the former. These two kinds of n-type semiconductor region 10 and $n^+$-type semiconductor substrate 11 having different concentrations are formed at the side of the gate length direction of the gate electrode 7 and in self-alignment with respect to -the gate electrode 7 (more accurately the gate electrode 7 and a later-described side wall spacer 9). In short, the drive MISFETs $Q_{d1}$ and $Q_{d2}$ have their individual source regions and drain regions constructed to have the so-called "double drain (i.e., DDD: Double Diffused Drain) structure". The source regions and drain regions of that double drain structure are individually formed in the principal face of the active region of the $p^-$-type well region 2 and in the regions, as enclosed by single-dotted chain lines DDD in FIG. 8A and FIG. 8C.

The source region and drain region are individually made of the n-type semiconductor region 10 which is doped with an n-type impurity such as phosphor (P). The $n^+$-type semiconductor region 11 is made of an n-type impurity such as arsenic (As) having a lower diffusion rate than the aforementioned P. In case, in the manufacture process, a common mask is used to introduce two kinds of n-type impurities at a common step, the different between the individual diffusion distances of the n-type semiconductor region 10 and the $n^+$-type semiconductor region 11 is determined by the diffusion rate difference of the two kinds of n-type impurities. In each of the drive MISFETs $Q_{d1}$ and $Q_{d2}$ adopting the double drain structure, the substantial size of the n-type semiconductor region 10 between the $n^+$-type semiconductor region 11 and the channel forming region in the gate length direction corresponds to the size which is calculated by subtracting the diffusion distance of the $n^+$-type semiconductor region 11 from the diffusion distance of the n-type semiconductor region 10. This n-type semiconductor region 10 is made to have a substantially smaller size in the gate length direction than that of a lightly doped n-type semiconductor region (17) having a later-described LDD (i.e., Lightly Doped Drain) structure and to have a higher impurity concentration than that of the lightly doped n-type semiconductor region (17) having the LDD structure. In other words, each of the drive MISFETs $Q_{d1}$ and $Q_{d2}$ has a higher driving ability (i.e., drivability) than that of the transfer MISfetS $Q_{t1}$ and $Q_{t2}$ adopting the later-described LDD structure because the parasitic resistance to be added to the n-type semiconductor region 10 is lower than that of the n-type semiconductor region (17) of the LDD structure in a current path between the source region and the drain region.

The gate electrode 7 is formed at its side wall of the gate length direction with the side wall spacer 9. This side wall spacer 9 is formed in self-alignment with the gate electrode 7 and is made of an insulating film such as a silicon oxide film.

In the region arranged with an upper conductive layer (13) over the gate electrode 7, two insulating films are sequentially laminated, although not numbered. Of these two insulating films, the lower insulating film is formed as an oxidation mask for preventing the oxidation of the surface of the gate electrode 7 and is made of a silicon nitride film, for example. The upper insulating film mainly isolates the lower gate electrode 7 and the upper conductive layer (13) electrically and is made of a silicon oxide film, for example.

The memory cell MC is arranged in the region, the planar shape of which, i.e. the plan view area associated with each memory cell, is defined by a rectangle enclosed by double-dotted chain lines, as indicated by reference letters MC in FIG. 7 and FIGS. 8A and 8C. The planar shape of the one drive MISFET $Q_{d1}$ of the memory cell MC is formed in central symmetry (and the same shape) with that of the drive MISFET $Q_{d2}$ with respect to the central point or location CP (i.e., the intersection of the diagonals of the rectangle) of the memory cell MC. Incidentally, the central point CP is provided for convenience of description but is not formed actually as a pattern in the memory cell MC of the SRAM.

In the memory cell array MAY or the sub-memory cell array SMAY, as shown in FIG. 7 and FIGS. 8A and 8C, the individual planar shapes of the drive MISFETs $Q_{d1}$ and $Q_{d2}$ of the memory cell MC are formed in linear symmetry with the individual planar shapes of the drive MISFETs $Q_{d1}$ and $Q_{d2}$ of the other memory cell MC with respect to an X1–X3 axis and an X2–X4 axis between the former memory cell MC and the drive MISFETs $Q_d$ adjacent in the X direction aligned with the gate length direction of those drive MISFETs $Q_d$. Likewise, the individual planar shapes of the drive MISFETs $Q_{d1}$ and $Q_{d2}$ of the memory cell MC are formed in linear symmetry with the individual planar shapes of the drive MISFETs $Q_{d1}$ and $Q_{d2}$ of the other memory cell MC with respect to an X1–X2 axis and an X3–X4 axis between the former memory cell MC and the drive MISFETs $Q_d$ adjacent in the Y direction aligned with the gate width direction of those drive MISFETs $Q_d$. In short, the drive MISFETs $Q_d$ of the memory cell MC are linerally symmetric for each of the memory cells MC arrayed in the X and Y directions.

Of the drive MISFETs $Q_d$ of the memory cells MC arrayed in the X direction, the opposed source regions of the drive MISFETs $Q_d$ of the adjoining memory cells MC are made integral (as shown in FIG. 9(B)). In other words, the source regions of the drive MISFETs $Q_d$ of one of the adjoining memory cells MC constitute the source regions of the drive MISFETs $Q_d$ of the other memory cell MC to reduce the area to be occupied by the source regions of the drive MISFETs $Q_d$. Since, moreover, the element isolating insulating film 4 (and the p-type channel stopper region 5) is not interposed between the source regions of the drive MISFETs $Q_d$ of the one memory cell MC and the source regions of the drive MISFETs $Q_d$ of the other memory cell MC opposed to the former, the area to be occupied by the memory cells MC can be reduced to an extent corresponding to the element isolating insulating film 4.

Each of the two transfer MISFETs $Q_{t1}$ and $Q_{t2}$ of the memory cell MC are individually formed over the principal face of the $p^-$-type well region 2 in the regions defined by the element isolating insulating film 4, as shown in FIGS. 6 and 7 and FIGS. 8A to 8C. Each of the transfer MISFETs $Q_{t1}$ and $Q_{t2}$ is formed mainly of the $p^-$-type well region 2, a gate insulating film 12, the gate electrode 13, a source region and a drain region.

The transfer MISFETs $Q_{t1}$ and $Q_{t2}$ have their individual gate length (Lg) directions set substantially in parallel and their individual gate length directions aligned in the Y direction (or the extending direction of the complementary data lines DL). In other words, the individual gate length directions of the transfer MISFETs $Q_{t1}$ and $Q_{t2}$ and the gate length directions of the drive MISFETs $Q_{d1}$ and $Q_{d2}$ intersect generally at a right angle. The element isolating insulating film 4 (and the p-type channel stopper region 5) is formed to regulate the individual gate width (Lw) of the transfer MISFETs $Q_{t1}$ and $Q_{t2}$.

The $p^-$-type well region 2 forms each of the channel forming regions of the transfer MISFETs $Q_{t1}$ and $Q_{t2}$.

The gate electrode 13 is formed in the active region over the channel forming region of the $p^-$-type well region 2 through the gate insulating film 12. The gate electrode 13 is formed at the step of forming the second-layered gate material and is constructed of the three-layered laminated structure (i.e., the so-called "polycide structure") which is formed by laminating a polycrystalline silicon film 13A, a polycrystalline silicon film 13B and a refractory metal silicide film 13C consecutively. The lower polycrystalline silicon film 13A is doped with an n-type impurity such as P (or As) for reducing the resistance. The middle polycrystalline silicon film 13B is doped with an n-type impurity such as P (or As) for reducing the resistance. The upper refractory metal silicide film 13C is made of $WSi_x$ (x: 2), for example. In this gate electrode 13, the upper refractory metal silicide film 13C has a lower specific resistance that those of the lower polycrystalline silicon film 13A and the middle polycrystalline silicon film 13B so that it can speed up the signal transmission rate. Moreover, the gate electrode 13 is constructed of the laminated structure of the polycrystalline silicon film 13A, the polycrystalline silicon film 13B and the refractory metal silicide film 13C and can increase the total sectional area and reduce the resistance so that it can further speed up the signal transmission rate. Incidentally, the upper refractory metal silicide film 13C of the gate electrode 13 may be made of not only the $WSi_x$ but also $MoSi_x$, $TiSi_x$ and $TaSi_x$.

The gate width size of the gate electrode 13 is made smaller than that of the gate electrode 7 of the drive MISFETs $Q_d$, as shown in FIG. 8A. Specifically, the transfer MISFETs $Q_t$ can be made to have a smaller driving ability than that of the drive MISFETs $Q_d$ thereby to earn a $\beta$ ratio so that the memory cells MC can stably latch the information stored in the information latching node region.

Each of the source region and the drain region is formed, as shown in FIG. 6, of a heavily doped $n^+$-type semiconductor region 18 and a lightly doped n-type semiconductor region 17 formed between the former region 18 and the channel forming region. Of these two kinds of different impurity concentrations, the n-type semiconductor region 17 is formed in self-alignment with the gate electrode 13 at the side portion of the gate electrode 13 in the gate length direction. The n-type semiconductor region 17 is made of an n-type impurity such as P having an impurity concentration gradient growing gentle at the pn junction with the channel forming region. The $n^+$-type semiconductor region 18 is formed in self-alignment with a side wall spacer 16 at the side portion of the gate electrode 13 in the gate length direction. The $n^+$-type semiconductor region 18 is made of an n-type impurity such as As capable of reducing the depth (i.e., the junction depth: xj) with the $p^-$-type well region 2. In short, each of the transfer MISFETs $Q_{t1}$ and $Q_{t2}$ is made to have the LDD structure. Each of the transfer MISFETs $Q_{t1}$ and $Q_{t2}$ adopting the LDD structure can reduce the intensity of electric field in the vicinity of the drain region so that it can reduce the amount of hot carriers to be generated thereby to reduce the aging fluctuations of the threshold voltage.

The side wall spacer 16 is formed in self-alignment with respect to the side wall of the gate electrode 13. The side wall spacer 16 is made of an insulating film such as a silicon oxide film.

Over the gate electrode 13, there is formed an insulating film 15. This insulating film 15 is made of a silicon oxide film, for example, mainly by isolating the lower gate electrode 13 and an upper conductive layer (23) electrically. This insulating film 15 is made thicker than the insulating film formed over the gate electrode 7.

As shown in FIG. 8A, the source region or drain region of one transfer MISFET $Q_{t1}$ is made integral with the drain region of the drive MISFET $Q_{d1}$. The transfer MISFET $Q_{t1}$ and the drive MISFET $Q_{d1}$ have their individual gate length directions (or gate width directions) intersecting so that the active region of the drive MISFET $Q_{d1}$ is formed in the X direction (i.e., the direction aligned with the gate length direction) across the integrated portion, and the active region of the transfer MISFET $Q_{t1}$ is formed in the Y direction (i.e., the direction aligned with the gate length direction). In short, the individual active regions of the transfer MISFET $Q_{t1}$ and the drive MISFET $Q_{d1}$ are formed to have generally L-shaped top plan views. Likewise, the source region or drain region of one transfer MISFET $Q_{t2}$ is made integral with the drain region of the drive MISFET $Q_{d2}$. In short, the individual active regions of the transfer MISFET $Q_{t2}$ and the drive MISFET $Q_{d2}$ are formed into generally L-shaped top plan views. The element isolating insulating film 4 (and the p-type channel stopper region 5 is formed in the outer periphery of the integrated transfer MISFETs $Q_t$ and drive MISFETs $D_d$, i.e., around the aforementioned L-shaped active regions and positioned to define the regions.

The individual planar shapes of the transfer MISFETs $Q_{t1}$ and $Q_{t2}$ are formed, in the memory cell MC, in central symmetry with respect to the central point CP like the relations of the drive MISFETs $Q_{d1}$ and $Q_{d2}$. Specifically, as shown in FIG. 8A, the memory cell MC is constructed such that the transfer MISFET $Q_{t1}$ and the drive MISFET $Q_{d1}$ integrated with the former and the transfer MISFET $Q_{t2}$ and the drive MISFET $Q_{d2}$ integrated with the former are in central symmetry with respect to the central point or location CP. The memory cell MC has its drive MISFETs $Q_{d1}$ and $Q_{d2}$ arranged between the transfer MISFETs $Q_{t1}$ and $Q_{t2}$ and opposed to each other. In other words, the transfer MISFET $Q_{t1}$ and the drive MISFET $Q_{d1}$, and the transfer MISFET $Q_{t2}$ and the drive MISFET $Q_{d2}$ of the memory cells MC are isolated only by the element isolating insulating film 4 and the p-type channel stopper region 5, which are arranged between the drive MISFETs $Q_{d1}$ and $Q_{d2}$, so that the spacing size is determined only by the width size of the element isolating insulating film 4.

In the memory cell array MAY or the sub-memory array SMAY, as shown in FIGS. 7 and 8A, the transfer MISFETs $Q_{t1}$ and $Q_{t2}$ of the memory cell MC have their individual planar shapes formed in linear symmetry with the individual planar shapes of the transfer MISFETs $Q_{t1}$ and $Q_{t2}$ of the other memory cell MC with respect to the X1-X2 axis and the X3-X4 axis of the other memory cell MC adjoining in the Y direction aligned with the gate length direction of those transfer MISFETs $Q_t$. Likewise, the transfer MISFETs $Q_{t1}$ and $Q_{t2}$ of the memory cell MC have their individual planar shapes formed in linear symmetry with the individual planar shapes of the transfer MISFETs $Q_{t1}$ and $Q_{t2}$ of the other memory cell MC with respect to the X1-X3 axis and the X2-X4 axis of the other memory cell MC adjoining in the X direction aligned with the gate width direction of those transfer MISFETs $Q_t$. In short, the transfer MISFETs $Q_t$ of the memory cell MC are formed in linear symmetry for each of the arrayed memory cells MC individually in the X and Y directions.

Of the transfer MISFETs $Q_t$ of the memory cells MC arrayed in the Y direction, the transfer MISFETs $Q_t$ of the adjoining memory cells MC have their facing other drain regions or source regions made integral with each other (as shown in FIG. 9C). In other words, the other drain region or source region of the transfer MISFETs $Q_t$ of one of the adjoining memory cells MC constitutes the other drain region or source region of the transfer MISFETs $Q_t$ of the other memory cell MC so that the area to be occupied by the other drain region or source region of the transfer MISFETs $Q_t$ can be reduced. Moreover, no element isolating insulating film 4 is interposed between the other drain region or source region of the transfer MISFETs $Q_t$ of one memory cell MC and the other drain region or source region of the transfer MISFETs $Q_t$ of the other memory cell MC facing the former so that the area to be occupied by the memory cells MC can be reduced to an extent corresponding to that element isolating insulating film 4.

The individual gate electrodes 13 of the transfer MISFETs $Q_{t1}$ and $Q_{t2}$ of the memory cell MC are connected with the word lines (WL) 13 in the X direction aligned with their gate width direction, as shown in FIGS. 7 and 8A. The word lines 13 are made integrated with the gate electrodes 13 and formed of a common conductive layer. In the memory cell MC, the first word line (WL1) 13 is connected with the gate electrode of the transfer MISFET $Q_{t1}$ and is extended substantially linearly in the X direction over the element isolating insulating film 4. The second word line (WL2) 13 is connected with the gate electrode 13 of the transfer MISFET $Q_{t2}$ and is extended substantially linearly in the X direction. In short, one memory cell MC is arranged with the two word lines, i.e., the first word line 13 and the second word line 13 which are spaced from each other and extended in parallel in the same X direction. In the memory cell array MAY, the planar shape of the first word line 13 and the second word line 13 are formed in linear symmetry in the X direction with respect to the aforementioned X1-X3 axis and X2-X4 axis. Moreover, the planar shape of the first word line 13 and the second word line 13 are formed in linear symmetry in the Y direction with respect to the X1-X2 axis and the X3-X4 axis.

The first word line (WL1) 13 intersects the portion protruding over the element isolating insulating film 4 in the direction aligned with the gate width direction of the gate electrode 7 of the drive MISFET $Q_{d1}$ of the memory cell MC, as shown in FIGS. 6 and 8A. Likewise, the second word line (WL2) intersects the portion protruding over the element isolating insulating film 4 in the direction aligned with the gate width direction of the gate electrode 7 of the drive MISFET $Q_{d2}$.

Moreover, the reference voltage line (i.e., the source line: $V_{ss}$) is arranged between the first word line (WL1) 13 and the second word line (WL2) 13 arranged in the memory cell MC. The reference voltage line 13 is arranged each in the memory cell MC so that it acts as a common source line between the drive MISFETs $Q_{d1}$ and $Q_{d2}$ of the memory cell MC. The reference voltage line 13 is formed of the same conductive layer as that of the word line 13 and is extended substantially linearly in the X direction over the element isolating insulating film 4 but at a spacing from the word line 13. In the memory cell array MAY or the sub-memory cell array SMAY, the planar shape of the reference voltage line 13 is made linearly symmetric in the X direction with respect to the X1-X3 axis and the X2-X4 axis. Moreover, the planar shape of the reference voltage line 18 is made linearly symmetric in the Y direction with respect to the X1-X2 axis and the X3-X4 axis.

The reference voltage line 13 intersects the portion protruding in the direction aligned with the gate width direction of the individual gate electrodes 7 of the drive MISFETs $Q_{d1}$ and $Q_{d2}$ of the memory cell MC over the element isolating insulating film 4 between the drive MISFETs $Q_{d1}$ and $Q_{d2}$, as shown in FIGS. 6 and 8A.

The reference voltage line 13 is connected with the individual source regions (i.e., $n^+$-type semiconductor substrate 11) of the drive MISFETs $Q_{d1}$ and $Q_{d2}$, as shown in FIGS. 6 and 7 and FIG. 8A. The reference voltage lines 13 are connected through connection holes 14 which are formed in the insulating film 12 formed at the same step as that of forming the gate insulating film 12 of the transfer MISFETs $Q_t$ over the source region of the drive MISFETs $Q_d$, as shown especially in FIG. 8A. The reference voltage line 13 is constructed to have the three-layer laminated structure, as has been described hereinbefore, and the connection holes 14 are also formed in the lower polycrystalline silicon film 13A of the reference voltage line 13 after this polycrystalline silicon film 13A has been formed. In other words, the reference voltage line 13 connects the middle polycrystalline silicon film 13B directly with the source region through the connection holes 14, which are formed in the lower polycrystalline silicon film 13A and the lower insulating film 12, and the upper refractory metal silicide film 13C with the source region through that middle polycrystalline silicon film 13B.

The connection structure of the reference voltage line 13 with the source region of the drive MISFETs $Q_d$ will be described hereinafter in accordance with the sequences of the steps of forming it when the manufacture process is to be described. After the lower polycrystalline silicon film 13A has been formed, the connection holes 14 are formed in the lower polycrystalline silicon film 13A and the insulating film 12 so that the surface of the gate insulating film of the transfer MISFETs $Q_t$ can be protected with the lower polycrystalline silicon film 13A when the photolithography technology and the etching technology are to be applied. In other words, the degradation of the gate insulating film 12 of the transfer MISFETs $Q_t$ can be prevented to improve the breakdown voltage of the gate insulating film 12.

Moreover, the connection structure of the reference voltage line 13 with the source region of the drive MISFETs $Q_d$ abolishes the direct connection between the source region and the upper refractory metal silicide film 13C and interposes the middle polycrystalline silicon film 13B inbetween so that it can reduce the contact resistance between the source region and the reference voltage line 13. The middle polycrystalline silicon film 13B of the reference voltage line 13 is more doped with an impurity reducing the resistance than the lower polycrystalline silicon film 13A with a view to reducing that contact resistance. On the contrary, the lower polycrystalline silicon film 13A of the reference voltage line 13 is less doped with an impurity reducing the resistance than the middle polycrystalline silicon film 13B with a view to improving the breakdown voltage of the gate insulating film of the transfer MISFETs $Q_t$.

The capacity element C arranged in the memory cell MC is constructed mainly by laminating the first electrode 7, a dielectric film 21 and a second electrode 23 consecutively, as shown in FIGS. 6 and 7 and FIG. 8B. In short, the capacity element C is constructed to have the stacked (or laminated) structure. The memory cell MC is equipped mainly with the two capacity elements C, which are connected in parallel between the information latching node regions of the memory cell MC.

The first electrode 7 of the capacity element C is formed of a portion of the gate electrode (i.e., the polycrystalline silicon film formed at the step of forming the first-layered gate material) of the drive MISFETs $Q_d$. In other words, the gate electrode 7 of the one drive MISFET $Q_{d1}$ of the memory cell MC constitutes the first electrode 7 of one of the two capacity elements C. The gate electrode 7 of the other drive MISFET $Q_{d2}$ constitutes the first electrode 7 of the other capacity element C.

The dielectric film 21 is formed over the aforementioned first electrode (i.e., the gate electrode) 7. The dielectric film 21 is formed in the regions other than the first electrode 7. Over this first electrode 7, the regions defined by the first word line (WL1) 13 and the reference voltage line 13 and the regions defined by the second word line (WL2) and the reference voltage line 13 are used as a substantial dielectric film 21 of the capacity element C. This dielectric film 21 is made of a silicon oxide film, for example.

The second electrode 23 is formed over the aforementioned first electrode 7 through the dielectric film 21. The second electrode 23 of the capacity element C is exemplified, like the aforementioned dielectric film 21, by the regions which are individually defined by the word line (WL) 13 and the reference voltage line 13. The second electrode 23 is formed, at the step of forming the third-layered gate material, of a single-layered polycrystalline silicon film, for example. This polycrystalline silicon film is doped with an n-type impurity such as P (or As) for reducing the resistance.

In other words, the capacity element C is constructed of the capacity element C, which uses the gate electrode 7 of the drive MISFET $Q_{d1}$ as the first electrode 7 and which is arranged in the region of the drive MISFET $Q_{d1}$, and the capacity element C which uses the gate electrode 7 of the drive MISFET $Q_{d2}$ as the first electrode 7 and which is arranged in the region of the drive MISFET $Q_{d2}$. The second electrode 23 of the capacity element C is also constructed as the gate electrode 23 of the load MISFET $Q_p$, as will be described hereinafter. Moreover, the second electrode 23 of the capacity element C is also constructed as the conductive layer (i.e., the middle conductive layer or the connecting conductive layer) 23 for connecting the drain region (i.e., the n-type channel forming region 26N in fact) of the load MISFET $Q_p$ and one semiconductor region of the transfer MISFETs $Q_t$, the drain region of the drive MISFETs $Q_d$, and the gate electrode 7 of the drive MISFETs $Q_d$.

The second electrode 23 of one capacity element C arranged in the region of the drive MISFET $Q_{d1}$ is connected with the drain region (11) of the drive MISFET $Q_{d1}$, one semiconductor region (18) of the transfer MISFET $Q_{t1}$, and the gate electrode 7 of the drive MISFET $Q_{d2}$. These connections are accomplished through the conductive layer 23, which is extracted from the second electrode 23 of the capacity element C in the X direction aligned with the gate length direction of the drive MISFET $Q_{d1}$ and which is integrally made of the same layer as that of the second electrode 23. The conductive layer 23 is connected with the drain region (11), the one semiconductor region (18) and the gate electrode 7 through connection holes 22 which are formed by removing the insulating film 21 (i.e., the same as that of the dielectric film 21) and the insulating film 12. Likewise, the second electrode 23 of the other capacity element C arranged in the region of the drive MISFET $Q_{d2}$ is connected with the drain region (11) of the drive MISFET $Q_{d2}$, the one semiconductor region (18) of the transfer MISFET $Q_{t2}$, and the gate electrode 7 of the drive MISFET $Q_{d1}$. These connections are accomplished through the conductive layer 23 which is extracted from the second electrode 23 of the capacity element C in the direction aligned with the gate length direction of the drive MISFET $Q_{d2}$. The conductive layer 23 is connected through the connection holes 22 with the aforementioned drain region (11), the one semiconductor region (18) and the gate electrode 7.

In the memory cell array MAY or the sub-memory cell array SMAY, the capacity element C of the memory cells MC arrayed in the X direction has its second electrode 23 (and the conductive layer 23) formed to have a planar shape in linear symmetry with respect to the X1–X3 axis and the X2–X4 axis, as shown in FIGS. 7 and 8B. On the other hand, the capacity element C of the memory cells MC arrayed in the Y direction has its second electrode 23 formed in its planar shape not in the linear symmetry unlike the linear symmetric array of the aforementioned drive MISFETs $Q_d$ and the transfer MISFETs $Q_t$. In other words, with respect to the array of the second electrodes 23 of the capacity elements C of the plurality of memory cells MC arrayed in the X direction, the capacity elements C of the plurality of memory cells MC arrayed in the X direction at the step adjacent in the Y direction are formed to have the second electrodes 23 in its planar shape in linear symmetry in the X direction, like the second electrodes 23 at the prior step, and the planar shapes of the second electrodes 23 are offset in the X direction to an extent of one memory cell MC (i.e., one memory cell pitch) from the array of the memory cells MC of the prior step. In the memory cell array MAY, the array of the second electrodes 23 (and the conductive layer 23) of the capacity element C of the aforementioned memory cells MC is determined in the non-linear symmetry by the non-linear symmetry of the planar shape of the supply voltage line ($V_{cc}$: 26P) and the load MISFETs $Q_p$ formed mainly over the second electrode 23, as will be described hereinafter.

The two load MISFETS $Q_{p1}$ and $Q_{p2}$ of the memory cell MC are individually formed over the region of the drive MISFETs $Q_d$, as shown in FIGS. 6 and 7 and FIG. 8B. The load MISFET $Q_{p1}$ is formed over the region of the drive MISFET $Q_{d2}$, and the load MISFET $Q_{p2}$ is formed over the region of the drive MISFET $Q_{d1}$. The load MISFETs $Q_{p1}$ and $Q_{p2}$ are individually arranged to have their gate length directions substantially at a right angle with respect to the directions aligned with the individual gate length directions of the drive MISFETs $Q_{d1}$ and $Q_{d2}$. Each of those load MISFETs $Q_{p1}$ and $Q_{p2}$ is formed mainly of an n-type channel forming region 26N, a gate insulating film 24, the gate electrode 23, a source region 26P and a drain region 26P.

The gate electrode 23 is formed of the second electrode (i.e., the polycrystalline silicon film formed at the step of forming the third-layered gate material) 23 of the aforementioned capacity element C. In other words, the second electrode 23 of one capacity element C arranged in the region of the drive MISFET $Q_{d1}$ constitutes the gate electrode 23 of the load MISFET $Q_{p2}$. The second electrode 23 of the other capacity element C arranged in the region of the drive MISFET $Q_{d2}$ constitutes the gate electrode 23 of the load MISFET $Q_{p1}$.

The gate insulating film 24 is formed over the gate electrode 23. The gate insulating film 24 is formed of a silicon oxide film, for example.

The n-channel type forming region 26N is formed over the gate electrode 23 through the gate insulating film 24. The n-channel forming region 26N is arranged to have its gate length direction generally aligned with the direction which is aligned with the gate width direction of the drive MISFETs $D_d$. The n-type channel forming region 26N is formed at the step of forming the fourth-layered gate material and is made of a polycrystalline silicon film, for example. This polycrystalline silicon film is doped with an n-type impurity (e.g., P) for setting the threshold voltage of the load MISFETs $Q_p$ to an enhancement type. The load MISFETs $Q_p$ can feed the supply voltage $V_{cc}$ sufficiently to the information latching node region, when it is operative (or turned ON), to latch the information stably. When inoperative (or turned OFF), the load MISFETs $Q_p$ can break the feed of the supply voltage $V_{cc}$ to the information latching node region substantially without fail so that they can reduce the standby current flow and accordingly the power consumption. In this regard, the load MISFETs $Q_p$ are different from loading high resistance elements (because these loading high resistance elements always allow a weak current to flow therethrough).

The source region 26P is formed of a p-type conductive layer (26P) which is made of the same conductive layer integrally with one end (i.e., at the source region side) of the n-type channel forming region 26N. In other words, the source region (i.e., the p-type conductive layer) 26P is formed of the polycrystalline silicon film, which is formed at the step of forming the fourth-layered gate material, and the polycrystalline silicon film is doped with a p-type impurity (e.g., $BF_2$). The source region 26P is formed in the region which is enclosed by single-dotted chain lines, as indicated at 26P in FIG. 8B (while its portion is formed as the supply voltage line 26P). The drain region 26P is made integral with the other end (i.e., the drain side) of the n-type channel forming region 26N and is formed of the p-type conductive layer (26P) formed, like the source region 26P, of the same conductive layer. The drain region 26P is formed in the region which is enclosed by single-dotted chain lines, as indicated at 26p. In short, in the later-described manufacture process, the region 26p enclosed by the single-dotted chain lines is doped with a p-type impurity for forming the source region and the drain region 26P, and the remaining regions are formed as the n-type channel forming region 26N.

The drain region 26P of the load MISFET $Q_{p1}$ is connected with the one semiconductor region of the transfer MISFET $Q_{t1}$, the drain region of the drive MISFET $Q_{d1}$, and the gate electrode 7 of the drive MISFET $Q_{d2}$. Likewise, the drain region 26P of the load MISFET $Q_{p2}$ is connected with the one semiconductor region of the transfer MISFET $Q_{t2}$, the drain region of the drive MISFET $Q_{d2}$, and the gate electrode 7 of the drive MISFET $Q_{d1}$. These connections are accomplished through the conductive layer 23.

Moreover, the drain region 26P of the load MISFETs $Q_p$ is isolated through the n-type channel forming region 26N from the gate electrode 23. In other words, the load MISFETs $Q_p$ are isolated with the gate electrodes 23 and the drain regions 26P having no overlap. In short, the drain regions 26P of the load MISFETs $Q_p$ are constructed to have an offset structure. The load MISFETs $Q_p$ of the offset structure can improve the breakdown voltage between the n-type channel forming region 26N and the drain region 26P. Specifically, that offset structure is enabled to improve the breakdown voltage of the pn junction between the drain region 26P and the n-type channel forming region 26N by isolating the drain region 26P from the n-type channel forming region 26N from which the charge is to be induced by the gate electrode 23. In case of the present embodiment, the load MISFETs $Q_p$ are formed to have an offset size (or isolating size) of about 0.6 [$\mu$m] or more.

The conductive layer 23 is constructed, as has been described hereinbefore, to extract of the second electrode 23 of the capacity element C (i.e., the polycrystalline silicon film formed at the step of forming the third-layered gate material). The conductive layer 23 is formed of the same conductive layer as that of the gate electrode 23 of the load MISFETs $Q_p$. The conductive layer 23 is connected with the p-type drain region 26P of the upper load MISFETs $Q_p$ through connection holes 25 which are formed in the interlayer insulating film 24. As has been described hereinbefore, moreover, the conductive layer 23 is connected through the connection holes 22 with the one semiconductor region of the transfer MISFETs $Q_t$, the drain region and the gate electrode 7 of the drive MISFETs $Q_d$. The conductive layer 23 thus constructed can isolate the other end of the drain region 26P of the load MISFETs $Q_p$, the one semiconductor region (18) of the transfer MISFETs $Q_t$ and the drain region (11) of the drive MISFETs $Q_d$ to an extent corresponding to the film thickness of the conductive layer 23 and the size between the positions of the upper connection holes 25 and the lower connection holes 22 of the conductive layer 23. The conductive layer 23 is formed of the polycrystalline silicon film doped with the n-type impurity so that it can increase the diffusion distances to the one semiconductor region (18) of p-type impurity forming the aforementioned p-type drain region 26P and the drain region (11). In other words, the conductive layer 23 can reduce the diffusions of the p-type impurity of the drain region 26P of the load MISFETs $Q_p$ into the individual channel forming regions of the transfer MISFETs $Q_t$ and the drive MISFETs $Q_d$ thereby to prevent the fluctuations of the individual threshold voltages of the transfer MISFETs $Q_t$ and the drive MISFETs $Q_d$. The aforementioned conductive layer 23 is formed of the gate electrode 23 of the load MISFETs $Q_p$, the second electrode 23 of the capacity element C or the same conductive layer (at the same forming step) as the conductive layer 23 extracted from the former so that it can reduce the number of the conductive layers structurally or the number of steps of the manufacture process.

As shown in FIGS. 6 and 7 and FIG. 8B, the supply voltage line ($V_{cc}$) 26P is connected with the source region (i.e., the p-type conductive layer 26P) of the load MISFETs $Q_p$. The supply voltage line 26P is made integral with the p-type conductive layer 26P or the source region and is formed of the same conductive layer. In other words, the supply voltage line 26P is made of a polycrystalline silicon film formed at the step of forming the fourth-layered gate material, and the polycrystalline silicon film is doped with a p-type impurity (e.g., $BF_2$) for reducing the resistance.

Two supply voltage lines ($V_{cc}$) 26P are arranged in the memory cell MC. These two supply voltage lines 26P are extended, in the memory cell array MAY and the sub-memory cell array SMAY, at a spacing from each other and generally in parallel in the identical X direction. The one supply voltage line 26P arranged in the memory cell MC is made integral with the source region of the load MISFET $Q_{p2}$ and is extended over the first word line (WL1) 13 and in the direction aligned with the extending direction of the word line 13. The other supply voltage line 26P is made integral with the source region of the load MISFET $Q_{p1}$ and is extended over the second word line (WL2) 13 in the direction aligned with the extending direction of the word line 13.

In the memory cell MC, as shown in FIGS. 7 and 8B, one supply voltage line 26P is extended in the X direction and bypasses in the Y direction the connection portion (i.e., a later-described middle conductive layer 29) between the other semiconductor region (18) of the transfer MISFET $Q_{t1}$ and the first data line (DL1: 33) of the complementary data line DL. In other words, one supply voltage line 26P does not pass between the load MISFET $Q_{p1}$ of the memory cell MC and the connection portion but passes and bypasses between the connection portion and the load MISFET $Q_{p1}$ of the other memory cell MC adjacent in the Y direction (i.e., arranged in the middle and upper portions shown in FIG. 8B). On the other hand, the one supply voltage line 26P is also used as the one supply voltage line 26P of the other memory cell MC adjoining in the Y direction (i.e., arranged in the middle and upper portions shown in FIG. 8B). Likewise, the other supply voltage line 26P is extended in the X direction and bypasses in the Y direction the connection portion (i.e., a later-described middle conductive layer 29) between the other semiconductor region (18) of the transfer MISFET $Q_{t2}$ and the second data line (DL2: 33) of the complementary data line DL. The other supply voltage line 26P bypasses between the load MISFET $Q_{p2}$ of the memory cell MC and the connection portion but does not pass between the connection portion and the load MISFET $Q_{p2}$ of the other memory cell MC adjacent in the Y direction (arranged in the middle and lower portions shown in FIG. 8B). Likewise, the other supply voltage line 26P is also used as the other supply voltage line 26P of the other memory cell MC adjacent in the Y direction (arranged in the middle and lower portions shown in FIG. 8B). In short, one memory cell MC is arranged with the two supply voltage lines 26P, which are individually used as the individual supply voltage lines 26P of the other memory cells MC adjacent in the Y direction at the upper and lower portions, so that one memory cell MC is arranged with substantially one supply voltage line 26P.

The two supply voltage lines 26P arranged in the memory cell MC are formed, in the memory cell array MAY and the sub-memory cell array SMAY, to have their planar shape in linear symmetry in the X direction with respect to the X1–X3 axis and the X2–X4 axis shown in FIG. 8B. Moreover, the two supply voltage lines 26P arranged in the memory cell MC are formed to have their planar shape in non-linear symmetry in the Y direction unlike the linear symmetric array of the aforementioned drive MISFETs $Q_d$ and the transfer MISFETs $Q_t$ and like the array of the second electrodes 23 of the capacity elements C. In other words, with respect to the planar shape of the supply voltage lines 26P extending on the plurality of memory cells MC arrayed in the X direction, the supply voltage lines 26P extending in the memory cells MC arrayed in the X direction at a step adjacent in the Y direction are formed in linear symmetric in the X direction like the supply voltages 26P extending in the memory cells MC at the prior step and are offset in the column direction to an extent corresponding to one memory cell MC (i.e., one memory cell pitch) from the supply voltage lines 26P extending in the memory cell at the prior step. In the memory cell array MAY or the sub-memory array SMAY, the bypass of the connection portion (i.e., the middle conductive layer 29) of the supply voltage lines 26P between the other semiconductor region of the transfer MISFETs $Q_t$ and the complementary data lines DL is wholly accomplished at an upper side in the same Y direction.

Of the capacity elements C arranged in the aforementioned memory cell MC, as shown in FIG. 8B, the second electrode 23 (and the conductive layer 23) of the capacity element C arranged over the drive MISFET $Q_{d1}$ bypasses one supply voltage line 26P in the connection portion (i.e., the middle conductive layer 29) to the upper other memory cell MC thereby to reduce the spacing size between the connection portion and the load MISFET $Q_{p1}$ so that the planar shape of the memory cell MC is reduced to an extent corresponding to that reduced size. Moreover, the second electrode 23 (and the conductive layer 23) arranged over the drive MISFET $Q_{d2}$ of the memory cell MC causes the other supply voltage line 26P in the connection portion (i.e., the middle conductive layer 29) to bypass into the memory cell MC so that the other supply voltage line 26P is caused to pass between the connection portion and the load MISFET $Q_{p2}$. As a result, the planar shape of the memory cell MC is increased to an extent corresponding to the passage of the other supply voltage line 26P. In other words, the supply voltage line 26P never fails to extend over the memory cell MC (0r utilize the area occupied by the memory cell MC) with a view to improving the degree of integration. In case, therefore, the supply voltage line 26P refers to the planar shape of the second electrode 23 (and the conductive layer 23) of the capacity element C arranged over the drive MISFET $Q_{d2}$ at the side for the supply voltage line 26P to bypass the memory cell MC, the planar shape of the second electrode 23 (and the conductive layer 23) of the capacity element C arranged over the drive MISFET $Q_{d1}$ is reduced because the supply voltage line 26P does not bypass the memory cell MC. As a result, in case the second electrode 23 (and the conductive layer 23) of the capacity element C of the memory cell MC is arranged in linear symmetry in the X direction (i.e., the X1–X2 axis or the X3–X4 axis), the planar shape of the second electrode 23 arranged over the drive MISFET $Q_{d2}$ determines the planar shape of all the second electrodes (over the drive MISFET $Q_{d1}$) so that the area to be occupied by the memory cell MC is increased. As has been described hereinbefore, however, the supply voltage lines 26P are arranged in non-linear symmetry in the Y direction, and the planar shape of the second electrode 23 over the drive MISFET $Q_{d1}$ is reduced so that the area to be occupied by the memory cell MC can be reduced to an extend corresponding to that reduction.

The other semiconductor region (18) of the transfer MISFETs $Q_t$ of the memory cells MC is connected with the complementary data line (DL) 33, as shown in FIGS. 6 and 7. The one transfer MISFET $Q_{t1}$ of the memory cells MC is connected with the first data line (DL1) of the complementary data line 33. The other transfer MISFET $Q_{t2}$ is connected with the second data line (DL2) of the complementary data line 33. The individual connections between the other semiconductor regions of the transfer MISFETs $Q_t$ and the complementary data lines 33 are accomplished through the middle conductive layers 23 and 29 which are sequentially laminated from the lower to upper layers.

The middle conductive layer 23 is formed over the interlayer insulating film 21, as shown in FIGS. 6 and 7 and 8B. This middle conductive layer 23 is partially connected in the region defined by the side wall spacer 16 with the other semiconductor region (18) of the transfer MISFETs $Q_t$ through the connection holes 22 formed in the interlayer insulating film 21. The connection holes 22 are formed to have larger (at the side of the gate electrode 12) opening sizes than those in the region defined by the side wall spacer 16. This side wall spacer 16 is formed, as has been described hereinbefore, in self-alignment with the side wall of the gate wall 12 of the transfer MISFETs $Q_t$. In short, the middle conductive layer 23 has its portion connected, in the position determined by the side wall spacer 16 and in self-alignment with the same, with the other semiconductor region of the transfer MISFETs $Q_t$. The other portion of the middle conductive layer 23 is extracted onto the interlayer insulating film 21 at least to an extent corresponding to the masking spare size of the manufacture process of the middle conductive layer 23 and the upper middle conductive layer 29. Even in case a masking displacement of the manufacture process occurs in the other semiconductor region of the transfer MISFETs $Q_t$ and the middle conductive layer 23, this layer 23 absorbs the masking displacement so that it can be apparently connected in self-alignment with the other semiconductor region of the transfer MISFETs $Q_t$.

The middle conductive layer 23 is formed of the same conductive layer as that of the gate electrode 23 of the load MISFET $Q_p$, the second electrode 23 of the capacity element C and the conductive layer 23. In short, the middle conductive layer 23 is formed of a polycrystalline silicon film formed at the step of forming the third-layered gate material, and this polycrystalline silicon film is doped with an n-type impurity for reducing the resistance.

The middle conductive layer 29 is formed over an interlayer insulating film 27, as shown in FIGS. 6 and 7. The middle conductive layer 29 has its one end connected with the middle conductive layer 23 through connection holes 28 formed in the interlayer insulating film 27. The middle conductive layer 23 is connected with the other semiconductor region of the transfer MISFETs $Q_t$, as has been described hereinbefore. The other end of the middle conductive layer 29 is extracted in the X direction and is connected with the complementary data line 33 through connection holes 31 formed in an interlayer insulating film 30.

The middle conductive layer 29 having its one end connected with the other semiconductor region of the transfer MISFET $Q_{t1}$ is extracted in the X direction to below the first data line (DL1) 33 of the complementary data lines 33 extending in the Y direction over the other semiconductor region of the transfer MISFET $Q_{t2}$ and is connected in its extracted region with the first data line 33. Likewise, the middle conductive layer 29 having its one end connected with the other semiconductor region of the transfer MISFET $Q_{t2}$ is extracted in the X direction to below the second data line (DL2) 33 of the complementary data lines 33 extending in the Y direction over the other semiconductor region of the transfer MISFET $Q_{t1}$ and is connected in its extracted region with the second data line 33. In short, the middle conductive layer 29 constitutes a crosslinking wiring structure connecting the transfer MISFETs $Q_{t1}$ and $Q_{t2}$ of the memory cell MC and the first data line 33 and the second data line 33 extending in the reverse positions in the X direction.

The middle conductive layer 29 is formed of a refractory metal film such as a W film which has been formed at the step of forming a first-layered metal material in the manufacture process, although its forming process will be described hereinafter. This W film has a lower specific resistance than those of the polycrystalline silicon film and the refractory metal silicide film.

The interlayer insulating film 27 underlying that middle conductive layer 29 is formed of a composite film which is prepared by laminating a silicon oxide film 27A and a BPSG (i.e., Boron-doped Phospho-Silicate Glass) film 27B sequentially, as shown in FIG. 6. The upper BPSG film 27B of the interlayer insulating film 27 is subjected to the glass flow to have a flattened surface.

The aforementioned interlayer insulating film 30 is constructed of the three-layer laminated structure which is prepared by laminating a deposit type silicon oxide film 30A, an applied type silicon oxide film 30B and a deposit type silicon oxide film 30C sequentially, as shown in FIG. 6. The lower silicon oxide film 30A and the upper silicon oxide film 30C are deposited by the plasma CVD (i.e., Chemical Vapor Deposition) method using tetraethoxysilane (i.e., TEOS: Tetra Ethoxy Silane) gas as its source gas, as will be described hereinafter. The lower silicon oxide film 30A is deposited to have a uniform film thickness along the underlying step shape so that it is reluctant to establish the overhang above the underlying recessed step portion. In short, the lower silicon oxide film 30A can reduce the cavity based on the aforementioned overhang. The middle silicon oxide film 30B is applied by the SOG (i.e., Spin On Glass) method and is etched (or etched back) all over its surface after the baking treatment. This middle silicon oxide film 30B is formed (or left) concentratedly in the step portion of the surface of the lower silicon oxide film 30A to flatten the surface of the interlayer insulating film 30. The middle silicon oxide film 30B is basically formed in the step portion of the surface of the lower silicon oxide film 30A, excepting the regions of the connection holes 31 connecting the aforementioned middle conductive layer 29 and complementary data lines 33. In short, the complementary data lines (of aluminum alloy) 33 can be prevented from being corroded with the moisture contained in the middle silicon oxide film 30B. The upper silicon oxide film 30C coats the surface the middle silicon oxide film 30B so that it can prevent the quality of the silicon oxide film 30B from degrading.

The complementary data lines (DL) 33 are formed over the interlayer insulating film 30, as shown in FIG. 6. These complementary data lines 33 are connected through the connection holes 31 with the extracted portions of the middle conductive layer 29. The complementary data lines 33 are formed at the step of forming the second-layered metal material in the manufacture process. The complementary data lines 33 are constructed to have the three-layer laminated structure which is prepared by laminating a lower metal film 33A, a middle aluminum alloy film 33B and an upper metal film 33C sequentially. The lower metal film 33A is basically formed as a barrier metal film for preventing the so-called "alloy spike", i.e., the mutual diffusions the silicon (Si) of the other semiconductor region (18) of the transfer MISFETs $Q_t$ and the middle conductive layer 23 and the aluminum (Al) of the middle aluminum alloy film 33B. The lower metal film 33A is formed of a TiW film, for example. The middle aluminum alloy film 33B has a lower specific resistance than those of the polycrystalline silicon film, the refractory metal film and the refractory metal silicide film. The aluminum alloy film 33B is made of aluminum having at least one of Cu and Si added. The Cu basically has an action to improve the electromigration breakdown voltage. The Si basically has an action to prevent the alloy spike. The upper metal film 33C is basically constructed to prevent the aluminum hill lock phenomenon of the middle aluminum alloy film 33B. On the other hand, the upper metal film 33C is formed at the exposure step for patterning by the photolithography technology with a view to reducing the reflectivity of the surface of the middle aluminum alloy film 33B and preventing the diffraction (or halation).

Incidentally, the complementary data lines 33 may be modified by making the aluminum alloy film 33B of an aluminum film or by eliminating the lower metal film 33A and replacing it by a single-layered aluminum alloy film.

The complementary data lines 33 are extended in the Y direction over the memory cells MC, as shown in FIG. 7. One first data line (DL1) 33 of the complementary data lines 33 is extended in the Y direction over the drive MISFET $Q_{d1}$, the transfer MISFET $Q_{t2}$ and load MISFET $Q_{p2}$ of the memory cells MC. The other second data line (DL2) 33 is extended in the Y direction over the drive MISFET $Q_{d2}$, the transfer MISFET $Q_{t1}$ and the load MISFET $Q_{p1}$ of the memory cells MC. In short, the first data line 33 and the second data line 33 of the complementary data lines 33 are extended at a spacing from each other and generally in parallel in the Y direction.

In the memory cell array MAY and the sub-memory cell array SMAY, as shown in FIG. 7, the planar shape of the complementary data lines 33 of the memory cells MC arrayed in the X direction is arranged in linear symmetry with respect to the X1-X3 axis and the X2-X4 axis. The planar shape of the complementary data lines of the memory cells MC arrayed in the Y direction is arranged in linear symmetry with respect to the X1-X2 axis and the X3-X4 axis.

Over the memory cells MC, as shown in FIGS. 6 and 7, there are arranged the main word lines (MWL) 29 and the sub-word lines (SWL1) 29. The main word lines 29 and the sub-word lines 29 are made of a common conductive layer (i.e., the refractory metal film formed at the step of forming the first-layered metal material) and of the same conductive layer as that of the aforementioned middle conductive layer 29. In short, the main word lines 39 and the sub-word lines 29 are individually formed into a layer between the word lines (WL) 13 and the complementary data lines 33. The main word lines 29 and the sub-word lines 29 are arranged between the middle conductive layer 29 connected with the transfer MISFET $Q_{t1}$ of the memory cells MC and the middle conductive layer 29 connected with the transfer MISFET $Q_{t2}$. The main word lines 29 and the sub-word lines 29 are extended at a spacing from each other and generally in parallel in the X direction over the memory cell array MAY.

As shown in FIGS. 2B and 3, the main word lines 29 are arranged each for the four (i.e., 4 [bits]) memory cells MC arrayed in the Y direction. One main word line 29 is extended over the totally sixteen memory cell arrays MAY of the four memory mats MM of the memory block MB shown in FIG. 2A, and is made to have a larger wiring width size than that of the sub-word line 29 with a view to reducing the resistance.

In the memory cell array MAY arranged at the side close to the word driver circuit WDR of the memory mat MM, as shown in FIGS. 2B and 3, one sub-word line (SWL1) 29 is arranged for one of the memory cells MC arrayed in the Y direction. The sub-word line 29 is as long at most as extends over one memory cell array MAY and is shorter than the main word line 29, and is made to have a smaller wiring width size than that of the main word line 29. As shown in FIGS. 6 and 7, the main word lines 29 and the sub-word lines 29 are individually constructed such that the reference voltage line ($V_{ss}$) 13 connected with the memory cell MC is made of the same conductive layer as that of the word lines (WL) 13, and the conductive layer having the reference voltage line 13 extended is made vacant, so that they are arranged by making use of the vacant region (i.e., the region as large as can arrange the two wiring lines). In short, the memory cell MC can extend not only the word line (WL) 13 and the reference voltage line 13 but also the two word lines, i.e., the main word line 29 used in the divided word line system in the X direction and the sub-word line 29 used in the double word line system.

The substrate containing the complementary data lines 33 of the aforementioned memory cells MC is formed all over its surface (excepting the region of the external terminals BP) with a final passivation film (i.e., a final protection film) 34, as shown in FIG. 6. This final passivation film 34 is constructed to have a three-layer laminated structure which is prepared by laminating a silicon oxide film, a silicon nitride film and a resin film sequentially, although not specified.

The lower silicon oxide film of the final passivation film 34 is further formed of a three-layer laminated structure like the interlayer insulating film 30. Specifically, the lower silicon oxide film is composed of a silicon oxide film deposited by the CVD method using the tetraethoxysilane gas as its source gas, a silicon oxide film etched after application, and a silicon oxide film deposited by the CVD method using the tetraethoxysilane as its source gas. In other words, the lower silicon oxide film flattens the surface and frees the upper silicon nitride film from any cavity. The middle silicon nitride film is formed by the plasma CVD method, This middle silicon oxide film has an action to enhance the moisture resistance. The upper resin film is made of a polyimide resin, for example. This resin film can shields the α-ray emitted from a radioactive element contained in a small quantity in the resin-sealed portion of a resin-sealed type semiconductor device thereby to improve the α-ray soft error breakdown voltage of the SRAM. Moreover, the resin film prevents the interlayer film such as the final passivation film 34 from being cracked by the filler contained in the resin-sealed portion.

Next, the structure of the memory cells MC arranged in the individual peripheral regions (or end portions) of the memory block MB, the memory mat MM, the memory cell array MAY and the sub-memory cell array SMAY of the SRAM will be described together with their peripheral structure.

Figure 10A:
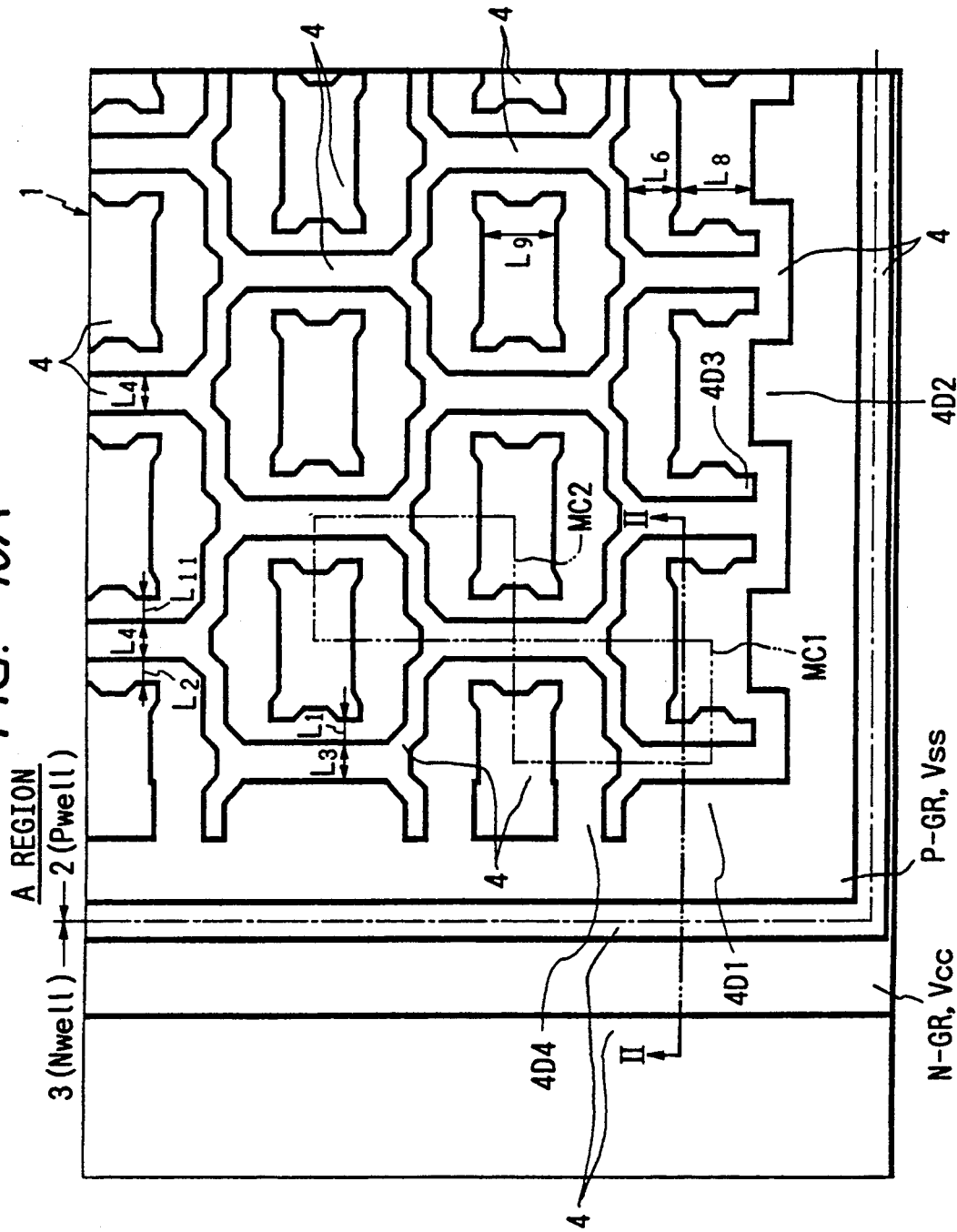
Figure 10C:
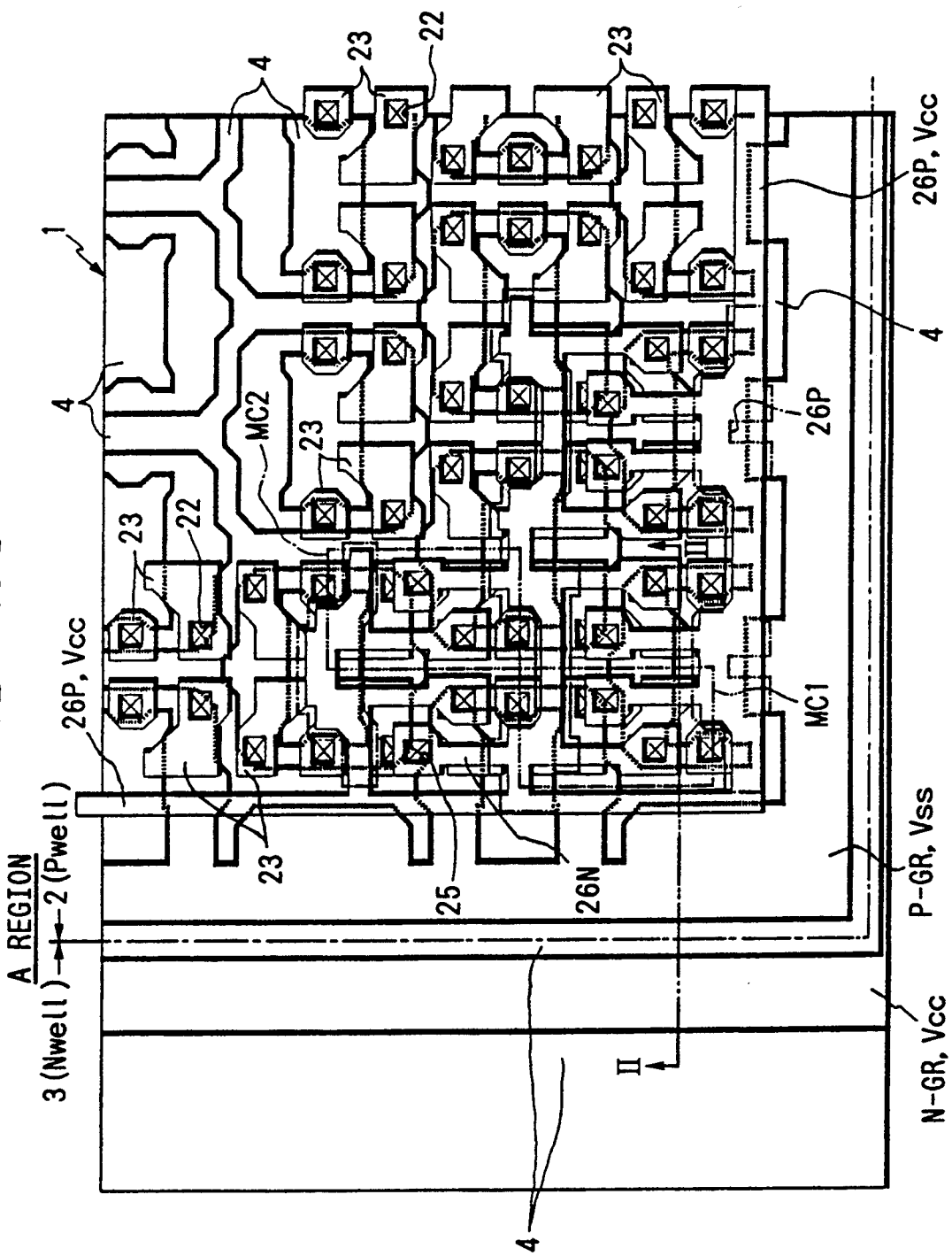

First of all, the lefthand lower end portion of the memory block MB1 arranged at the lefthand side of the SRAM shown in FIG. 2A, namely, the lefthand end portion of the memory cell array MAY or the sub-memory cell array SMAY arranged at the most lefthand side of the memory mat MM shown in FIG. 2A, as indicated at the A region enclosed by broken lines designated at reference letter A in FIG. 1 and FIG. 2B, will be described in the following. The structure of the memory cell MC in this A region and its peripheral structure are shown in FIG. 9 (presenting an enlarged top plan view of the A region) and FIG. 10 (presenting a top plan view of the A region). In FIG. 9, FIG. 9A shows a planar shape of the active region which is defined by the element isolating insulating film 4. FIG. 9B shows the planar shape of the drive MISFETs $Q_d$ overlapped on the active region. FIG. 9C shows a planar shape of the transfer MISFETs $Q_t$ overlapped on the active region and the drive MISFETs $Q_d$. FIG. 10A shows a planar shape of the active region defined by the element isolating insulating film 4. FIG. 10B shows a planar shape of the drive MISFETs $Q_d$ and the transfer MISFETs $Q_t$ overlapped on the active region. FIG. 10C shows a planar shape of the capacity element and the load MISFET $Q_p$ overlapped on the active region. FIG. 10D shows a planar shape of the sub-word line (SWL) 20, the main word line (MWL) 29 and the complementary data line (DL) 33 overlapped on the active region. FIG. 10E is similar to FIG. 10D but omits the reference voltage line 33 and the supply voltage line 33 from the guard ring regions P-GR and N-GR.

At the central region of the memory cell array MAY or the sub-memory cell array SMAY, as shown in FIG. 9A and FIG. 10A, the four memory cells MC adjoining in the X direction and in the Y direction have their partial active regions made integral to have a ring-shaped planar shape. Specifically, in the totally four memory cells MC taken at the center memory cell MC2 indicated at MC2 in FIG. 9A and FIG. 10A, i.e., the memory cell MC2, the memory cell MC adjacent at the righthand side, and the two memory cells MC adjacent at the lower side of the foregoing two memory cells MC, the individual one transfer MISFETs $Q_t$ and one drive MISFETs $Q_d$ of the four memory cells MC, i.e., the totally four transfer MISFETs $Q_t$ and four drive MISFETs $Q_d$ have their active regions made integral to form a ring-shaped active region (i.e., the region as indicated partially solid in FIG. 9A).

In other words, the totally four transfer MISFETs $Q_t$ and four drive MISFETs $Q_d$ (i.e., the totally eight MISFETs) have their individual opposed source regions or drain regions made integral in a ring shape connected electrically in series. In the four memory cells MC adjoining in the X direction and in the Y direction, the active regions having a shape of letter "L" composed of the one transfer MISFETs $Q_t$ and the drive MISFETs $Q_d$ of the memory cell MC are made to merge into each other, and the active regions have no extending terminal (as taken in the direction aligned with the gate length direction of the plurality of MISFETs connected in series) to form the ring shape having the closed active region pattern. The opposed inner and outer frame sides (i.e., the regions regulating the individual gate widths of the transfer MISFETs $Q_t$ and drive MISFETs $Q_d$) of the ring-shaped active regions are defined by the element isolating insulating film 4 and the p-type channel stopper region 5. In the aforementioned four memory cells MC, the individual transfer MISFETs $Q_t$ have their gate length directions aligned with the Y direction, and the drive MISFETs $Q_d$ have their gate length directions aligned with the X directions so that the ring shape is formed into a planar shape similar not to the ring or oval shape but rather a square (or rectangular) shape.

The ring-shaped active regions are arrayed in plurality in the same shape in the X direction (i.e., the direction aligned with the gate width direction of the transfer MISFETs $Q_t$ or the gate length direction of the drive MISFETs $Q_d$) and at an equal pitch. These plurality of ring-shaped active regions adjoining in the X direction are electrically isolated from one another through the element isolating insulating film (and the p-type channel stopper region 5). The plurality of ring-shaped active regions adjoining at a subsequent step in the Y direction (i.e., the direction aligned with the gate length direction of the transfer MISFETs $Q_t$ or the gate width direction of the drive MISFETs $Q_d$) of the ring-shaped active regions are arrayed in the same shape in the X direction and at an equal pitch and are displaced by a half pitch in the X direction from the array of the prior step. In short, the ring-shaped active regions are arrayed while retaining the periodicity in a zigzag form in the memory cell array MAY (or the sub-memory cell array SMAY), as shown in FIG. 9A and FIG. 10A.

As shown in FIG. 9A and FIG. 10A, the terminal end of the memory cell array MAY (or the sub-memory cell array SMAY), namely, the lefthand lower end of the memory cell array MAY and the region adjacent to the guard ring region P-GR arranged around the memory cell array MAY are laid out to damp the disturbances of the periodicity of the array of the ring-shaped active regions.

In the memory cell array MAY, as shown in FIG. 9A and FIG. 10A, the memory cell MC1 is arranged in the position (i.e., the lefthand lower end) located at the end portion in any array direction of the plurality of memory cells MC arrayed in the X direction and in the Y direction. In this memory cell MC1, the transfer MISFETs $Q_t$ and the drive MISFETs $Q_d$ are arranged in the generally half ring shaped lefthand half of the active region, in which the upper half of the ring-shaped active region arranged at the central region of the memory cell array MAY, and in the generally half ring shaped lower half in which the lefthand half exists.

The active region, which is arranged with the other transfer MISFET $Q_{t2}$ of that memory cell MC1, especially its gate width $L_1$ is regulated by the element isolating insulating film 4 (and the p-type channel stopper region 5), as shown in FIGS. 9A and 10A and FIG. 15 (presenting a section taken along line II—II of FIG. 10). Likewise, the active region to be arranged with the one transfer MISFET $Q_{t1}$ of the memory cell MC1, especially its gate width $L_2$ is regulated by the element isolating insulating film 4. The gate width $L_2$ of the one transfer MISFET $Q_{t1}$ of the memory cell MC1 and the gate size $L_1$ of the other transfer MISFET $Q_{t2}$ are basically made to have an equal size (that is, the two transfer MISFETs $Q_t$ in the memory cell MC1 are made to have an equal gate width).

Moreover, the gate width $L_2$ of the one transfer MISFET $Q_{t1}$ of the memory cell MC1 and the gate width $L_1$ of the other transfer MISFET $Q_{t2}$ are made to have an equal size like that (e.g., the gate width $L_{11}$ of the MC2) of the other memory cell MC arranged at the central region of the memory cell array MAY (that is, all the gate widths of the individual transfer MISFETs $Q_t$ of the memory cell MC1 and other memory cells MC are made to have an equal size). In short, the gate widths of the transfer MISFETs $Q_t$ of the memory cell MC1 arranged at the end portion of the memory cell array MAY are made to have the equal size not only in the memory cell MC1 but also the other memory cells MC arranged at the central region of the memory cell array MAY so that the periodicity of the shapes of the active regions is retained.

The width size $L_3$ in the direction aligned with the X direction of the element isolating insulating film 4, which is positioned at the outer frame side of the ring-shaped active region regulating the gate size $L_1$ of the other transfer MISFET $Q_{t2}$ of the memory cell MC1 (or which is positioned between the other transfer MISFET $Q_{t2}$ and the guard ring P-GR), is made to have a size equal to the width size $L_4$ of the element isolating insulating film 4 in the same position for regulating the gate width $L_2$ of the one transfer MISFET $Q_{t1}$. In short, the width sizes of the element isolating insulating film 4 regulating the two transfer MISFETs $Q_t$ in the memory cell MC1 are made to have an equal size. Moreover, the width size $L_4$ of the element isolating insulating film 4 regulating the gate width $L_2$ of the one transfer MIS-FET $Q_{t1}$ of the memory cell MC1 and the width size $L_3$ of the element isolating insulating film 4 regulating the gate width $L_1$ of the other transfer MISFET $Q_{t2}$ are equalized like those of the other memory cell MC arranged at the central region of the memory cell array MAY. In short, all the width sizes of the element isolating insulating film 4 for regulating the gate widths of the individual transfer MISFETs $Q_t$ of the memory cell MC1 and the other memory cells MC are made to have an equal size. Likewise, the width sizes of the element isolating insulating film 4 regulating the gate widths of the transfer MISFETs $Q_t$ of the memory cell MC1 arranged at the end portion of the memory cell array MAY are made to have an equal size not only in memory cell MC1 but also in the other memory cells MC arranged at the central portion of the memory cell array MAY so that the periodicity of the shape of the active region is retained.

The width size $L_3$ of the element isolating insulating film 4 regulating the gate size $L_1$ of the other transfer MISFET $Q_{t2}$ of the memory cell MC1 is made equal to the width size $L_4$ of the other element isolating insulating film 4 while arranging the active region (i.e., the dummy active region, as indicated partially solid in FIG. 9A) 4D1 between the element isolating insulating film 4 and the guard ring region P-GR. This active region 4D1 has a size $L_5$ in the direction aligned with the X direction. In other expressions, the width size $L_3$ of the element isolating insulating film 4 regulating the gate size $L_1$ of the other transfer MISFET $Q_{t2}$ of the memory cell MC1 is made smaller than the size (i.e., the addition of the size $L_5$ of the active region 4D1 to the width size $L_3$ of the element isolating insulating film 4) between the portion regulating the gate width $L_1$ of the other transfer MISFET $Q_{t2}$ and the guard ring region P-GR.

The active region 4D1 arranged between the element isolating insulating film 4 and the guard ring region P-GR is formed to have a planar shape (or contour) identical to or belonging to the shape arranged in linear symmetry in the X direction with respect to the planar shape of the (L-shaped) active region in which the other transfer MISFET $Q_{t2}$ and the other drive MISFET $Q_{d2}$ of the memory cell MC1 are arranged. In short, the active region 4D1 can retain the periodicity of the shape of the active region of the plurality of memory cells MC arranged at the central region of the memory cell array MAY, with the end portion of the memory cell array MAY.

The width size $L_{12}$ in the direction aligned with the X direction of the element isolating insulating film 4, which is positioned at the inner frame side of the ring-shaped active region regulating the gate width $L_2$ of the one transfer MISFET $Q_{t1}$ of the memory cell MC1 shown in FIG. 9A (or which is positioned between the one transfer MISFET $Q_{t1}$ and the guard ring P-GR), is extended to the guard ring region P-GR in the direction aligned with the X direction of the element isolating insulating film 4 so that it is equalized to the width size $L_{13}$ of the element isolating insulating film 4 in the same position regulating the gate size $L_1$ of the other transfer MISFET $Q_{t2}$. In short, the width sizes of the element isolating insulating film 4 regulating the gate widths of the two transfer MISFET $Q_{t2}$ in the memory cell MC1 are equalized. The width size $L_{12}$ of the element isolating insulating film 4 regulating the gate width $L_2$ of the one transfer MISFETs $Q_t$ of the memory cell MC1 and the width size $L_{13}$ of the element isolating insulating film 4 regulating the gate size $L_1$ of the other transfer MISFET $Q_{t2}$ are equalized like those of the other memory cells MC arranged at the central region of the memory cell array MAY. In short, all the width sizes of the element isolating insulating film 4 regulating the gate widths of the individual transfer MISFETs $Q_t$ of the memory cell MC1 and the other memory cells MC are made to have the equal size. In other words, the width sizes of the element isolating insulating film 4 regulating the gate widths of the transfer MISFETs $Q_t$ of the memory cell MC1 arranged at the end portion of the memory cell array MAY are equalized not only in the memory cell MC1 but also in the other memory cells MC arranged at the central region of the memory cell array MAY thereby to retain the periodicity of the shape of the active region.

On the other hand, the active region to be arranged with the other drive MISFET $Q_{d2}$ of the memory cell MC1, especially its gate width $L_6$ is regulated by the element isolating insulating film 4 (and the p-type channel stopper region 5), as shown in FIG. 9A and FIG. 10A. Likewise, the active region to be arranged with the one drive MISFET $Q_{d1}$ of the memory cell MC1, especially its gate width $L_7$ is regulated by the element isolating insulating film 4. The gate width $L_7$ of the one drive MISFET $Q_{d1}$ of the memory cell MC1 and the gate width $L_6$ of the other drive MISFET $Q_{d2}$ are basically made to have the equal size (that is, the gate widths of the two drive MISFETs $Q_d$ in the memory cell MC1 are equalized).

Moreover, the gate width $L_7$ of the one drive MISFET $Q_{d1}$ of the memory cell MC1 and the gate width $L_6$ of the other drive MISFET $Q_{d2}$ are equalized like those of the other memory cells MC arranged at the central region of the memory cell array MAY (that is, all the gate widths of the individual drive MISFETs $Q_d$ of the memory cell MC1 and the other memory cells MC are equalized). In short, the gate widths of the drive MISFETs $Q_d$ of the memory cell MC1 arranged at the end portion of the memory cell array MAY are equalized not only in the memory cell MC1 but also in the other memory cells MC arranged at the central portion of the memory cell array MAY, thus retaining the periodicity of the shape of the active region.

The width size $L_8$ in the direction aligned with the Y direction of the element isolating insulating film 4, which is positioned at the inner frame side of the ring-shaped active region regulating the gate width $L_6$ of the other drive MISFET $Q_{d2}$ of the memory cell MC1 (or which is positioned between the other drive MISFET $Q_{d2}$ and the guard ring P-GR), is made to have a size equal to the width size $L_9$ of the element isolating insulating film 4 in the same position for regulating the gate width $L_7$ of the one drive MISFET $Q_{d1}$. In short, the width sizes of the element isolating insulating film 4 regulating the two drive MISFETs $Q_d$ in the memory cell MC1 are made to have an equal size. Moreover, the width size $L_9$ of the element isolating insulating film. 4 regulating the gate width $L_7$ of the one drive MISFET $Q_{d1}$ of the memory cell MC1 and the width size $L_8$ of the element isolating insulating film 4 regulating the gate width $L_6$ of the other drive MISFET $Q_{d2}$ are equalized like those of the other memory cell MC arranged at the central region of the memory cell array MAY. In short, all the width sizes of the element isolating insulating film 4 for regulating the gate widths of the individual drive MISFETs $Q_d$ of the memory cell MC1 and the other memory cells MC are made to have an equal size.

Likewise, the width sizes of the element isolating insulating film 4 regulating the gate widths of the drive MISFETs $Q_d$ of the memory cell MC1 arranged at the end portion of the memory cell array MAY are made to have an equal size not only in the memory cell MC1 but also in the other memory cells MC arranged at the central portion of the memory cell array MAY so that the periodicity of the shape of the active region is retained.

The width size $L_8$ of the element isolating insulating film 4 regulating the gate width $L_6$ of the other drive MISFET $Q_{d2}$ of the memory cell MC1 is made equal to the width size $L_9$ of the other element isolating insulating film 4 while arranging the active region (i.e., the dummy active region, as indicated partially solid in FIG. 9A) 4D2 between the element isolating insulating film 4 and the guard ring region P-GR. This active region 4D2 has a size $L_{10}$ in the direction aligned with the Y direction. In other expressions, the width size $L_{10}$ of the element isolating insulating film 4 regulating the gate width $L_6$ of the other drive MISFET $Q_{d2}$ of the memory cell MC1 is made smaller than the size (i.e., the addition of the size $L_{10}$ of the active region 4D1 to the width size $L_8$ of the element isolating insulating film 4) between the portion regulating the gate width $L_6$ of the other drive MISFET $Q_{d2}$ and the guard ring region P-GR.

Like the aforementioned active region 4D1, the active region 4D2 arranged between the element isolating insulating film 4 and the guard ring region P-GR is formed to have a planar shape (or contour) identical to or belonging to the shape arranged in linear symmetry in the Y direction with respect to the planar shape of the active region in which the other drive MISFET $Q_{d2}$ of the memory cell MC1 are arranged. In short, the active region 4D2 can retain the periodicity of the shape of the active region of the plurality of memory cells MC arranged at the central region of the memory cell array MAY, with the end portion of the memory cell array MAY.

An active region (i.e., a dummy active region) 4D3 is arranged, as shown in FIG. 9A, between the other semiconductor region (18) of the other transfer MISFET $Q_{t2}$ of the plurality of memory cells MC arrayed along the periphery of the memory cell array MAY at the lower end of the memory cell array MAY including the memory cell MC1 of the lefthand lower end of the aforementioned memory cell array MAY and the element isolating insulating film 4. This active region 4D3 is constructed to have a shape identical to or belonging to the shape in which the active regions arranged with the other semiconductor region of the other transfer MISFET $Q_{t2}$ are arranged in linear symmetry in the Y direction. In short, the active region 4D3 is enabled by the end portion of the memory cell array MAY to retain the periodicity of the shape of the active region of the plurality of memory cells MC arrayed at the central region of the memory cell array MAY. This active region 4D3 can prevent the fluctuations of the shape of the active region, in which the other semiconductor region of the other transfer MISFET $Q_{t2}$ is arranged, on the basis of the disturbances of the periodicity and can prevent the connection error between the other semiconductor region of the other transfer MISFET $Q_{t2}$ and the complementary data line (DL) 33.

Moreover, an active region (i.e., a dummy active region) 4D4 is arranged, as shown in FIG. 9A, between the source region (11) of the one drive MISFET $Q_{d1}$ of the plurality of memory cells MC arrayed along the periphery of the memory cell array MAY at the lefthand end of the memory cell array MAY including the memory cell memory cell MC1 of the lefthand lower end of the memory cell array MAY and the guard ring P-GR. This active region 4D4 is constructed to have a shape identical to or belonging to the shape in which the active regions arranged with the source region of the one drive MISFET $Q_{d1}$ are arranged in linear symmetry in the X direction. In short, the active region 4D4 is enabled by the end portion of the memory cell array MAY to retain the periodicity of the shape of the active region of the plurality of memory cells MC arrayed at the central region of the memory cell array MAY. This active region 4D4 can prevent the fluctuations of the shape of the active region, in which the source region of the one drive MISFET $Q_{d1}$ is arranged, on the basis of the disturbances of the periodicity and can prevent the connection error between the source region of the one drive MISFET $Q_{d1}$ and the reference voltage line ($V_{ss}$) 13.

The guard ring P-GR surrounding the two memory cell arrays MAY of the memory mat MM shown in FIG. 4 is formed at the peripheral region of the principal face of the $p^-$-type well region 2 into a region defined by the element isolating insulating film 4 (or partially defined by an active region 4D), as shown in FIG. 9A, FIG. 10A and FIG. 15. The guard ring region P-GR is formed mainly of a $p^+$-type semiconductor region 40 formed over the principal face of the $p^-$-type well region 2, to feed the fixed reference voltage $V_{ss}$ to the $p^-$-type well region 2.

The regions, which are individually arranged at the end portion of the memory cell array MAY with the active regions 4D1, 4D2 and 4D4 for retaining the periodicities of the shapes of the active regions, are also used as the regions for absorbing the mistaken registration in the mask manufacture process when the $p^+$-type semiconductor region 40 of the guard ring region P-GR is to be doped with a p-type impurity in the manufacture process. In other words, the peripheral region of the memory cell array MAY can omit the spare region corresponding to the mistaken registration (or can act as the active region 4D) so that the effective area to be occupied by the memory cell array MAY can be reduced to improve the degree of integration of the SRAM.

The guard ring region P-GR is electrically connected with the reference voltage line ($V_{ss}$) 33 through the reference voltage line ($V_{ss}$) 29, as shown in FIGS. 10D and 10E and FIG. 15. The reference voltage line 29 is formed of the same conductive layer as that of the main word line.(MWL) 29 and the sub-word line (SWL) 29 and is extended along the memory cell array MAY. The reference voltage line 29 is connected with the guard ring region P-GR through the connection hole 28 which is formed in the interlayer insulating film 27. The reference voltage line 33 is formed of the same conductive layer as that of the complementary data line (DL) 33. In the memory cell array MAY, the complementary data line 33 is extended in the Y direction, and the reference voltage line 33 is extended in the Y direction so that it may avoid contact with the complementary data line 33. The reference voltage line 33 is connected with the underlying reference voltage line 29 through the connection hole 31 which is formed in the interlayer insulating film 30.

As shown in FIG.9A, FIG. 10A and FIG. 15, moreover, around the periphery of the $p^-$-type well region 2 arranged with the memory cell array MAY, there is formed the $n^-$-type well region 3, which in turn is surrounded by the guard ring region N-GR. This guard ring region N-GR is formed at the peripheral region of the principal face of the $n^-$-type well region 3 into the region which is defined by the element isolating insulating film 4. The guard ring region N-GR is formed mainly of the $n^+$-type semiconductor regions 11 and 18 formed over the principal face of the $n^-$-type well region 3, to feed the fixed supply voltage $V_{cc}$ to the $n^-$-type well region 3.

The aforementioned guard ring region N-GR is electrically connected with the supply voltage line ($V_{cc}$) 33 through the supply voltage line ($V_{cc}$) 29. This supply voltage line 29 is formed of the same conductive layer as that of the reference voltage line 29, and the supply voltage line 33 is formed of the same conductive layer as that of the reference voltage line 33.

The memory cell MC1 at the lefthand lower end portion of the memory cell array MAY is constructed, as shown in FIG. 9B and FIG. 10B, such that the gate length $F_1$ of the one drive MISFET $Q_{d1}$ and the gate length $F_2$ of the other drive MISFET $Q_{d2}$ are made to have basically equal sizes (that is, the gate lengths of the two drive MISFETs $Q_d$ in the memory cell MC1 are equalized). In other expressions, the channel length (i.e., the size between the n-type semiconductor region 10 of the source region and the n-type semiconductor region 10 of the drain region) of the one drive MISFET $Q_{d1}$ of the memory cell MC1 is equalized to the channel length of the other drive MISFET $Q_{d2}$.

Moreover, the gate length $F_1$ of the one drive MISFET $Q_{d1}$ of the memory cell MC1 and the gate length $F_2$ of the other drive MISFET $Q_{d2}$ are individually equalized to the gate length $F_5$ of the one drive MISFET $Q_{d1}$ of the other memory cell MC (e.g., the memory cell MC2) arranged at the central region of the memory cell array MAY. In short, all the gate lengths of the individual drive MISFETs $Q_d$ of the memory cell MC1 and the other memory cells MC are equalized. In other words, the gate lengths of the drive MISFETs $Q_d$ of the memory cell MC1 arranged at the end portion of the memory cell array MAY are equalized not only in the memory cell MC1 but also between the other memory cells MC arranged at the central region of the memory cell array MAY thereby to retain the periodicity of the shapes of the active regions.

The gate electrode 7 of the other drive MISFET $Q_{d2}$ of the memory cell MC1 is spaced at a spacing size $F_4$ from the gate electrode 7 of the other drive MISFET $Q_{d2}$ of the other memory cells MC arranged adjacent at the righthand side, as shown in FIG. 9, in the direction (i.e., the X direction) aligned with the gate length direction of the former gate electrode 7. The one drive MISFET $Q_{d1}$ of the memory cell MC1 is arranged, at the end portion of the memory cell array MAY so that no memory cell MC is arranged at the position adjacent at the lefthand side in the X direction to that memory cell MC1, but a dummy gate electrode 7D (as designated as a solid region in FIG. 9B) is arranged in the position opposed to the gate electrode 7 of the one drive MISFET $Q_{d1}$ of the memory cell MC1. The dummy gate electrode 7D is constructed in a planar shape, in which the gate electrode 7 of the one drive MISFET $Q_{d1}$ of the memory cell MC is arranged in linear symmetry in the X direction or in which the planar shape is partially incorporated. The spacing size $F_3$ between the dummy gate electrode 7D and the gate electrode 7 of the one drive MISFET $Q_{d1}$ is equalized to the spacing size $F_4$ between the gate electrode 7 of the other drive MISFET $Q_{d2}$ of the aforementioned memory cell MC1 and the gate electrode 7 of the other drive MISFET $Q_{d2}$ of the other memory cells MC.

In other words, the dummy gate electrode 7D is constructed such that the spacing size $F_3$ between itself and the gate electrode 7 of the one drive MISFET $Q_{d1}$ of the memory cell MC1 is equalized to the spacing size (e.g., the spacing size $F_4$ or $F_6$) in the same position at the central region of the memory cell array MAY, so that the disturbances of the periodicity of the spacing size at the end portion of the memory cell array MAY can be prevented. The dummy gate electrode 7D is formed of the same conductive layer as that of the gate electrode 7 of the drive MISFETs $Q_d$ of the memory cells MC and is arranged in each of the plurality of memory cells MC arrayed in the Y direction at the lefthand end of the memory cell array MAY. The plurality of dummy gate electrodes 7D are made integral for a plurality or for all and are fed with the reference voltage ($V_{ss}$) with a view to excluding the causes of troubles such as electrifications. As shown in FIGS. 10D and 10E, the dummy gate 7D is fed with the reference voltage through the reference voltage line 29 from the reference voltage line 33 extending over the guard ring region P-GR. In short, the dummy gate electrode 7D is apparently formed into the reference voltage line ($V_{ss}$) extending in the Y direction at the lefthand end of the memory cell array MAY. The reference voltage line 29 is connected with the dummy gate electrode through the connection holes 28B which are formed in the interlayer insulating film 27.

In the present embodiment, the lower end of the memory cell array MAY is not arranged with the dummy gate electrode 7D, as shown in FIG. 9B and FIG. 10B. The end portion (as located in the middle and lower end in FIG. 9B) in the direction aligned with the gate width direction of the gate electrode 7 of the other drive MISFET $Q_{d2}$ of the memory cells MC arranged at the lower end of the memory cell array MAY is protruded to have a size $F_7$ over the surface of the element isolating insulating film 4 so that the protruded portion can absorb the fluctuations of the planar shape of the gate electrode 7 in the Y direction thereby to leave the dummy gate electrode 7D unelectrified. Incidentally, in case the fluctuations of the planar shape of the gate electrode 7 cannot be absorbed to the last, a dummy gate electrode having a function similar to that of the dummy gate electrode 7D may be arranged along the lower end of the memory cell array MAY.

At the lefthand end of the memory cell array MAY, the lefthand end portion in the X direction of the word line (WL) connected with each of the plurality of memory cells MC such as the memory cell MC1 arrayed in the Y direction is formed with a dummy word line 13D1 (as indicated as the solid regions in FIG. 9C), as shown in FIG. 9C, FIG. 10B and FIG. 15. The dummy word line 13D1 is formed of the region (i.e., the same conductive layer) having an excess length of the lefthand end portion of the word line 13, as located at the end portion of the memory cell array MAY. Even with a mistaken mask registration in the X direction at least in the manufacture process, the position of the lefthand end of the intrinsic word line 13 is set in a position, in which the active region (e.g., the active region in which the other transfer MISFET $Q_{t2}$ of the memory cell MC1 is arranged) is not exposed to the outside. The dummy word line 13D1 can retain the periodicity of the planar shape of the word line 13 (or can maintain the continuity in case of the word line 13) like the active region (i.e., the dummy active region) 4D or the dummy gate electrode 7D, thereby to prevent the fluctuations of the gate width $S_1$ of the other transfer MISFET $Q_{t2}$ of the memory cell MC1, for example. In short, the dummy word line 13D1 can equalize the gate width $S_1$ of the other transfer MISFET $Q_{t2}$ of the memory cell MC1 and the gate width $S_2$ of the one transfer MISFET $Q_{t1}$ (that is, the gate widths of the two transfer MISFETs $Q_t$ in the memory cell MC1 are equalized).

In the dummy word line 13D1, on the other hand, the gate width $S_1$ of the one transfer MISFET $Q_{t1}$ of the memory cell MC1 and the gate width $S_2$ of the other transfer MISFET $Q_{t2}$ can be equalized to those of the other memory cells MC which are arranged at the central region of the memory cell array MAY.

Moreover, at the lefthand end portion of the memory cell array MAY, i.e., at the lefthand end portion in the X direction of the reference voltage line ($V_{ss}$) connected with each of the plurality of memory cells MC arrayed in the Y direction, such as memory cell MC1, as shown in FIG. 9C and FIG. 10B, there is formed a dummy reference voltage line 13D2 (as indicated as solid regions in FIG. 9C). This dummy reference voltage line 13D2 is constructed of the region (i.e., the same conductive layer) having an excess length of the position of the lefthand end portion of the reference voltage line 13 positioned at the end portion of the memory cell array MAY. The position of the lefthand end portion of the intrinsic reference voltage line 13 is set to include the connection region with the source region (11) of the drive MISFETs $Q_d$ of the memory cells MC. The dummy reference voltage line 13D2 can retain the periodicity of the planar shape of the reference voltage line 13 (or can maintain the continuity in case of the reference voltage line 13), like the active regions (or dummy active regions) 4D3 and 4D4, to prevent the fluctuations (i.e., the fluctuations of the planar shape of the connection hole 14) of the planar shape of the active region of the source region of the one drive MISFET $Q_{d1}$ of the memory cell MC1, for example.

On the other hand, the dummy reference voltage line 13D2 is arranged, as shown in FIG. 10D, in a position, in which it is overlapped on the reference voltage line arranged above the guard ring region P-GR. The reference voltage line 33 feeds the reference voltage ($V_{ss}$) to the reference voltage line 13 through the reference voltage line 29 and the dummy reference voltage line 13D2 in the overlapped region. In short, the dummy reference voltage line 13D2 is also formed as the connection region with the reference voltage line 33 (i.e., the reference voltage line 29). The reference voltage line 29 is connected with the reference voltage line 13D2 through the connection hole 28a which is formed in the interlayer insulating film 27.

Incidentally, the present invention may be modified such that the lower end portion of the memory cell array MAY is arranged with a dummy word line, as indicated at 13D3 by double-dotted chain lines in FIG. 9C, with a view to retaining the periodicity of the array of the word line 13 in the Y direction.

Figure 11D:
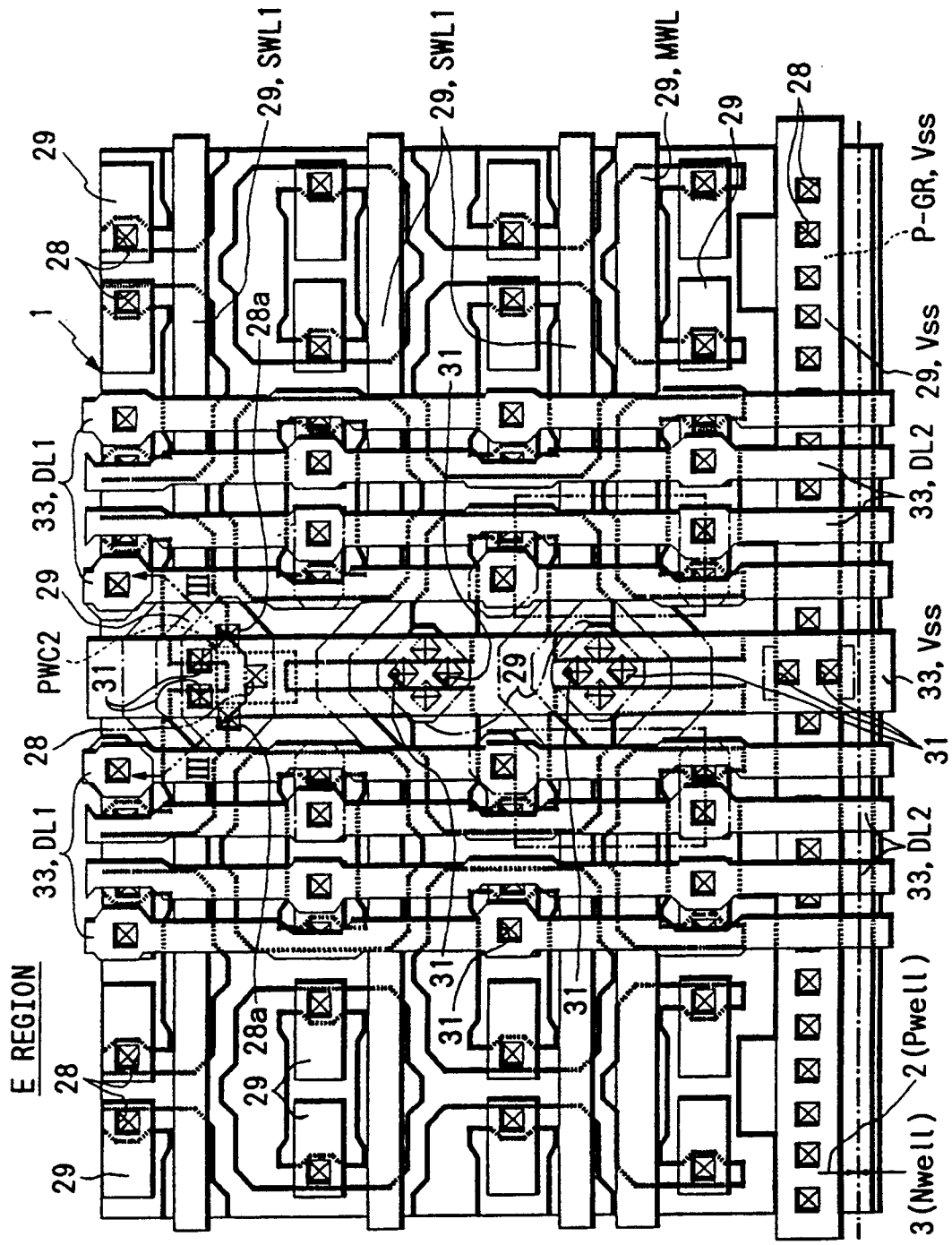
Figure 11E:
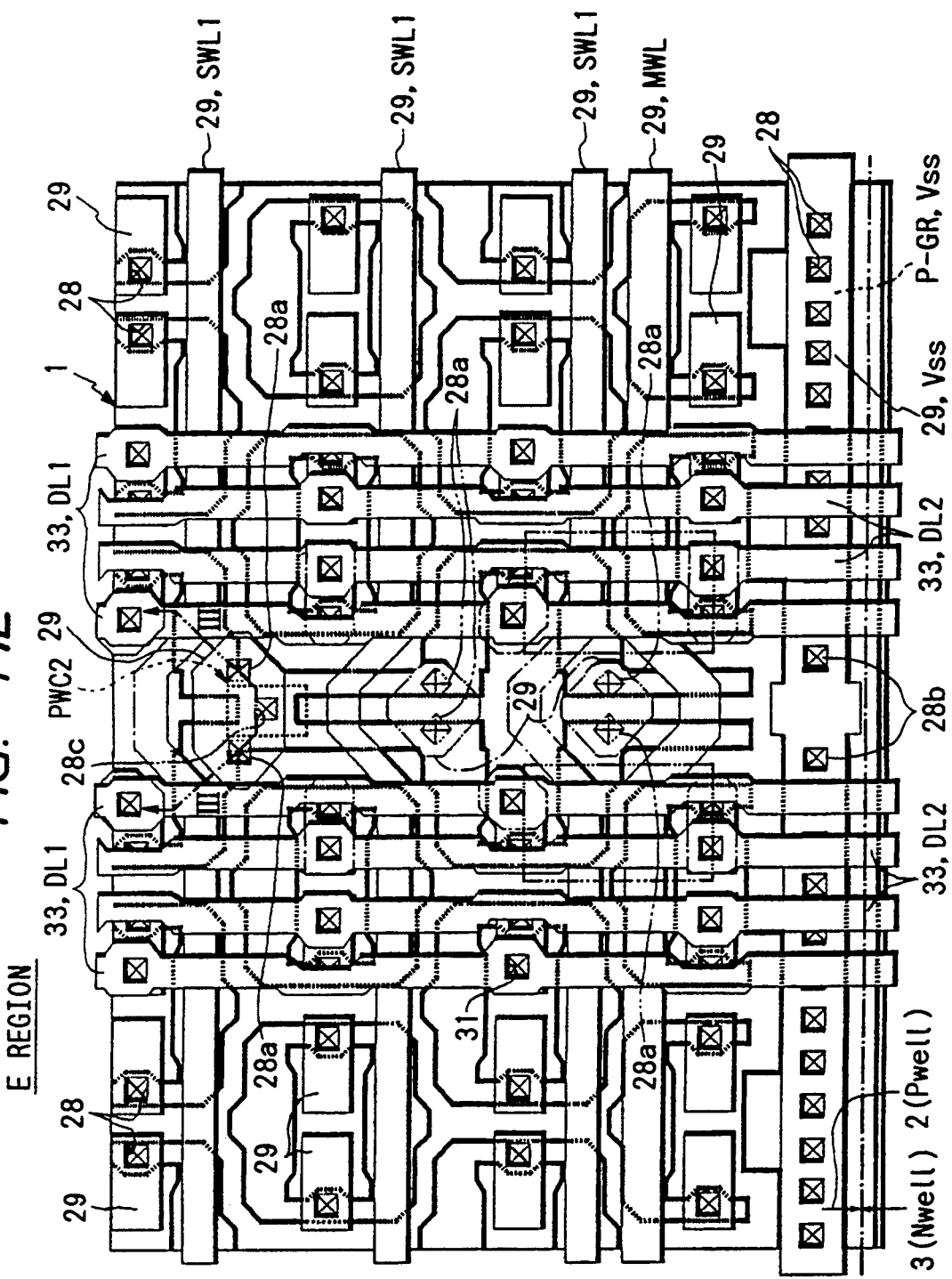

Here will be described an E region, as enclosed at reference letter E by broken lines in FIG. 3, between the plurality of sub-memory cell arrays SMAY of the memory mats MM of the SRAM shown in FIGS. 3 and 4, namely, the well contact region PWC2. The structure of the memory cells MC of the E region and their peripheral structure are shown in FIG. 11 (presenting a top plan view of the E region) and in FIG. 16 (presenting a section taken along line III—III of FIG. 11). In FIG. 11, FIG. 11A shows a planar shape of the active region which is defined by the element isolating insulating film 4. FIG. 11B shows a planar shape of the drive MISFETs $Q_d$ and the transfer MISFETs $Q_t$ overlapped on the active regions. FIG. 11C shows a planar shape of the capacity element C and the load MISFETs $Q_p$ overlapped on the active region. FIG. 11D shows a planar shape of the sub-word line (SWL) 29, the main word line (MWL) 29 and the complementary data line (DL) 33 overlapped on the active region. FIG. 11E is a diagram omitting the reference voltage line 33 from FIG. 11D. FIG. 11F shows the shape of the reference voltage line 13 in the region adjacent to the well contact region PWC2 of FIG. 11B. FIG. 11G omits the word line 13 and the reference voltage line 13 from FIG. 11B (but shows the dummy gate electrode 7D, as hatched).

As shown in FIG. 11A, the well contact region PWC2 is arranged between the plurality of sub-memory cell arrays SMAY. The memory cells MC arranged individually at the righthand end portion of the sub-memroy cell array SMAY arranged at the righthand side, as shown in FIG. 11, and at the righthand end portion of the sub-memory cell array SMAY arranged at the lefthand side, namely, the memory cells MC arranged at the two sides in the X direction of the well contact region PWC2 are made to have a similar structure substantially identical to that of the memory cell MC1 arranged in the aforementioned A region. In short, the memory cells MC arranged at the righthand and lefthand end portions of the sub-memory cell array SMAY are constructed such that the active region (i.e., the dummy active region) 4D are constructed, as shown in FIG. 11A, and such that the dummy gate electrode 7D, the dummy word line 13D1 and the dummy reference voltage line ($V_{ss}$) 13D2 are constructed, as shown in FIGS. 11B, 11F and 11G.

The well contact region PWC2 is formed mainly of the p+-type semiconductor region 40 which is formed in the active region (which is made integral with the active region 4D1, as shown in FIG. 11A), which is defined by the openings formed in the element isolating insulating film 4 and the dummy gate electrode 7D of the principal face of the p--type well region 2, as shown in FIG. 11 and FIG. 16. The p+-type semiconductor region 40 of the well contact region PWC2 is electrically connected through the middle conductive layer 29 with the reference voltage line ($V_{ss}$) extended in the Y direction between the two sub-memory cell arrays SMAY, as shown in Figs. 11D and 11E and in FIG. 16, so that it is fed with the reference voltage ($V_{ss}$). The reference voltage line 33 is connected with the middle conductive layer 29 through the connection hole 31, and the middle conductive layer 29 is connected with the p+-type semiconductor region 40 through the connection hole 28C. The reference voltage line ($V_{ss}$) 33 is electrically connected with the reference voltage line ($V_{ss}$) 29 through the connection hole 31. Moreover, the reference voltage line ($V_{ss}$) 29 is electrically connected with the dummy gate electrode 7D through the connection hole 28b, and the dummy gate electrode 7D is fed with the reference voltage ($V_{ss}$).

The size PWC2 in the X direction of the well contact region PWC2 is made substantially equal to or smaller than the cell pitch CP of the memory cell MC in the X direction, as shown in FIG. 11A. With a view to maintaining the periodicity of the array of the memory cells MC in the sub-memory cell array SMAY, the aforementioned ring-shaped active regions are arrayed in the X direction to construct the well contact region PWC2 in one of the ring-shaped active regions. In this case, the size PWC2 of the well contact region PWC2 in the X direction becomes larger than the cell pitch CP. The well contact region PWC2 of the present embodiment is formed, while the active region (i.e., the dummy active region) 4D being added to each of the end portions of the two sub-memory cell arrays SMAY, by isolating the two sub-memory cell arrays SMAY once through the element isolating insulating film 4 and by abolishing a portion of the element isolating insulating film 4. In other words, the well contact region PWC2 can be constructed to have a size (in the X direction) equal to the width size of the element isolating insulating film 4 for isolating the active regions 4D and equal to or smaller than the cell pitch CP, as has been described hereinbefore, so that the area to be occupied by the well contact region PWC2 can be reduced to improve the degree of integration of the SRAM.

Moreover, the region arranged with the aforementioned well contact region PWC2 is used, as shown in FIG. 11B, as the individual connection (or Joint) regions of the word lines 13 extending individually over the two sub-memory cell arrays SMAY and as the connection regions of the individually extending reference voltage lines 13. The individual connections of the word lines 13 extending over the two sub-memory cell arrays SMAY are accomplished by using (or co-using) the dummy word lines 13D1. The individual connections of the reference voltage lines 13 extending over the two sub-memory cell arrays SMAY are accomplished by using (or co-using) the dummy reference voltage lines 13D2.

The dummy reference voltage line 13D2 is electrically connected with the reference voltage line ($V_{ss}$) through the middle conductive layer 29 so that it is fed with the reference voltage ($V_{ss}$). The middle conductive layer 29 is connected with the dummy reference voltage line 13D2 through the connection hole 28a. As a result, the fluctuations of the potential of the reference voltage line 13 can be reduced.

Likewise, the region arranged with the well contact region PWC2 is used, as shown in FIG. 11C, as the connection regions of the supply voltage lines ($V_{cc}$) 26P extending individually over the two sub-memory cell arrays SMAY. Moreover, the region arranged with the well contact region PWC2 is used, as shown in FIG. 11D, as the connection regions (i.e., the passing regions) of the sub-word lines (SWL) 29 extending over the two sub-memory cell arrays SMAY and as the connection regions (i.e., the passing regions) of the main word lines (MWL) 29.

In short, the region arranged with the well contact region PWC2 is used not only for arranging the well contact region PWC but also for multiple purposes (mutually using the areas to be occupied by a plurality of layers) so that the degree of integration of the SRAM can be improved.

Figure 12C:
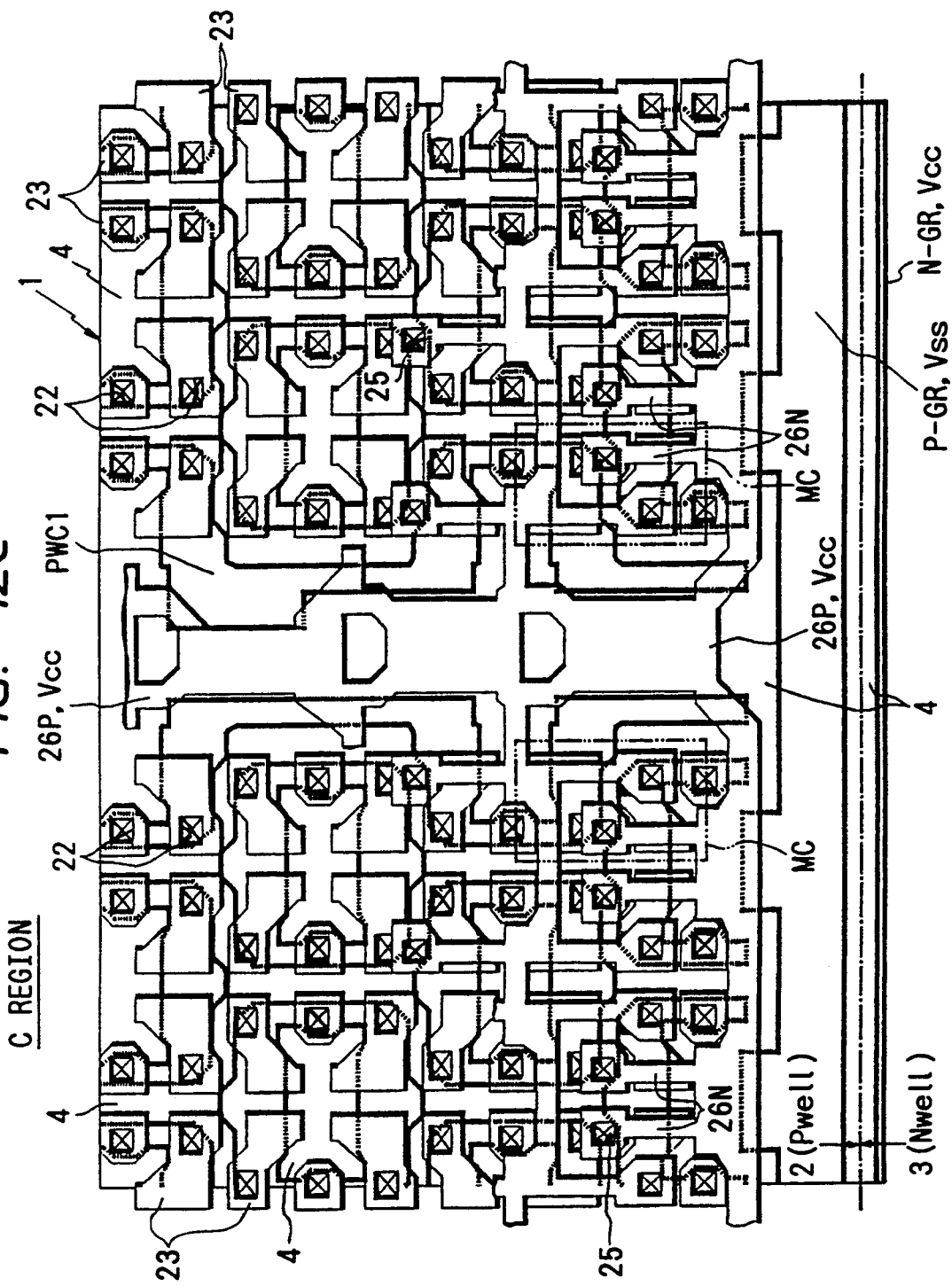
Figure 12D:
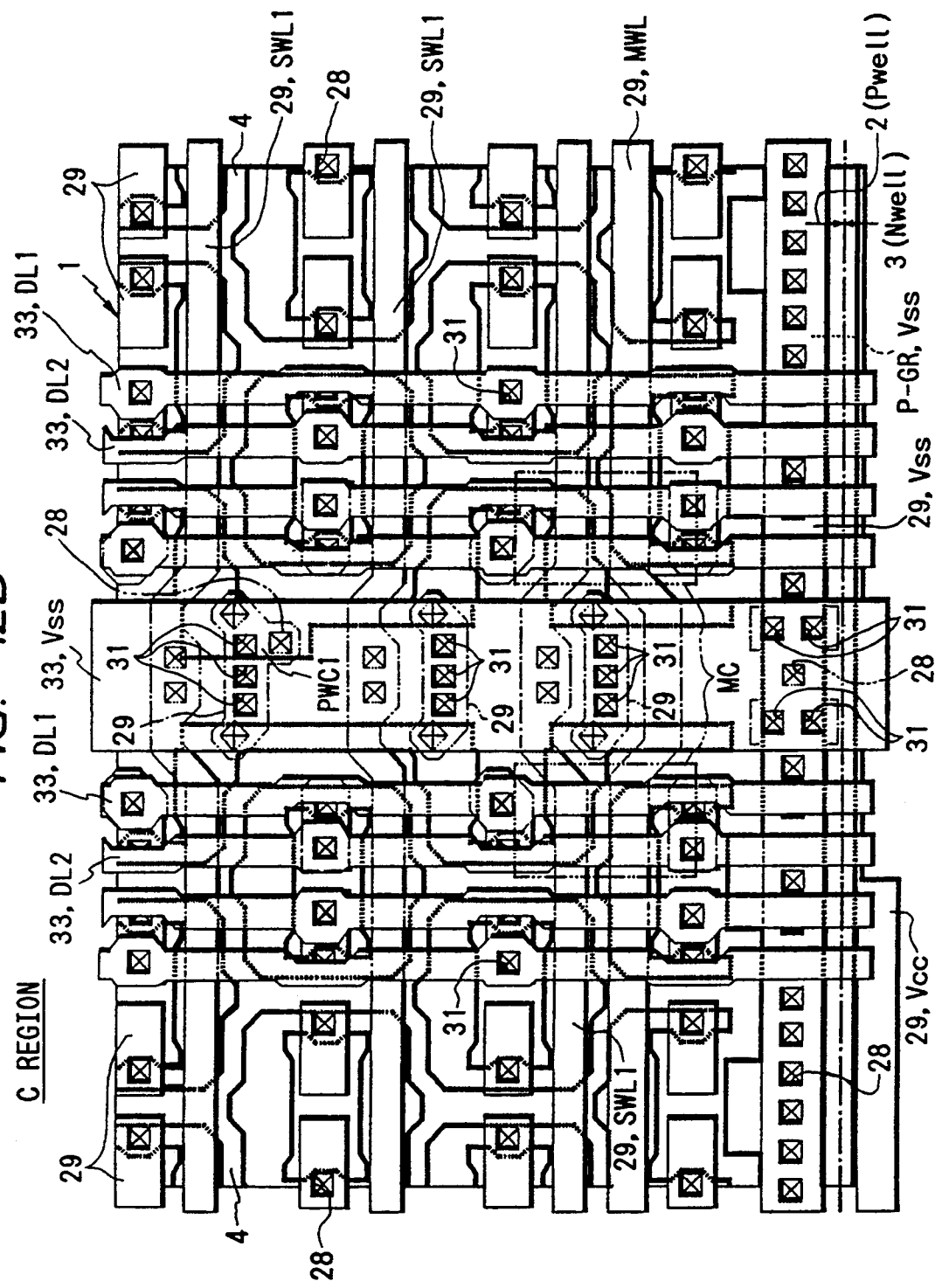
Figure 12F:
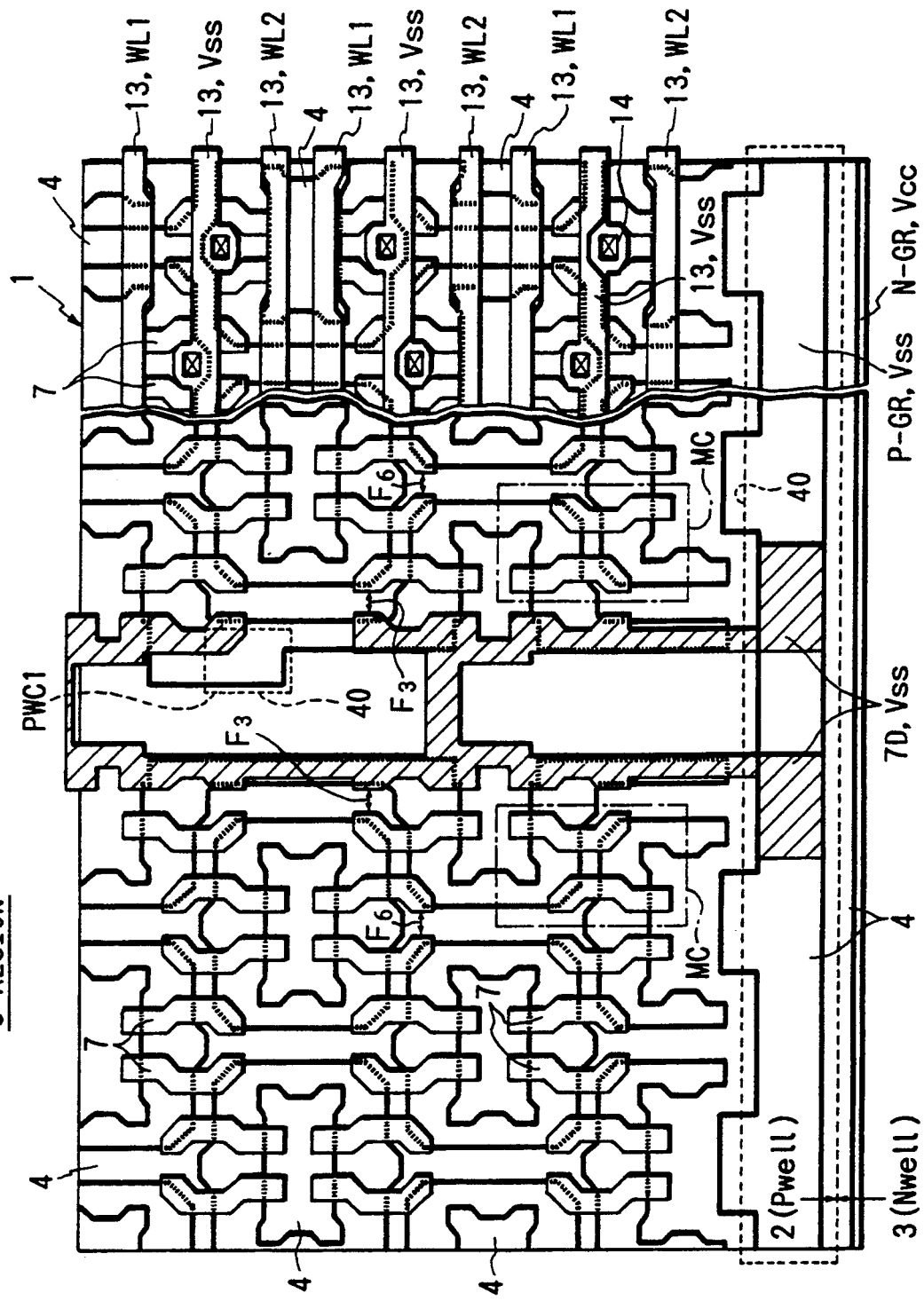

Here will be described an C region, as enclosed at reference letter C by broken lines in FIG. 2B, between the plurality of memory cell arrays MAY of the memory mats MM of the SRAM shown in FIGS. 2B and 4, namely, the well contact region PWC1. The structure of the memory cells MC of the C region and their peripheral structure are shown in FIG. 12 (presenting a top plan view of the C region). In FIG. 12, FIG. 12A shows a planar shape of the active region which is defined by the element isolating insulating film 4. FIG. 12B shows a planar shape of the drive MISFETs $Q_d$ and the transfer MISFETs $Q_t$ overlapped on the active regions. FIG. 12C shows a planar shape of the capacity element C and the load MISFETs $Q_p$ overlapped on the active region. FIG. 12D shows a planar shape of the sub-word line (SWL) 29, the main word line (MWL) 29 and the complementary data line (DL) 33 overlapped on the active region. FIG. 12E is a diagram omitting the reference voltage line ($V_{ss}$) 33 from FIG. 12D. FIG. 12F omits the word line 13 and the reference voltage line 13 from FIG. 12B (but shows the dummy gate electrode 7D, as hatched).

As shown in FIG. 12, the well contact region PWC1 is arranged between the plurality of memory cell arrays MAY. The memory cells MC arranged individually at the righthand end portion of the memory cell array MAY arranged at the righthand side, as shown in FIG. 12, and at the righthand end portion of the memory cell array MAY arranged at the lefthand side, namely, the memory cells MC arranged at the two sides in the X direction of the well contact region PWC1 are made to have a similar structure substantially identical to that of the memory cell MC1 arranged in the aforementioned A region. Moreover, the well contact region PWC1 has a structure substantially identical to that of the well contact region PWC2 arranged in the aforementioned E region (i.e., between the sub-memory cell arrays SMAY). In short, the well contact region PWC1 is formed, in the active region defined by the element isolating insulating film 4, as shown in FIG. 12, of the p+-type semiconductor region 40 which is formed over the principal face of the p−-type well region 2, so that it is fed with the reference voltage ($V_{ss}$). In short, the reference voltage line ($V_{ss}$) 33 is electrically connected with the p+-type semiconductor region 40 through the middle conductive layer 29. The reference voltage line ($V_{ss}$) is also electrically connected with the reference voltage line ($V_{ss}$) 13 through the middle conductive layer 29.

The well contact region PWC1 is basically constructed to have a structure identical to that of the well contact region PWC2 and is used as the individual connection regions of the two first word line (WL1) 13 and the second word line (WL2) extending in the direction over the memory cell array MAY arranged at the lefthand side of FIG. 12B, and the two word lines 13 are used as the region to be connected with the sub-word line (SWL1) 29 shown in FIG. 12D. The sub-word line SWL1 29 is electrically connected with the first word line 13 and the second word line 13 through the connection hole 28d. In short, the well contact region PWC1 is constructed, as shown in FIG. 12A, such that its size PWC1 is made larger than both the aforementioned well contact region PWC2 and the cell pitch CP.

Figure 13D:
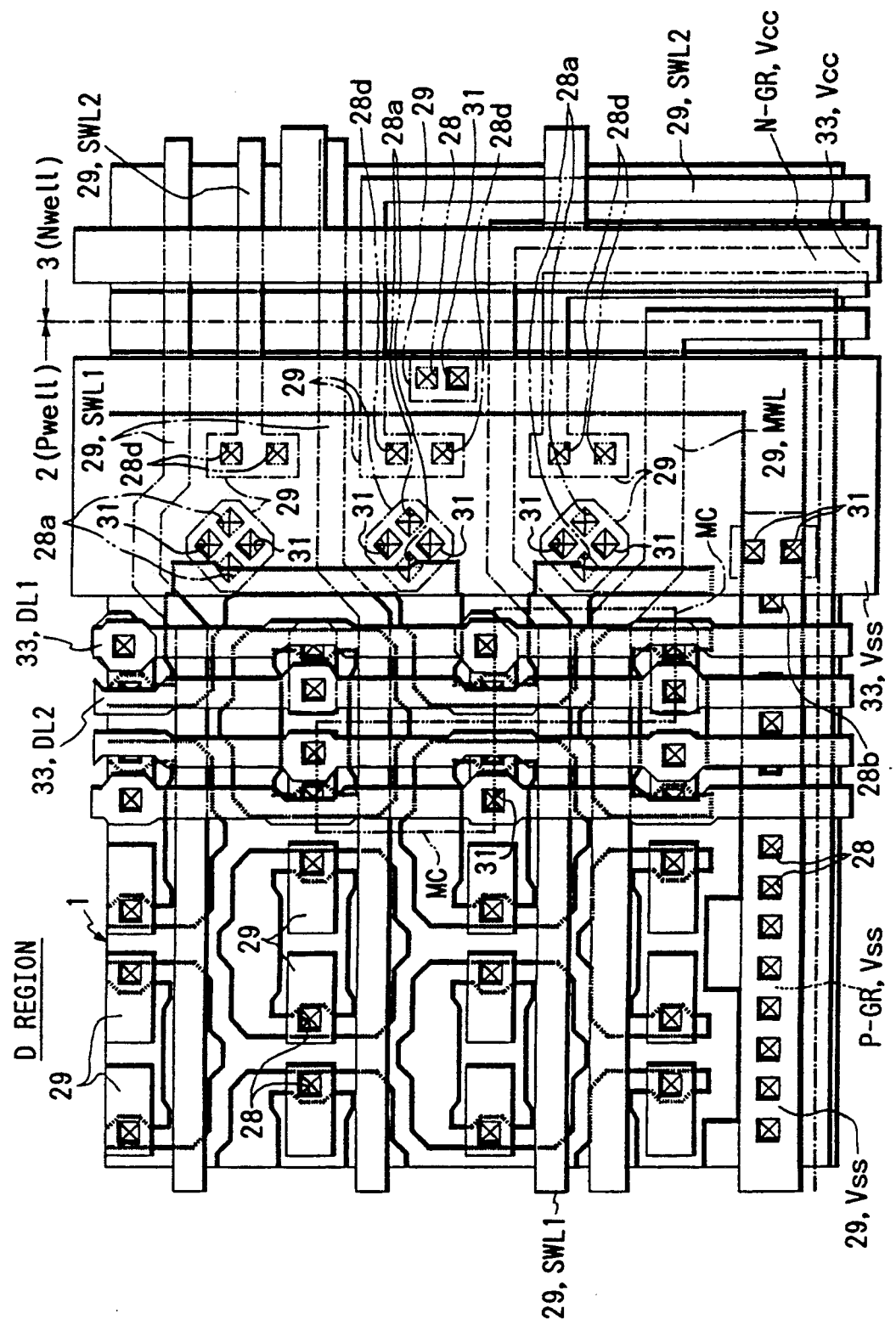

Next, the structure of the memory cells MC, which are arranged at the righthand end portion, as indicated by a D region enclosed by broken lines, of the memory cell array MAY of the memory mat MM of the SRAM shown in FIG. 2B, i.e., at the end portion close to the word driver circuit WDR of the memory cell array MAY will be described together with its peripheral structure. The structure of the memory cell MC of the D region and its peripheral structure are shown in FIG. 13 (presenting a top plan view of the D region). In FIG. 13, FIG. 13A shows a planar structure of an active region defined by the element isolating insulating film 4. FIG. 13B shows a planar shape showing the drive MISFETs $Q_d$ and the transfer MISFETs $Q_t$ overlapped on the aforementioned active region. FIG. 13C shows a planar shape of the capacity element C and the load MISFETs $Q_p$ overlapped on the aforementioned active region. FIG. 13D shows a planar shape of the sub-word line (SWL) 29, the main word line (MWL) 29 and the complementary data line (DL) 33 overlapped on the aforementioned active region.

As shown in FIG. 13, the memory cells MC arranged at the righthand end portion of the memory cell array MAY are constructed to have a planar shape similar to that of the aforementioned well contact region PWC1. The righthand end portion of the memory cell array MAY is constructed to have a structure identical to that of the memory cells MC to be intrinsically arranged in the aforementioned A region, because the guard ring region P-GR extends therearound in the Y direction. Like the region of the well contact region PWC1, however, the righthand end portion of the memory cell array MAY is used as the individual connection regions of the two first word line (WL1) 13 and second word line (WL2) 13, as shown in FIG. 13B, and also as the connection regions of the two word line 13 and sub-word line (SWL2) 29, as shown in FIG. 13D, so that it resembles the well contact region PWC1. In short, the memory cells MC arranged at the righthand end portion of the memory cell array MAY have the active region (i.e., the dummy active region) 4D added between itself and the guard ring region P-GR, and the width size of the element isolating insulating film 4 between the memory cells MC and the guard ring region P-GR can be enlarged to an extent corresponding to the aforementioned connection regions. The sub-word line SWL2 29 is electrically connected with the first word line 13 and the second word line 13 through the connection hole 28d. The reference voltage line ($V_{ss}$) 33 is connected with the reference voltage line ($V_{ss}$) 13 through the middle conductive layer 29. Moreover, the reference voltage line ($V_{ss}$) 33 is connected with the guard ring region P-GR through the middle conductive layer 29 and the reference voltage line 29.

Figure 14C:
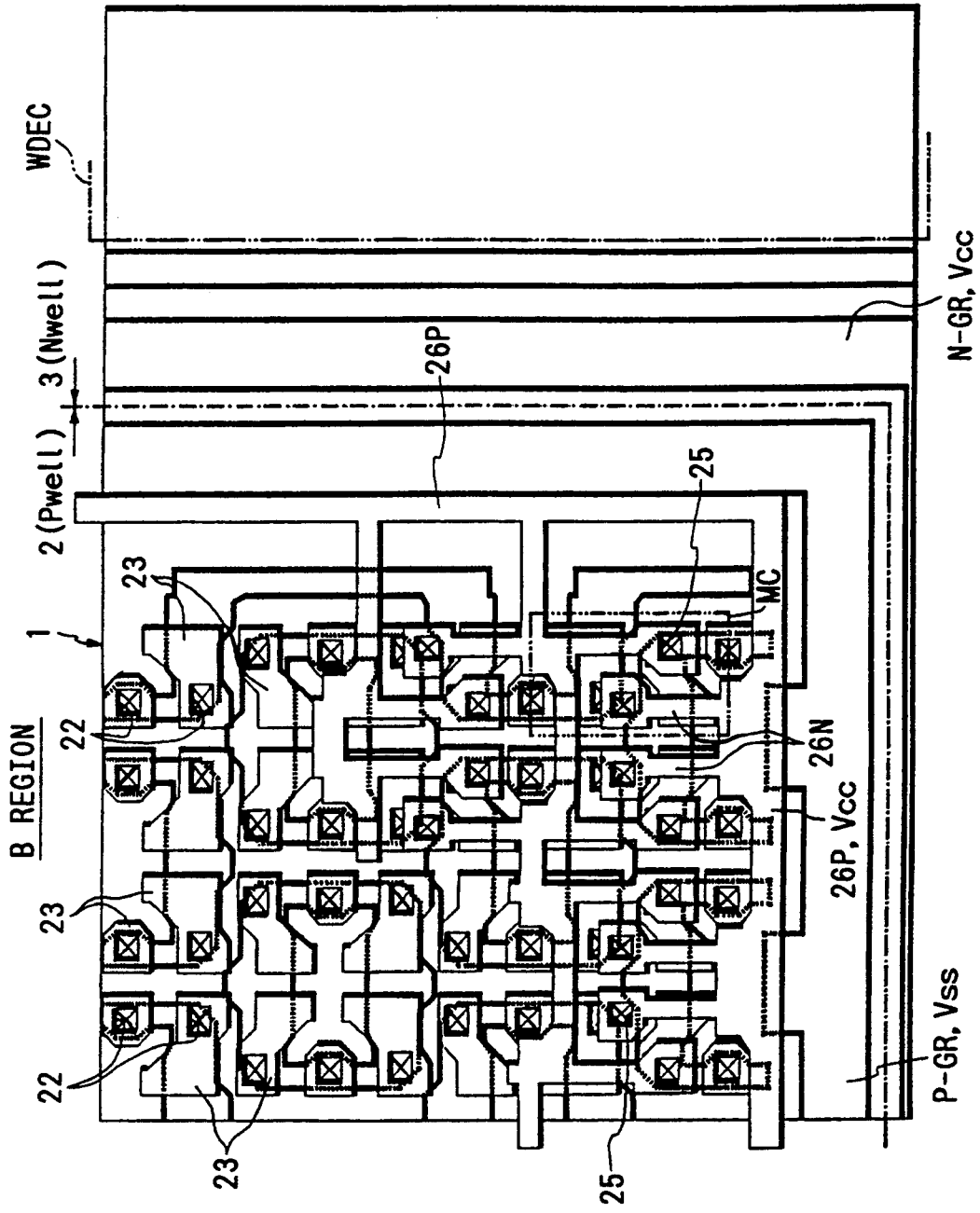
Figure 14D:
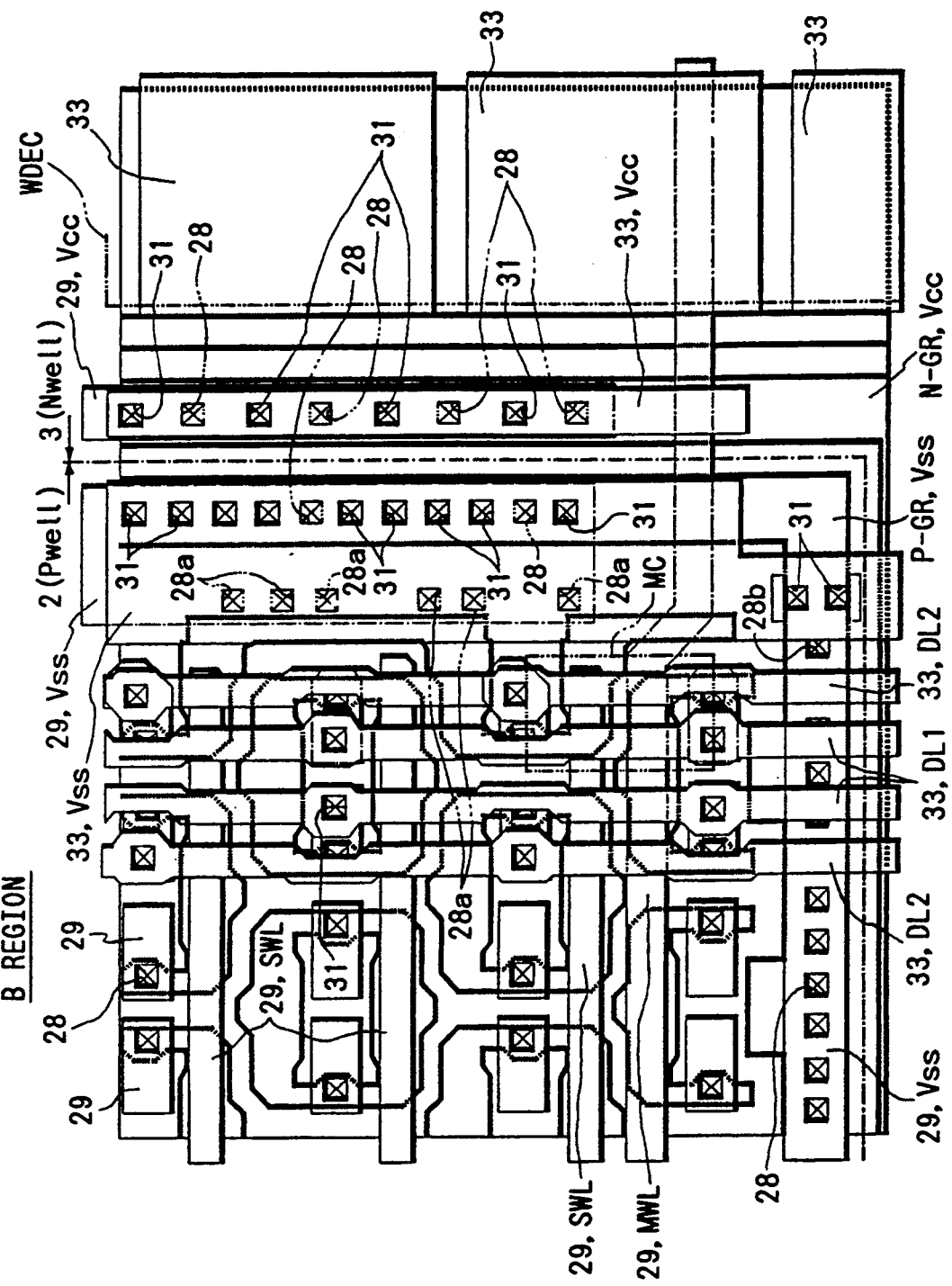

Next, in the memory block MB1 arranged at the lefthand side of the SRAM shown in FIG. 1, the structure of the memory cells MC arranged at the righthand lower end portion, as indicated at B by a B region enclosed by broken lines, of the memory cell array MAY of the memory mat MM arranged at the lefthand side of the X-decoder circuit XDEC, i.e., at the end portion close to the X-decoder circuit XDEC of the memory cell array MAY will be described together with its peripheral structure. The structure of the memory cells MC in the B region and its peripheral structure are shown in FIG. 14 (presenting a top plan view of the B region). In FIG. 14, FIG. 14A shows a planar shape of the active region defined by the element isolating insulating film 4. FIG. 14B shows a planar shape of the drive MISFETs $Q_d$ and the transfer MISFETs $Q_t$ overlapped on the aforementioned active region. FIG. 14C shows a planar shape showing the capacity element C and the load MISFETs $Q_p$ overlapped on the aforementioned active region. FIG. 14D shows a planar shape of the sub-word line (SWL) 29, the main word line (MWL) 29 and the complementary data line (DL) 33.

As shown in FIG. 14, the memory cells MC arranged at the righthand end portion of the memory cell array MAY is constructed to have a planar shape resembling the aforementioned D region (i.e., the region close to the word driver circuit WDR of the memory cell array MAY). Basically, the righthand end portion of the memory cell array MAY is surrounded by the guard ring region P-GR extending in the Y direction. Since the connection region for the two word-lines 13 and the connection regions for the two word lines 13 and the sub-word lines 29 are not arranged between the memory cell array MAY and the X-decoder circuit XDEC, the width size of the element isolating insulating film 4 between the memory cell array MAY and the X-decoder circuit XDEC is reduced to an extent corresponding to those connection regions. Moreover, each reference voltage line ($V_{ss}$) 13 is formed at its righthand end into a structure integral with the reference voltage line ($V_{ss}$) 13'. This reference voltage line ($V_{ss}$) 13' is electrically connected with the reference voltage line 33 through the reference voltage line ($V_{ss}$) 29.

The regions of the SRAM other than the aforementioned A region, B region, C region, D region and E region are constructed to have structures (including the case in which they are arranged in linear symmetry in the X direction or in the Y direction) substantially identical to or similar to those of any of the regions.

Next, the specific manufacture process of the aforementioned SRAM will be brief described in the following with reference to FIG. 17 (presenting a section showing an essential portion of the central region of the memory cell array at the individual steps) and FIG. 18 (presenting a section showing an essential portion of the A region, i.e., the peripheral region of the memory cell array at the individual steps).

<Well Forming Step>

First of all, there is prepared the n⁻-type semiconductor substrate 1 made of single crystal silicon (as shown in FIG. 17(A) and 18(A)).

Next, a silicon oxide film 42A is formed over the principal face of the n⁻-type semiconductor substrate 1. This silicon oxide film 42A is formed by the thermal oxidation method, for example, to have a film thickness of about 40 to 50 [nm].

Next, a silicon nitride film is formed through the aforementioned silicon oxide film 42A over the principal face of the n⁻-type semiconductor substrate 1 at the region formed with a p⁻-type well region 2. The silicon nitride film is used as an impurity doping mask and an oxidation resistance mask. The silicon nitride film is deposited by the CVD method, for example, to have a film thickness of about 40 to 60 [nm]. After the deposition, the silicon nitride film is patterned by the etching technique with the use of the mask which is formed by the photolithography technique.

Next, the silicon nitride film is used as the impurity doping mask to introduce an n-type impurity into the principal face of the n⁻-type semiconductor substrate 1 in the region formed with the n⁻-type well region 3. The n-type impurity to be used is exemplified by a phosphor (P). This P is introduced in an impurity concentration of about $10^{13}$ [atoms/cm$^2$] by using the ion implantation technique with an energy of about 120 to 130 [KeV]. The P is introduced through the silicon oxide film 42A into the principal face of the n⁻-type semiconductor substrate 1.

Next, the silicon oxide film 42A formed on the principal face of the region of the n⁻-type semiconductor substrate 1 formed with the n⁻-type well region 3 is grown to form a thick silicon oxide film 42B. The growth of the oxide silicon film 42B is accomplished by the thermal oxidation method using the silicon nitride film as the oxidation resistance mask. The silicon oxide film 42B is grown to have a film thickness of about 130 to 140 [nm].

Next, the silicon nitride film is removed. Then, the grown silicon oxide film 42B is used as the impurity doping mask to introduce a p-type impurity into the principal face of the n⁻-type semiconductor substrate 1 in the region formed with the p⁻-type well region 2. The p-type impurity used is exemplified by BF$_2$. This BF$_2$ is introduced in an impurity concentration of about $10^{12}$ to $10^{13}$ [atoms/cm$^2$] by using the ion implantation technique with an energy of about 60 [KeV]. The BF$_2$ is introduced into the principal face of the n⁻-type semiconductor substrate 1 through the silicon oxide film 42A.

Next, the p-type impurity and the n-type impurity introduced into the principal face of the n⁻-type semiconductor substrate 1 are individually extended and diffused to form the p⁻-type well region 2 of the p-type impurity and the n⁻-type well region 3 of the n-type impurity, as shown in FIG. 17(A) and FIG. 18(A). The extended diffusion of the impurities is performed at a high temperature of 1,100 to 1,300 [°C.], for example, for about 100 to 200 [min.]. The n⁻-type semiconductor substrate 1 having the twin-well structure shown in FIG. 17(A) and FIG. 18(A) is completed when the p⁻-type well region 2 and the n⁻-type well region 3 are formed.

<Step of Forming Element Isolating Region>

Next, the silicon oxide film 42A and the silicon oxide film 42B are removed from the respective principal faces of the p⁻-type well region 2 and the n-type well region 3 of the n⁻-type semiconductor substrate 1.

Next, a silicon oxide film 42C is newly formed over the individual principal faces of the p⁻-type well region 2 and the n⁻-type well region 3. The silicon oxide film 42C is formed by the thermal oxidation method to have a film thickness of about 15 to 20 [nm], for example.

Next, a silicon nitride film 43 is formed over the principal faces of the regions formed with the individual active regions of the aforementioned p⁻-type well region 2 and n⁻-type well region 3 (as shown in FIG. 17(B) and FIG. 18(B)). The silicon nitride film 43 is used as an impurity doping mask and an oxidation resistance mask. The silicon nitride film 43 is deposited by the CVD method, for example, to have a film thickness of about 100 to 150 [nm]. The silicon nitride film 43 is patterned by the etching technique using a mask (of a photosensitive resin film) 44, which is formed after deposition by the photolithography technique, as indicated at 43 by single-dotted chain lines in FIG. 17(B) and FIG. 18(B).

At this time, in the aforementioned A region (like the B region to the E region), the width size $L_3$ of the inactive region (i.e., the region to be formed with the element isolating insulating film 4, as shown in FIG. 9A) between the active region arranged with the other transfer MISFET $Q_{t2}$ of the memory cell MC (i.e., the memory cell MC1) arranged at the end portion of the memory cell array MAY shown in FIG. 18(B) and the guard ring region P-GR is formed to have a size substantially equal to the width size of the inactive region in the same position of the central region of the memory cell array MAY with a view to retaining the periodicity at the end portion of the memory cell array MAY. As a result, some stress due to the disturbances of the periodicity, as indicated at reference numeral 44A by broken lines in FIG. 18(B), will not act upon the mask 44 defining the active region arranged with the other transfer MISFET $Q_{t2}$ of the memory cell MC1 so that the flow 44A of the side face of the mask 44 can be reduced to work the side of the mask 44 in a steep shape. In other words, the gate width $L_1$ of the active region arranged with the other transfer MISFET $Q_{t2}$ of the memory cell MC1 can be equalized to either the gate width $L_2$ of the one transfer MISFET $Q_{t1}$ in the memory cell MC1 or that of another memory cell MC.

Incidentally, the phenomenon corresponding to the flow 44A at the side face of the mask 44 is not limited to that at the working step of the mask 44 but will likewise occur at various steps such as the step of patterning the lower silicon nitride film 43 using the mask 44 or the step of forming the element isolating insulating film 4. Moreover, the step of working the aforementioned mask 44, i.e., the step of forming the mask 44 by the photolithography technique ordinarily includes the step of applying the photosensitive resin film, the step of setting the photosensitive resin film by the baking treatment, the exposure step and the development step.

The aforementioned mask 44 is removed after the aforementioned silicon nitride film 43 has been patterned.

Next, when the aforementioned silicon nitride film 43 is patterned, the silicon oxide film 42C or its portion is removed from the inactive region exposed from that silicon nitride film 43 so that a new silicon oxide film 42C is formed again over that inactive region. This new silicon oxide film 42C is prepared by the thermal oxidation, for example, to have a film thickness of about 8 to 12 [nm]. This new silicon oxide film 42C is provided to eliminate the etching damage at the time of patterning the silicon nitride film 43 or to prevent a contamination at the time of introducing the impurity.

Next, the aforementioned silicon nitride film 43 is used as the impurity doping mask to dope the region of the $p^-$-type well region 2 formed with the inactive region (i.e., the element isolating film), with a p-type impurity. This p-type impurity used is exemplified by $BF_2$. This $BF_2$ is introduced in an impurity concentration of about $10^{12}$ to $10^{13}$ [atoms/cm$^2$] by the ion implantation technique with an energy of about 30 to 50 [KeV]. The $BF_2$ is introduced into the principal face of the $p^-$-type well region 2 through the aforementioned silicon oxide film 42C.

Figure 17C:
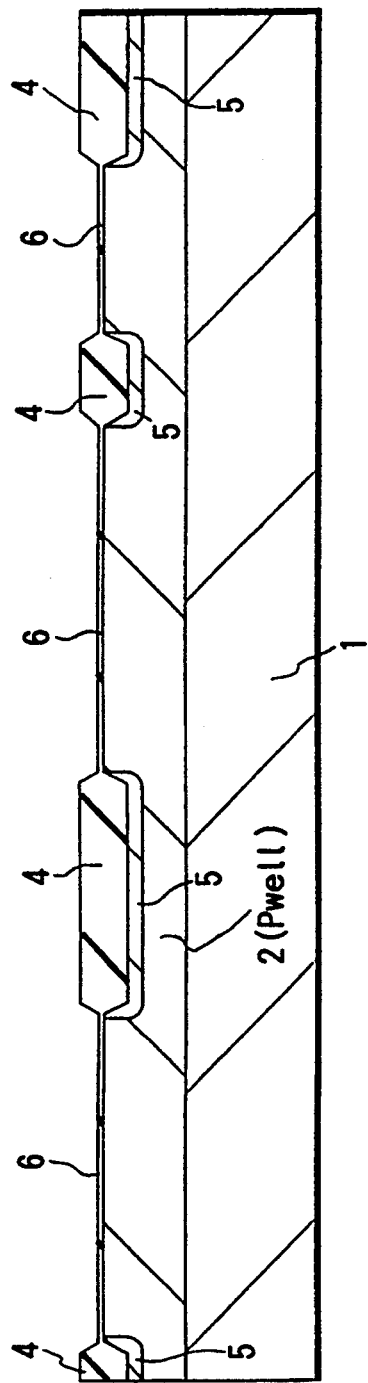

Next, the aforementioned silicon nitride film 43 is used as an oxidation resistance mask to grow the silicon oxide film 42C over the principal faces of the individual inactive regions of the $p^-$-type well region 2 and the $n^-$-type well region 3 thereby to form the element isolating insulating film 4 (as shown in FIG. 17(C) and FIG. 18(C)). This element isolating insulating film 4 is made of a silicon oxide film formed by the thermal oxidation method (i.e., the selective thermal oxidation method of the substrate), for example, to have a film thickness of about 400 to 500 [nm].

As has been described hereinbefore, the width size $L_3$ of the element isolating insulating film 4 defining the A region or the like, i.e., the active region to be arranged with the other transfer MISFET $Q_{t2}$ of the memory cell MC1 arranged at the end portion of the memory cell array MAY is equalized to the width size of the same position of the element isolating insulating film 4 at the central region of the memory cell array MAY so that the periodicity at the end portion of the memory cell array MAY can be retained. As a result, the gate width $L_1$ of the other transfer MISFET $Q_{t2}$ of the aforementioned memory cell MC1 can be equalized to other gate widths. In other words, the active region (i.e., the dummy active region) 4D, as shown in FIGS. 9A, 10A, 11A, 12A, 13A, 14B and 15, is formed by forming the element isolating insulating film 4.

When the heat treatment step of forming the element isolating insulating film 4, the p-type impurity introduced in advance into the inactive region of the $p^-$-type well region 2 is extended diffused to form the p-type channel stopper region 5.

After the element isolating insulating film 4 and the p-type channel stopper region 5 have been formed, the silicon nitride film 43 used as the oxidation resistance mask is removed.

<Step of Forming First Gate Insulating Film>

Next, the silicon oxide film 42C is removed from the principal faces of the individual active regions of the aforementioned $p^-$-type well region 2 and $n^-$-type well region 8. By this step of removing the silicon oxide film 42C, the principal faces of the individual active regions of the $p^-$-type well region 2 and the $n^-$-type well region 8 are exposed to the outside.

Next, a silicon oxide film is newly formed over the principal faces of the individual active regions of the $p^-$-type well region 2 and the $n^-$-type well region. The silicon oxide film is formed mainly to prevent contamination at the time of introducing the impurity and to remove the so-called "white ribbon", i.e., the silicon nitride film at the end portion of the element isolating insulating film 4, which could not be removed at the time of removing the aforementioned silicon nitride film. The silicon oxide film is formed by the thermal oxidation method, for example, to have a film thickness of about 18 to 20 [nm].

Next, the principal faces of the individual active regions of the $p^-$-type well region 2 and the $n^-$-type well region 3 are doped with an impurity for adjusting the threshold voltage. This threshold voltage adjusting impurity used is exemplified by a p-type impurity such as $BF_2$. This $BF_2$ is introduced in an impurity concentration of about $10^{12}$ to $10^{13}$ [atoms/cm$^2$] by using the ion implantation technique with an energy of about 40 to 50 [KeV]. This $BF_2$ is introduced through the aforementioned silicon oxide film into the individual principal faces of the $p^-$-type well region 2 and the $n^-$-type well region 3.

Next, the silicon oxide film is removed from the principal faces of the individual active regions of the aforementioned $p^-$-type well region 2 and $n^-$-type well region 3 to expose the principal faces of the individual active regions of the $p^-$-type well region 2 and the $n^-$-type well region 3. After this, as shown in FIG. 17(C) and 18(C), the principal faces of the individual active regions of the $p^-$-type well region 2 and the $n^-$-type well region 3 are formed thereover with the gate insulating film 6. This gate insulating film 6 is formed by the thermal oxidation method to have a film thickness of about 13 to 15 [nm]. The gate insulating film 6 is used as the individual gate insulating films of the drive MISFETs $Q_d$ of the memory cell MC and the n-type channel MISFETs $Q_n$ constituting an electrostatic breakdown preventing circuit (e.g., a clamping MISFETs) and an output step circuit to be connected between the external terminal and the input step circuit of the SRAM.

<Step of Forming First-Layered Gate Material)>

Next, the polycrystalline silicon film (7) is deposited all over the surface of the substrate including that of the aforementioned gate insulating film 6. This polycrystalline silicon film is formed at the step of forming the first-layered gate material. The polycrystalline silicon film is formed of the so-called "doped poly-silicon" which is deposited by the CVD method and doped during the deposition with an impurity for reducing the resistance. This polysilicon film is deposited by the CVD method using disilane ($Si_2H_6$) and phosphine ($PH_3$) as its source gas. In case of the present embodiment, the polycrystalline silicon film is doped with an n-type impurity such as P in an impurity concentration of about $10^{20}$–$10^{21}$ [atoms/$cm^2$]. Moreover, the polycrystalline silicon film is formed to have a relatively small film thickness of about 100 [nm] in case it is used as the gate electrode 7 of the MISFET or the first electrode 7 of the capacity element C. The polycrystalline silicon film can retain the breakdown voltage of the dielectric film (21) to be formed thereover or the underlying gate insulating film (6) to such an extent that it will not deteriorate the operating speed in case it is used as the gate electrode 7 or the like of the MISFET, thereby to thin and flatten the upper layer.

The polycrystalline silicon film is subjected to a heat treatment after it has been formed at the aforementioned step of forming the first-layered gate material. This heat treatment is accomplished in a nitrogen ($N_2$) gas, for example, at a temperature of 700 to 950 [°C.] for about 8 to 12 [minx], to activate the P introduced into the polycrystalline silicon film and to stabilize the film quality.

Next, the substrate including the aforementioned polycrystalline silicon film is formed all over its surface with an (not-numbered) insulating film. This insulating film isolates the underlying polycrystalline silicon film and the overlying conductive layer (13) electrically from each other. The insulating film is formed of the silicon oxide film which is deposited by the CVD method using the inorganic silane ($SiH_4$ or $SiH_2Cl_2$) as the source gas and the nitrogen oxide ($N_2O$) gas as the carrier gas. The silicon oxide film is deposited at a temperature of about 800 [°C.]. The insulating film is formed to have a film thickness of about 130 to 160 [nm].

Figure 17D:
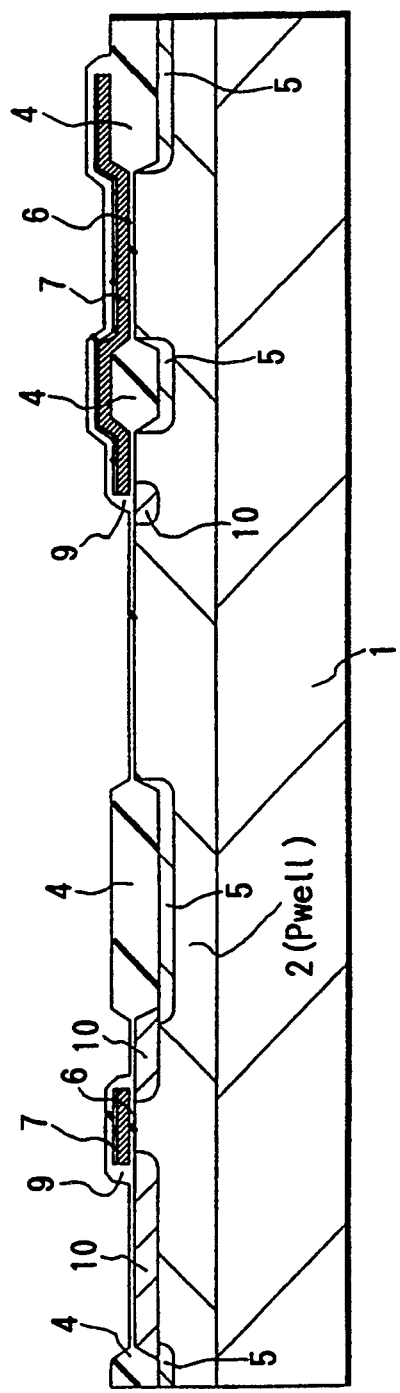

Next, the aforementioned insulating film and polycrystalline silicon film are sequentially patterned to form the gate electrode 7 of the polycrystalline silicon film (as shown in FIG. 17(D) and FIG. 18(D)). The patterning uses the mask formed by the photolithography technique, and is accomplished by the anisotropic etching such as the RIE. The gate electrode 7 is constructed as the gate electrode 7 of the drive MISFETs $Q_d$ or the like. The dummy gate electrode 7D, as shown in FIGS. 9B, 10B, 11B and 11G, 12B and 12F, 13B, 14B and 16, is formed at the same step as that of forming the gate electrode 7.

<Step of Forming First Source Region and Drain Region>

Next, the gate electrode 7 and the insulating film formed over the former are formed at their side walls with the side wall spacer 9. This side wall spacer 9 is formed by depositing the silicon oxide film all over the surface of the substrate including the aforementioned insulating film and by etching the whole surface of the silicon oxide film to an extent corresponding to the deposited film thickness. The silicon oxide film is deposited like before by the CVD method using the inorganic silane gas as the source gas to have a film thickness of 140 to 160 [nm], for example. The etching used is exemplified by the anisotropic etching such as the RIE.

Next, at the etching time for forming the aforementioned side wall spacer 9, the principal faces of the individual active regions of the $p^-$-type well region 2 and the $n^-$-type well region 3 in the regions other than those formed with the gate electrode 7 and the side wall spacer 9 are exposed to the outside, and this exposed region is formed with the (not-numbered) silicon oxide film. This silicon oxide film is used mainly to prevent contamination at the impurity introducing time and to prevent the principal faces of the active regions from being damaged by the impurity introduction. This silicon oxide film is formed by the thermal oxidation method, for example, to have a film thickness of about 10 to 30 [nm].

Next, although not shown, the regions formed with the transfer MISFETs $Q_t$ of the memory cell array MAY and the n-type channel MISFETs $Q_n$ and the p-type channel MISFET $Q_p$ of the peripheral circuit (excepting the regions formed with the double drain structure) are formed with an impurity introduction mask. This impurity introduction mask is formed in the memory cell array MAY and outside of the region which is enclosed at reference letters DDD by single-dotted chain lines in FIGS. 8A and 8C. The impurity introduction mask is formed by the photolithography technique, for example.

Next, the aforementioned impurity introduction mask is used to dope the principal face portion of the $p^-$-type well region 2 with an n-type impurity, as shown in FIG. 17(D) and 18(D), in the region formed with the drive MISFETs $Q_d$ of the memory cell array MAY. This n-type impurity used is the P having a low diffusion rate to form the lightly doped n-type semiconductor region 10 of the source region and drain region of the drive MISFETs $Q_d$ mainly adopting the double drain structure. The P is introduced in an impurity concentration of about $10^{14}$ to $10^{15}$ [atoms/$cm^2$] by the ion implantation technique with an energy of about 30 to 40 [KeV]. At the time of introducing the P, not only the aforementioned impurity introduction mask (DDD) but also the gate electrode 7 and the side wall spacer 9 formed at the side wall of the former are also used as the impurity introduction mask.

The aforementioned impurity introduction mask is removed after the introduction of the P.

Next, the aforementioned n-type impurity P is extended and diffused to form the lightly doped n-type semiconductor region 10, as shown in FIG. 17(D) and FIG. 18(D). This n-type semiconductor region 10 uses the side wall spacer 9 as the impurity introduction mask so that the amount of diffusion to the channel forming region is determined by the side wall spacer 9 at the region to be formed with the drive MISFETs $Q_d$. In other words, the n-type semiconductor region 10 can reduce the amount of diffusion to the channel forming region to an extent corresponding to the film thickness of the side wall spacer 9, as compared with the case in which the gate electrode 7 is used as the impurity introduction mask. This reduction in the amount of diffusion to the channel forming region can increase the effective gate length size (i.e., the channel length size) of the drive MISFETs $Q_d$ thereby to prevent the short-channel effect of the drive MISFETs $Q_d$.

<Step of Forming Second Gate Insulating Film>

Next, in the individual regions formed with the transfer MISFETs $Q_t$ of the memory cell array MAY and the n-type channel MISFETs $Q_n$ and p-type channel MISFETs $Q_p$ of the peripheral circuit, the principal faces of the individual active regions of the p⁻-type well region 2 and the n⁻-type well region 3 are doped with a threshold voltage adjusting impurity. This threshold voltage adjusting impurity used is exemplified by a p-type impurity such as $BF_2$. This $BF_2$ is introduced in an impurity concentration of about $10^{12}$ to $10^{13}$ [atoms/cm$^2$] by using the ion implantation method with an energy of about 40 to 60 [KeV]. The $BF_2$ is introduced into the individual principal faces of the p⁻-type well region 2 and the n⁻-type well region 3 through the silicon oxide film formed over the principal face of the active regions.

Next, in the individual regions formed with the transfer MISFETs $Q_t$ of the memory cell array MAY and the n-type channel MISFETs $Q_n$ and the p-type channel MISFETs $Q_p$ of the peripheral circuit, the silicon oxide film is removed from the principal faces of the individual active regions of the p⁻-type well region 2 and the n⁻-type well region 3 to expose the principal faces to the outside.

Next, the exposed principal faces of the individual active regions of the p⁻-type well region 2 and the n⁻-type well region 3 are formed with the gate insulating film 12. This gate insulating film 12 is formed by the thermal oxidation method to have a film thickness of about 13 to 14 [nm]. The gate insulating film 12 is used as the individual gate insulating films of the transfer MISFETs $Q_t$ of the memory cell MC and the n-type channel MISFETs $Q_n$ and the p-type channel MISFETs $Q_p$ of the peripheral circuit.

<Step of Forming Second-Layered Gate Material>

Next, the polycrystalline silicon film 13A (i.e., the lower one of the electrode layers of three-layered structure) is deposited all over the surface of the substrate including the aforementioned gate insulating film 12. This polycrystalline silicon film 13A is formed at the step of forming the second-layered gate material. The polycrystalline silicon film 13A is deposited like the polycrystalline silicon film of the aforementioned gate electrode 7 by the CVD method using the $Si_2H_6$ and $PH_3$ as the source gas. In case of the present embodiment, the polycrystalline silicon film 13A is doped with the P in an impurity concentration of about $2 \times 10^{20}$ [atoms/cm$^2$] with a view to improving the breakdown voltage of the underlying gate insulating film 13A. Moreover, the polycrystalline silicon film 13A is formed to have a small film thickness of about 30 to 50 [nm] with a view to flattening the upper layer.

Next, over the source region (10) of the drive MISFETs $Q_d$ of the memory cells MC of the memory cell array MAY and at the connection regions between the source regions and the reference voltage lines ($V_{ss}$ and 13), the polycrystalline silicon film 13A and the underlying gate insulating film 12 are removed individually and sequentially to form the connection holes 14. These connection holes 14 are formed by the anisotropic etching such as the RIE using the mask formed by the photolithography technique. The connection holes 14 connect the source regions of the drive MISFETs $Q_d$ and the reference voltage lines (13). After the clean gate insulating film 12 has been formed, the polycrystalline silicon film 13A is formed directly over the gate insulating film 12, and the connection holes 14 are then formed. As a result, the mask for forming the connection holes 14 will not come into direct contact with the surface of the gate insulating film 12. In short, the step of forming the connection holes 14 is freed from the contamination of the gate insulating film 12, which might otherwise be based on the mask formation and separation, so that the breakdown voltage of the gate insulating film 12 is not degraded.

Next, the substrate including the aforementioned polycrystalline silicon film 13A is formed all over the surface sequentially with the polycrystalline silicon film 13B and the refractory metal silicide film 13C. The polycrystalline silicon film 13B is formed at the step of forming the second-layered gate material. Like the polycrystalline silicon film of the aforementioned gate electrode 7, the polycrystalline silicon film 13B is deposited by the CVD method using the $Si_2H_6$ and $PH_3$ as the source gas. In case of the present embodiment, the polycrystalline silicon film 13B is connected as the reference voltage line (13) directly with the surface of the source region (10) so that it is doped with the P in an impurity concentration of about $4 \times 10^{20}$ [atoms/cm$^2$] with a view to improving the contact resistance at the time of connection. In other words, the middle polycrystalline silicon film 13B is doped with the P in a higher impurity concentration than that of the P introducing into the lower polycrystalline silicon film 13A. Moreover, the polycrystalline silicon film 13B is formed to have a small film thickness of about 30 to 50 [nm] with a view to flattening the upper layer. The aforementioned refractory metal silicide film 13C is formed at the step of forming the second-layered gate material. The refractory metal silicide film 13C has its portion connected with the source region of the drive MISFETs $Q_d$ through the connection holes 14 and the middle polycrystalline silicon film 13B. The refractory metal silicide film 13C is formed of the $WSi_2$ which is deposited by the CVD method or the sputtering method. The $WSi_2$ is a productively highly stable gate material. Since the refractory metal silicide film 13C has a lower specific resistance than those of the polycrystalline silicon films 13A and 13B, it is formed to have a relatively small film thickness of about 80 to 100 [nm] so as to suppress the growth of the step shape of the upper layer.

Next, the substrate including the aforementioned refractory metal silicide film 13C is formed all over the surface with the insulating film 15. This insulating film 15 is formed to have a film thickness of 200 to 300 [nm], for example. The insulating film 15 is formed of the silicon oxide film which is deposited by the CVD method using the organic silane ($Si(OC_2H_5)_4$) as the source gas at a high temperature (e.g., 700 to 850 [°C.]) and under a low pressure (e.g., 1.0 [Torr]).

Next, the aforementioned insulating film 15, refractory metal silicide film 13C, polycrystalline silicon film 13B and polycrystalline silicon film 13A are individually patterned to form the gate electrode 13 having the laminated structure composed of the polycrystalline silicon films 13A and 13B and the refractory metal silicide film 13C. The gate electrode 13 is used as the individual gate electrodes of the transfer MISFETs $Q_t$ of the memory cells MC and the n-type channel MISFETs $Q_n$ and p-type channel MISFETs $Q_p$ of the peripheral circuit. At the same step as that of forming the gate electrode 13, moreover, the word lines (WL) 13 and the reference voltage lines ($V_{ss}$) 13 are formed (as shown in FIG. 17(E) and FIG. 18(E)). The aforementioned patterning is accomplished by the anisotropic etching such as the RIE using the mask formed by the photolithography technology. At the step of forming the gate electrode 13, moreover, the dummy word line 13D1 and the dummy reference voltage line 13D2 are formed, as shown in FIG. 9C, 10B, 11B and 11G, 12B and 12F, 13B, 14B and 15.

<Step of Forming Second Source Region and Drain Region>

Next, in the regions formed with the transfer MISFETs $Q_t$ and the drive MISFETs $Q_d$ of the memory cells MC of the memory cell array MAY and the n-type channel MISFETs $Q_n$ of the peripheral circuit, the active region of the $p^-$-type well region 2 has its principal face doped with an n-type impurity. This n-type impurity is introduced to form the lightly doped n-type semiconductor region (17) having the LDD structure and is exemplified by the P having a gentler impurity concentration gradient than the As so as to weaken the intensity of electric field in the vicinity of the drain region. The P is introduced in an impurity concentration of about $10^{13}$ [atoms/cm$^2$] by using the ion implantation technology with an energy of about 40 to 60 [KeV]. The P is introduced in self-alignment into the individual gate electrodes 13 and 7 by using the gate electrode 13 as the impurity introduction mask in the individual regions formed with the transfer MISFETs $Q_t$ and the n-type channel MISFETs $Q_n$ of the memory cells MC and by using the gate electrode 7 as the impurity introduction mask in the regions formed with the drive MISFETs $Q_d$.

After this, a heat treatment is accomplished to extend and diffuse the P thereby to form the lightly doped n-type semiconductor region 17 (as shown in FIG. 17(E) and 18(E)). The heat treatment is accomplished in argon (Ar) at a high temperature of 900 to 1,000 [°C.] for about 15 to 25 [min.]. On the basis of this heat treatment, the aforementioned n-type semiconductor region 17 has an increased amount of diffusion to the individual channel forming regions of the transfer MISFETs $Q_t$ and n-type channel MISFETs $Q_n$ so that it is suitably overlapped on the gate electrode 13 after the completion of the manufacture process.

Next, in the region formed with the p-type channel MISFETs $Q_p$ of the peripheral circuit, although not shown, the active region of the $n^-$-type well region 3 has its principal face with a p-type impurity. This p-type impurity is introduced to form a lightly doped p-type semiconductor region having the LDD structure. The p-type impurity used is exemplified by the BF$_2$. The BF$_2$ is introduced in an impurity concentration of about $10^{12}$ to $10^{13}$ [atoms/cm$^2$] by using the ion implantation technique with an energy of about 40 [KeV]. The BF$_2$ is introduced in self-alignment with the gate electrode 13 by using the gate electrode 13 as the impurity introduction mask. The introduction of the p-type impurity forms the lightly doped p-type semiconductor region of the LDD structure of the p-type channel MISFETs $Q_p$. Since the p-type impurity has a higher diffusion rate than that of the n-type impurity, the p-type semiconductor region can be sufficiently overlapped on the gate electrode 13 without any heat treatment.

Next, the aforementioned gate electrode 13 and insulating film 15 have their individual side walls formed with the side wall spacer 16. This side wall spacer 16 is formed by depositing the silicon oxide film on the whole surface of the substrate including the insulating film 15d and by etching the whole surface of the silicon oxide film to an extent corresponding to the deposited film thickness. The silicon oxide film is deposited like before by the CVD method using the inorganic silane gas as the source gas to have a film thickness of 250 to 300 [nm], for example. The etching uses the anisotropic etching such as the RIE.

Next, at the etching time for forming the side wall spacer 16, the individual active regions of the $p^-$-type well region 2 and the $n^-$-type well region 3 other than the regions formed with the gate electrode 13 and the side wall spacer 16 have their principal faces exposed to the outside, and these exposed regions are formed with the (not-numbered) silicon oxide film. This silicon oxide film is used mainly to prevent contamination at the time of impurity introduction and to prevent the principal faces of the active regions from being damaged on the basis of the impurity introduction. This silicon oxide film is formed by the thermal oxidation method, for example, to have a thickness of about 10 to 20 [nm].

Next, in the regions formed with transfer MISFETs $Q_t$ and drive MISFETs $Q_d$ of the memory cells MC of the memory cell array MAY and the n-type channel MISFETs $Q_n$ of the peripheral circuit, the principal face of the active region of the $p^-$-type well region 2 is doped with an n-type impurity. This n-type impurity used is exemplified by the As having a lower diffusion rate than that of the P with a view to shallowing the pn junction. The As is introduced in an impurity concentration of about $10^{15}$ to $10^{16}$ [atoms/cm$^2$] by using the ion implantation technique with an energy of about 30 to 50 [KeV]. This As is introduced in self-alignment with the gate electrodes 7 and 12 and the side spacers 9 and 16 by using them as the impurity introduction mask.

After this, a heat treatment is accomplished to extend and diffuse the aforementioned n-type impurity thereby to form the highly doped $n^+$-type semiconductor regions 11 and 18. The heat treatment is accomplished in the nitrogen gas, for example, at a high temperature of 800 to 900 [°C.] for about 15 to 20 [min.]. The aforementioned $n^+$-type semiconductor regions 11 and 18 are individually used as the source region and the drain region. As shown in FIG. 17(E) and 18(E), the step of forming the $n^+$-type semiconductor region 11 completes the drive MISFETs $Q_d$ adopting the DDD structure of the memory cell MC, and the step of forming the $n^+$-type semiconductor region 18 completes the transfer MISFETs $Q_t$ adopting the LDD structure. Moreover, the step of forming the $n^+$-type semiconductor region 18 completes the n-type channel MISFETs adopting the LDD structure of the peripheral circuit. As shown in FIG. 17(E) and 18(E), on the other hand, the formation of the aforementioned $n^+$-type semiconductor regions 11 and 18 completes the guard ring region N-GR formed of the $n^+$-type semiconductor region 11 and 18 arranged in the peripheral region of the n⁻-type well region 3.

<Step of Forming Third-Layered Gate Material>

Next, the substrate is etched all over its surface mainly to remove the insulating film formed over the gate electrode 7 of the drive MISFETs $Q_d$ of the memory cell MC of the memory cell array MAY. The removal of this insulating film is accomplished by using as the etching mask the insulating film and the side wall spacer 16 formed over the aforementioned gate electrode 13, word line 13 and reference voltage line 13 (to remove the regions defined by those masks). In other words, the insulating films individually existing below the gate electrode 13, the word line 13 and the reference voltage line 13 are left. This removal of the insulating film is accomplished mainly to expose the surface of the gate electrode 7 of the drive MISFETs $Q_d$ for the first electrode 7 of the capacity element C of the memory cell MC. The insulating film over the gate electrode 7, i.e., the first electrode 7 is made of the silicon oxide film, as has been described hereinbefore, and the insulating film 15 and the side wall spacer 16 over the gate electrode 13 or the like are made of the silicon oxide film, as has been described hereinbefore, so that the difference in the etching rate cannot be retained. Since, however, the insulating film 15 and the side wall spacer 16 are made thick, only the insulating film over the first electrode 7 can be removed while leaving the insulating film 15 and the side wall spacer 16.

Next, the whole face of the substrate including the exposed surface of the aforementioned gate electrode 7, i.e., the first electrode 7 is formed with the insulating film 21. This insulating film is used mainly as the dielectric film 21 of the capacity element C of the memory cell MC. The insulating film 21 is formed of the silicon oxide film which is deposited by the CVD method using the inorganic silane as the source gas, for example. The first electrode 7 of the capacity element C is deposited by the CVD method using the $Si_2H_6$ as the source gas and can have its surface flattened, so that the insulating film 21 can have its breakdown voltage improved to have its film thickness reduced. Moreover, the insulating film 21 is made of a single-layered silicon oxide film so that it can be formed of a thin film as small as about 40 to 50 [nm], for example.

Next, the aforementioned insulating film 21 and the underlying insulating film are removed from the one semiconductor region (18) and other semiconductor region (18) of the transfer MISFETs $Q_t$ of the memory cell MC to form the connection holes 22 (as shown in FIG. 17(F)). The connection hole 22 formed over one semiconductor region of the transfer MISFETs $Q_t$ is formed to connect the one semiconductor region, the drain region (11) of the drive MISFETs $Q_d$, the gate electrode 7 and the second electrode (23) of the capacity element C. The connection hole 22 formed over the other semiconductor region of the transfer MISFETs $Q_t$ is formed to connect the other semiconductor region and the middle conductive layer (23). The connection hole 22 formed in the latter insulating film 22 has a larger opening size at the gate electrode 13 than the side wall spacer 16 formed on the side walls of the gate electrode 13 of the transfer MISFETs $Q_t$. In other words, the surface of the side wall spacer 16 is exposed to the inside of the connection hole 22 formed in the insulating film 21, and the substantial opening size of the connection hole 22 on the other semiconductor region (18) is regulated by the side wall spacer 16. Thus, the substantial opening position of the connection hole 22 at the gate electrode 13 is located in self-alignment with the gate electrode 13 because the side wall spacer 16 is formed in self-alignment with the gate electrode 13.

Next, the polycrystalline silicon film 23 is deposited on the whole surface of the substrate including the insulating film 21 for the aforementioned dielectric film. The polycrystalline silicon film 23 is formed at the step of the third-layered gate material. The polycrystalline silicon film 23 is partially connected through the aforementioned connection holes 22 with the semiconductor region of the transfer MISFETs $Q_t$, the drain region of the drive MISFETs $Q_d$ and the gate electrode 7. The polycrystalline silicon film 23 is used as the gate electrode (23) of the load MISFETs $Q_p$, the second electrode (23) of the capacity element C, the conductive layer (23) and the middle conductive layer (23). Since the polycrystalline silicon film 23 is used as the gate electrode (23) of the load MISFETs $Q_p$ and the second electrode (23) of the capacity element C, it is deposited like before (into the doped poly-silicon) by the CVD method using the $Si_2H_6$ and the $PH_3$ as the source gas. The polycrystalline silicon film 23 is formed to have a film thickness as small as 60 to 80 [nm], for example, so as to suppress the growth the upper step shape and is doped with the P in an impurity concentration of about $10^{20}$ to $10^{21}$ [atoms/cm$^2$].

After this, a heat treatment is accomplished to activate the P introduced into the polycrystalline silicon film 23. This heat treatment is accomplished in the nitrogen gas at a high temperature of 700 to 900 [°C.] for about 20 [min.].

Next, the aforementioned polycrystalline silicon film 23 is patterned to form the gate electrode 23 of the load MISFETs $Q_p$, the second electrode 23 of the capacity element C, the conductive layer 23 and the middle conductive layer 23. The patterning of the polycrystalline silicon film 23 is accomplished by using the mask formed by the photolithography technique, for example, and by the anisotropic etching such as RIE.

The step of forming the aforementioned second electrode 23 completes the capacity element C in which the first electrode 7, the dielectric film 21 and the second electrode 23 are sequentially laminated.

<Step of Forming Third Source Region and Drain Region>

Next, in the region formed with the p-type channel MISFETs $Q_p$ of the peripheral circuit, although not shown, the principal face of the active region of the n⁻-type well region 3 is doped with the p-type impurity. This p-type impurity used is exemplified by the $BF_2$. This $BF_2$ is introduced in an impurity concentration of about $10^{15}$ to $10^{16}$ [atoms/cm$^2$] by using the ion implantation technique with an energy of about 50 to 70 [KeV]. This $BF_2$ is introduced in self-alignment into the gate electrode 13 and the side wall spacer 16 by using them as the impurity introduction mask. By introducing the p-type impurity, the highly doped p⁺-type semiconductor region 40 is formed to complete the p-type channel MISFETs $Q_p$ adopting the LDD structure of the peripheral circuit. Moreover, the p⁺-type semiconductor region 40 is also formed around the memory cell array MAY and on the principal face of the peripheral region of the p⁻-type well region 2 so that it forms the guard ring region P-GR (as shown in FIG. 18(F)).

Next, the gate electrode 23 of the load MISFETs $Q_p$, the second electrode 23 of the capacity element C, the conductive layer 23 and the middle conductive layer 23 have their individual side walls formed with the (not-numbered) side wall spacers (as shown in FIG. 17(F) and 18(F)). These side wall spacers are formed to damp the steep step shape of the side walls of the gate electrode 213 and the second electrode 23 thereby to flatten the upper layer (i.e., to flatten the fourth-layered gate material including the channel forming region 26N of the load MISFETs $Q_p$). The side wall spacers are formed by depositing the silicon oxide film all over the surface of the substrate including the upper layer of the gate electrode 23 and by the anisotropic etching such as the RIE to an extent corresponding to the deposited film thickness. The silicon oxide film of the side wall spacers is deposited by the CVD method using the inorganic silane as the source gas, for example, to have a film thickness of about 80 to 120 [nm].

<Step of Forming Third Gate Insulating Film>

Next, the substrate including the upper portions of the aforementioned gate electrode 23, second electrode 23, conductive layer 23 and middle conductive layer 23 formed all over the surface with the insulating film 24. This insulating film 24 is used to isolate the conductive layer such as the underlying gate electrode 23 and the upper conductive layer (26) electrically and as the gate insulating film 24 of the load MISFETs $Q_p$. Like the dielectric film 21 of the aforementioned capacity element C, the insulating film 24 is formed of the silicon oxide film which is deposited by the CVD method using the inorganic silane as the source gas. The insulating film 24 is formed to have a film thickness of about 50 to 70 [nm] with a view to retaining the breakdown voltage and the conductive characteristics (i.e., ON characteristics) of the load MISFETs $Q_p$.

<Step of Forming Fourth-Layered Gate Material>

Next, over the conductive layer 23 of the memory cell MC of the memory cell array MAY, the aforementioned insulating film 24 is formed with the connection holes 25. These connection holes 25 are formed to connect the lower conductive layer 23 and the upper conductive layer (26, i.e., the n-type channel forming region 26N of the load MISFETs $Q_p$ as a matter of fact).

Next, the substrate including the aforementioned insulating film 24 is formed all over its surface with the polycrystalline silicon film. This polycrystalline silicon film is formed at the step of forming the fourth-layered gate material. This polycrystalline silicon film forms the n-type channel forming region (26N), the source region (26P) and the supply voltage line ($V_{cc}$: 26P) of the load MISFETs $Q_p$. Unlike the aforementioned polycrystalline silicon film (7, 13A, 13B and 23), the polycrystalline silicon film is formed of the so-called "non-doped polysilicon" which is deposited by the CVD method using the $Si_2H_6$ as the source gas. This polycrystalline silicon film is formed to have a film thickness as small as about 30 to 50 [nm], for example. In short, the polycrystalline silicon film is made thicker than that, at which the crystal grain exerts no influence to the uniformity of the film thickness, and thinner than that, at which the leakage current of the load MISFETs $Q_p$ can be reduced.

<Step of Forming Fourth Source Region and Drain Region>

Next, the aforementioned polycrystalline silicon film (26) is formed thereover with the insulating film, although not shown. This insulating film is formed to prevent contamination at the time of impurity introduction and to damp the damage of the surface. The insulating film is formed of the silicon oxide film formed by the thermal oxidation method, for example, to have a film thickness as small as about 4 to 6 [nm].

Next, the aforementioned polycrystalline silicon film is doped all over its surface with a threshold voltage adjusting impurity. This threshold voltage adjusting impurity used is exemplified by an n-type impurity such as the P. The P is introduced to turn the threshold voltage of the load MISFETs $Q_p$ into an enhancement type. The enhancement type threshold voltage is obtained in an impurity concentration of about $10^{17}$ to $10^{18}$ [atoms/cm$^2$]. As a result, the P is introduced in an impurity concentration of about $10^{12}$ to $10^{13}$ [atoms/cm$^2$] by using the ion implantation technique with an energy of about 20 to 40 [KeV]. In case the impurity concentration of the P introduced into the polycrystalline silicon film exceeds $10^{18}$ [atoms/cm$^2$], the polycrystalline silicon film has its threshold voltage raised (in its absolute value) so that it acts as a high-resistance element. In other words, the load MISFETs $Q_p$ can feed a voltage as high as the supply voltage $V_{cc}$ in a current corresponding to the leakage current of the n-type channel forming region (26N) to the information latching node region of the memory cell MC when it is inconductive (or OFF) so that the information latching characteristics are degraded. If, moreover, the impurity concentration of the P to be introduced into the polycrystalline silicon film is further increase to raise the threshold voltage, the leakage current flow will increase. This increase in the leakage current obstruct the reduction of the power consumption. The step of introducing the aforementioned threshold voltage adjusting impurity forms the n-type channel forming region 26N (as shown in FIG. 17(F) and 18(F)).

Next, in the regions formed with the source region (26P) of the load MISFETs $Q_p$ of the memory cell MC of the memory cell array MAY and the supply voltage line ($V_{cc}$: 26P), the aforementioned polycrystalline silicon film (26) is doped with a p-type impurity. This p-type impurity used is exemplified by the $BF_2$ and is introduced into the region which is enclosed at reference numeral 26P by single-dotted chain lines in FIG. 7 and FIG. 8B. This $BF_2$ is introduced in an impurity concentration of about $10^{14}$ to $10^{15}$ [atoms/cm$^2$] by using the ion implantation technique with an energy of about 20 to 40 [KeV]. At the time of introducing the p-type impurity, the mask formed by the photolithography is used.

Next, as shown in FIG. 17(F) and 18(F), the aforementioned polycrystalline silicon film is patterned to form the n-type channel forming region 26N, the source region 26P and the supply voltage line 26P. This patterning of the polycrystalline silicon film is accomplished by the anisotropic etching such as RIE using the mask which is formed by the photolithography technique, for example. If the aforementioned n-type channel forming region 26N and source region 26P are formed, the load MISFETs $Q_p$ of the memory cell MC are completed. Moreover, the completion of the load MISFETs $Q_p$ completes the memory cell MC.

<Step of Forming First-Layered Metal Wiring Line>

Next, the substrate including the aforementioned memory cell MC is formed all over the surface with the interlayer insulating film 27. This interlayer insulating film 27 is constructed of the two-layered laminar structure in which the silicon oxide film 27A and the BPSG film 27B are sequentially laminated.

The lower silicon oxide film 27A is formed to prevent the B and P contained in the upper BPSG film 27B from leaking to the individual lower layers. The silicon oxide film 27A is deposited by the CVD method using the $Si(OC_2H_5)_4$ as the source gas, for example, at a high temperature (e.g., 600 to 800 [°C.]) and under a low pressure (e.g., 1.0 [Tor]). The silicon oxide film 27A is formed to have a film thickness of about 140 to 160 [nm], for example.

The upper BPSG film 27B is formed to flatten the surface and to suppress the growth of the upper step shape. The BPSG film 27B is deposited mainly by the CVD method using the inorganic silane (e.g., $SiH_4$) as the source gas. The BPSG film 27B is deposited with a film thickness of 280 to 320 [nm] and is then subjected to the glass flow to have its surface flattened. The glass flow is accomplished in the nitrogen gas, for example, at a high temperature of 800 to 900 [°C.] for about 10 [min.].

Next, the aforementioned interlayer insulating film 27 is formed with the connection holes 28. The connection holes 28 are formed over the middle conductive layer 23 which is formed over the other semiconductor region (18) of the transfer MISFETs $Q_t$ of the memory cell MC (as shown in FIG. 17(F)). Moreover, the connection holes 28 are also formed over the peripheral region of the memory cell array MAY, i.e., over the $p^+$-type semiconductor region 40 of the guard ring region P-GR and the $n^+$-type semiconductor regions 11 and 18 of the guard ring region N-GR. The connection holes 28 are formed by the anisotropic etching such as the RIE using the mask which is formed by the photolithography technique.

Next, the substrate including the aforementioned interlayer insulating film 27 is formed all over the surface with the refractory metal film 29. This refractory metal film 29 is formed at the step of forming the first-layered metal wiring line. The refractory metal film 29 is formed of the W film which is deposited by the sputtering method, for example. The W film has an excellent step coverage at the step portion, in case it is deposited by the CVD method, and is liable to leave the surface of the interlayer insulating film 27. The W film deposited by the sputtering method is advantageous in the high adhesion at the surface of the interlayer insulating film 27 but is defective in that its step coverage is poor and in that the internal stress will increase if the film thickness is large. In the SRAM of the present embodiment, therefore, the advantage of the high adhesion of the W film is exploited to flatten the surface of the interlayer insulating film 27 underlying the W film (while using the BPSG film 27B to accomplish the glass flow) thereby to cope with the step coverage, and the W film is thinned to cope with the internal stress. The W film is formed to have a thin film of about 280 to 820 [nm] as the metal wiring line.

Figure 17G:
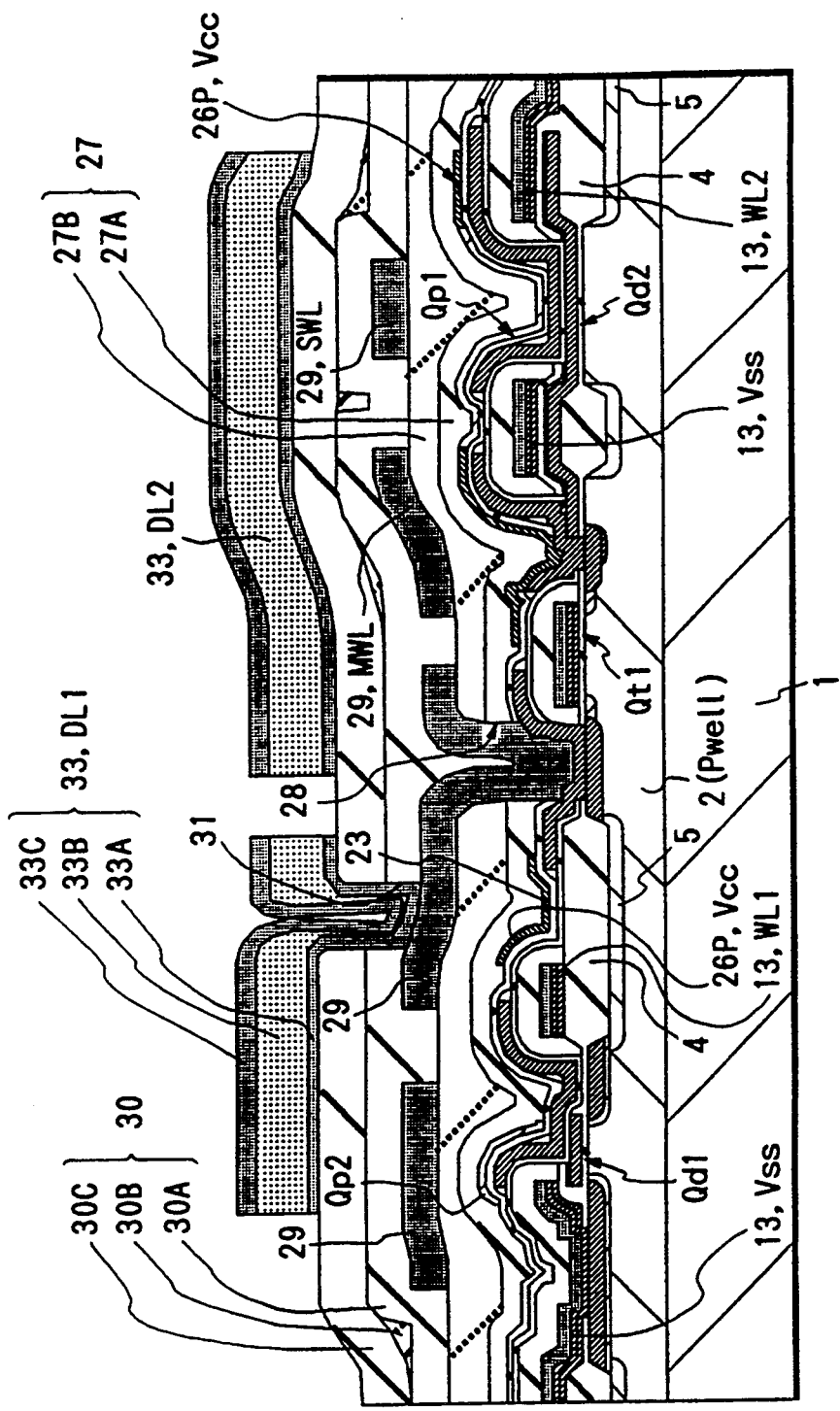

Next, the refractory metal film 29 is patterned to form the main word line (MWL) 29, the sub-word line (SWL) 29 and the middle conductive layer 29 in the memory cell array MAY (as shown in FIG. 17(G)). The aforementioned middle conductive layer 29 is partially connected through the connection holes 28 with the underlying middle conductive layer 23. This middle conductive layer 28 is connected with the other semiconductor region (18) of the transfer MISFETs $Q_t$ of the memory cell MC. In the region other than the memory cell array MAY, on the other hand, above the $p^+$-type semiconductor region 40 of the guard ring region P-GR, the refractory metal film 29 is formed as the reference voltage line ($V_{ss}$) 29. Above the $n^+$-type semiconductor regions 11 and 18 of the guard ring region N-GR, the refractory metal film 29 is formed as the supply voltage line ($V_{cc}$) 29. The patterning of the refractory metal film 29 is accomplished by the anisotropic etching using the mask which is formed by the photolithography technique, for example.

<Step of Forming Second-Layered Metal Wiring Line>

Next, the substrate including the aforementioned main word line 29, sub-word line 29 and middle conductive layer 29 is formed all over its surface with the interlayer insulating film 30. This interlayer insulating film 30 is formed of the three-layered laminated structure, in which the silicon oxide film 30A, the silicon oxide film 30B and the silicon oxide film 30C are sequentially laminated.

The lower silicon oxide film 30A is deposited by the plasma CVD method using tetraethoxysilane gas (i.e., TEOS: $Si(OC_2H_5)_4$) as the source gas. The silicon oxide film 30A can form the flat portion and the step portion with a uniform film thickness. For example, in case the recess (which corresponds to the minimum wiring line gap) between the main word line 29 and the sub-word line 29 is buried to flatten the surface, the so-called "cavity" is not established because the overhang shape is hardly formed. The silicon oxide film 30A is formed to have a film thickness of one half or more of the minimum wiring line gap, e.g., 400 to 600 [nm] with a view to bury the minimum wiring line gap thereby to flatten the surface.

The middle layer or the silicon oxide film 30B is applied with a film thickness of about 200 to 300 [nm] by using the spin-off glass method and is subjected to the baking treatment so that it is etched all over the surface. This silicon oxide film 30B is formed mainly to flatten the surface of the interlayer insulating film 30. The whole surface etching is accomplished under the condition that the silicon oxide film 30B is left not at the connection portion (e.g., the connection hole 31) between the lower conductive layer (29) and the upper conductive layer (33) but at the step portion.

The upper silicon oxide film 30C is deposited like the lower silicon oxide film 30A by the plasma CVD method using the tetraethoxysilane gas as the source region. This silicon oxide film, 30C is formed to have a film thickness of about 300 to 500 [nm], for example. The silicon oxide film 30C is formed mainly to retain the film thickness necessary for insulating isolation between the upper and lower wiring layers as the interlayer insulating film 30 and to coat the middle silicon oxide film 30B thereby to prevent the film quality of the middle silicon oxide film 30B from degrading.

Next, the aforementioned interlayer insulating film 30 is formed with the connection holes 31. The connection holes 31 are formed by the anisotropic etching such as RIE by using the mask formed by the photolithography technique, for example.

Next, as shown in FIG. 17(G) and 18(G), in the memory cell array MAY, the aforementioned interlayer insulating film 30 is formed thereover with the complementary data line (DL) 33. In the peripheral region of the memory cell array MAY, moreover, the p+-type semiconductor region 40 of the guard ring region P-GR is formed thereover with the reference voltage line ($V_{ss}$) 33, and the n+-type semiconductor regions 11 and 18 of the guard ring region N-GR are formed thereover with the supply voltage line ($V_{cc}$) 33.

The aforementioned complementary data line 33 (and the wiring line 33) is formed at the step of forming the second-layered metal wiring line. The complementary data line 33 is connected through the connection hole 31 with the underlying middle conductive layer 29. The complementary data line 33 is formed of the two-layered laminated structure, in which the lower metal film 33A, the middle aluminum alloy film 33B and the upper metal film 33C are sequentially laminated. The lower metal film 33A is formed of the TiW film deposited by the sputtering method, for example, to have a film thickness of about 30 to 50 [nm]. This lower metal film 33A functions mainly as the barrier metal film and may be formed of a film such as a TiN film other than the TiW film. This middle aluminum alloy film 33B is made of the aluminum, which is deposited by the sputtering method to contain at least either Cu or Si added thereto, to have a film thickness of about 700 to 900 [nm]. The upper metal film 33C is formed of the TiW film deposited by the sputtering method, for example, to have a film thickness of about 150 to 250 [nm]. The upper metal film 33C is formed to prevent the diffraction phenomenon (i.e., to prevent the halation effect by reducing the optical reflectivity) at the time of patterning the middle aluminum alloy film 33B and to prevent the aluminum hill lock.

<Step of Forming Final Passivation Film>

Next, as shown in FIG. 6, FIG. 15 and FIG. 16, the substrate including the aforementioned complementary data line 33 is formed all over the surface with the final passivation film 34. This final passivation film 34 is constructed of the three-layered laminated structure, in which the silicon oxide film, the silicon nitride film and the resin film are sequentially laminated, although not the detailed structure is specified.

The lower silicon oxide film is further formed of the three-layered laminated structure similar to that of the interlayer insulating film 30. Specifically, the lower silicon oxide film is formed by sequentially laminating the silicon oxide film deposited by the plasma CVD method using the tetraethoxysilane gas as the source gas, the silicon oxide film left only at the step portion after applied and etched, and the silicon oxide film deposited by the plasma CVD method using the tetraethoxysilane as the source gas. The lower and upper silicon oxide films of the lower silicon oxide film are formed after the aluminum alloy film 33B of the complementary data line 33 has been formed, and uses the aforementioned CVD method by which it can be formed at a low temperature such as about 400 [°C.]. In this lower silicon oxide film: the lower silicon-oxide film is formed to have a film thickness of about 400 to 600 [nm]; the middle silicon oxide film is formed to have a film thickness of about 200 to 300 [nm]; and the upper silicon oxide film is formed to have a film thickness of about 700 to 900 [nm].

The middle silicon nitride film is formed mainly to improve the moisture resistance. This middle silicon nitride film is deposited by the plasma CVD method, for example, to have a film thickness of 1.0 to 1.4 [$\mu$m].

The upper resin film is formed of a polyimide resin film, for example, mainly to shield the $\alpha$-ray. This upper resin film is formed to have a film thickness of 2.2 to 2.4 [$\mu$m], for example.

After a series of this manufacture process has been executed, the SRAM of the present embodiment is completed. The following effects can be achieved from the SRAM of the present embodiment.

(1) In a SRAM of the type, in which a plurality of memory cells MC each having two transfer MISFETs $Q_{t1}$ and $Q_{t2}$ both having their gate widths regulated by an element isolating insulating film 4 are arrayed in a direction aligned with the (X) direction of the gate widths, and in which the other transfer MISFET $Q_{t2}$ of at least such one memory cell MC1 of the plurality of arrayed memory cells MC as is located at the initial and final steps in the array direction and a p+-type semiconductor region 40 (i.e., a guard ring region P-GR or a well contact region PWC1 or PWC2) arranged in a direction aligned with the gate width direction of the other transfer MISFET $Q_{t2}$ for feeding a reference potential ($V_{ss}$) to a p--type well region 2 (i.e., a substrate) arranged in the outer peripheral region of the plurality of arrayed memory cells MC are spaced from each other through the element isolating insulating film 4, an active region (i.e., a dummy active region) 4D1 is arranged between the element isolating insulating film 4 for regulating the gate width $L_1$ of the other transfer MISFET $Q_{t2}$ of the memory cell MC1 at the initial or final step in the array direction and the p+-type semiconductor region 40, and the width size $L_3$ of the element isolating insulating film 4, which is arranged between the other transfer MISFET $Q_{t2}$ and the p+-type semiconductor region 40, in the direction aligned with the spacing direction is made smaller than the spacing size (i.e., the size of addition of $L_3$ to $L_5$) between the other transfer MISFET $Q_{t2}$ and the p+-type semiconductor region 40. (Reference should be made to FIG. 9A)

Thanks to this structure, (A) the width size $L_3$ of the element isolating insulating film (i.e., the end portion) 4 between the other transfer MISFET $Q_{t2}$ of the memory cell MC1 at the initial or final step in the array direction and the p+-type semiconductor region 40 is reduced to an extent arranging the active region 4D1 so that the width size $L_3$ of the element isolating insulating film (i.e., the end portion) can be equalized or approximated to the width size $L_4$ of the element isolating insulating film (i.e., the internal portion) between one transfer MISFET $Q_{t1}$ at the initial or final step in the array direction and the transfer MISFET $Q_t$ of the memory cell MC at either the step subsequent to the initial step or the step prior to the final step in the array direction. As a result, the periodicities of the respective width sizes $L_4$ and $L_3$ of the element isolating insulating film 4 regulating the gate width $L_2$ of the one transfer MISFET $Q_{t1}$ at the initial or final step in the array direction and the element isolating insulating film 4 regulating the gate width $L_1$ of the other transfer MISFET $Q_{t2}$ can be maintained to equalize the respective gate width sizes $L_1$ and $L_2$ of the two transfer MISFETs $Q_{t1}$ and $Q_{t2}$ of the memory cell MC1 at the initial or final step in the array direction. (B) Oh the basis of the aforementioned effect (A), moreover, the $\beta$ ratio, which is given by the one transfer MISFET $Q_{t1}$ of the memory cell MC1 at the initial or final step in the array direction and one drive MISFET $Q_{d1}$ connected with the former, and the $\beta$ ratio, which is given by the other transfer MISFET $Q_{t2}$ and the other drive MISFET $Q_{d2}$ connected with the former, can be individually equalized to improve the information latching characteristics of the memory cell MC1 so that the reliability in the circuit operation of the SRAM can be improved.

(2) In a SRAM of the type, in which a plurality of memory cells MC having two transfer MISFETs $Q_{t1}$ and $Q_{t2}$ both having their gate widths regulated by an element isolating insulating film 4 are arrayed in a direction aligned with the direction of the gate widths, and in which the other transfer MISFET $Q_{t2}$ of at least such one memory cell MC of the plurality of arrayed memory cells MC as is located at the initial and final steps in the array direction and a p+-type semiconductor region 40 arranged in a direction aligned with the gate width direction of the other transfer MISFET $Q_{t2}$ for feeding a reference potential to a p−-type well region 2 arranged in the outer peripheral region of the plurality of arrayed memory cells MC are spaced from each other through the element isolating insulating film 4, the width size $L_3$ of the element isolating insulating film 4, which is located between the channel forming region of the other transfer MISFET $Q_{t2}$ of the memory cell MC at the initial or final step in the array direction, in the direction aligned to the gate width direction is substantially equalized to the width size $L_4$ of the element isolating insulating film 4, which is located between the channel forming region of the one transfer MISFET $Q_{t1}$ of the memory cell MC at the initial or final step in the array direction and the channel forming region of the one transfer MISFET $Q_{t1}$ of the memory cell MC at either the step subsequent to the initial step or the step prior to the final step in the array direction, in the direction aligned to the gate width direction. (Reference should be made to FIG. 9A).

Thanks to this structure, (A) the width size $L_3$ of the element isolating insulating film (i.e., the end portion) 4 between the other transfer MISFET $Q_{t2}$ of the memory cell MC1 at the initial or final step in the array direction and the p+-type semiconductor region 40 can be substantially equalized to the width size $L_4$ of the element isolating insulating film (i.e., the internal portion) between the one transfer MISFET $Q_{t1}$ of the memory cell MC1 at the initial or final step in the array direction and the one transfer MISFET $Q_{t1}$ of the memory cell MC at either the step subsequent to the initial step or the step prior to the final step in the array direction, so that the periodicities of the respective width sizes $L_3$ and $L_4$ of the element isolating insulating film 4 regulating the gate width $L_1$ of the other transfer MISFET $Q_{t2}$ of the memory cell MC1 at the initial or final step in the array direction and the element isolating insulating film 4 regulating the gate width $L_2$ of the one transfer MISFET $Q_{t1}$ can be maintained to equalize the respective gate width sizes $L_2$ and $L_1$ of the two transfer MISFETs $Q_{t1}$ and $Q_{t2}$ of the memory cell MC1 at the initial or final step in the array direction.

(B) On the basis of the aforementioned effect (A), moreover, the $\beta$ ratio, which is given by the one transfer MISFET $Q_{t1}$ of the memory cell MC at the initial or final step in the array direction and the one drive MISFET $Q_{d1}$ connected with the former, and the $\alpha$ ratio, which is given by the other transfer MISFET $Q_{t2}$ and the other drive MISFET $Q_{d2}$ connected with the former, can be individually equalized to improve the information latching characteristics of the memory cell MC1 so that the reliability in the circuit operation of the SRAM can be improved.

(3) In a SRAM as set forth in the aforementioned means (1) or means (2), the respective gate width sizes $L_2$ and $L_1$ of the one transfer MISFET $Q_{t1}$ of the memory cell MC1 at the initial or final step in the array direction and the other transfer MISFET $Q_{t2}$ are substantially equalized.

Thanks to this structure, the $\beta$ ratio, which is given by the one transfer MISFET $Q_{t1}$ of the memory cell MC1 at the initial or final step in the array direction and the one drive MISFET $Q_{d1}$ connected with the former, and the $\beta$ ratio, which is given by the other transfer MISFET $Q_{t2}$ and the other drive MISFET $Q_{d2}$ connected with the former, can be individually equalized to improve the information latching characteristics of the memory cell MC1 so that the reliability in the circuit operation of the SRAM can be improved.

(4) In a SRAM as set forth in the aforementioned means (1) to means (3), either the width size $L_3$ of the element isolating insulating film 4 regulating the gate width $L_1$ of the other transfer MISFET $Q_{t2}$ of the memory cell MC1 at the initial or final step in any array direction or the gate width size $L_1$ of the other transfer MISFET $Q_{t2}$ and the width size $L_4$ of the element isolating insulating film 4 regulating the gate width $L_{11}$ of the other transfer MISFET $Q_{t2}$ of the memory cell MC at either the step subsequent to the initial step or the step prior to the final step in the array direction or the gate width size $L_{11}$ of the other transfer MISFET $Q_{t2}$ are substantially equalized to each other.

Thanks to this structure, the $\beta$ ratio of the memory cell MC1 at the initial or final step in the array direction and the $\beta$ ratio of the memory cell MC at either the step subsequent to the initial step or the step prior to the final step in the array direction can be individually equalized to equalize the individual information latching characteristics of the two memory cells MC1 and MC so that the reliability in the circuit operation of the SRAM cab be improved better.

(In case either of the information latching characteristics are degraded, the information latching characteristics of the whole system of the SRAM are determined by the memory cell MC1 or MC having its information latching characteristics degraded. However, this determination can be prevented.)

(5) In a SRAM as set forth in the aforementioned means (1) to means (4), the p+-type semiconductor region 40 for feeding the reference potential to the $p^{31}$-type well region 2 is either a guard ring P-GR enclosing the plurality of arrayed memory cells MC or a well contact region PWC1 OR PWC2 arranged around the plurality of arrayed memory cells MC at a predetermined spacing along either the array direction or a direction intersecting the array direction.

(6) In a SRAM of the type, in which a plurality of memory cells MC having two drive MISFETs $Q_{d1}$ and $Q_{d2}$ both having their gate widths regulated by an element isolating insulating film 4 are arrayed in a direction aligned with the (Y) direction of the gate widths, and in which the other drive MISFET $Q_{d2}$ of at least such one memory cell MC1 of the plurality of arrayed memory cells MC as is located at the initial and final steps in the array direction and a p+-type semiconductor region 40 arranged in a direction aligned with the gate width direction of the other drive MISFET $Q_{d2}$ for feeding a reference potential to a p⁻-type well region 2 arranged in the outer peripheral region of the plurality of arrayed memory cells MC are spaced from each other through the element isolating insulating film 4, an active region (i.e., a dummy active region) 4D2 is arranged between the element isolating insulating film 4 for regulating the gate width $L_6$ of the other drive MISFET $Q_{d2}$ of the memory cell MC1 at the initial or final step in the array direction and the p⁺-type semiconductor region 40, and the width size $L_8$ of the element isolating insulating film 4, which is arranged between the other drive MISFET $Q_{d2}$ and the p⁺-type semiconductor region 40, in the direction aligned with the spacing direction is made smaller than the spacing size (i.e., the size of addition of $L_8$ to $L_{10}$) between the other drive MISFET $Q_{d2}$ and the p⁺-type semiconductor region 40. (Reference should be made to FIG. 9A)

Thanks to this structure, (A) the width size $L_8$ of the element isolating insulating film (i.e., the end portion) 4 between the other drive MISFET $Q_{d2}$ of the memory cell MC1 at the initial or final step in the array direction and the p⁺-type semiconductor region 40 is reduced to an extent arranging the active region 4D1 so that the width size $L_8$ of the element isolating insulating film (i.e., the end portion) can be equalized or approximated to the width size $L_9$ of the element isolating insulating film (i.e., the internal portion) between one drive MISFET $Q_{d1}$ at the initial or final step in the array direction and the one drive MISFET $Q_{d1}$ of the memory cell MC at either the step subsequent to the initial step or the step prior to the final step in the array direction. As a result, the periodicities of the respective width sizes $L_8$ and $L_9$ of the element isolating insulating film 4 regulating the gate width $L_6$ of the one drive MISFET $Q_{d1}$ at the initial or final step in the array direction and the element isolating insulating film 4 regulating the gate width $L_7$ of the other drive MISFET $Q_{d2}$ can be maintained to equalize the respective gate width sizes $L_7$ and $L_6$ of the two drive MISFETs $Q_{d1}$ and $Q_{d2}$ of the memory cell MC1 at the initial or final step in the array direction. (B) On the basis of the aforementioned effect (A), moreover, the β ratio, which is given by the one drive MISFET $Q_{d1}$ of the memory cell MC1 at the initial or final step in the array direction and one transfer MISFET $Q_{t1}$ connected with the former, and the β ratio, which is given by the other drive MISFET $Q_{d2}$ and the other transfer MISFET $Q_{t2}$ connected with the former, can be individually equalized to improve the information latching characteristics of the memory cell MC1 so that the reliability in the circuit operation of the SRAM can be improved.

(7) In a SRAM of the type, in which a plurality of memory cells MC having two drive MISFETs $Q_{d1}$ and $Q_{d2}$ both having their gate widths regulated by an element isolating insulating film 4 are arrayed in a direction aligned with the direction of the gate widths, and in which the other drive MISFET $Q_{d2}$ of at least such one memory cell MC1 of the plurality of arrayed memory cells MC as is located at the initial and final steps in the array direction and a p⁺-type semiconductor region 40 arranged in a direction aligned with the gate width direction of the other drive MISFET $Q_{d2}$ for feeding a reference potential to a p⁻-type well region 2 arranged in the outer peripheral region of the plurality of arrayed memory cells MC are spaced from each other through the element isolating insulating film 4, the width size $L_8$ of the element isolating insulating film 4, which is located between the channel forming region of the other drive MISFET $Q_{d2}$ of the memory cell MC1 at the initial or final step in the array direction, in the direction aligned to the gate width direction is substantially equalized to the width size $L_9$ of the element isolating insulating film 4, which is located between the channel forming region of the one drive MISFET $Q_{d1}$ of the memory cell MC1 at the initial or final step in the array direction and the channel forming region of the one drive MISFET $Q_{d1}$ of the memory cell MC at either the step subsequent to the initial step or the step prior to the final step in the array direction, in the direction aligned to the gate width direction.

Thanks to this structure, (A) the width size $L_8$ of the element isolating insulating film (i.e., the end portion) 4 between the other drive MISFET $Q_{d2}$ of the memory cell MC1 at the initial or final step in the array direction and the p⁺-type semiconductor region 40 can be substantially equalized to the width size $L_9$ of the element isolating insulating film 4 (i.e., the internal portion) between the one drive MISFET $Q_{d1}$ of the memory cell MC1 at the initial or final step in the array direction and the one drive MISFET $Q_{d1}$ of the memory cell MC at either the step subsequent to the initial step or the step prior to the final step in the array direction, so that the periodicities of the respective width sizes $L_8$ and $L_9$ of the element isolating insulating film 4 regulating the gate width $L_6$ of the other drive MISFET $Q_{d2}$ of the memory cell MC1 at the initial or final step in the array direction and the element isolating insulating film 4 regulating the gate width $L_7$ of the one drive MISFET $Q_{d1}$ can be maintained to equalize the respective gate width sizes $L_7$ and $L_6$ of the two drive MISFETs $Q_{d1}$ and $Q_{d2}$ of the memory cell MC1 at the initial or final step in the array direction.

(B) On the basis of the aforementioned effect (A), moreover, the β ratio, which is given by the one drive MISFET $Q_{d1}$ of the memory cell MC at the initial or final step in the array direction and the one transfer MISFET $Q_{t1}$ connected with the former, and the β ratio, which is given by the other drive MISFET $Q_{d2}$ and the other transfer MISFET $Q_{t2}$ connected with the former, can be individually equalized to improve the information latching characteristics of the memory cell MC1 so that the reliability in the circuit operation of the SRAM can be improved.

(8) In a SRAM as set forth in the aforementioned means (6) or (7), the respective gate width sizes $L_7$ and $L_6$ of the one drive MISFET $Q_{d1}$ of the memory cell MC1 at the initial or final step in the array direction and the other drive MISFET $Q_{d2}$ are substantially equalized.

Thanks to this structure, the β ratio, which is given by the one drive MISFET $Q_{d1}$ of the memory cell MC1 at the initial or final step in the array direction and the one drive MISFET $Q_{d1}$ connected with the former, and the β ratio, which is given by the other drive MISFET $Q_{d2}$ and the other drive MISFET $Q_{d2}$ connected with the former, can be individually equalized to improve the information latching characteristics of the memory cell MC1 so that the reliability in the circuit operation of the SRAM can be improved.

(9) In a SRAM as set forth in the aforementioned means (6) to means (8), either the width size $L_8$ of the element isolating insulating film 4 regulating the gate width $L_6$ of the other drive MISFET $Q_{d2}$ of the memory cell MC1 at the initial or final step in any array direction or the gate width size $L_6$ of the other drive MISFET $Q_{d2}$ and the width size of the element isolating insulating film 4 regulating the gate width of the other drive MISFET $Q_{d2}$ of the memory cell MC at either the step subsequent to the initial step or the step prior to the final step in the array direction or the gate width size of the other drive MISFET $Q_{d2}$ are substantially equalized to each other.

Thanks to this structure, the $\beta$ ratio of the memory cell MC1 at the initial or final step in the array direction and the $\beta$ ratio of the memory cell MC at either the step subsequent to the initial step or the step prior to the final step in the array direction can be individually equalized to equalize the individual information latching characteristics of the two memory cells MC1 and MC so that the reliability in the circuit operation of the SRAM cab be improved better

(10) In a SRAM as set forth in the aforementioned means (6) to means (9), the p+-type semiconductor region 40 for feeding the reference potential to the p−-type well region 2 is a guard ring P-GR enclosing the plurality of arrayed memory cells MC.

(11) In a SRAM of the type, in which a plurality of memory cells MC having two transfer MISFETs $Q_{t1}$ and $Q_{t2}$ having both their gate widths regulated by an element isolating insulating film 4 are arrayed in a direction (i.e., a Y direction) aligned with the gate length direction and in which a p+-type semiconductor region 40 for feeding a reference potential to a p−-type well region 2 is arranged through the element isolating insulating film 4 at one side along the plurality of arrayed memory cells MC in a direction aligned with the gate length direction, either an active region having a shape identical or approximate to that of an active region, in which the other transfer MISFET $Q_{t2}$ of the plurality of memory cells MC arrayed in a direction aligned with the gate length direction, or a portion (i.e., a dummy active region) 4D1 of the active region is arranged between the element isolating insulating film 4 regulating the gate width $L_1$ of the other transfer MISFET $Q_{t2}$ and the p+-type semiconductor region 40 arranged along one side of the plurality of arrayed memory cells MC. (Reference should be referred to FIG. 9A.)

Thanks to this structure, (A) the width size $L_3$ of the element isolating insulating film 4 between the other transfer MISFET $Q_{t2}$ of each of the plurality of memory cells MC arrayed in a direction aligned with the gate length direction and the p+-type semiconductor region 40 is made smaller to an extent (corresponding to a size $L_5$) arranging the active region or its portion 4D1, and the width size $L_3$ of the element isolating insulating film (i.e., the end portion) 4 can be equalized or approximated to the width size $L_4$ of the element isolating insulating film (i.e., the internal portion) 4 between the one transfer MISFET $Q_{t1}$ of the memory cell MC1 and the one transfer MISFET $Q_{t1}$ of the other memory cell MC of the subsequent step, which is arranged in the gate width direction. As a result, the periodicities of the respective width sizes $L_3$ and $L_4$ of the element isolating insulating film 4 regulating the gate width $L_1$ of the individual other transfer MISFET $Q_{t2}$ of the plurality of memory cells MC arrayed in a direction aligned with the gate length direction and the element isolating insulating film 4 regulating the gate width $L_2$ of the one transfer MISFET $Q_{t1}$, so that the respective gate width sizes $L_2$ and $L_1$ of the two transfer MISFETs $Q_{t1}$ and $Q_{t2}$ of the plurality of memory cells MC arrayed in the direction aligned with the gate length direction can be equalized. (B) On the basis of the aforementioned effect (A), the $\beta$ ratio, which is given by the one transfer MISFET $Q_{t1}$ of each of the plurality of memory cells MC arrayed in the direction aligned with the gate length direction and the one drive MISFET $Q_{d1}$ connected with the former, and the $\beta$ ratio, which is given by the other transfer MISFET $Q_{t2}$ and the other drive MISFET $Q_{d2}$ connected with the former, can be individually equalized to improve the information latching characteristics of the memory cells MC so that the reliability in the circuit operation of the SRAM can be improved.

(12) In a SRAM of the type, in which a plurality of memory cells MC having two transfer MISFETs $Q_{t1}$ and $Q_{t2}$ having both their shapes around the source regions or drain regions (18) defined by an element isolating insulating film 4 are arrayed in a direction (i.e., an X direction) aligned with the gate width direction and in which a p+-type semiconductor region 40 for feeding a reference potential to a p−-type well region 2 is arranged through the element isolating insulating film 4 at one side along the plurality of individual memory cells MC arrayed in a direction aligned with the gate width direction, either an active region having a shape identical or approximate to that of an active region, in which the other transfer MISFET $Q_{t2}$ is arranged, or a portion (i.e., a dummy active region) 4D3 of the active region is arranged between the source region or drain region of the other transfer MISFET $Q_{t2}$ of each of the plurality of memory cells MC arrayed in the direction aligned with the gate width direction and the p+-type semiconductor region 40 arranged along at one side of the plurality of arrayed memory cells MC.

`Thanks to this structure, (A) the width size of the element isolating insulating film (i.e., the end portion) 4 between the source region or drain region connected with the complementary data lines (DL and 33) of the other transfer MISFET $Q_{t2}$ of the plurality of memory cells MC arrayed in a direction aligned with the gate width direction and the p+-type semiconductor region 40 is reduced to an extent arranging the active region or its portion 4D3 so that the width size of the element isolating insulating film (i.e., the end portion) 4 can be equalized or approximated to the width size of the element isolating insulating film (i.e., the internal portion) 4 between the one transfer MISFET $Q_{t1}$ of the memory cell MC and the one transfer MISFET $Q_{t1}$ of the other memory cell MC at the subsequent step arranged in the gate length direction. As a result, the periodicities of the respective width sizes of the element isolating insulating film 4 defining the source region or drain region of the other transfer MISFET $Q_{t2}$ of each of the plurality of memory cells MC arrayed in the direction aligned with the gate width direction and the width sizes of the element isolating insulating film defining the source region or drain region of the one transfer MISFET can be maintained to uniform the shapes of the individual source regions or drain regions of the two transfer MISFETs $Q_{t1}$ and $Q_{t2}$ of the plurality of memory cells MC arrayed in the direction aligned with the gate width direction. (B) On the basis of the aforementioned effect (A), moreover, it is possible to prevent the conduction errors and the resistance fluctuations between the source region or drain region of the other transfer MISFET $Q_{t2}$ of each of the plurality of memory cells MC arrayed in the direction aligned with the gate width direction and the complementary data lines.

(13) In a SRAM of the type, in which a plurality of memory cells MC having two drive MISFETs $Q_{d1}$ and $Q_{d2}$ having both their gate widths regulated by an element isolating insulating film 4 are arrayed in a direction aligned with the gate length direction and in which a p+-type semiconductor region 40 for feeding a reference potential to a p−-type well region 2 is arranged through the element isolating insulating film 4 at one side along the plurality of arrayed memory cells MC in a direction aligned with the gate length direction, either an active region having a shape identical or approximate to that of an active region, in which the other drive MISFET $Q_{d2}$ of the plurality of memory cells MC arrayed in a direction aligned with the gate length direction, or a portion (i.e., a dummy active region) 4D2 of the active region is arranged between the element isolating insulating film 4 regulating the gate width $L_6$ of the other drive MISFET $Q_{d2}$ and the p+-type semiconductor region 40 arranged along one side of the plurality of arrayed memory cells MC. (Reference should be referred to FIG. 9A.)

Thanks to this structure, (A) the width size $L_8$ of the element isolating insulating film 4 between the other drive MISFET $Q_{d2}$ of each of the plurality of memory cells MC arrayed in a direction aligned with the gate length direction and the p+-type semiconductor region 40 is made smaller to an extent arranging the active region or its portion 4D1, and the width size $L_8$ of the element isolating insulating film (i.e., the end portion) 4 can be equalized or approximated to the width size $L_9$ of the element isolating insulating film (i.e., the internal portion) 4 between the one drive MISFET $Q_{d1}$ of the memory cell MC1 and the one drive MISFET $Q_{d1}$ of the other memory cell MC of the subsequent step, which is arranged in the gate width direction. As a result, the periodicities of the respective width sizes $L_8$ and $L_9$ of the element isolating insulating film 4 regulating the gate width $L_6$ of the individual other drive MISFET $Q_{d2}$ of the plurality of memory cells MC arrayed in a direction aligned with the gate length direction and the element isolating insulating film 4 regulating the gate width $L_7$ of the one transfer MISFET $Q_{t1}$, so that the respective gate width sizes $L_7$ and $L_6$ of the two drive MISFETs $Q_{d1}$ and $Q_{d2}$ of the plurality of memory cells MC arrayed in the direction aligned with the gate length direction can be equalized. (B) On the basis of the aforementioned effect (A), the $\beta$ ratio, which is given by the one transfer MISFET $Q_{t1}$ of each of the plurality of memory cells MC arrayed in the direction aligned with the gate length direction and the one drive MISFET $Q_{d1}$ connected with the former, and the $\alpha$ ratio, which is given by the other transfer MISFET $Q_{t2}$ and the other drive MISFET $Q_{d2}$ connected with the former, can be individually equalized to improve the information latching characteristics of the memory cells MC so that the reliability in the circuit operation of the SRAM can be improved.

(14) In a SRAM of the type, in which a plurality of memory cells MC having two drive MISFETs $Q_{d1}$ and $Q_{d2}$ having both their shapes around the source regions (11) defined by an element isolating insulating film 4 are arrayed in a direction (i.e., a Y direction) aligned with the gate width direction and in which a p+-type semiconductor region 40 for feeding a reference potential to a p−-type well region 2 is arranged through the element isolating insulating film 4 at one side along the plurality of individual memory cells MC arrayed in a direction aligned with the gate width direction,, either an active region having a shape identical or approximate to that of an active region, in which the one drive MISFET $Q_{d1}$ is arranged, or a portion (i.e., a dummy active region) 4D4 of the active region is arranged between the source region of the other drive MISFET $Q_{d2}$ of each of the plurality of memory cells MC arrayed in the direction aligned with the gate width direction and the p+-type semiconductor region 40 arranged along at one side of the plurality of arrayed memory cells MC.

Thanks to this structure, (A) the source region connected with the reference voltage line ($V_{ss}$) 13 of the one drive MISFET $Q_{d1}$ of the plurality of memory cells MC arrayed in the direction aligned with the gate width direction can be enlarged to an extent arranging the active region or its portion 4D4 between itself and the p+-type semiconductor region 40 so that the width size $L_{12}$ in a direction aligned with the gate width direction of the element isolating insulating film (i.e., the end portion) defining the source region can be equalized or approximated to the width size $L_{13}$ of the element isolating insulating film (i.e., the internal portion) defining the respective source regions of the other drive MISFET $Q_{d2}$ of the memory cells MC and the other drive MISFET $Q_{d2}$ of the other memory cells MC at the subsequent step. As a result, the periodicities of the respective width sizes of the element isolating insulating film 4 defining the source region of the one drive MISFET $Q_{d1}$ of each of the plurality of memory cells MC arrayed in the direction aligned with the gate width direction and the element isolating insulating film 4 defining the source region of the other drive MISFET $Q_{d2}$ can be maintained to uniform the shapes of the respective source regions of the two drive MISFETs $Q_{d1}$ and $Q_{d2}$ of the plurality of memory cells MC arrayed in the direction aligned with the gate width direction. (B) As a result, it is possible to prevent the connection error between the source region of the one drive MISFET $Q_{d1}$ of the plurality of memory cells MC arrayed in the direction aligned with the gate width direction and the reference voltage line 13.

(15) In a SRAM of the type, in which a plurality of memory cells MC having their other drive MISFET $Q_{d2}$ constructed to have a planar shape of central symmetry with respect to that of their one drive MISFET $Q_{d2}$ and their one drive MISFET $Q_{d1}$ and other drive MISFET $Q_{d2}$ substantially in parallel gate length directions are arrayed such that the two drive MISFETs $Q_{d1}$ and $Q_{d2}$ of the memory cells MC are alternately arranged for each memory cell MC in a direction aligned with the gate length direction, a dummy gate electrode layer 7D formed of a layer identical to the individual gate electrodes 7 of the one and other drive MISFETs $Q_d$ is so arranged in the outer peripheral region in the direction aligned with the array direction of memory cell MC1 at the initial or final step of the array direction of the plurality of arrayed memory cells MC as to face at a predetermined spacing $F_3$ one side of the outer peripheral region of the gate electrode 7 of at least one drive MISFET $Q_{d1}$ of the initial or final step in the array direction, and the spacing size $F_3$ is set substantially equal to the spacing size $F_4$ between the gate electrode 7 of at least the other drive MISFET $Q_{d2}$ of the memory cell MC1 at the initial or final state in the array direction and the gate electrode 7 of at least the other drive MISFET $Q_{d2}$ of the memory cell MC at either the step subsequent to the initial step or the step prior to the final step in the array direction.

Thanks to this structure, (A) the spacing size $F_3$ between the gate electrode 7 of at least one drive MISFET $Q_{d1}$ of the memory cell MC at the initial or final step in the array direction and the dummy gate electrode layer 7D and the spacing size $F_4$ between the gate electrode 7 of at least the other drive MISFET $Q_{d2}$ of the memory cell MC at the initial or final step in the array direction and the gate electrode 7 of at least the other drive MISFET $Q_{d2}$ of the memory cell MC at either the step subsequent to the initial step or the step prior to the final step in the array direction can be set to a substantially equal size to equalize the spacing between the gate electrode 7 of the one drive MISFET $Q_{d1}$ and the dummy gate electrode layer 7D and the spacing between the gate electrodes 7 of the other drive MISFET $Q_{d2}$. As a result, the periodicities can be maintained to equalize the gate length size $F_1$ of at least one drive MISFET $Q_{d1}$ of the memory cell MC at the initial or final step in the array direction and the gate length size $F_2$ of the other drive MISFET $Q_{d2}$. (B) On the basis of the aforementioned effect (A), moreover, the $\beta$ ratio, which is given by the one drive MISFET $Q_{d1}$ of either memory cell MC at the initial and final steps in the array direction and the one transfer MISFET $Q_{t1}$ connected with the former, and the $\beta$ ratio, which is given by the drive MISFET $Q_{d2}$ and the other transfer MISFET $Q_{t2}$ connected with the former can be individually equalized to improve the information latching characteristics of the memory cells MC so that the reliability in the circuit operation of the SRAM can be improved. (C) Still moreover, the two drive MISFETs $Q_{d1}$ and $Q_{d2}$ of the memory cell MC at the initial or final step in the array direction are constructed in central symmetry with each other so that the $\alpha$ ratio given by the one drive MISFET $Q_{d1}$ and the one transfer MISFET $Q_{t1}$ connected with the former and the $\beta$ ratio given by the other drive MISFET $Q_{d2}$ and the other transfer MISFET $Q_{t2}$ connected with the former can be easily equalized. As a result, the information latching characteristics of the memory cells MC can be better improved to improve the reliability in the circuit operation of the SRAM better.

(16) In a SRAM as set forth in the aforementioned means (15), the dummy gate electrode layer 7D is fed with a reference potential (i.e., a fixed potential).

Thanks to this structure, a phenomenon that the dummy gate electrode layer 7D is electrified can be prevented to improve the reliabilities in the manufacture and use of the SRAM.

(17) In a SRAM of the type, in which a plurality of memory cells MC having their other transfer MISFET $Q_{t2}$ constructed to have a planar shape of central symmetry with respect to that of their one transfer MISFET $Q_{t1}$ and their one transfer MISFET $Q_{t1}$ and other transfer MISFET $Q_{t2}$ substantially in parallel gate length directions are arrayed such that the two transfer MISFETs $Q_{t1}$ and $Q_{t2}$ of the memory cells MC are alternately arranged for each memory cell MC in a direction aligned with the gate length direction, a dummy gate electrode layer (i.e., a dummy word line) 13D3 formed of a layer identical to the individual gate electrodes 13 of the one and other transfer MISFETs $Q_t$ is so arranged in the outer peripheral region in the direction aligned with the array direction of memory cell MC at the initial or final step of the array direction of the plurality of arrayed memory cells MC as to face at a predetermined spacing one side of the outer peripheral region of the gate electrode 13 of at least one transfer MISFET $Q_{t1}$ of the initial or final step in the array direction, and the spacing size is set substantially equal to the spacing size between the gate electrode 13 of at least the one transfer MISFET $Q_t1$ of the memory cell MC at the initial or final state in the array direction and the gate electrode 13 of at least the one transfer MISFET $Q_{t1}$ of the memory cell MC at either the step subsequent to the initial step or the step prior to the final step in the array direction.

Thanks to this structure, (A) the spacing size between the gate electrode 13 of at least the other transfer MISFET $Q_{t2}$ of the memory cell MC at the initial or final step in the array direction and the dummy gate electrode layer 13D3 and the spacing size between the gate electrode 13 of at least the one transfer MISFET $Q_{t1}$ of the memory cell MC at the initial or final step in the array direction and the gate electrode 13 of at least the one transfer MISFET $Q_{t1}$ of the memory cell MC at either the step subsequent to the initial step or the step prior to the final step in the array direction (i.e., between the word lines 13) can be set to a substantially equal size to equalize the spacing between the gate electrode 13 of the other transfer MISFET $Q_{t2}$ and the dummy gate electrode layer 13D3 and the spacing between the gate electrodes 13 of the one transfer MISFET $Q_{t1}$. As a result, the periodicities can be maintained to equalize the gate length size of at least the other transfer MISFET $Q_{t2}$ of the memory cell MC at the initial or final step in the array direction and the gate length size of the one transfer MISFET $Q_{t1}$. (B) On the basis of the aforementioned effect (A), moreover, the $\beta$ ratio, which is given by the one transfer MISFET $Q_{t1}$ of either memory cell MC at the initial and final steps in the array direction and the one drive MISFET $Q_{t1}$ connected with the former, and the $\beta$ ratio, which is given by the transfer MISFET $Q_{t2}$ and the other drive MISFET $Q_{t2}$ connected with the former can be individually equalized to improve the information latching characteristics of the memory cells MC so that the reliability in the circuit operation of the SRAM can be improved.

(18) In a SRAM as set forth in the aforementioned means (1) to means (14), the memory cells MC are constructed: either such that the planar shape of the other transfer MISFET $Q_{t2}$ is formed in central symmetry with respect to the planar shape of the one transfer MISFET $Q_{t1}$ and such that the gate length directions of the one transfer MISFET $Q_{t1}$ and the other transfer MISFET $Q_{t2}$ are substantially in parallel with each other; or such that the planar shape of the other drive MISFET $Q_{d2}$ is formed in central symmetry with respect to the planar shape of the one drive MISFET $Q_{d1}$ and such that the gate length directions of the one drive MISFET $Q_{t1}$ and the other drive MISFET $Q_{d2}$ are substantially in parallel with each other.

Thanks to this structure, the two transfer MISFETs $Q_t$ of the memory cells MC at the initial or final step in the array direction are constructed in central symmetry with respect to each other, or the two drive MISFETS $Q_d$ of the memory cells MC are constructed in central symmetry with respect to each other so that the $\beta$ ratio given by the one transfer MISFET $Q_{t1}$ and the one drive MISFET $Q_{d1}$ connected with the former and the $\beta$ ratio given by the other transfer MISFET $Q_{t2}$ and the other drive MISFET $Q_{d2}$ can be easily equalized. As a result, the information latching characteristics of the memory cells MC can be better improved to improve the reliability in the circuit operation of the SRAM better.

Next, a further embodiment will be described with reference to FIGS. 19 to 21.

In the present embodiment, a potential barrier region is formed in the memory cell array of the SRAM of the aforementioned another embodiment.

A sectional structure of the SRAM of the present embodiment will be briefly described with reference to FIGS. 19(A) and 19(B). FIG. 19(A) is a section showing an essential portion of a central region of the memory cell array of the SRAM. FIG. 19(B) is a section showing an essential portion of a peripheral region of the memory cell array of the SRAM.

In the memory cell array MAY of the SRAM, as shown in FIGS. 19(A) and 19(B), there is formed in the p⁻-type well region 2 a potential barrier region (i.e., a p⁺-type semiconductor region) 45. This potential barrier region 45 is formed in the lowermost region of the transfer MISFET $Q_t$ of the memory cell MC and in the region below the drive MISFET $Q_d$, i.e., below at least the information storing node region. The potential barrier region 45 is formed of the same conduction type as that of the p⁻-type well region 2 but is set to have a higher impurity concentration than that of the p⁻-type well region 2. The potential barrier region 45 is enabled to improve the α-ray soft error breakdown voltage of the SRAM by preventing the minority carriers generated in the p⁻-type well region 2 (i.e., in the region deeper than the potential barrier region 45) and in the n⁻-type semiconductor substrate 1 from being trapped in the information storing node region. The potential barrier region 45 can increase the junction capacities to be individually added to the transfer MISFET $Q_t$ and the drive MISFET $Q_d$ of the memory cell MC thereby to increase the amount of information to be stored in the information storing node region.

The aforementioned potential barrier region 45 is formed, as shown in FIG. 20(A) (presenting a section showing an essential portion of the central region of the memory cell array at a predetermined step) and in FIG. 20(B) (presenting a section showing an essential portion of the peripheral region of the memory cell array at a predetermined step) after a lightly doped n-type semiconductor region 10 for forming the DDD structure, as shown in FIG. 17(D) and FIG. 18(D) of the manufacture process of the aforementioned embodiment 1 has been formed.

First of all, a mask 46 is formed by using the technology of photolithography, as shown in FIG. 20. This mask 46 has retained not only the periodicity of the planar shape at the central region of the memory cell array MAY, as shown in FIG. 21(A) (presenting a top plan view of the A region at a predetermined step) and in FIG. 21(B) (presenting a top plan view of the C region at a predetermined step), but also the periodicity of the planar shape in the region of the memory cell MC arranged at the end portion of the memory cell array MAY by adding a dummy mask 46D in the peripheral region of the memory cell array MAY.

Next, the aforementioned mask 46 and dummy mask 46D are used to introduce a p-type impurity into the p⁻-type well region 2 arranged with the memory cell array MAY, as shown in FIGS. 20(A) and 20(B). The p-type impurity is exemplified by B, which is introduced in a concentration of about $10^{23}$ [atoms/cm²] with an energy of 200 to 250 [KeV] by using the technology of ion implantation. After this introduction of the p-type impurity, the mask 46 and the dummy mask 46D are removed.

The succeeding manufacture process is similar to that of the aforementioned another embodiment and will be omitted from the present embodiment.

Thus, the fluctuations of the β ratio of the memory cell MC arranged at the end portion of the memory cell array MAY can be reduced by adding the dummy mask to the end portion of the memory cell array MAY in the mask 46 for forming the aforementioned potential barrier region 45, so that the reliability in the circuit operation of the SRAM can be improved.

Although our invention has been specifically described hereinbefore in connection with the foregoing embodiments, it should not be limited thereto but can naturally be modified in various manners without departing from the gist thereof.

For example, the present invention can be applied to the case in which a high resistance element is used as the load element of the memory cell of the aforementioned SRAM.

The present invention can also be applied in the aforementioned SRAM to the steps of forming the third-layered gate material and the subsequent layer.

Moreover, the present invention can be applied to the SRAM to be packaged in the semiconductor integrated circuit device such as a microprocessor.

The effects to be obtained from the representative of the invention disclosed therein will be briefly described in the following:

(1) In the semiconductor integrated circuit device equipped with the SRAM, the information latching characteristics of the memory cells arranged at the end portion of the memory cell array of the SRAM can be improved to improve the reliability in the circuit operation of the SRAM; and (2) In the semiconductor integrated circuit device equipped with the SRAM, the degree of integration of the SRAM can be improved in addition to the aforementioned effect (1).

What is claimed is:

1. A semiconductor integrated circuit device comprising:
    a memory array having memory cells arranged in a matrix shape; and
    a guard ring enclosing said memory array,
    wherein said guard ring has an inner periphery substantially conforming to the shape of a diffusion layer arranged at an end portion of said memory array,
    wherein said guard ring has formed thereover a dummy pattern, said dummy pattern having a portion with a plan view shape substantially identical to that of a gate electrode formed over the diffusion layer which is arranged at the end portion of said memory array, and
    wherein said dummy pattern and said guard ring are electrically connected with each other.

2. A semiconductor integrated circuit device according to claim 1, wherein said dummy pattern is made of the same material as that of said gate electrode.

3. A semiconductor integrated circuit device comprising:
    a semiconductor substrate having a main surface;
    a plurality of memory cells of a static random access memory each having first and second transfer MISFETs and first and second driver MISFETs disposed in such a manner that said first and second driver MISFETs are arranged, in a first direction, between said first and second transfer MISFETs, said plurality of memory cells being formed at a first region of said main surface and are arrayed in said first direction and in a second direction, perpendicular to said first direction, and said second direction being in parallel with gate widths of said first and second transfer MISFETs;

element isolating insulating films formed in said semiconductor substrate and regulating the gate widths of said first and second transfer MISFETs, said element isolating insulating films defining active regions where said transfer MISFETs and driver MISFETs are formed;

a first semiconductor region formed in said semiconductor substrate and extending in said first and second directions as a peripheral region surrounding said first region, said first semiconductor region having applied thereto a fixed potential; and second semiconductor regions formed in said semiconductor substrate, said second semiconductor regions being formed integrally with said first semiconductor region and being formed between said first semiconductor region and said element isolating insulating films, said second semiconductor regions being arranged between said first semiconductor region and those ones of said plurality of memory cells adjacent to said first semiconductor region in said second direction, wherein said element isolating insulating films include a first portion and a second portion, said first portion being formed between said second semiconductor region and a channel forming region of the first transfer MISFET of a memory cell adjacent to said second semiconductor region in said second direction, and said second portion being formed between a channel forming region of the second transfer MISFET of said memory cell and a channel forming region of the first transfer MISFET of a memory cell adjacent to said memory cell in said second direction, and wherein said first and second portions have widths, in said second direction, that are substantially equal.

4. A semiconductor integrated circuit device according to claim 3, wherein a gate width of said first transfer MISFET of said memory cell adjacent to said first semiconductor region in said second direction is substantially equal to a gate width of said second transfer MISFET of said memory cell adjacent to said first semiconductor region in said second direction.

5. A semiconductor integrated circuit device according to claim 3, wherein said first semiconductor region comprises a guard ring enclosing said plurality of arrayed memory cells.

6. A semiconductor integrated circuit device according to claim 3, wherein said first driver MISFET has a plan view shape arranged symmetrically with that of said second driver MISFET about a central location of a plan view area associated with each memory cell and said first transfer MISFET has a plan view shape arranged symmetrically with that of said second transfer MISFET about said central location of each memory cell, said first and second driver MISFETs having gate widths in parallel with each other and in parallel with said first direction, and said first and second transfer MISFETs having gate widths in parallel with each other and in parallel with said second direction.

7. A semiconductor integrated circuit device according to claim 6, further comprising:

a dummy gate electrode layer extending over said main surface in said first direction and formed of the same layer as that of gate electrodes of said driver MISFETs, wherein a first spacing size, in said second direction, is formed between said dummy gate electrode layer and a gate electrode of the first driver MISFET of a memory cell adjacent to said first semiconductor region in said second direction, a second spacing size, in said second direction, is formed between a gate electrode of the second driver MISFET of said memory cell and a gate electrode of the first driver MISFET of a memory cell adjacent to said memory cell in said second direction, said first spacing size being substantially equal to that of said second spacing size.

8. A semiconductor integrated circuit device according to claim 6, wherein said first portion and said second portion are defined by plan view patterns shaped in a manner such that said first and second portions have widths, in said second direction, that are substantially equal.

9. A semiconductor integrated circuit device according to claim 8, wherein said first and second transfer MISFETs of each memory cell are defined by plan view patterns, respectively, such that in an array of memory cells in one of said first and second directions the plan view patterns of said first and second transfer MISFETs between adjacent memory cells are symmetrically arranged.

10. A semiconductor integrated circuit device according to claim 9, wherein said first and second driver MISFETs of each memory cell are defined by plan view patterns, respectively, such that in an array of memory cells in said first direction the plan view patterns of said first and second driver MISFETs between adjacent memory cells are symmetrically arranged.

11. A semiconductor integrated circuit device according to claim 9, wherein said first and second driver MISFETs of each memory cell are defined by plan view patterns, respectively, such that in an array of memory cells in said second direction the plan view patterns of said first and second driver MISFETs between adjacent memory cells are symmetrically arranged.

12. A semiconductor integrated circuit device comprising:

a semiconductor substrate having a main surface;

a plurality of memory cells of a static random access memory each having first and second transfer MISFETs and first and second driver MISFETs disposed in such a manner that said first and second driver MISFETs are arranged in a first direction between said first and second transfer MISFETs, said plurality of memory cells being formed at a first region of said main surface and are arrayed in said first direction and in a second direction, perpendicular to said first direction, and said first direction is in parallel with gate widths of said first and second driver MISFETs;

element isolating insulating films formed in said semiconductor substrate and regulating the gate widths of said first and second driver MISFETs, said element isolating insulating films defining active regions where said transfer MISFETs and driver MISFETs are formed;

a first semiconductor region formed in said semiconductor substrate and extending in said first and second directions as a peripheral region surrounding said first region, said first semiconductor region having applied thereto a fixed potential; and second semiconductor regions formed in said semiconductor substrate, said second semiconductor regions being formed integrally with said first semiconductor region and being formed between said first semiconductor region and said element isolating insulating films, said second semiconductor regions being arranged between said first semiconductor region and said memory cells adjacent to said first semiconductor region in said first direction, wherein said element isolating insulating films include a first portion and a second portion, said first portion being formed between said second semiconductor region and a channel forming region of the first driver MISFET of a memory cell adjacent to said second semiconductor region in said first direction, and said second portion being formed between a channel forming region of the second driver MISFET of said memory cell and a channel forming region of the first driver MISFET of a memory cell adjacent to said memory cell in said first direction, and wherein said first and second portions have widths, in said first direction, that are substantially equal.

13. A semiconductor integrated circuit device according to claim 12, wherein a gate width of said first driver MISFET of said memory cell adjacent to said first semiconductor region in said first direction is substantially equal to a gate width of said second driver MISFET of said memory cell adjacent to said first semiconductor region in said first direction.

14. A semiconductor integrated circuit device according to claim 12, wherein said first semiconductor region comprises a guard ring enclosing said plurality of arrayed memory cells.

15. A semiconductor integrated circuit device according to claim 12, wherein said first driver MISFET has a plan view shape arranged symmetrically with that of said second driver MISFET about a central location of a plan view area associated with each memory cell and said first transfer MISFET has a plan view shape arranged symmetrically with that of said second transfer MISFET about said central location of each memory cell, said first and second driver MISFETs having gate widths in parallel with each other and in parallel with said first direction, and said first and second transfer MISFETs having gate widths in parallel with each other and in parallel with said second direction.

16. A semiconductor integrated circuit device according to claim 15, further comprising:

a dummy gate electrode layer extending over said main surface in said second direction and formed of the same layer as that of gate electrodes of said transfer MISFETs, wherein a first spacing size, in said first direction, is formed between said dummy gate electrode layer and a gate electrode of the first transfer MISFET of a memory cell adjacent to said second semiconductor region in said first direction, a second spacing size, in said first direction, is formed between a gate electrode of the second transfer MISFET of said memory cell and a gate electrode of the first transfer MISFET of a memory cell adjacent to said memory cell in said first direction, said first spacing size being substantially equal to that of said second spacing size.

17. A semiconductor integrated circuit device according to claim 15, wherein said first and second driver MISFETs of each memory cell are defined by plan view patterns, respectively, such that in an array of memory cells in said first direction the plan view patterns of said first and second driver MISFETs between adjacent memory cells are symmetrically arranged.

18. A semiconductor integrated circuit device according to claim 15, wherein said first and second driver MISFETs of a memory cell are defined by plan view patterns, respectively, such that in an array of memory cells in said second direction the plan view patterns of said first and second driver MISFETs between adjacent memory cells are symmetrically arranged.

19. A semiconductor integrated circuit device comprising:

a semiconductor substrate having a main surface;

a plurality of memory cells of a static random access memory each having first and second transfer MISFETs and first and second driver MISFETs disposed in such a manner that said first and second driver MISFETs are arranged, in a first direction, between said first and second transfer MISFETs, said first and second driver MISFETs each having a gate electrode formed over said main surface, said first driver MISFET having a plan view shape arranged symmetrically with that of said second driver MISFET about a central location of a plan view area associated with each memory cell, and said first transfer MISFET having a plan view shape arranged symmetrically with that of said second transfer MISFET about said central location of the plan view area of each memory cell, said first and second driver MISFETs having gate widths directioned in parallel with each other and in parallel with said first direction, said first and second transfer MISFETs having gate widths directioned in parallel with each other and in parallel with a second direction, perpendicular to said first direction, and said plurality of memory cells being arrayed in said first direction and in said second direction and are formed at a first region of said main surface;

a first semiconductor region formed in said semiconductor substrate and extending in said first and second directions as a peripheral region surrounding said first region, said first semiconductor region having applied thereto a fixed potential; and a dummy gate electrode layer extending on said first semiconductor region in said first direction and formed of a same layer as that of gate electrodes of said driver MISFETs, wherein a first spacing size, in said second direction, is formed between said dummy gate electrode layer and a gate electrode of the first driver MISFET of a memory cell adjacent to said first semiconductor region in said second direction, wherein a second spacing size, in said second direction, is formed between the gate electrode of the second driver MISFET of said memory cell and the gate electrode of the first driver MISFET of a memory cell adjacent to said memory cell in said second direction, and wherein said first spacing size is substantially equalized to said second spacing size.

20. A semiconductor integrated circuit device according to claim 19, wherein said dummy electrode layer is fed with the fixed potential.

21. A semiconductor integrated circuit device according to claim 19, wherein said first and second driver MISFETs of each memory cell are defined by plan view patterns, respectively, such that in an array of memory cells in said first direction the plan view patterns of said first and second driver MISFETs between adjacent memory cells are symmetrically arranged.

22. A semiconductor integrated circuit device according to claim 19, wherein said first and second driver MISFETs of a memory cell are defined by a plan view patterns, respectively, such that in an array of memory cells in said second direction the plan view patterns of said first and second driver MISFETs between adjacent memory cell are symmetrically arranged.

23. A semiconductor integrated circuit device comprising:
a semiconductor substrate having a main surface;
a plurality of memory cells of a static random access memory each having first and second transfer MISFETs and first and second driver MISFETs disposed in such a manner that said first and second driver MISFETs are arranged, in a first direction, between said first and second transfer MISFETs, said first and second transfer MISFETs having gate electrodes formed over said main surface, said first driver MISFET having a plan view shape arranged symmetrically with that of said second driver MISFET about a central location of a plan view area associated with each memory cell, said first transfer MISFET having a plan view shape arranged symmetrically with that of said second transfer MISFET about said central location of the plan view area of each memory cell, said first and second driver MISFETs having gate widths in parallel with each other and in parallel with said first direction, said first and second transfer MISFETs having gate widths directioned in parallel with each other and in parallel with a second direction, perpendicular to said first direction, and said plurality of memory cells being arrayed in said first direction and in said second direction and being formed at a first region of said main surface;
a first semiconductor region formed in said semiconductor substrate and extending in said first and second directions as a peripheral region surrounding said first region, said first semiconductor region having applied thereto a fixed potential; and
a dummy gate electrode layer extending over said main surface in said second direction and formed of the same layer as that of gate electrodes of said transfer MISFETs,
wherein a first spacing size, in said first direction, is formed between said dummy gate electrode layer and a gate electrode of the first transfer MISFET of a memory cell adjacent to said first semiconductor region in said first direction,
wherein a second spacing size, in said first direction, is formed between a gate electrode of the second transfer MISFET of said memory cell and a gate electrode of the first transfer MISFET of a memory cell adjacent to said memory cell in said first direction, and
wherein said first spacing size is substantially equal to that of said second spacing size.

24. A semiconductor integrated circuit device according to claim 23, wherein word lines extend over said main surface in said second direction and are formed integrally with the gate electrodes of said transfer MISFETs, wherein said dummy gate electrode layer extends in said second direction in parallel with said word lines.

25. A semiconductor integrated circuit device comprising:
a semiconductor substrate having a well region, said well region having a main surface;
a plurality of memory cells of a static random access memory each having first and second transfer MISFETs and first and second driver MISFETs disposed in such a manner that said first and second driver MISFETs are arranged, in a first direction, between said first and second transfer MISFETs, said plurality of memory cells being formed at a first region of said main surface and being arrayed in said first direction and in a second direction, perpendicular to said first direction, and said second direction being in parallel with gate widths of said first and second transfer MISFETs;
element isolating insulating films formed in said semiconductor substrate and regulating the gate widths of said first and second transfer MISFETs, said element isolating insulating films defining active regions where said transfer MISFETs and driver MISFETs are formed;
well connecting regions formed in said well region, said well connecting regions being arranged, in said first direction and, in said second direction, and said well region having applied thereto a fixed potential through said well connecting regions,
wherein said element isolating insulating films include a first portion and a second portion, said first portion being formed between a well connecting region and a channel forming region of the first transfer MISFET of a memory cell adjacent to said well connecting region in said second direction, and said second portion is formed between a channel forming region of the second transfer MISFET of said memory cell and a channel forming region of the first transfer MISFET of a memory cell adjacent to said memory cell in said second direction, and
wherein said first portion and said second portion have widths, in said second direction, that are substantially equal.

26. A semiconductor integrated circuit device according to claim 25, wherein said first driver MISFET has a plan view shape arranged symmetrically with that of said second driver MISFET about a central location of a plan view area associated with each memory cell and said first transfer MISFET has a plan view shape arranged symmetrically with that of said second transfer MISFET about said central location of each memory cell, said first and second driver MISFETs having gate widths in parallel with each other and in parallel with said first direction, and said first and second transfer MISFETs having gate widths in parallel with each other and in parallel with said second direction.

27. A semiconductor integrated circuit device according to claim 26, further comprising:
a dummy gate electrode layer extending over said main surface in said first direction and formed of the same layer as that of gate electrodes of said driver MISFETs, said dummy gate electrode layer having openings over said well connecting regions, wherein a first spacing size, in said second direction, is formed between said dummy gate electrode layer and a gate electrode of the first driver MISFET of a memory cell adjacent to said well connecting region in said second direction and a second spacing size, in said second direction, is formed between a gate electrode of the second driver MISFET of said memory cell and a gate electrode of the first driver MISFET of a memory cell adjacent to said memory cell in said second direction, said first spacing size being substantially equal to that of said second spacing size.

28. A semiconductor integrated circuit device according to claim 27, further comprising:
a first semiconductor region formed in said well region and extending in said first and second directions as a peripheral region surrounding said first region, wherein a fixed potential is applied to said well region.

29. A semiconductor integrated circuit device according to claim 26, wherein said first and second driver MISFETs of each memory cell are defined by plan view patterns, respectively, such that in an array of memory cells in said first direction the plan view patterns of said first and second driver MISFETs between adjacent memory cells are symmetrically arranged.

30. A semiconductor integrated circuit device according to claim 26, wherein said first and second driver MISFETs of a memory cell are defined by plan view patterns, respectively, such that in an array of memory cells in said second direction the plan view patterns of said first and second driver MISFETs between adjacent memory cells are symmetrically arranged.

* * * * *